(12) United States Patent
Langemyr et al.

(10) Patent No.: US 7,596,474 B2
(45) Date of Patent: Sep. 29, 2009

(54) METHOD FOR ASSEMBLING THE FINITE ELEMENT DISCRETIZATION OF ARBITRARY WEAK EQUATIONS INVOLVING LOCAL OR NON-LOCAL MULTIPHYSICS COUPLINGS

(75) Inventors: Lars Langemyr, Stockholm (SE); Daniel Bertilsson, Sollentuna (SE); Arne Nordmark, Stockholm (SE); Per-Olof Persson, Cambridge, MA (US); Jerome Long, Middx (GB)

(73) Assignee: Comsol AB, Stockholm (SE)

( * ) Notice: Subject to any disclaimer, the term of this patent is extended or adjusted under 35 U.S.C. 154(b) by 351 days.

(21) Appl. No.: 10/042,936

(22) Filed: Jan. 9, 2002

(65) Prior Publication Data
US 2004/0034514 A1     Feb. 19, 2004

Related U.S. Application Data

(63) Continuation-in-part of application No. 09/995,222, filed on Nov. 27, 2001, and a continuation-in-part of application No. 09/675,778, filed on Sep. 29, 2000.

(60) Provisional application No. 60/253,154, filed on Nov. 27, 2000, provisional application No. 60/222,394, filed on Aug. 2, 2000.

(51) Int. Cl.
*G06F 7/60* (2006.01)
*G06F 17/13* (2006.01)
*G06G 7/48* (2006.01)
*G06G 7/50* (2006.01)

(52) U.S. Cl. .................. 703/2; 703/6; 703/7; 703/9

(58) Field of Classification Search .................. 703/2, 703/6, 7, 9
See application file for complete search history.

(56) References Cited

U.S. PATENT DOCUMENTS

| 5,408,638 | A | 4/1995 | Sagawa et al. |
| 6,349,272 | B1 | 2/2002 | Phillips |
| 6,810,370 | B1 | 10/2004 | Watts, III ................ 703/10 |

OTHER PUBLICATIONS

FEMLAB® Installation and New Features Guide, Version 2.3. Nov. 2002.*
FEMLAB® Reference Manual, Version 1.0. Jul. 1998.*

(Continued)

*Primary Examiner*—Paul L Rodriguez
*Assistant Examiner*—Luke Osborne
(74) *Attorney, Agent, or Firm*—Nixon Peabody LLP

(57) ABSTRACT

Disclosed are techniques for representing and modeling one or more systems in which each system corresponds to an application mode. This may be done for one or more geometries using local and/or non-local couplings. For each application mode, physical quantities are modeled and may be defined using a graphical user interface. Physical properties may be used to model the physical quantities of each system. The physical properties may be defined in terms of numerical values or constants, and mathematical expressions that may include numerical values, space coordinates, time coordinates, and actual physical quantities. Physical quantities and any associated variables may apply to some or all of a geometric domain, and may also be disabled in other parts of a geometrical domain. Partial differential equations describe the physical quantities. One or more application modes may be combined using an automated technique into a combined system of partial differential equations as a multiphysics model. A portion of the physical quantities and variables associated with the combined system may be selectively solved for. Also described are methods for computing the stiffness matrix, residual vector, constraint matrix, and constraint residual vector for the finite element discretization of a system of partial differential equations in weak form that includes local and non-local variables coupling multiple geometries.

72 Claims, 100 Drawing Sheets

OTHER PUBLICATIONS

FEMLAB 2.2: New Features. © 2001. Printed from http://www.technion.ac.il/~leonidb/BursteinSite/Femlb22About.htm.*

Anderson, D.G. "Iterative Procedures for Nonlinear Integral Equations." Journal of the ACM. vol. 12, Issue 4. Oct. 1965.*

Saitz, J. "Newton-Raphson Method and Fixed-Point Technique in Finite Element Computation of Magnetic Field Problems in Media with Hysteresis", IEEE Transactions on Magnetics, May 1999. vol. 35, No. 3, pp. 1398-1401.*

Canova, A. and M. Repetto, "Integral Solution of Nonlinear Magnetostatic Field Problems", IEEE Transactions on Magnetics, May 2001. vol. 37, No. 3, pp. 1070-1077.*

Ribeiro, P. "Non-linear Forced Vibrations of Thin/Thick Beams and Plates by the Finite Element and Shooting Methods", Computers and Structures, May 2004. vol. 82, pp. 1413-1423.*

Rao, P. "An Efficient Scalable Finite Element Model for Simulating Large Scale Hydrodynamic Flows", 16th ASCE Enegineering Mechanics Conf., Jul. 16-18, 2003.*

16th American Society of Civil Engineers (ASCE) Engineering Mechanics Conference, Jul. 16-18, 2003. Printed Jan. 10, 2007. http://www.ce.washington.edu/em03/proceedings/authorindex.htm.*

Persson, P. "Implementation of Finite Element-Based Navier-Stokes Solver 2.094—Project". Apr. 25, 2002. http://www.mit.edu/~persson/nsfem_report.pdf.*

FEMLAB Installation Guide For Use With MatLab Windows, Unix, Linux. MacIntosh; Version 2.2; Copyright 1994-2001 by COMSOL AB.

FEMLAB Reference Manual For Use With MatLab Windows, Unix, Linux, MacIntosh; Version 2.2; Copyright 1994-2001 by COMSOL AB.

FEMLAB Chemical Engineering *Module* For Use With MatLab Windows, Unix, Linux, MacIntosh; Version 2.2; Copyright 1994-2001 by COMSOL AB.

FEMLAB Model Library For Use With MatLab Windows, Unix, Linux, MacIntosh; Version 2.2; Copyright 1994-2001 by COMSOL AB.

FEMLAB User's Guide and Instruction For Use With MatLab Windows, Unix, Linux, MacIntosh; Version 2.2: Copyright 1994-2001 by COMSOL AB.

FEMLAB Electromagnetics Module For Use With MatLab Windows, Unix, Linux, MacIntosh; Version 2.2; Copyright 1994-2001 by COMSOL AB.

George et al., "Delaunay Triangulation and Meshing," *Hermes*, Paris 33-238 (1998) Delaunay triangulation: 33-46, 50-59; Constrained triangulation: 73-99; Parametric surface meshing: 161-173; Optimizations; 215-238.

Dahlquist, et al., "Numerical Methods," *Prentice Hall* 284-355 (1974) Interpolation: 284-285; Linear Solver: 146-172; Time-Dependent Solver: 347-355; Eigenvalue Solver: 208-211; Damped Newton Method: 248-253.

Brenner et al., "The Mathematical Theory of Finite Element Methods," *Springer-Verlag* 1-12 (1994) The Finite Element Method: 1-12.

Frey et al., "Mesh Generation, Application to Finite Elements," *Hermes*, Paris 88-90 (2000) Mesh Search; 88-90.

Zienkiewicz et al., "The Finite Element Method," *McGraw-Hill* 1:23-177 Basis Function: 23-26; Quadrature Formulas, Gauss Points, Weights: 175-177.

Davenport et al., "Computer Algebra Systems and Algorithms for Algebraic Computation," *Academic Press* 28-32 (1993) Symbolic Differentiation: 28-32.

C. Johnson, "Numerical Solution of Partial Differential Equations by the Finite Element Method," *Studentlitteratur* 14-18 (1987) Test Function 14-18.

Mathworks, Inc., "Partial Differential Equation Toolbox: User's Guide" For Use with MATLAB © (Copyright 1984-1997 The Mathworks, Inc.).

Wilks, "Primer on Object-Oriented Programming," http://www.eimc.brad.ac.uk/java/tutorial/Project1/ooprim.htm(1996).

FEMLAB, "Reference Manual," For Use With MATLAB V5, Windows 95/98, Windows NT, Unix, Version 1.0 (Copyright 1994-1998 by COMSOL AB).

FEMLAB, "User's Guide and Introduction," For Use With MATLAB V5, Windows 95/98, Windows NT, Unix, Version 1.0 (Copyright 1994-1998 by COMSOL AB).

FEMLAB, "Model Library," For Use With MATLAB V5, Windows 95/98, Windows NT, Unix, Version 1.0 (Copyright 1994-1998 by COMSOL AB).

FEMLAB, "Structural Mechanics Engineering Module," For Use With FEMLAB (Copyright 1994-1998).

Notice of Allowance and Fee(s) Due, U.S. Appl. No. 09/995,222, filed Nov. 27, 2001, mail on Oct. 27, 2008, 10 pages.

Allowed Claims 43-86, U.S. Appl. No. 09/995,222, filed Nov. 27, 2001, 11 pages.

* cited by examiner

Boundary Conditions/ht

Equation: T = T0

Subdomain selection

```
1
2
3
4
5
6
7
```

Name: `1`

☑ Enable borders

PDE coefficients ☑ Unlock

| Quantity | Value | Description |
|---|---|---|
| ○ q | 0 | Heat flux |
| ○ h | 0 | Heat transfer coefficient |
| ○ T_inf | 0 | External temperature |
| ○ C | 0 | Problem-dependent constant |
| ○ T_amb | 0 | Ambient temperature |
| ○ n·[k·gradT]=0 | | Insulation/symmetry |
| ◉ T | 300 | Temperature |
| ○ T=0 | | Zero temperature |

☑ On top

[ OK ]  [ Cancel ]  [ Apply ]

FIG. 5

$$\left\{\begin{array}{l} d_{a\,lk}\dfrac{\partial u_k}{\partial t} - \dfrac{\partial}{\partial x_j}\left[c_{lkji}\dfrac{\partial u_k}{\partial x_i} + \alpha_{lkji}u_k - \gamma_{lj}\right] + \beta_{lki}\dfrac{\partial u_k}{\partial x_i} + a_{lk}u_k = f_i \bigg\rangle \Omega \quad \text{—142} \\ \\ n_j\left[c_{lkji}\dfrac{\partial u_k}{\partial x_i} + \alpha_{lkj}u_k - \gamma_{lj}\right] + q_{lk}u_k = g_l - h_{ml}\lambda_m \quad \Big\} \partial\Omega \quad \text{—146a} \\ \\ h_{ml}u_l = r_m \hspace{5cm} \Big\} \partial\Omega \quad \text{—146b} \end{array}\right\} \text{—146}$$

$$\underbrace{\phantom{xxxxxxxxxxxxxxxxxxxxxxxxxxxxxxxxxxxxxxxxxxxxxxxx}}_{140}$$

FIG. 8

$$\left\{\begin{array}{l} d_{a\,lk}\dfrac{\partial u_k}{\partial t} + \dfrac{\partial \Gamma_{lj}}{\partial x_j} = F_l \hspace{1cm} \Big\} \Omega \quad \text{—152} \\ \\ -n_j\Gamma_{lj} = G_l + \dfrac{\partial R_m}{\partial u_l}\lambda_m \quad \Big\} \partial\Omega \quad \text{—154a} \\ \\ 0 = R_m \hspace{3cm} \Big\} \partial\Omega \quad \text{—154b} \end{array}\right\} \text{—154}$$

$$\underbrace{\phantom{xxxxxxxxxxxxxxxxxxxxxxxxxxxxx}}_{150}$$

FIG. 9

$$\gamma_{lj} = \Gamma_{lj}$$

$$f_l = F_l$$

$$c_{lkji} = -\frac{\partial \Gamma_{lj}}{\partial\left(\frac{\partial n_k}{\partial x_i}\right)}$$

$$\alpha_{lkj} = -\frac{\partial \Gamma_{lj}}{\partial u_k}$$

$$\beta_{lki} = -\frac{\partial F_l}{\partial\left(\frac{\partial m_k}{\partial x_i}\right)}$$

$$a_{lk} = -\frac{\partial F_l}{\partial u_k}$$

$$g_l = G_l \qquad r_l = R_l$$

$$q_{lk} = -\frac{\partial G_l}{\partial u_k} \qquad h_{lk} = -\frac{\partial R_l}{\partial u_k}$$

$$\Gamma_{lj} = -c_{lkji}\frac{\partial u_k}{\partial x_l} - \alpha_{lkj}u_k + y_{lj}$$

$$F_l = f_l - \beta_{lki}\frac{\partial u_k}{\partial x_i} - a_{lk}u_k$$

$$\underbrace{\int_\Omega \left\{ \left[ c_{lkji} \frac{\partial u_k}{\partial x_i} + \alpha_{lkj} u_k \right] \frac{\partial v}{\partial x_j} + \left[ d_{alk} \frac{\partial u_k}{\partial t} + \beta_{lki} \frac{\partial u_k}{\partial x_i} + a_{lk} u_k \right] v \right\} dx +}_{300}$$

$$\int_{\partial\Omega} q_{lk} u_k v ds = \int_\Omega \left[ \gamma_{lj} \frac{\partial v}{\partial x_j} + f_l v \right] dx + \int_{\partial\Omega} (g_l - h_{ml} \lambda_m) v ds$$

$$\int_{\partial\Omega} \mu h_{mk} u_k ds = \int_{\partial\Omega} \mu r_m ds$$

FIG. 12

$$\underbrace{\int_\Omega \left[\Gamma_{lj}\frac{\partial v}{\partial x_j}+F_{lv}-d_{alk}\frac{\partial u_k}{\partial l}v\right]dx+\int_{\partial\Omega}+\left[G_l+\frac{\partial R_m}{\partial u_l}\lambda_m\right]vds=0}_{302}$$

$$\int_{\partial\Omega} R_m \mu ds = 0$$

FIG. 13

$$U_k(x) = \sum_{I=1}^{N_p} U_{I,k} \Phi_I(x);$$

⎫ 304

$$\Lambda_m(x) = \sum_{k=1}^{N_c} \sum_{L=1}^{n} \Lambda_{K,L,m} \Psi_{K,L}(x)$$

FIG. 14

$$\int_t \left[ c_{lkji} U_{I,k} \frac{\partial \Phi_I}{\partial x_i} + \alpha_{lkj} U_{I,k} \Phi_I \right] \frac{\partial \Phi_J}{\partial x_j} dx +$$

$$\int_t \left[ d_{alk} \frac{\partial U_{I,k}}{\partial t} \Phi_I + \beta_{lki} U_{I,k} \frac{\partial \Phi_I}{\partial x_i} + a_{lk} U_{I,k} \Phi_I \right] \Phi_J \, dx +$$

$$\int_{\partial t} q_{lk} U_{I,k} \Phi_I \Phi_J \, ds = \int_t \left[ \gamma_{lj} \frac{\partial \Phi_J}{\partial x_j} + f_l \Phi_J \right] dx +$$

$$\int_{\partial t} (g_l - h_{ml} \Lambda^\Lambda_{K,L}, m^\Psi_{K,L}) \Phi_J \, ds$$

$$308 \left\{ \int h_{mk} \frac{U_{I,k} \Phi_I \Psi_{K,L}}{\partial t} ds = \int r_m \Psi_{K,L} ds \right.$$

FIG. 16

$$\underbrace{\int_t \left[ \Gamma_{lj} \frac{\partial \Phi_j}{\partial x_j} + F_l \Phi_j - d_{alk} \frac{\partial u_k}{\partial t} \Phi_J \right] dx + \int \frac{\partial}{\partial t} + \int \left[ G_l + \frac{\partial R_m}{\partial u_l} \Lambda_{K,L}, m \Psi_{K,L} \right] \Phi_J ds = 0}_{312}$$

$$\int R_m \Psi_{K,L} \frac{\partial}{\partial t} ds = 0$$

FIG. 17

$$310 \begin{cases} DA_{(J,l),(I,k)} = \int_t d\,a_{lk}\Phi_I\Phi_J\,dx \\[2ex]
C_{(J,l),(I,k)} = \int_t c_{lkji}\frac{\partial \Phi_I}{\partial x_i}?\frac{\partial \Phi_J}{\partial x_j}\,dx \\[2ex]
AL_{(J,l),(I,k)} = \int_t \alpha_{lkj}\Phi_I?\frac{\partial \Phi_J}{\partial x_j}\,dx \\[2ex]
BE_{(J,l),(I,k)} = \int_t \beta_{lki}\frac{\partial \Phi_I}{\partial x_i}\Phi_J\,dx \\[2ex]
A_{(J,l),(I,k)} = \int_t a_{lk}\Phi_I\Phi_J\,dx \\[2ex]
Q_{(J,l),(I,k)} = \int_{\partial t} q_{lk}\Phi_I\Phi_J\,ds \\[2ex]
GA_{(J,l)} = \int_t \gamma_{lj}\frac{\partial \Phi_J}{\partial x_j}\,dx \\[2ex]
F_{(J,l)} = \int_t f_l \Phi_J\,dx \\[2ex]
G_{(J,l)} = \int_{\partial t} g_l \Phi_J\,ds \\[2ex]
H_{(K,L,m),(I,k)} = \int_{\partial t} h_{mk}\Phi_I \Psi_{K,L}\,ds \\[2ex]
R_{(K,L,m)} = \int_{\partial t} r_m \Psi_{K,L}\,ds \end{cases}$$

FIG. 18

$$DA\frac{\partial U}{\partial t} + \underbrace{(C+AL+BE+A+Q)U + H^T \Lambda}_{320} = GA+F+G$$

$$\underbrace{DA\frac{\partial U}{\partial t}+H^T\Lambda=GA+F+G \quad R=O}_{322}$$

FIG. 20

$$\begin{cases} J(U^{(k)}) \Delta U^{(k)} = -\rho(U^{(k)}) \\ U^{(k+1)} = U^{(k)} + \lambda_k \Delta U^{(k)} \end{cases}$$

1-D PHYSICS APPLICATION MODES { 502 }

| APPLICATION MODE | CLASS NAME | PARENT CLASS |
|---|---|---|
| DIFFUSION | flpdedf1d | flpdedf |
| HEAT TRANSFER | flpdeht1d | flpdeht |

1-D PDE APPLICATION MODES { 504 }

| APPLICATION MODE | CLASS NAME | PARENT CLASS |
|---|---|---|
| COEFFICIENT PDE MODEL, n VARIABLES | flpdecf1d(n) | flpdecf(n) |
| GENERAL PDE MODEL, n VARIABLES | flpdegt1d(n) | flpdegt(n) |

FIG. 25

2-D PHYSICS APPLICATION MODES {506}

| APPLICATION MODE | CLASS NAME | PARENT CLASS |
|---|---|---|
| AC POWER ELECTROMAGNETICS | flpdeac | flpdec2d |
| CONDUCTIVE MEDIA DC | flpdedc2d | flpdedc |
| DIFFUSION | flpdedf2d | flpdedf |
| ELECTROSTATICS | flpdees2d | flpdees |
| MAGNETOSTATICS | flpdems2d | flpdems |
| HEAT TRANSFER | flpdeht2d | flpdeht |
| INCOMPRESSIBLE NAVIER-STOKES | flpdens2d | flpdens |
| STRUCTURAL MECHANICS, PLANE STRESS | flpdeps | flpdec2d |
| STRUCTURAL MECHANICS, PLANE STRAIN | flpdepn | flpdec2d |

PDE APPLICATION MODES {508}

| APPLICATION MODE | CLASS NAME | PARENT CLASS |
|---|---|---|
| COEFFICIENT PDE MODEL, n VARIABLES | flpdec2d($n$) | flpdec($n$) |
| GENERAL PDE MODEL, n VARIABLES | flpdeg2d($n$) | flpdeg($n$) |

FIG. 26

APPLICATION OBJECT PROPERTIES {510}

| Property name | Description | Data type |
|---|---|---|
| dim | Names of the dependent variables | Cell array of strings |
| form | PDE form | String (coefficient/general) |
| name | Application name | String |
| parent | Parent class names | String, cell array of strings, or the empty matrix |
| sdim | Names of the independent variables (space dimensions) | Cell array of strings |
| submode | Name of current submode | String (std/wave) |
| tdiff | Time differentiation flag | String (on/off) |

FIG. 27

```
function obj = myapp()
%MYAPP Constructor for a FEMLAB application object.

obj.name = 'My first FEMLAB application';
obj.parent = 'flpdeht2d';

%MYAPP is a subclass of FLPDEHT2D.
p1 = flpdeht2d;
obj = class(obj,'myapp',p1);
sat(obj,'dim',default_dim(obj));
```

PHYSICS MODELING METHODS

| FUNCTION | PURPOSE |
| --- | --- |
| appspec | Return application specifications |
| bnd_compute | Convert application-dependent boundary conditions to generic boundary coefficients. |
| default_bnd | Default boundary conditions. |
| default_dim | Default names of dependent variables. |
| default_equ | Default PDE coefficients/material parameters. |
| default_init | Default intitial conditions. |
| default_sdim | Default space dimension variables. |
| default_var | Default application scalar variables. |
| dim_compute | Return dependent variables for an application |
| equ_compute | Convert application-dependent material parameters to generic PDE coefficients. |
| form_compute | Return PDE form. |
| init_compute | Convert application-dependent initial conditions to generic initial conditions. |
| posttable | Define assigned variable names and post-processing information. |

530 $\quad \Delta E_z + (2\pi i k)^2 E_z = 0$

532 $\quad k = \dfrac{1}{\lambda} = \dfrac{f}{c}$

534 $\quad \bar{n},(\nabla E_z) + 2\pi i k_x E_z = 4\pi i k_x \sin\left(\dfrac{\pi}{d}(y-y_0)\right)$ 536 $\quad k^2 = k_x^2 + k_y^2$ 538 $\quad k_x = \sqrt{\dfrac{1}{\lambda^2} - \dfrac{1}{(2d)^2}}$ 540 $\quad n \cdot (\nabla E_z) + 2\pi i k_x E_z = 0$ 542 $\quad E_z = 0$ 544 $\quad f_c = \dfrac{c}{2d}$

```
function obj = flwaveguide(varargin)
%FLWAVEGUIDE Constructor for a Waveguide application object.

obj.name = 'In-Plane Waveguide';
obj.parent = 'flpdeac';

%FLWAVEGUIDE is a subclass of FLPDEAC:
p1 = flpdeac;
obj = class(obj,'flwaveguide',p1);
set(obj,'dim',default_dim(obj));
```

| fem user field | |
|---|---|
| field | description |
| geomparam | 1-by-2 structure of geometry parameters. |
| entrybnd | Index to the entry boundary. |
| exitbnd | Index to the exit boundary. |
| freqs | Frequency vector |

| fem user field | |
|---|---|
| field | description |
| startpt | Index of the lower left corner point of the waveguide. |
| type | Type of waveguide. ('straight or 'elbow) |

| field | description | geoparam fields defaults for elbow | default for straight |
|---|---|---|---|
| entrylength | Length of the entrance part of the waveguide. | 0.1 | 0.1 |
| exitlength | Length of the exit part of the waveguide. | 0.1 | not used |
| radius | Outer radius of the waveguide bend. | 0.05 | not used |
| width | Width of the waveguide. | 0.025 | 0.025 |
| cavityflag | Turn resonance cavity *on* or *off*. | 0 | 0 |
| cavitywidth | Width of the resonance cavity. | 0.025 | 0.025 |
| postwidth | Width of the protruding posts. | 0.005 | 0.005 |
| postdepth | Depth of the protruding posts. | 0.005 | 0.005 |

FIG. 35

$$0 = \int_\Omega W^{(2)} dA + \int_B W^{(1)} ds + \sum_P W^{(0)} +$$

$$+ \int_\Omega v_l \frac{\partial R_m^{(2)}}{\partial U_l} \mu_m^{(2)} dA + \int_B v_l \frac{\partial R_m^{(1)}}{\partial u_l} \mu_m^{(1)} ds + \sum_P v_l \frac{\partial R_m^{(0)}}{\partial u_l} \mu_m^{(0)}$$

⎫ 1102

$0 = R^{(2)}$ on $\Omega$
$0 = R^{(1)}$ on $B$
$0 = R^{(0)}$ on $P$

$$W_l^{(n)} = W_l^{(n)} + \Gamma_{lij}\frac{\partial v_l}{\partial x_j} + F_l v_l$$

$$W_l^{(nt)} = W_l^{(nt)} + d_{alk}\frac{\partial u_k}{\partial t} v_l$$

2720 — RETURN THE SUMS $\sum u_i * F_i(p_j)$, WHERE THE SUM IS TAKEN OVER ALL INDICES i OF THE DEGREES OF FREEDOM, FOR $p_j$ IN THE SET P

FIG. 55C

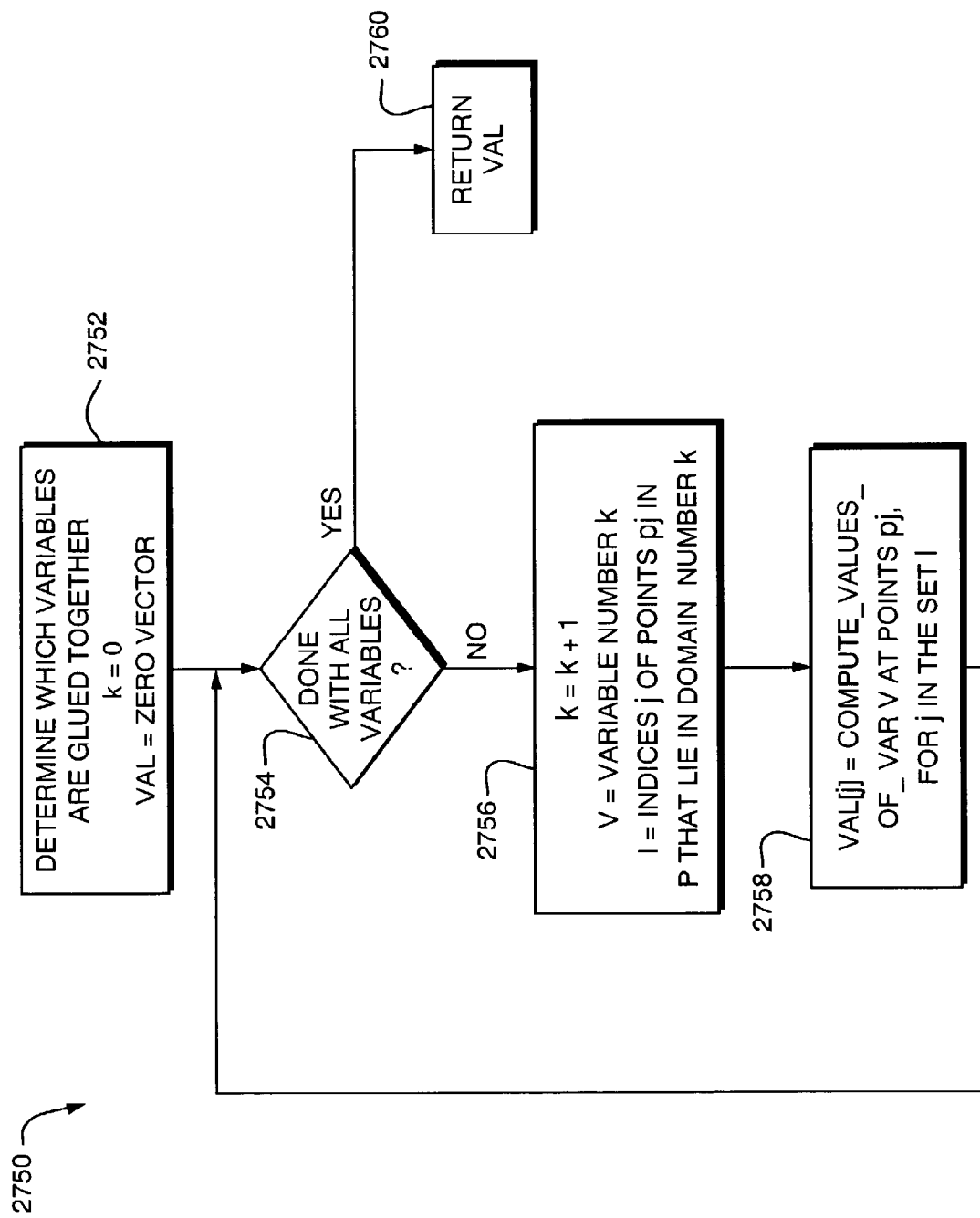

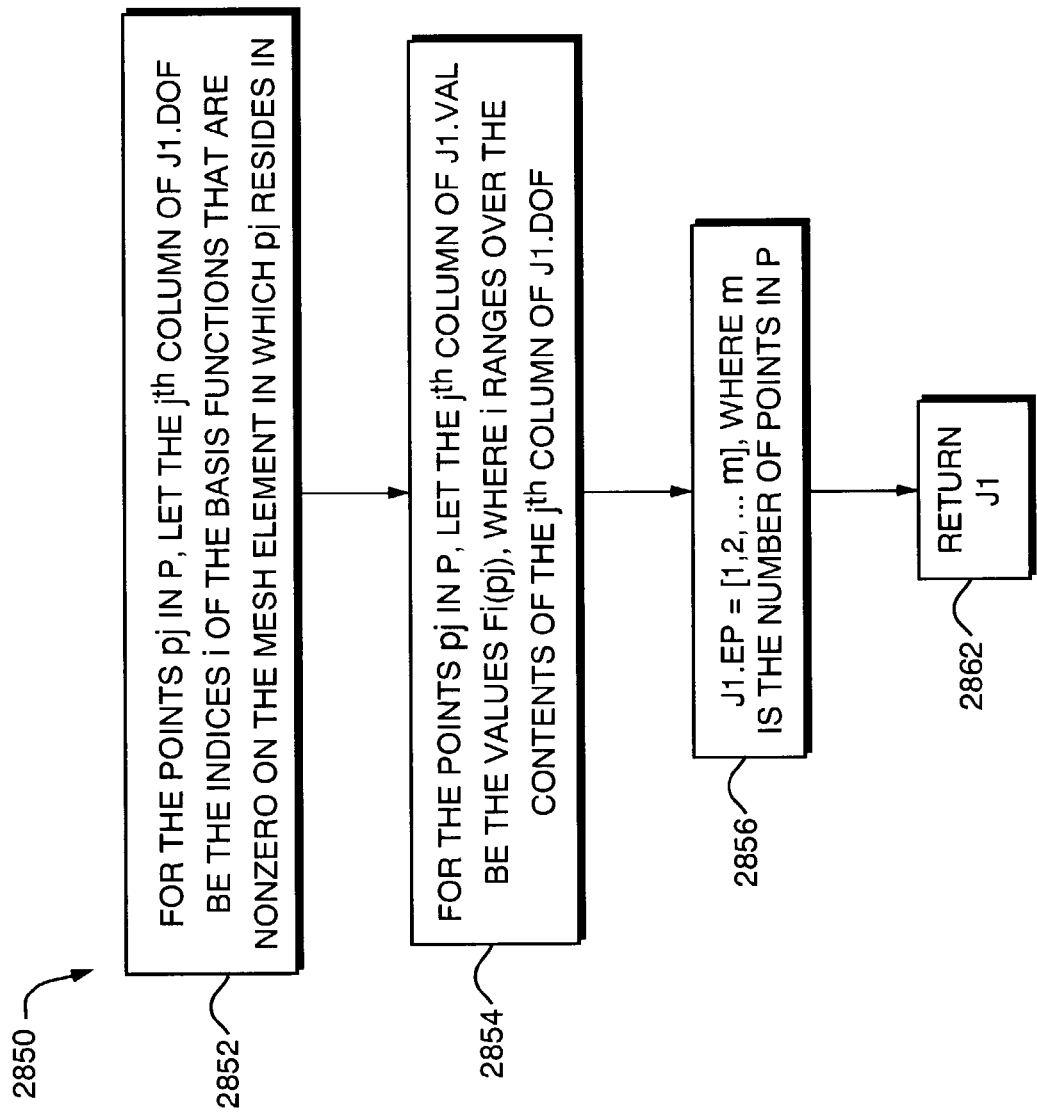

APPLICATION SCALAR VARIABLES...

Application Scalar Variables

| Assigned name: | Description: | Value: |
|---|---|---|
| epsilon0_qvp | permittivity | 8.8539999999992e-012 |
| mu0_qvp | permeability | 1.2566370614359173e-006 |
| T_qvp | time constant | 1.0000000000000001e-017 |
| omega_ac | angular frequency | 314.1592653897933 |

[OK] [Cancel] [Apply]

METHOD FOR ASSEMBLING THE FINITE ELEMENT DISCRETIZATION OF ARBITRARY WEAK EQUATIONS INVOLVING LOCAL OR NON-LOCAL MULTIPHYSICS COUPLINGS

CROSS REFERENCE TO RELATED APPLICATIONS

This application is a continuation in part of U.S. patent application Ser. No. 09/995,222, filed on Nov. 27, 2001, now issued as U.S. Pat. No. 7,519,518, which is herein incorporated by reference, and claims priority to U.S. Provisional Patent Application Ser. No. 60/253,154, filed on Nov. 27, 2000, which is herein incorporated by reference in its entirety, and which is a continuation in part of U.S. patent application Ser. No. 09/675,778, filed Sep. 29, 2000 (pending), which is based on U.S. Provisional Patent Application No. 60/222,394, filed on Aug. 2, 2000, which are both herein incorporated by reference in their entirety.

BACKGROUND

1. Technical Field

This application relates to computer systems, and more particularly to techniques for modeling, simulation, and problem solving using a computer system.

2. Description of Related Art

Computer systems may be used for performing any one of a variety of different tasks. One way in which computer systems may be utilized is by executing one or more computer programs that include instructions which, when executed, perform one or more tasks. In particular, a computer system may execute machine instructions, as may be generated, for example, in connection with translation of source code to machine executable code, to perform modeling, simulation, and problem solving tasks. One technique which may be used in connection with modeling a particular system is to represent various physical aspects of the system in terms of equations or other type of quantifications. In turn, these equations may be solved using a computer system for one or more variables.

Use of the computer in modeling may provide many advantages in accordance with the functionality included in a particular modeling or simulation package. At times, a user may wish to combine one or more systems that are each represented by different models.

It may be desirous to provide an automatic technique for combining these one or more systems such that the combination of the systems together may be modeled and accordingly represented in terms of combined physical quantities and equations.

It may also be desirous and advantageous for this automatic technique to provide for selectively solving for one or more variables associated with either the combined system, or with variables included in one or more of the individual systems.

Additionally, it may be useful and advantageous to provide for different representations of equations that model the physical quantities of a particular system. The different types of representations of the equations may allow for different techniques to be utilized in connection with solving for the system of equations in a singular or combined system. It may be advantageous, for example, in that different forms of equations may proved to be more expedient and efficient for such types of equations such as linear or non-linear equations.

It may also be advantageous and desirable to work with systems of partial differential equations having multiple geometries and also provide an efficient and flexible arrangement for defining various couplings between the partial differential equations within a single geometry as well as between different geometries.

SUMMARY OF THE INVENTION

In accordance with one aspect of the present invention, a method is set forth that computes the finite element discretization. The computation of the finite element discretization includes computing a stiffness matrix, residual vector, constraint matrix, and constraint residual vector for weak equations and constraints of a multiphysics problem that include local and non-local couplings.

In accordance with another aspect of the present invention, the method may be used for assembling the finite element discretization of arbitrary weak equations, involving local and non-local couplings. The weak equations are defined in terms of basic variables, auxiliary variables, glued variables, mapped variables, and integrated variables. The basic variables, auxiliary variables, and glued variables may be used to represent local multiphysics couplings, and the mapped variables and the integrated variables may be used to represent non-local multiphysics couplings.

Additionally, a method of the present invention includes a plurality of sub-methods that that may be employed to evaluate each variable type. The evaluation can be performed on both structured and unstructured data, and the method of the present invention can switch between these representations during recursive expression evaluation.

Furthermore, each variable type can include sub-methods that are employed to compute the Jacobian of a variable with respect to the degrees of freedom. In one aspect, the method includes a format to represent the Jacobian of a variable with respect to the degrees of freedom. The computing of the Jacobian can be performed on both structured and unstructured data, and the method can switch between these representations during the recursive expression evaluation of the Jacobian computation.

In another aspect, a method is set forth that computes the residual vector in the finite element discretization of the weak equation of the multiphysics problem. The method uses the sub-method for the evaluation of a variable and the sub-method for the computation of the Jacobian of a variable.

In another aspect, a method is set forth that computes the stiffness matrix in the finite element discretization of the weak equation of the multiphysics problem. The method uses the sub-method for the computation of the Jacobian of a variable.

In another aspect, methods are set forth that compute the constraint matrix and the constraint residual vector in the finite element discretization of the constraints in a multiphysics problem. The methods use the sub-methods for the computation of the values and the Jacobian of a variable.

In accordance with another aspect of the invention is a method executed in a computer system for producing a combined system of partial differential equations comprising: representing each of a plurality of systems as an application mode modeling physical quantities of said each system; determining a representation of a partial differential equation system for each application mode corresponding to one of said plurality of systems using at least one non-local coupling, said at least one non-local coupling determining a value in at least one point depending on a value from at least one other point; and forming said combined system of partial differential equations using partial differential equation systems associated with said plurality of systems.

In accordance with another aspect of the invention is a computer program product for producing a combined system of partial differential equations comprising machine executable code for: representing each of a plurality of systems as an application mode modeling physical quantities of said each system; determining a representation of a partial differential equation system for each application mode corresponding to one of said plurality of systems using at least one non-local coupling, said at least one non-local coupling determining a value in at least one point depending on a value from at least one other point; and forming said combined system of partial differential equations using partial differential equation systems associated with said plurality of systems.

In accordance with another aspect of the invention is a method executed in a computer system for assembling a finite element discretization of a system of weak partial differential equations comprising: determining a stiffness matrix by evaluating at least one of a Jacobian of a variable and a value of a variable in accordance with a type of said variable included in said system, said Jacobian of said variable being represented as at least one contribution in accordance with a number of degrees of freedom; and determining a residual vector by evaluating at least one of a Jacobian of a variable and a value of a variable in accordance with a type of said variable included in said system, said Jacobian of said variable being represented as at least one contribution determined in accordance with a number of degrees of freedom.

In accordance with yet another aspect of the invention is a computer program product for assembling a finite element discretization of a system of weak partial differential equations comprising machine executable code for: determining a stiffness matrix by evaluating at least one of a Jacobian of a variable and a value of a variable in accordance with a type of said variable included in said system, said Jacobian of said variable being represented as at least one contribution in accordance with a number of degrees of freedom; and determining a residual vector by evaluating at least one of a Jacobian of a variable and a value of a variable in accordance with a type of said variable included in said system, said Jacobian of said variable being represented as at least one contribution determined in accordance with a number of degrees of freedom.

BRIEF DESCRIPTION OF THE DRAWINGS

Features and advantages of the present invention will become more apparent from the following detailed description of exemplary embodiments thereof taken in conjunction with the accompanying drawings in which:

FIG. 5 is an example of an embodiment of a graphical user interface for specifying physical properties on boundaries for a heat transfer application mode;

FIG. 8 is an example of an embodiment of a coefficient form partial differential equation format;

FIG. 9 is an example of a general form partial differential equation format;

FIG. 10 is an example of formulae that may be used in an embodiment in solving for non-linear systems of equations in connection with performing substitutions for linearization;

FIG. 11 is an example of formulae that may be used when performing a conversion from coefficient to general form;

FIGS. 12 and 13 are example of formulae that may be used in solving for equations in coefficient and general form;

FIG. 14 is an example of formulae that may be used when approximating the solution with a function from a finite-dimensional function space;

FIGS. 15 and 16 are examples of formulae that may be used in connection with solving systems of equations in coefficient form;

FIG. 17 is an example of an embodiment of formulae that may be used in connection with solving equations in the general form;

FIG. 18 is an example of the representation of finite element discretization in accordance with conditions of formulae of FIGS. 15 and 16;

FIG. 19 is an example of formulae that may be used in connection with solving equations in the coefficient form;

FIG. 20 is an example of formulae that may be used in connection with solving equations in the general form;

FIG. 21 is an example of an iteration formula that may be used in connection with solving equations in general form;

FIG. 25 is an example of one dimensional predefined application modes that may be included in an embodiment;

FIG. 26 is an example of two dimensional predefined application modes that may be included in an embodiment;

FIG. 27 is an example of properties of an application mode;

FIG. 28 is an example of a class constructor that may be used to create a user defined application or application mode;

FIG. 29 is an example of methods that may be included in an embodiment for an object class;

FIG. 31 is an example of formulae that may be used in connection with the user-defined application of FIG. 30;

FIG. 32 is an example of a constructor used in creating the user-defined application of FIG. 30;

FIG. 33 and FIG. 34 are examples of fields that may be included in a user-defined portion of a data structure used in connection with the user-defined application of FIG. 30; and FIG. 35 includes examples of fields that may be included in a data structure used to define a geometric object used in connection with the user-defined application mode of FIG. 30;

FIG. 41 is an example of a weak formulation;

FIG. 42 is an example of a conversion from general form to weak form;

FIGS. 55B-55M are flowcharts of processing steps in an embodiment for determining the Jacobian and values of different types of variables;

FIGS. 58-75 are examples of embodiments of screenshots that may be used in an embodiment of the computer system of FIG. 1.

DESCRIPTION OF PREFERRED EMBODIMENT(S)

Figure 1:
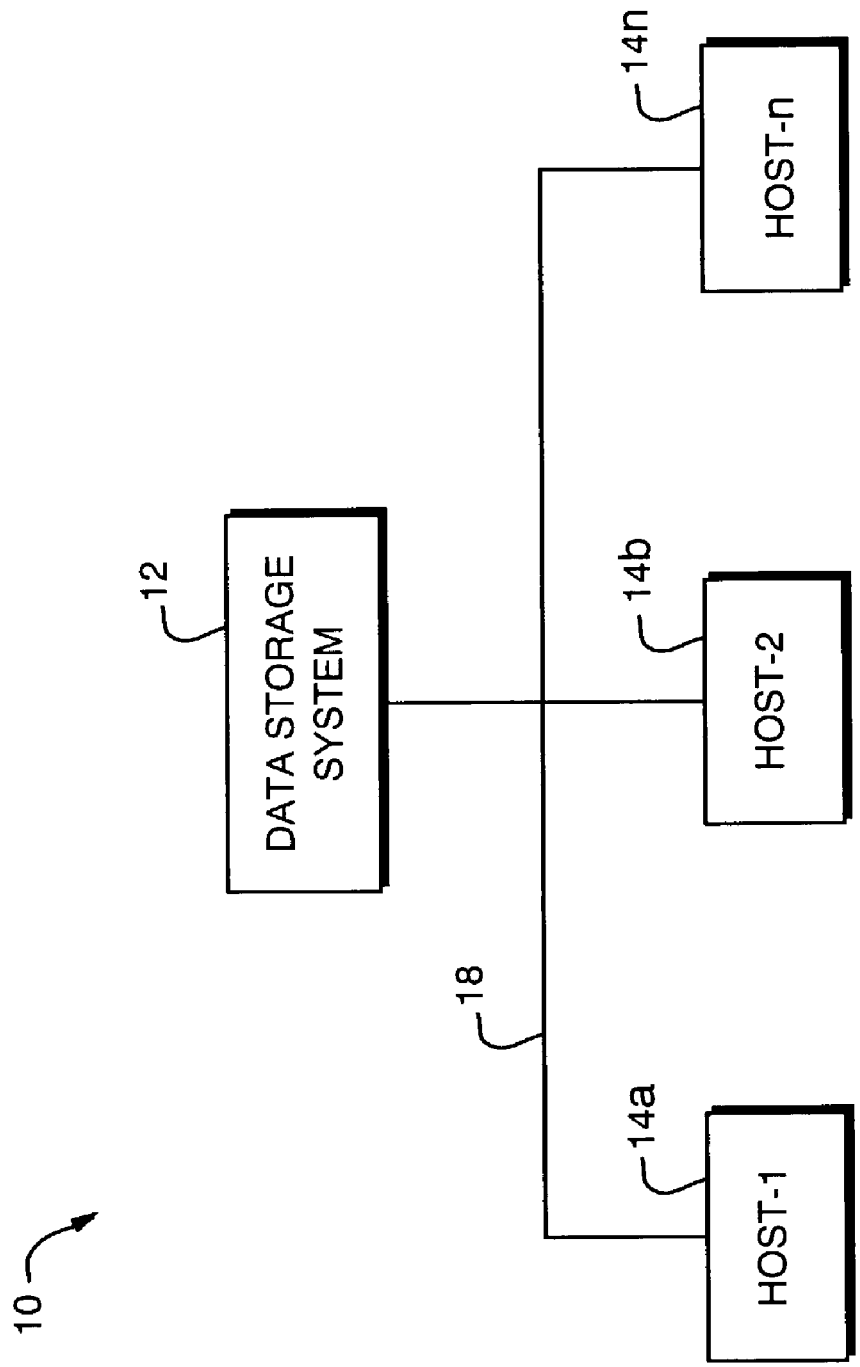
FIG. 1 is an example of an embodiment of a computer system.

Referring now to FIG. 1, shown is an example of an embodiment of a computer system according to the present invention. The computer system 10 includes a data storage system 12 connected to host systems $14a$-$14n$ through communication medium 18. In this embodiment of the computer system 10, the N hosts $14a$-$14n$ may access the data storage system 12, for example, in performing input/output (I/O) operations. The communication medium 18 may be any one of a variety of networks or other type of communication connections as known to those skilled in the art. For example, the communication medium 18 may be the Internet, an intranet, or other network connection by which the host systems $14a$-$14n$ may access and communicate with the data storage system 12, and may also communicate with others included in the computer system 10.

Each of the host systems $14a$-$14n$ and the data storage system 12 included in the computer system 10 may be connected to the communication medium 18 by any one of a variety of connections as may be provided and supported in accordance with the type of communication medium 18. The processors included in the host computer systems $14a$-$14n$ and the data manager system 16 may be any one of a variety of commercially available single or multi-processor system, such as an Intel-based processor, IBM mainframe or other type of commercially available processor able to support incoming traffic in accordance with each particular embodiment and application.

It should be noted that the particulars of the hardware and software included in each of the host systems $14a$-$14n$, as well as those components that may be included in the data storage system 12 are described herein in more detail, and may vary with each particular embodiment. Each of the host computers $14a$-$14n$, as well as the data storage system 12, may all be located at the same physical site, or, alternatively, may also be located in different physical locations. Examples of the communication medium that may be used to provide the different types of connections between the host computer systems, the data manager system, and the data storage system of the computer system 10 may use a variety of different communication protocols such as SCSI, ESCON, or Fiber Channel. Some or all of the connections by which the hosts, data manager system 16 and data storage system 12 may be connected to the communication medium 18 may pass through other communication devices, such as a Connectrix or other switching equipment that may exist such as a phone line, a repeater, a multiplexer or even a satellite.

Each of the host computer systems may perform different types of data operations, such as storing and retrieving data files used in connection with an application executing on one or more of the host computer systems. For example, a computer program may be executing on the host computer $14a$ and store and retrieve data from the data storage system 12.

The data storage system 12 may include any number of a variety of different data storage devices, such as disks, tapes, and the like in accordance with each implementation. As will be described in following paragraphs, software may reside and be executing on any one of the host computer systems 14a-14n. Data may be stored locally on the host system executing software, as well as remotely in the data storage system 12 or on another host computer system. Similarly, depending on the configuration of each computer system 10, software as described herein may be stored and executed on one of the host computer systems and accessed remotely by a user on another computer system using local data. A variety of different system configurations and variations are possible then as will be described in connection with the embodiment of the computer system 10 of FIG. 1 and should not be construed as a limitation of the techniques described elsewhere herein.

Figure 2:
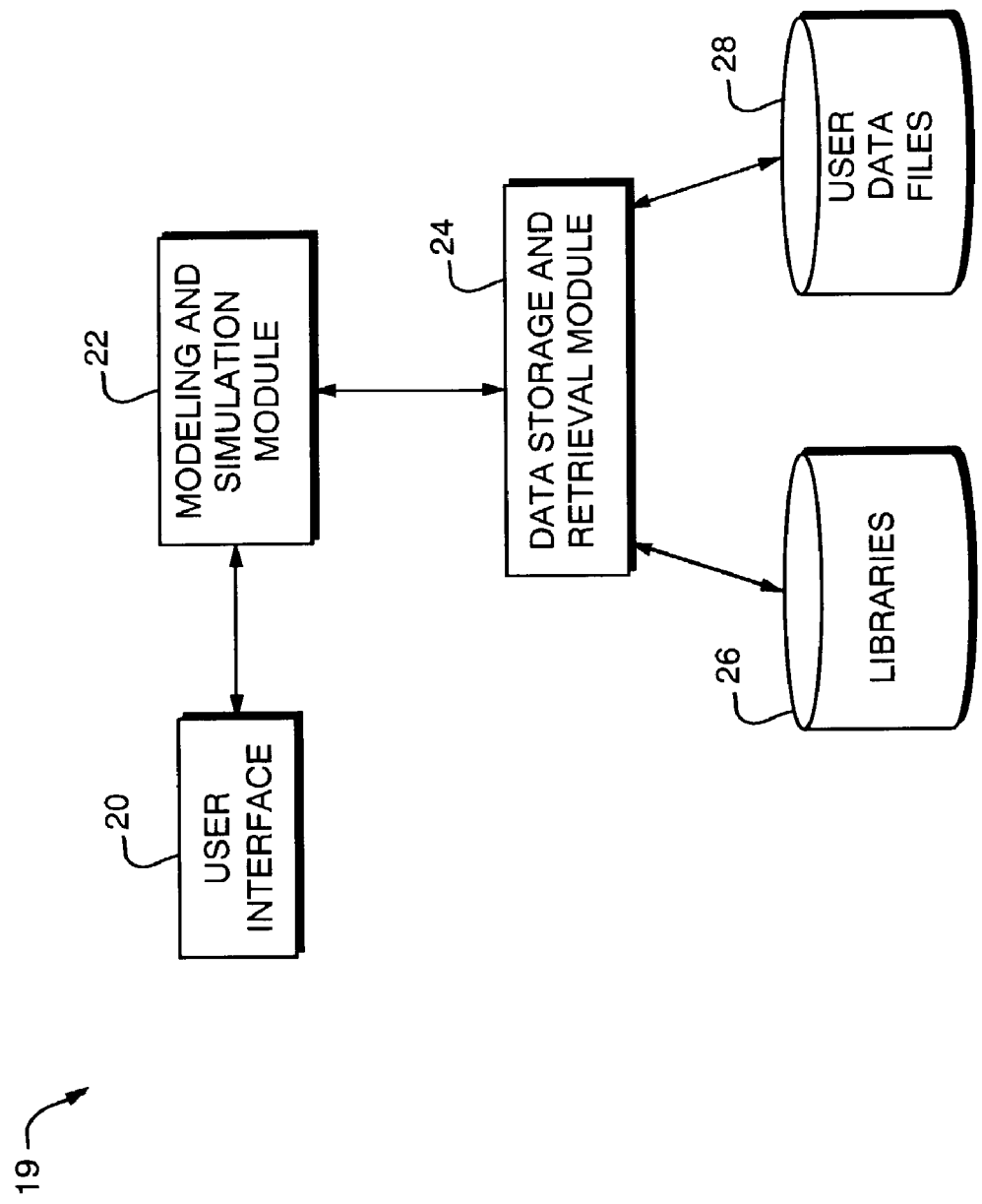
FIG. 2 is an example of an embodiment of software that may reside and be executed in one of the hosts of FIG. 1.

Referring now to FIG. 2, shown is an example of an embodiment of the software 19 that may reside in one of the host computer systems such as whose computer system 14a-14n. Included in the software of computer system 14a of FIG. 2 is a User Interface module 20 that communicates with the Modeling and Simulation module 22. The software further includes a Data Storage and Retrieval module 24 which communicates with the Modeling and Simulation module 22 for performing tasks in connection with data storage and retrieval. The Data Storage and Retrieval module 24 may retrieve data files, for example, that may be stored in Libraries 26 as well as perform data operations in connection with User Data Files 28.

It should be noted that other embodiments may include other software components other than what is described and functionally represented in the software modules 19 of FIG. 2. In the embodiment shown in FIG. 2, both the Libraries and the User Data Files are shown as being stored locally within the host computer system. It should also be noted that the Libraries and/or User Data Files, as well as copies of these, may be stored in another host computer system as well as in the Data Storage System 12 of the computer system 10. However, for simplicity and explanation in paragraphs that follow, it is assumed that the software may reside on a single host computer system such as 14a with additional backups, for example, of the User Data Files and Libraries, in the Data Storage System 12.

In one embodiment, portions of the software 19, such as the user interface 20, the Modeling and Simulation module 22, Data Storage and Retrieval module, and Libraries 26 may be included in combination in a commercially available software package. These components may operate on one of the host systems 14a-14n running Matlab V5.0, as well as one of Windows 95 or 98, Windows NT, Unix, or Linux operating system. One embodiment of the software 19 may be implemented using MATLAB5.3 running on one of Windows 95, Windows NT, Unix or Linux operating systems.

The User Interface module 20 as will be described in more paragraphs that follow, may display user interface screens in connection with obtaining data used in performing modeling, simulation, and/or other problem solving for one or more systems under consideration. These one or more systems may be modeled and/or simulated by the Modeling and Simulation module 22. Data gathered such as in connection with the User Interface 20 and used by the Modeling and Simulation module 22 may be forwarded to the Data Storage and Retrieval module 24 where user-entered data, for example, may be stored in User Data Files 28. Additionally, other data and information may be obtained from the Libraries 26 as needed by the Modeling and Simulation module or in connection with the User Interface 20. In this particular example, the software in the modules may be written in any one of a variety of computer programming languages such as C, C++, Java or any combination of these or other commercially available programming languages. For example, one embodiment includes software written in MATLAB 5.3 and C. C routines may be invoked using the external function interface of MATLAB.

Additionally, various data files such as User Data Files 28 and the Libraries 26 may be stored in any one of a variety of data file formats in connection with a file system that may be used in the host computer system, for example, or in the Data Storage System 12. An embodiment may use any one of a variety of database packages in connection with the storage and retrieval of data. The User Data files 28 may also be used in connection with other software simulation and modeling packages. For example, the User Data files 28 may be stored in a format that may also be used directly or indirectly as an input to any one of a variety of other modeling packages, such as Matlab. In particular, an embodiment may provide for importing and exporting data between this system and another system, such as Matlab, for example. The precise format of the data may vary in accordance with each particular embodiment as well as the additional functionalities included therein.

As will be described in more detail in connection with following figures, paragraphs that follow describe a technique that may be used in combining application modes modeling different systems. Properties of these application modes represented by partial differential equations (PDEs) may be automatically combined to form PDEs describing these quantities in a combined system or representation. The combined PDEs when displayed, for example, in a "coefficient view" may be modified and further used as input to a finite element solver. It should be noted that the differential equations may be provided to the finite element solver either independently, describing a single system, or as a combined system of PDEs.

The software 19 provides the ability to combine application modes that model physical properties through one or more graphical user interfaces (GUIs) in which the user selects one or more application modes from a list. When a plurality of application modes are combined, this may be referred to as a multiphysics model. In addition to the application mode names, the variable names for the physical quantities may be selected through a GUI. Application modes may have different meanings depending on a "submode" setting. This is described in more detail elsewhere herein.

The physical properties that are used to model the physical quantities in a system under examination in connection with the software 19 may be defined using a GUI in which the physical properties may be described as numerical values. These physical properties may also be defined as mathematical expressions including one or more numerical values, space coordinates, time coordinates and the actual physical quantities. The physical properties may apply to some parts of a geometrical domain, and the physical quantity itself can also be disabled in the other parts of the geometrical domain. A geometrical domain or "domain" may be partitioned into disjoint subdomains. The mathematical union of these subdomains forms the geometrical domain or "domain". The complete boundary of a domain may also be divided into sections referred to as "boundaries". Adjacent subdomains may have common boundaries referred to as "borders". The complete boundary is the mathematical union of all the boundaries including, for example, subdomain borders. For example, in one embodiment, the geometrical domain may be one-dimensional, two-dimensional or three dimensional in the GUI. However, as described in more detail elsewhere herein, the PDE solution solvers may be able to handle any space dimension. Through the use of GUIs in one implementation, the physical properties on the boundary of the domain may be specified and used to derive the boundary conditions of the PDEs.

Additional function included in the software 19, such as in the Modeling and Simulation module, may provide for automatically deriving the combined PDEs and boundary conditions of the multiphysics system. This technique merges the PDEs of the plurality of systems, and may perform symbolic differentiation of the PDEs, and produce a single system of combined PDEs.

The combined PDEs may be modified before producing a solution. In this embodiment, this may be performed using a dialog box included in a GUI displaying the combined PDEs in a "coefficient view". When the derived PDEs are modified in this way, the edit fields for the corresponding physical properties become "locked". The properties may subsequently be unlocked in this embodiment by an explicit user action.

It should be noted that an embodiment may include functionality for modeling any one or more of many engineering and scientific disciplines. These may include, for example, acoustics, chemical reactions, diffusion, electromagnetics, fluid dynamics, general physics, geophysics, heat transfer, porous media flow, quantum mechanics, semiconductor devices, structural mechanics, wave propagation, and the like. Some models may involve more than one of the foregoing systems and rather may require representing or modeling a combination of the foregoing. The techniques that are described herein may be used in connection with one or more systems of PDEs. In one embodiment described herein, these PDEs may be represented in general and/or coefficient form. The coefficient form may be more suitable in connection with linear or almost linear problems, while the general form may be better suited for use in connection with non-linear problems. The system(s) being modeled may have an associated submode, for example, such as stationary or time dependent, linear or non-linear, scalar or multi-component. An embodiment may also include the option of performing, for example, eigenvalue or eigenfrequency analysis. In the embodiment described herein, a Finite Element Method (FEM) may be used to solve for the PDEs together with, for example, adaptive meshing and a choice of a one or more different numerical solvers.

In one embodiment, a finite element mesh may include simplices forming a representation of the geometrical domain. Each simplex belongs to a unique subdomain, and the union of the simplices forms an approximation of the geometrical domain. The boundary of the domain may also be represented by simplices of the dimensions 0, 1, and 2, for geometrical dimensions 1, 2, and 3, respectively. The finite element mesh may be formed by using a Delanunay technique, for example, as described in "Delanunay Triangulation and Meshing", by P.-L. George, and H. Bourouchaki, Hermes, Paris, 1998. Generally, this technique may be used to divide the geometrical domain into small partitions. For example, for a 1-dimensional domain, the partitions may be intervals along the x-axis. For a 2-dimensional square domain, the domain may be partitioned into triangles or quadrilaterals. For a 3-dimensional domain, the domain may be partitioned into tetrahedrons, blocks or other shapes.

It should be noted that a mesh representing a geometry may also be created by an outside or external application and may subsequently be imported for use into this system in this embodiment.

The initial value of the solution process may be given as numerical values, or expressions that may include numerical values, space coordinates, time coordinates and the actual physical quantities. The initial value(s) may also include physical quantities previously determined.

The solution of the PDEs may be determined for any subset of the physical properties and their related quantities. Further, any subset not solved for may be treated as initial values to the system of PDEs.

Figure 3:
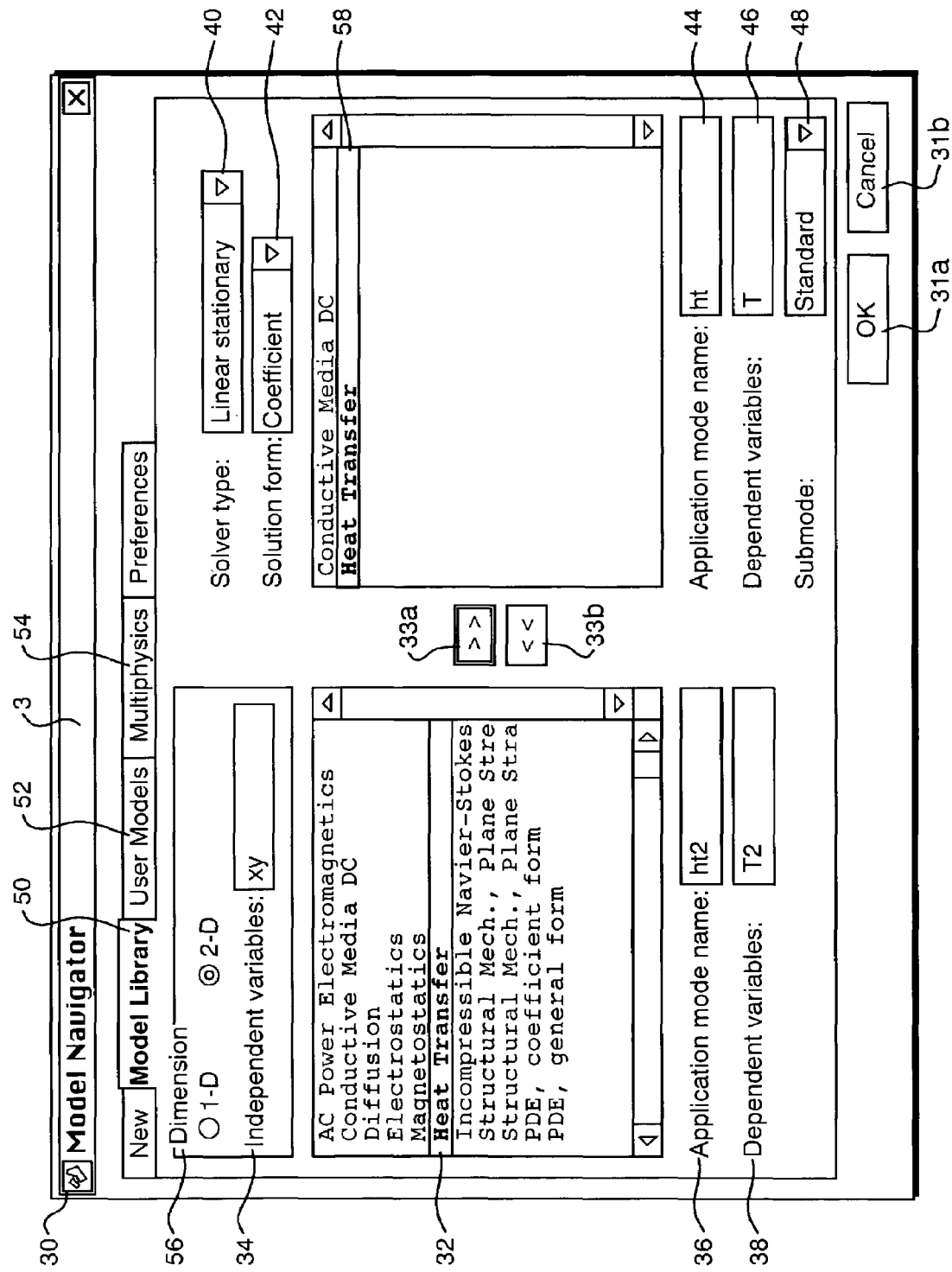
FIG. 3 is an example of an embodiment of a graphical user interface for selecting the application modes.

Referring now to FIG. 3, shown is an example of an embodiment of a user interface or GUI 30 that may be used in connection with specifying a multiphysics system of more than one system to be combined. In this example, each system to be combined may correspond to an application mode. Through the use of the GUI 30, the application modes that are to be used in this combined multiphysics system may be specified. Each application mode models physical quantities in terms of PDEs. The physical quantities may be represented either directly as the dependent variables in the PDE, or by a relation between the dependent variable and the variable representing the physical quantity. The PDEs in this embodiment may be generally "hidden" from the user through the use of the GUIs. When several application modes are combined into one single model or system, it may be referred to as a multiphysics model.

The list of application modes 32 is the list of possible application modes from which a user may select in accordance with the user choice of space dimension indicated the buttons 56 in the left-hand top of the GUI 30. To add application modes to a multiphysics model, the user selects application modes from the left-most list box 32 and may specify that these application modes are to be included in a multiphysics model, for example, selecting the button 33a. After selection, this application mode is added to the list 58 on the right hand side of the GUI 30. Application modes may also be removed from the list by selecting button 33b. Before adding an application mode, the user may edit its name 36 and names of the variables 38 representing the physical quantities that may be solved for, for example, resulting in the new name 44 and new name of the variable 46.

Each application mode in the multiphysics model is given a unique name that may be used to identify the origin of the variables in the multiphysics model. The example shown in the GUI 30 is for an application mode "Heat Transfer" in the list 32. When selected using button 33a, the application mode appears on list 58. The user may edit the application mode name, for example, changing it from that included in display 36 to the corresponding name of display item 44. Similarly, the dependent variable name may be modified from that shown in item 38 to the item 46. In this example, only one variable is associated with the Heat Transfer application mode. For an application mode including more than one physical quantity, the user may enter all the names of the physical quantities as space-separated entries in the Dependent variables edit field 46.

There are also application modes that directly correspond to PDEs. In these modes, the quantities are represented by the dependent variables. Each of these application modes may have more than one dependent variable. The number of dependent variables and the dimension of system of PDEs may be determined by entering one or more corresponding space-separated variable names.

On the right-hand side of the multiphysics GUI 30, a solver type and solution form may be selected. The solver type may be specified in the item 40, for example, as one of stationary, time-dependent, and the like. Similarly, the solution form may be specified in item 42, for example as "coefficient" or "general" form. These refer to the form of the PDE for which the solution is derived and are described in more detail elsewhere herein. The solver types and solution forms may vary in accordance with the application modes of the multiphysics model. In the list box 58, all the application modes that have been added to the model appear. A user may select any of the model's application modes and change its submode 48. Generally, a submode may relate to the manner in which equations are derived or differentiated, for example, with respect to what variables differentiation may be performed.

In this example, shown is the standard submode as being specified in item 48. Additionally, an application mode may include other associated submodes, for example, such as, a wave-extension submode that extends a standard time-dependent equation to a wave equation using the second derivative of the standard equation with respect to time. Selecting OK using button 31a saves the updated multiphysics model with all the added application modes and closes the GUI 30. In contrast, selecting Cancel using button 31b closes the GUI and discards any changes. Referring to FIG. 2, when the OK button 31a is selected, the data may be communicated from the GUI 20 to the Modeling and Simulation Module 22 and subsequently to the Data Storage and Retrieval Module 24 for storage in the User Data Files 28.

The foregoing screen display, such as GUI 30, may be displayed by and included as a portion of the software of the User Interface Module 20 of the software 19. It should be noted that an embodiment may include different types of application modes. In one embodiment, application modes may be classified as one of user defined or predefined. A predefined application mode may be one for which functionality is included in the libraries 26 as may be available from a software vendor. In other words, a software vendor may supply libraries including defined systems of PDEs, GUIs and the like for a particular type of system, such as heat transfer. Additionally, an embodiment may include support to provide for user-defined models or application modes for which a user may specify the PDEs, the quantities being modeled, and the like. Subsequently, a user-defined model may be saved in a user defined library, for example, included in the user defined data files 28. Definitions and other data files associated with a user-defined model may be stored in any one of a variety of data formats, for example, similar to those of the libraries 26 that may be included in an implementation by a software vendor. The format and function may vary in accordance with each embodiment.

In one embodiment, a user may define and add a user-defined application mode by adding functions in MATLAB format for transforming the physical properties on subdomains, boundaries, and initial conditions. The user may specify a first function, equ_compute, for transforming physical quantities to PDE coefficients, a second function, bnd_compute, for transforming the physical properties on the boundaries to boundary conditions, and a third function, init_compute, for transforming the physical properties in the initial condition. More detail on user defined application modes is described elsewhere herein.

Figure 4:
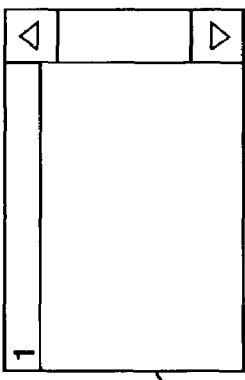
FIG. 4 is an example of an embodiment of a graphical user interface for selecting the physical properties on subdomains for a heat transfer application mode.

Referring now to FIG. 4, shown is an example of an screen display of the physical property specification GUI 60 for the heat transfer application mode. In this embodiment, each application mode may have a specifically designed GUI display in which the physical properties associated with that application mode may be specified. The list 62 in the left of the GUI 60 includes one or more geometrical domains to which the physical properties may apply. These may also be referred to as subdomains. The user may select one or several subdomains from the list 62, for example, using a mouse, keyboard or other selection device. If a single subdomain is selected, entering a new name in the edit field Name 62a may change the name. If the user selects multiple subdomains, the properties that are specified apply to all the selected subdomains. The "on-top" check box 64a makes the boundary condition GUI "float" on top of the view of the geometrical domain also. In other words, the corresponding dialog box "floats" on top of other items that may be displayed on the screen in connection with the GUI.

In this embodiment, if the properties of the currently selected subdomains differ, the edit fields for the properties may be "locked" for no editing. One may unlock the subdomains by explicitly checking the Unlock check box 64a. The properties from the first selected subdomain may be copied to all the selected subdomains.

It should be noted that in one embodiment, selecting several subdomains with different physical properties may also cause locking. Checking "unlocking" may then result in the properties in the first selected subdomain being copied to the other subdomains.

The physical properties of the subdomains are specified in the list 64. As previously described, these properties may be specified as numerical values, or also as symbolic expressions in terms of the space coordinates, the physical quantities and their space derivatives, and the time. Additionally, a name of a procedure to compute a value of the property may also be specified by entering the name and any parameters that may be included in the procedure. In one embodiment, the procedure may be written, for example, in C, Fortran, or Matlab. The particular language of implementation may vary in accordance with each particular embodiment and the calling standards and conventions included therein.

A user may also disable the physical quantities of an application mode in a subdomain entirely by un-checking the "Active in this Subdomain" checkbox 66. This removes the properties in 64 from the application in the selected subdomain(s). Also the physical quantities in this application mode are disabled in the selected subdomain(s).

Referring now to FIG. 5, shown is an example of a screen display of a GUI 70 which is a physical property boundary specification GUI for the heat transfer application mode. The list 72 in the left portion of the GUI 70 includes geometrical boundaries where the physical properties may apply. Only the boundaries that form the outer boundary with respect to the active subdomains are included in the list. As described elsewhere herein, those subdomains that are "active" may be specified in the GUI 60 for physical properties.

Boundaries that are entirely inside the sub domain or between two subdomains are also not shown unless the "Enable borders" check box 72a is selected. A user may select one or several boundaries from the list 72. If the user selects a single boundary, the user can change its name by entering a new name in the Name edit field 72b. If the user selects multiple boundaries, the properties that the user specifies, as in list 74, apply to all the selected boundaries. If the properties on the currently selected boundaries differ, the edit field 72b for the properties is locked. One may unlock the subdomains by explicitly checking the "Unlock" check box 74a. The properties from the first selected boundary are then copied to all the selected boundaries.

In one embodiment, selecting several boundaries with different physical properties may also cause locking. Checking "unlock" may then result in the properties in the first selected boundary being copied to the other boundaries.

The physical properties of the geometrical boundaries are specified in the list 74 in the right hand portion of the GUI 70. These properties have values that may be specified as numerical values, or symbolic expressions in terms of the space coordinates, the physical quantities and their space derivatives from any application modes added by using the previous section, and the time. Additionally, the name of a procedure to determine the value of the property may also be specified in a manner similar to as described elsewhere herein.

It should be noted that a portion of the different GUIs displayed may be similar, for example, such as the "on top" check box 74b that is similar in function to 64a as described elsewhere herein.

Figure 6:
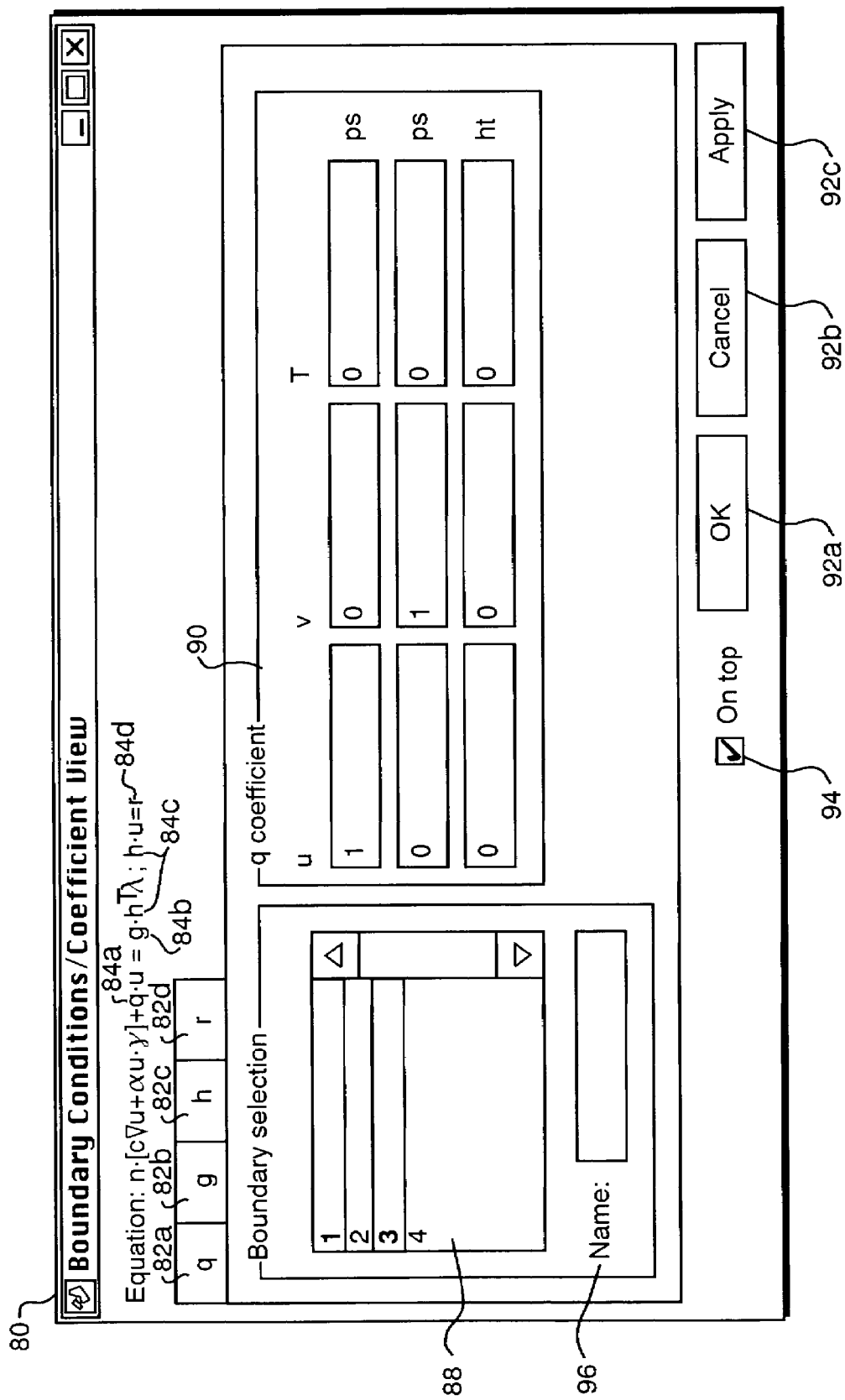
FIG. 6 is an example of an embodiment of a graphical user interface for modifying the partial differential equations in "coefficient view"

Referring now to FIG. 6, shown is an example of an embodiment of a screen display that may be used in connection with modifying the PDEs in a "coefficient view". Using this interface 80 of FIG. 6, this may be used in connection with modifying the boundary conditions in coefficient view as associated with the combined system of PDEs. It should be noted that other embodiments may also include a similar screen display and interface to allow for modification of PDEs of each individual application mode or system being modeled. Additionally, an embodiment may also include a similar screen display for modifying a system in general form rather than coefficient form as shown in the display 80 of FIG. 6.

The GUI 80 may be displayed in connection with modifying the boundary conditions associated with a coefficient. For example, in the GUI 80, the boundaries 1 and 3 have been selected as associated with the coefficient tab "q" 82a corresponding to the coefficient appearing in the PDE at position 84a. The list 90 on the right hand side of the GUI 80 includes the boundary conditions associated with the active "q" coefficient. A user may modify the conditions associated with the currently active coefficient, such as "q". Any one of the tabbed coefficients, such as 82a-82d may be made active, for example, by selecting the tab, such as with a mouse or other selection device. This causes the right hand portion 90 of the GUI 80 to be updated with corresponding values for the currently active coefficient. The values may be modified by editing the fields of 90 and selecting the OK button 92a, or the apply button 92c. The modification may be cancelled, as by selecting the cancel operation button 92b. A boundary number that is selected on list 88 may be changed to have a symbolic name, as may be specified in field 96. The values indicated in 90 are set accordingly for the selected boundaries 88. The on-top check box 94, and other features of GUI 80, are similar to those appearing in other GUIs and described in more detail elsewhere herein.

It should be noted that the PDE coefficient and boundary conditions associated with the combined system of PDEs for the various application modes selected may be stored in a data structure that is described in more detail elsewhere herein. Subsequently, if these coefficient and boundary conditions are modified, for example, using the GUI 80 of FIG. 6, the corresponding data structure field(s) may be updated accordingly. As will be described in connection with other figures, the combined system of PDEs and associated boundary condition fields may be updated.

It should also be noted that the dialog for modifying the boundary conditions in coefficient view of a system of three variables may be viewed in the example GUI 80 of FIG. 6. If the system to be solved is in general form, the coefficient view dialog box may also include symbolic derivatives of the general form coefficients with respect to the physical quantities or solution components and their derivatives according to FIG. 10. As described in more detail elsewhere herein, the derivatives may be used for the solution of nonlinear stationary and time-dependent problems.

In one embodiment, when the coefficients in coefficient view are changed for a subdomain or a boundary, the "Unlock check-box" in the corresponding application modes for that subdomain or boundary dialog box is enabled, as previously described in connection with GUI 70 of FIG. 5. In one embodiment, in order to disable the change in coefficient view, a user may remove the checkmark as may be displayed in the Unlock check box on the subdomain or boundary in the application mode, for example, as described in connection, respectively, with GUIs 60 and 70.

Figure 6A:
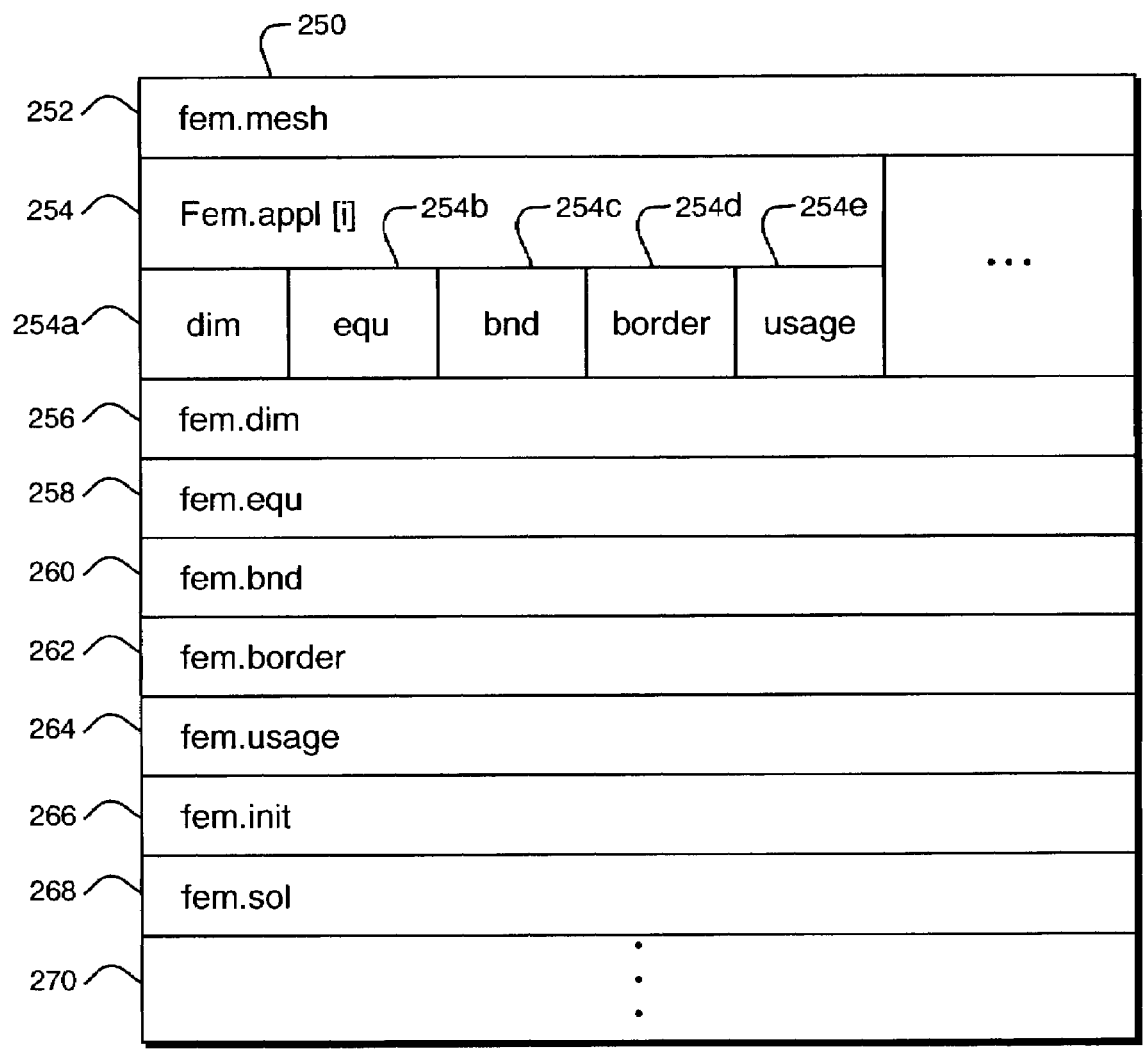
FIG. 6A is an example of an embodiment of a data structure that may be used in connection with data for each application mode selected and also in connection with storing data for the combined partial differential equation system of application modes.

Using the GUIs 60 and 70 for, respectively, physical properties for subdomains and boundaries, as well as possible modifications specified as with GUI 80, the Modeling and Simulation Module 22 may create, initialize, and possibly modify the data structure 250 of FIG. 6A.

Referring now to FIG. 6A, shown is an example of a representation of the data structure that may be included in an embodiment in connection with storing data in connection with the PDEs selected and combined. The data in the data structure 250 may include data used in connection with the multiphysics model.

The data structure 250 includes the following fields:

| Data field | Description |
| --- | --- |
| fem.mesh | Finite element mesh |
| fem.appl{i} | Application mode i |
| fem.appl{i}.dim | Dependent variable name |
| fem.appl{i}.equ | Domain physical data |
| fem.appl{i}.bnd | Boundary physical data |
| fem.appl{i}.submode | Text string containing submode setting |
| fem.appl{i}.border | Border on or off |
| fem.appl{i}.usage | Matrix of subdomain usage |
| fem.dim | Multiphysics dependent variable names |
| fem.equ | PDE coefficients |
| fem.bnd | Boundary conditions |
| fem.border | Vector of border on or off |
| fem.usage | Multiphysics subdomain usage matrix |
| fem.init | initial value |
| fem.sol | Finite element solution |

The field fem.mesh 252 includes the finite element discretization. The mesh partitions the geometrical domain into subdomains and boundaries. Data stored in this field may be created from an analyzed geometry. A mesh structure representing a geometry may also be created by an outside or external application and may subsequently be imported to use in this system in this embodiment. To obtain good numerical results in the solution to a particular multiphysics problem, the mesh may have certain specific characteristics available in connection with an externally provided mesh, such as by a MATLAB routine. In instances such as these, a mesh may be imported from a compatible external source. Support may vary with embodiment as to what external interfaces are supported and what external formats of meshes may be compatible for use with a particular implementation. For example, a mesh structure may be compatible for use with an embodiment such as a mesh structure produced by the product Tet-Mesh by Simulog, and HyperMesh by Altair Engineering.

In one embodiment, a geometry is used in generating a mesh structure. In other words, in an embodiment that includes functionality to define and create a mesh as an alternative to obtaining a mesh, for example, from an external compatible software product, a geometry definition may be used in generating a mesh structure. What will now be described is a function that may be included in an embodiment. An embodiment may include any one or more of a variety of alternatives to represent a geometry of a PDE problem to be solved. One technique includes defining a geometry in accordance with a predefined file format, predefined formatted object, and the like. It should be noted that an embodiment may include the option of importing a predefined file format or specifying a function for describing the geometry.

It should be noted that the predefined file format may include differences in accordance with the varying dimensions that may be supported by an embodiment.

An embodiment may include a function or routine definition for returning information about a geometry represented in accordance with a predefined file format. This routine may be included in an implementation, or, may also be defined by a user. In other words, an implementation may include support allowing a user to provide an interface function in accordance with a predefined template or API, such as particular input and output parameters and function return values. Such a routine may be used as an interface function, for example, to obtain geometry information in which a geometry may be represented in any one of a variety of predefined file formats, data structure formats, and the like.

The fem.mesh structure may represent a finite element mesh that is partitioning a geometrical domain into simplices. In one embodiment, minimal regions may be divided into elements and boundaries may also be broken up into boundary elements. In one embodiment of the mesh structure, the mesh may be represented by fields of data, two of which are optional. The five fields are: the node point matrix (p), the boundary element matrix (e), the element matrix (t), the vertex matrix (v) and the equivalence matrix (equiv), in which v and equiv may be optional. The matrix p includes the node point coordinates of the mesh. The matrix e may include information to assemble boundary conditions on $\delta\Omega$, such as node points of boundary elements, parameter values on boundary elements, geometry boundary numbers, and left and right subdomain numbers. The matrix t includes information needed to assemble the PDE on the domain $\Omega$. It includes the node points of the finite element mesh, and the subdomain number of each element. The matrix v includes information to recreate geometric vertices. The equiv matrix includes information on equivalent boundary elements on equivalent boundaries. It should be noted that contents and of the data structure may vary with dimension of the domain being represented. For example, in connection with a 2-dimensional domain, the node point matrix p may include x and y coordinates as the first and second rows of the matrix. The boundary element matrix e may include first and second rows that include indices of the starting and ending point, third and fourth rows including the starting and ending parameter values, a fifth row including the boundary segment number, and sixth and seventh rows including left and right hand side subdomain numbers. The element matrix t may include in the first three rows indices of the corner points, given in counterclockwise order, and a fourth row including a subdomain number. The vertex matrix v may have a first row including indices into p for vertices. For isolated vertices, the second row may also include the number of the subdomain that includes the vertex. For other vertices, the second row may be padded. The field v may not be used during assembly, but rather have another use when the mesh structure, for example, may be used in connection with other operations or data representations. The equivalence matrix equiv may include first and second rows of indices into the columns in e for equivalent boundary elements. The third and fourth row may include a 1 and 2, or a 2 and 1 depending on the permutation of the boundaries relative to each other.

As another example of the mesh structure, consider one that may be used in connection with a 1-dimensional structure being represented. The node matrix p may include x coordinates of the node points in the mesh in the first row. In the boundary element matrix e, the first row may include indicates of the boundary point, the second row may include the boundary segment number, and the third and fourth rows may include left and right hand side subdomain numbers. In the element matrix e, the first two rows include indices to the corner points, given from left to right, and the third row includes the subdomain number. In a 1-dimensional domain, there is no vertex matrix since vertices are exactly equivalent to the boundaries. In the equivalence matrix equiv, the first and second rows include indices into the columns in e for equivalent boundaries. The third row is padded with ones.

In one embodiment, the fem structure may additionally include a fem.equiv field indicating boundaries that should be equivalent with respect to elements and node points, e.g., for periodic boundary conditions. One implementation of fem.equiv includes a first row with master boundary indices and a second row with slave boundary indices. The mesh has the same number of node points for the boundaries listed in the same column. The points are placed at equal arc-length from the starting point of the equivalent boundaries. If a negative number is used in row two, the slave boundary may be generated by following the master boundary from end point to start point. A master boundary may not be a slave boundary in another column.

Following is a summary of the Delaunay triangulation method in connection with forming a 2-dimensional mesh structure:

1. Enclose geometry in a bounding box
2. Put node points on the boundaries following HMAX
3. Perform Delaunay triangulation of the node points on the boundaries and the vertices of the box. Use the properties MINIT/ON and BOX/ON to see the output of this step.
4. Insert node points into center of circumscribed circles of large elements and update Delaunay triangulation until HMAX is achieved.
5. Check that the Delaunay triangulation respects the boundaries and enforce respected boundaries.
6. Remove bounding box.
7. Improve mesh quality.

in which HMAX refers to the maximum element size; BOX and MINIT and other properties that may be used in one embodiment are summarized below:

| Property | 1-D | 2-D | Value | Default | Description |
|---|---|---|---|---|---|
| Box | | X | on/off | off | preserve bounding box |
| Hcurve | | X | numeric | 1/3 | curvature mesh size |
| Hexr | X | X | string | | maximum mesh size |
| Hgrad | X | X | numeric | 1.3 | element growth rate |

-continued

| Property | 1-D | 2-D | Value | Default | Description |
|---|---|---|---|---|---|
| Hmax | X | X | numeric or cell array | estimate | maximum element size |
| Hmesh | X | X | numeric | | maximum element size given per point or element on an input mesh |
| Hnum | X | X | numeric, cell array | | number of elements |
| Hpnt | | X | numeric, cell array | | number of resolution points |
| Minit | | X | on/off | off | boundary triangulation |
| jiggle | | X | off/mean min/on | mean | call mesh smoothing routine |
| Jiggleiter | | X | numeric | 10 | maximum iterations |
| out | X | X | values | mesh | output variables |

The foregoing properties may be used in connection with forming a mesh structure. The Box and Minit properties are related to the way the mesh method works. By turning the box property "on", one may obtain an estimate of how the mesh generation technique may work within the bounding box. By turning on minit, the initial triangulation of the boundaries may be viewed, for example, in connection with step 3 above.

Hcurve is a scalar numeric value relating the mesh size to the curvature of the geometry or mesh boundaries. The radius of the curvature is multiplied by the hcurve factor to obtain the mesh size along the boundary. Hexpr is a string including an expression of x and y giving the size of the elements at different coordinates using the mesh structure. Hmax controls the size of the elements in the mesh. Hmax may either be a global value, or a cell array. The syntax of the cell array varies in accordance with 1-D and 2-D. For 2-D, the first entry in the cell includes a global Hmax, the second entry is a matrix with two rows where the first row includes point indices and the second row includes Hmax and corresponding points. The third entry includes indices to edge segments and corresponding Hmax, and the fourth entry includes indices to subdomains and corresponding Hmax. For a 1-D the first entry in the cell includes a global Hmax, the second entry is a matrix with two rows where the first row includes point indices, and the second row includes Hmax in the corresponding points. The third entry includes indices to the subdomains and corresponding Hmax.

Hmesh is a vector with one entry for every node or element in the mesh given in the mesh structure. Hnum controls the approximate number of elements in the mesh. Depending on other properties, the number of elements specified by Hnum may be exceeded, but at least as many elements specified are generated. Hnum may be either a global numeric value or a cell array. Syntax of the cell array varies with 1-D or 2-D. For 2-D, the first entry in the cell includes a global Hnum, the second entry is a matrix with two rows where the first row include edge indices and the second row includes Hnum on the corresponding edges. For 1-D, the first entry in the cell includes a global Hnum, the second entry is a matrix with two rows where the first row includes subdomain indices and the second row includes Hnum on the corresponding subdomain.

The Hpnt property controls the number of points placed on each edge to resolve the mesh. Additional points may be placed as needed in accordance with the curvature and distances. It is either a number for all edges, or a cell. If it is a cell array, the first entry applies to all edges and the second entry is a matrix with two rows where the first row includes edge indices and the second row includes Hpnt on that edge.

The Jiggle property may be used to control whether "jiggling" of the mesh may be attempted, for example, in using a smoothing technique. This may be performed until the minimum or mean of the quality of elements decreases by setting jiggle accordingly to min or mean. Jiggleiter may be used to specify a maximum number of iterations.

It should be noted that the foregoing properties may be included as parameters to an API for forming a mesh structure, for example, using the Delaunay triangulation method. Other techniques may also be used and the exact parameters in an embodiment using an API may also vary. Additionally, other embodiments may also include other representations of the mesh structure that may vary in accordance with dimension of the geometry.

Referring back to other fields of the fem structure in one embodiment, each application mode has a separate fem.appl{i} field 254, referred to as appl{i}. The index i in the appl vector runs over the set of application modes that have been selected, for example, in connection with FIG. 3. In this embodiment, corresponding to each appl{i} for each selected application mode are five subfields denoted 254*a*-254*e*. The appl{i}.dim field 254*a* includes the names of the dependent variables or physical quantities in application mode i. The appl{i}.equ field 254*b* includes the physical properties associated with subdomain data, for example as described in connection with FIG. 4. The field appl{i}.bnd 254*c* includes data describing the physical properties associated with boundary data, for example as described in connection with FIG. 5, for application mode i. The field border 254*d* is a flag that controls if boundary conditions on inner boundaries are to be considered, and, for example, corresponds to the "Enable Borders check box" as described in connection with the GUI of FIG. 5. There is one border flag for each application mode. The field usage 254*e* corresponds to the "Activate in this Subdomain check box" as described in connection with the GUI of FIG. 4. In one embodiment, this may be implemented as a boolean vector, with one column for each geometrical subdomain. A logical value of "1" or true in an entry indicates that application mode i is active in the subdomain corresponding to that column. Fem.appl{i}.submode represents a corresponding submode setting, such as 48 of FIG. 3.

In one embodiment, the remaining fields in the data structure 250 may be associated with the combined application modes. The field fem.dim 256 includes the names of the dependent variables or physical quantities in all application modes. The fields fem.equ 258 and fem.bnd 260 correspond to the derived equations and boundary conditions for all the application modes. These fields may be used in connection with data from dialog boxes for PDE and Boundary conditions in coefficient view, such as those GUIs described in connection with FIG. 6. Similarly the field fem.border 262 may be implemented as a vector specifying borders for each variable of the variables in appl{i}.dim separately. The field fem.usage 254e includes data associated with the activation of dependent variables in each geometrical subdomain. The variables in fem.dim 256 correspond to the rows of the fem.usage field 264, and the columns correspond to the geometrical subdomains. The field fem.init 266 includes the initial value for nonlinear and time dependent solvers, for example, as may be used in connection with solving for the PDEs. The field fem.sol 268 may include the solution to the combined system of PDEs using a solution or PDE solving technique, for example, as may be selected in accordance with the GUI of FIG. 7, other parameters included in the structure 250, and the type of PDE system being solved, such as whether the PDEs correspond to a linear or non-linear system, are in coefficient or general form, and the like. The field 270 indicates that other fields may be included in an embodiment in accordance with each implementation.

The equ fields 254b may include several application mode dependent subfields with one list per physical property. Each list entries correspond to the subdomains of the problem. Each subfield may include a list of expression values representing the physical properties involved. For example, the heat transfer application mode includes the list: rho, C, k, Q, htrans, Text, Camb, Tambtrans, corresponding, respectively, to the density, heat capacity, coefficient of heat conduction, heat source, convective heat transfer coefficient, external temperature, user-defined constant, and transversal ambient temperature. This may be interpreted as a heat source of Q+htrans*(Text−T)+Camb*(Tambtrans^4−T^4) on a subdomain.

The usage fields 254e and 264 describe the setting of the Active in this subdomain setting for each physical property (or dependent variable). The bnd fields 254c include several application mode dependent subfields with one list per physical property. The list entries correspond to the boundaries of the subdomain. Each subfield contains a list of expression values for the physical quantities involved, e.g., the heat transfer application mode contains the list: q, h, Tinf, C, Tamb, and T, corresponding to the heat flux and heat transfer coefficient, external temperature, user-defined constant, ambient temperature, and temperature, respectively. An additional subfield, type, controls the basic type of the boundary condition and what physical properties are used on the boundary. For example, referring to the heat transfer application mode, the type may be one of T0, T, q, or q0. T0 indicates a zero temperature; T indicates that the temperature is specified in the field T; and q0 indicates a zero heat flux through that boundary, and q indicates a heat flux of q+h*(Tinf−T)+C*(Tamb^4−T^4) through that boundary.

The border fields 254d and 262 indicate if the internal boundaries between subdomains are to be considered during the solution of the model. In one embodiment, the outer boundaries with respect to the active in this subdomain setting may be ignored. The equ fields 254b and 258, and the bnd fields 254c and 260 may further include an ind subfield. Each of the ind subfields may be implemented as a vector with length equal to the number of subdomains or boundaries. For each subdomain, the corresponding ind vector entry may indicate a domain group, or "0" for no group. For boundaries, each of the subfields bnd.ind may have the corresponding meaning for boundaries. When the ind field is not given, each subdomain or boundary forms a separate group.

Referring back to FIG. 6 in connection with GUI 80, fields in fem.equ 258 and fem.bnd 260 may be modified if they are specified as being applied to the combined PDE system and subsequently modified, for example, using the GUI 80.

Figure 7:
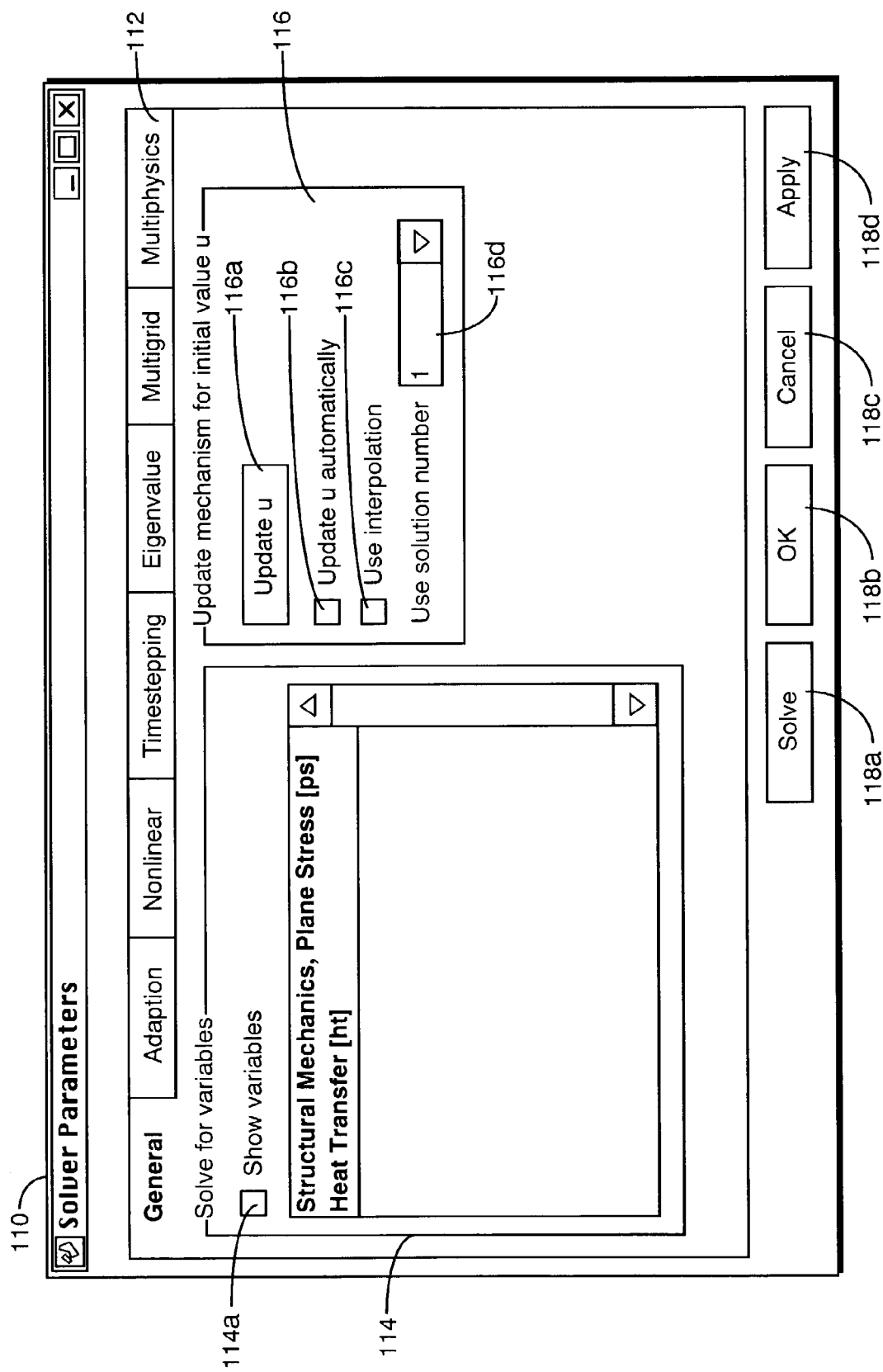
FIG. 7 is an example of an embodiment of a graphical user interface for specifying the ability to solve for any subset of the physical quantities.

Referring now to FIG. 7, shown is an example of an embodiment of a screen display that may be used in connection with solving the PDEs for any subset of physical quantities from any one or more application modes, or of the combined PDE system. The GUI 110 includes a left hand portion 114 displaying the one or more application modes selected with the current combined or multiphysics mode. The "show variables" box 114a, if checked or activated, may modify the content displayed in area 114 to further include dependent variables in each of the associated application modes. In this instance, the physical quantities may be selected as well as a particular application mode with regard to solving for the combined system of PDEs in which the combined system includes those systems corresponding to the application modes in the area 114. The area 116 includes one or more various options that may be associated with solving for the PDEs. In this embodiment, the reference to "u" as included in the area 116 refers to all physical quantities for all application modes. Activating the field 116b causes the updating of the appropriate data structure fields upon solving for the system of PDEs. Activating field 116c uses interpolation in solving for the PDEs. This is described in more detail elsewhere herein.

The GUI 110 may be used in selecting what physical quantities to solve for in the system of PDEs. Selecting all application modes, such as by selection an highlighting application modes of area 114, solves for all physical quantities in the system of PDEs. Selecting a subset of the application modes solves for all the variables in these application modes. In one embodiment, checking the checkbox 114a "Show variables" shows the actual variable names instead of the names of the application mode, and enables selection of these. The "Update u" button 116a inserts the current solution (in fem.sol) into the initial conditions (in fem.init). The check-box "update u automatically" makes u automatically update the data structure fields fem.init with fem.sol each time a solution is computed, and the check-box "use interpolation" 116c allows interpolation to be used when the current solution and the current discretization mesh are different. In one embodiment, the solution may be interpolated to the current discretization and inserted into fem.init. The use of interpolation, for example, is set forth in "Numerical Methods", G. Dahlquist, Å. Björk, Prentice Hall, 1974, ISBN 0-13-627315. The "Use solution number" pop-up menu 116d controls which solution to update fem.init with, for example, if there are several columns in fem.sol as may be for a time-dependent problem.

The values in the physical property fields of the application mode appl structure, for each of the "i" selected application modes, may be converted into PDEs. The formats of the PDEs formed for each specified application mode may be represented as in FIGS. 8 and 9.

Referring now to FIG. 8, shown is an example of an embodiment of formulae 140 describing a system of PDEs in coefficient form. $\Omega$, formula 142, is for a bounded domain. The formulae 146, including 146a-146b $\partial \Omega$, correspond to the boundary of the domain 142. $n_j$ corresponds to the components of an outward unit normal.

The first equation 142 is satisfied inside the domain, and the second and third equations of 146 are both satisfied on the boundary of the domain. The second equation 146a may be referred to as a generalized Neumann boundary condition, and the third equation 146b may be referred to as a Dirichlet boundary condition.

The unknown solutions, such as those corresponding to the physical quantities, may be denoted by $u_k$ in the formulae of 140. The unknown solutions may include one or more components. N denotes the number of solution components, or physical quantities. The solution is allowed to take complex values. $\lambda_m$ is an unknown Lagrange multiplier. $n_j$ is a component of the gradient of the solution. The coefficients included in the formulae 140 $d_{a,l,k}$, $c_{l,k,j,i}$, $\alpha_{l,k,j}$, $\gamma_{l,j}$, $\beta_{l,k,i}$, $a_{l,k}$, $f_l$, $q_{l,k}$, $h_{m,l}$, and $r_m$ may be complex-valued functions of the space, time, and the solution. The coefficients $d_a$, c, $\alpha$, g, $\beta$, a, and $f$ may be functions of the gradient of u.

For a stationary system in coefficient form, for example as may be specified in FIG. 3, item 40, $d_a=0$. With respect to solution components, the coefficients $d_a$, c, $\alpha$, $\beta$, a, and q are N-by-N matrices, and $\gamma$, $f$, and g are N vectors. The coefficient h is an M-by-N matrix, and r is an M vector, where 0<=M<=N and M is the number of constraints. With respect to space dimension, n, (or independent variables) the c coefficient is an n-by-n matrix, and the $\alpha$, $\gamma$, and b coefficients are n vectors. The remaining coefficients may be scalars.

Referring to the indices of the formulae 140, i and j are space indices and k and l are component indices. Using the standard summation convention, i.e., there is an implicit summation over each index pair, i and j, and k and l, the formulae of FIG. 8 where the indices i and j run from 1 to n, the indices k and l run from 1 to N, and where the index m runs from 1 to M. $n_j$ is the jth component of the outward normal vector.

Referring now to FIG. 9, shown is an example of an embodiment of a representation of formulae 150 describing a system of PDEs in general form. Here $\Omega$ 152 is a bounded domain, each $\partial\Omega$, 154a and 154b of 154, is a boundary of the domain, and $n_j$ is the outward unit normal. The unknown solution is denoted by $u_k$ and may include one or more components. N denotes the number of physical quantities. The solution is allowed to take complex values. $\lambda_m$ is an unknown Lagrange multiplier. The generalized Neumann condition, for example as expressed by 154a, includes a source where the Lagrange multipliers $\lambda_m$ are computed such that the Dirichlet conditions become satisfied. The coefficients $\Gamma_{l,j}$, $F_l$, $G_{l,j}$, and $R_m$, may be complex-valued functions of the space, time, the solution and its gradient. With respect to solution components the coefficients $\Gamma$, F and G are N vectors. The coefficient R is an M vector, where $0 \leq M \leq N$, and N is the number of constraints. The $\Gamma$ coefficient is an n vector with respect to space dimension n. The rest of the coefficients are scalars with respect to space. Using j as a space index, and k and l as component indices in conjunction with implied standard summation convention, the general form 150 of FIG. 9 may be expressed where the index j runs from 1 to n, the indices k and l run from 1 to N, where the index m runs from 1 to M, and $n_j$ is the jth component of the outward normal vector.

The application mode physical properties, for example, as described in connection with each selected application mode corresponding to an entry in the appl{i} structure, may be converted to the representation of PDEs in coefficient and/or general form. The combined PDEs may be represented in fields of the data structure 250, such as in the equ 258 and bnd 260 fields.

As described in more detail elsewhere herein, in one embodiment, the same syntactic rules may be used in determining coefficients for both PDEs, as may be represented in the equ field 258, and boundary conditions, as may be represented in the field 260. In other words, as summarized here and described further in more detail elsewhere herein are syntactic rules that may be used in forming coefficients for the PDEs. These rules may be used in forming coefficients for each system of PDEs associated with each application mode. These rules may also be used in connection with forming coefficients for the combined PDE or multiphysics system. The coefficients may be stored in nested lists. Each nested level of the lists may correspond to a nesting index position. For example, level 1 may corresponds to subdomain/boundary, level 2 may correspond to a solution component or physical quantity, and level 3 may correspond to the space coordinate. Level 4 may be a value level, where the actual expressions are stored. In connection with forming coefficients for each application mode selected, input data, as may be obtained in connection with previously described GUIs, may be converted to PDE format. Coefficients may be formed as part of this process. Data for each application mode may be stored in fields of the appl{i} data structure subfields dim, form, equ, bnd, and init.

For the combined or multiphysics, referring back to fields of the data structure 250 described in more detail elsewhere herein, the following list provides the position in the data structure 250 for the combined system of PDEs and boundary conditions with regard to those elements referenced, for example, in FIG. 8: $d_a$: equ.da, c: equ.c, $\alpha$: equ.al, $\gamma$: equ.ga, $\beta$: equ.be, a: equ.a, $f$: equ.f, q: bnd.q, g: bnd.g, h: bnd.h, r: bnd.r.

The general form coefficients, for example as described in connection with FIG. 9 and FIG. 11 in more detail elsewhere herein, $\Gamma$, F, G, and R may be stored in the equ.ga, equ.f, bnd.q, and bnd.r fields, respectively. A uniform format may be used for each of these coefficients. Subdomains and boundaries may be merged into groups where the expressions for the PDEs and boundary conditions are the same.

A subfield equ.ind of field 258 may be a vector with length equal to the number of subdomains. For each subdomain, the corresponding entry designates a subdomain group or 0 for no group. Similarly the field bnd.ind has the corresponding meaning for boundaries. When the ind field is not given, each subdomain or boundary form a separate group.

The data structure field fem.border 262 controls if assembly of boundary conditions are performed on borders. In one embodiment, this may be implemented as one or more boolean conditions each representing two states: "on" and "off". Setting fem.border 262 to "off" (default) turns off assembly on borders, and setting fem.border to "on" turns on assembly on borders. An embodiment may implement fem.border 262 as an array of text strings with either on or off conditions specified, or a vector of logical values. The length of the array or the vector may be equal to the number of dependent variables. A border for a given dependent variable has that variable activated by fem.usage on each side.

What will now be described are formal rules of one embodiment for determining coefficients at varying levels. Given a PDE or boundary coefficient P1 with L subdomains/boundary groups and N solution components, n space coordinates, with a varying number of levels, such as 1-4 having corresponding coefficient leveling notation P1-P4, respectively, the formal rules for coding the coefficients at varying levels in one embodiment may be represented as:

Level 1 (subdomain/boundary level): If P1 is a cell array then each element of P1 is a P2, otherwise P1 is a single P2. The number of P2s in P1 is either 1 or L.

Level 2 (solution component level): If P2 is a cell array then each element of P2 is a P3, otherwise P2 is a single P3. If P2 is a $d_a$, c, $\alpha$, $\beta$, a, or q coefficient the number of P3s in P2 is 1, N, N(N+1)/2, or $N^2$. If P2 is a $\gamma$, $f$, or g coefficient the number of P3s in P2 is 1 or N. If P2 is an h coefficient the number of P3s in P2 is 1 or MN, where M is an integer between 0 and N, representing the number of constraints. If P2 is an r coefficient the number of P3s in P2 is M.

Level 3 (space-coordinate level): If P3 is a cell array then each element of P3 is a P4, otherwise P3 is a single P4. If P3 is a c coefficient, then the number of P4s in P3 is 1, n, n(n+1)/2, or $n^2$. If P3 is an a, f, q, g, h, r, or da coefficient, there is one P4. If P3 is an $\alpha$, $\gamma$, or $\beta$ coefficient, there are "n" P4s.

Level 4 (value level): A single item including a symbolic text expression for computing PDE coefficient values. The expression may be evaluated where the variables xi, sd, ui, uixj, and h correspond, respectively, to representing the ith coordinate, subdomain label, ith solution component, jth derivative of the ith solution, and the local element size. ui and xj may refer to the variable names defined by fem.dim 256 and fem.sdim (independent variable names or space coordinate names), respectively. It should be noted that fem.sdim may be an additional field included in the portion 270 of data structure 250 in an embodiment.

What will now be described is one embodiment of a method for converting application mode physical properties on subdomains and boundaries into a PDE form, either general or coefficient. In other words, once data is input and stored in the structure 250, this data may be expanded or transformed into another form used in subsequent processing steps. In other words, the following may be used in connection with converting GUI data into PDE format for each application mode.

It should be noted that in the following example, the GUI or input data is stored in a temporary or tmp structure for each application mode. The combined system of PDEs may be formed using as input each of the tmp structure for each application mode. An embodiment may store a representation of the combined PDE system in the fem structure as described in more detail elsewhere herein.

The application mode properties in the fields equ and bnd in the appl{i} structure are rewritten as symbolic expressions by using an application mode dependent set of transformation rules, e.g., for heat transfer:
tmp{i}.equ.c{j}=appl{i}.equ.k{j};
tmp{i}.equ.a{j}=appl{i}.equ.htrans{j};
tmp{i}.equ.f{j}=appl{i}.equ.Q+appl{i}.equ.Text{j}+
   appl{i}.equ.Camb{j}*(appl{i}.equ.Tambtrans{j}^4-
   appl{i}.dim^4)
tmp{i}.equ.da{j}=appl{i}.equ.rho*appl{i}.equ.C{j} by looping over the subdomain index j. The field appl{i}.dim is the physical quantity, the temperature. Similarly the boundary subdomain properties are rewritten by the rules:
tmp{i}bnd.q{j}=appl{i}.bnd.h{j};
tmp{i}.bnd.g{j}=appl{i}.bnd.q{j}+
   appl{i}.bnd.h{j}*appl{i}.bnd.Tinf{j}+
   appl{i}.bnd.Const{j}*(appl{i}.bnd.Tamb{j}^4-
   appl{i}.dim.^4);

when the type is QG and as
tmp{i}.bnd.h{j}=1;
tmp{i}.bnd.r{j}=appl{i}.bnd.T{j};

when type is T. The remaining type cases, QG0 and T0, are simple cases of the above cases, where all left hand side terms are zero, except the bnd{i}.h term.

It should be noted that the foregoing rules to produce symbolic expression may vary with application mode. For example, the foregoing rules may be used in connection with forming coefficients for heat transfer application mode. As known to those of ordinary skill in the art, the techniques may be applied to forming coefficients for other application modes. It should be noted that functionality associated with the above description is included in one embodiment as a function "appl2fem" as described in the FEMLAB V1.1 Reference Manual from Comsol AB, 1999.

The foregoing may be performed for each of the application modes, i, to expand or transform data into PDE form data included in the application mode structure tmp{i}. This structure tmp{i} includes a representation of the physical properties as instances of the PDE formulae of FIG. 8 or FIG. 9.

The fields usage and border for the tmp data structure may be copied from the corresponding fields in the data structure 250. The field dim 256 may be updated with another variable name, and introduce a relation between the physical quantity and the dependent variables, and introducing this relation when the equ and bnd fields are transformed into the tmp structure.

The submode setting described elsewhere herein in more detail, for example, in connection with FIG. 3, may be used in determining the number of variables. The submode setting may be used to distinguish between a stationary and time-dependent problem. In certain application modes, such as structural mechanics, the number of dependent variables in the application mode may vary in accordance with a submode setting or selection. For example, PDE formulation as described in connection with FIG. 8 does not provide for a second order time derivative. Thus, for example, in application modes related to structural mechanics, where the displacements are the dependent variables, it may be desirous to add the velocities of the displacements as dependent variables in addition to the displacements. Thus the application mode describing the system may include twice the number of variables for the time-dependent subdomain than for the stationary.

What has just been described are processing steps that may be included in an embodiment in connection with expanding or converting input data, as using the GUIs, into a PDE form, such as general or coefficient.

An embodiment may continue by merging the formulae associated with a plurality of application modes and PDEs into a single system of combined PDEs. Appending the subsystems in the order they are specified in each of the fem.appl 254 creates the composite system. In one embodiment, the affected fields in the data structure 250 structure may include dim 256, form (additional field in area 270 indicating problem form as general or coefficient in this example), equ 258, bnd 260, border 262, and usage 264.

The dim field 256 of the composite system may be obtained by concatenating the dim field lists from each of the application modes appl{i}254. The default form of the composite system is the most general form of the subsystems, where "general" is the most general form, and "coefficient" is the least general form.

The conversion of a PDE in coefficient form to general form is described elsewhere herein. The output form may be "forced" to general form by forcing the conversion also if none of the appl{i} application modes are specified in general form. A value may be stored in an additional field that may be included in an embodiment of the data structure 250, such as an additional field in the area 270, indicating the type of problem form, for example, as one of general or coefficient in this embodiment.

The equ 258 and bnd 260 fields in the data structure 250 may be determined using corresponding fields appl{i} in the application modes, after each application structure has been converted to the representation of the PDEs, and the desired output form, according to FIG. 11. The coefficients in the second row may be deemed "weakly" coupled in the sense that the corresponding coefficients in the composite system are block diagonal. This may limit the coupling between the subsystems. By using general form, however, there are no limitations on the composite system. In this embodiment, the border field 262 in the data structure 250 may indicate a list of on/off, one for each solution component. The usage field 264 may be determined using the usage matrices, such as 254e of each subsystems, by concatenating usage lists as rows in a matrix.

Thus, one technique for combining PDEs may be represented by the following pseudocode-like description:

```
Gpos=0;
for i=1 to Nappl
    j=Ndim(i);
    for k=1 to Nsub
        fem.equ.da{k}(gpos+(1:j),gpos+(1:j))=tmp{i}equ.da{k};
        fem.equ.c{k}(gpos+(1:j),gpos+(1:j))=tmp{i}equ.c{k};
        fem.equ.al{k}(gpos+(1:j),gpos+(1:j))=tmp{i}equal{k};
        fem.equ.ga{k}(gpos+(1:j))=tmp{i}.equ.ga{k};
        fem.equ.be{k}(gpos+(1:j),gpos+(1:j))=tmp{i}equ.be{k};
        fem.equ.a{k}(gpos+(1:j),gpos+(1:j))=tmp{i}eq.a{k};
        fem.equ.f{k}(gpos+(1:j))=tmp{i}equ.f{k};
    end
    for k=1 to Nbnd
        fem.bnd.q{k}(gpos+(1:j),gpos+(1:j))=tmp{i}bnd.q{k};
        fem.bnd.g{k}(gpos+(1:j)) =tmp{i}.bnd.g{k};
        fem.bnd.h{k}(gpos+(1:j),gpos+(1:j))=tmp{i}bnd.h{k};
        fem.bnd.r{k}(gpos+(1:j)) =tmp{i}bnd.r{k};
    end
    fem.border(gpos+(1:j))=tmp.border(1:j);
    fem.usage(gpos+(1:j),:)=tmp.usage(gpos+(1:j));
    gpos=gpos+j;
end
```

In the above description, the "Nsub" denotes the number of subdomains in the geometry, "Nappl" denotes the number of application modes, and "Nbnd" denotes the number of boundaries. "Ndim(i)" is the number of dependent variables of the application mode.

The result of performing the foregoing is the data representation of the system of PDEs corresponding to the full multiphysics system of the combined PDEs for the selected application modes. In an embodiment, the above procedure is documented as function "multiphysics" in the FEMLAB V1.1 Reference Manual.

It should be noted that if the systems represented in the structure tmp{i} are converted to general form, the foregoing pseudocode description may be applied to the coefficients, for example, as represented by ga (corresponding to "gamma"), f, g, r.

An embodiment may include storing the data for the PDEs and boundary conditions for each application mode in a more compact format using, for example, the ind field in appl{i}.equ and appl{i}.bnd. In one embodiment, as also described elsewhere herein, the ind fields may be implemented each as a vector with length equal to the number of subdomains or boundaries. For each subdomain, the corresponding entry designates a domain group or 0 for no group. Similarly the field bnd.ind has the corresponding meaning for boundaries. When the ind field is not given, each subdomain or boundary forms a separate group. It should be noted that when using this compact format representation feature and the appl{i}.equ.ind or appl{i}.bnd.ind fields are different for the selected application modes, the ind fields may also be merged or combined into the ind fields in fem.equ.ind (subfield of 258) and fem.bnd.ind (subfield of 260). These fields may have a minimal common set of subdomain or boundary groups. This may be determined, for example, by jointly sorting the groups in the application modes and removing duplicates.

In one embodiment, the solution procedure uses the Finite Element Method (FEM) to solve the system of PDEs in coefficient and general form, for example, as represented in FIGS. 8 and 9. This is described, for example, in "The Mathematical Theory of Finite Element Methods", S. C. Brenner, L. R. Scott, Springer-Verlag, ISBN 3-540-94193-2. This is a well-known procedure, but has been adapted to specifically fit a particular context of one embodiment. In this embodiment, the first equation in FIG. 8, element 142, and the first equation in FIG. 9, element 152, may be multiplied with an arbitrary test function v, and integrated over the domain $\Omega$, such as integrated by parts, for example, using Green's formula. The boundary integral may be replaced using the Neumann boundary condition. Furthermore, the Dirichlet boundary condition may be multiplied by an arbitrary test function $\mu$ and integrated on the boundary, and obtain the variational formulation of the full problem: Find $u_k$ and $\lambda_m$ such that for all v, m, l=1, . . . , N, and m=1, . . . , M the equations in FIG. 12 and FIG. 13 hold, for coefficient and general form, respectively.

As described in connection with one embodiment, the PDE system to be solved may be passed to a solver algorithm for PDEs that uses the finite element method. In addition to the data structure 250 that may include the representation of the PDEs, two sets of constraint matrices may be used and are referred to and described in more detail elsewhere herein in connection with particular features that may be included in an embodiment.

The finite-dimensional function space is the set of piecewise linear functions on a triangulation $\tau$ of the domain $\Omega$. u and $\Lambda$ may be approximated, for example, using the formulae 304 of FIG. 14, where $\phi_1$ is linear on each element, continuous, and 0 on all node points in the triangulation except the node point I. $\psi_{K,L}$ is a delta function at a vertex L on a boundary element K.

By using the test functions $\phi_J$ and $\psi_{K,L}$ on the weak form of the PDE in coefficient form, it may be determined that the formulae 306 of FIG. 15 applies for all J and l, and that the formula 308 of FIG. 16 apply for all K, L, and m. The finite element discretization represented by 310 of FIG. 18 may be determined. It should be noted that the integrals as included in the formulae 310 of FIG. 18 may be computed using a Gauss quadrature within each element. The formula corresponding to those of 306 of FIG. 15 and 308 of FIG. 16 for general form may be represented as in formulae 312 of FIG. 17.

With reference to the data structure 250 described elsewhere herein, when the integrals in 310 of FIG. 18 are computed, the initial value in fem.init 266 may be used as values for the solution when it occurs in the expressions in the PDE coefficients and boundary conditions.

By numerically computing the matrices according to the foregoing formulae, the systems of equations represented in FIG. 19 and FIG. 20 may be determined. In particular, referring to FIG. 19, shown are formulae 320 in coefficient form, and referring to FIG. 20, shown are formulae 322 in general form, in which C, AL, BE, A, and Q are $N_pN$-by-$N_pN$ matrices, and F, GA, and G are $N_pN$ vectors. H is a $N_enM$-by-$N_pN$ matrix and R is a $N_enM$ vector. The DA matrix is used in time-dependent and eigenvalue problems. When these matrices are produced, the first index in the index list in FIG. 18 is expanded first.

Linear solvers, nonlinear solvers, time-dependent solvers and eigenvalue solvers may be used in solving systems of PDEs of FIG. 19 in coefficient form, and PDEs of FIG. 20 in general form. Such solvers, or solving techniques, are generally known in the numeric literature, for example, such as in "Numerical Methods", G. Dahlquist, Å. Björk, Prentice Hall, 1974, ISBN 0-13-627315. In one embodiment, a technique may be used to generate the Jacobian for nonlinear solvers and for solvers of time-dependent problems. This technique may be used in systems in general form, or PDE systems that have been converted from coefficient form to general form, for example as described in connection with the formulae 240 of FIG. 11.

It should be noted that use of PDEs in general form may be used to more efficiently provide PDE solutions in solving for non-linear systems of equations. One technique, as described elsewhere herein in more detail, may utilize the general form to derive a Jacobian. This may be more efficient than using the coefficient form for solving for non-linear systems. Using this general form to derive the Jacobian, the Newton method may then be used. FIG. 10 shows an iteration of using the Newton method.

For the combined system or multiphysics, the solution may be stored in the field fem.sol 268 of the data structure 250. In one embodiment, the solution field 268 may represent the solution to a PDE system as a vector having the same number of elements as the corresponding U. Similarly fem.init 266 may include the initial value for the nonlinear and time-dependent solvers. For time-dependent solutions, there may be several columns in fem.sol 268, one for each point in time.

In one embodiment, nonlinear equations in general form may be solved by Newton iterations.

Referring now to FIG. 11, shown is an example of the formulae that may be used in an embodiment in converting from coefficient to general form of the PDEs. The conversion from coefficient to general form may be performed on the app{i} structure for each application mode separately in accordance with the form desired, for example, as may vary in accordance with equation or system type. For example, if a system being solved is in coefficient form and it is a non-linear system, it may be desired to convert from the coefficient form to general form using the formulae 240 of FIG. 11 in conjunction with the other formulae 140 for coefficient form to produce a system of PDEs of the general form, such as those represented by the formulae 150 of FIG. 9. This conversion may also be performed in accordance with a user selected or specified mode, for example, as may be included in an embodiment. Other embodiments may perform this conversion from coefficient to general form in connection with other function that may be included and vary with implementation.

The formulae 240 of FIG. 11 may be used to derive $\Gamma$, $F$, $G$, and $R$ from $d_a$, $c$, $\alpha$, $\gamma_l$, $\beta$, $a$, $f$, $q$, $g$, $h$, and $r$ as included in the formulae 140 of FIG. 8. This may be performed, for example, as by symbolic manipulation of the mathematical expressions.

The discretization by the finite element method, given a nonlinear system of equations in as in the general form of FIG. 20, may be viewed as the problem $\rho(U)=0$, where U is the vector of unknown coefficients of the finite element solution to the PDE problem. In this instance, DA=0 since this problem is stationary. The LaGrange multipliers, $\Lambda$, may be considered auxiliary values $\Lambda=\Lambda(U)$ which may be assumed to be eliminated. For the solution of the discretized system, an affine invariant form of the dampened Newton method may be applied: Given an initial guess, $U^{(0)}$; a sequence of iterates $U^{(k)}$ is computed by the iteration formula 326 in FIG. 21, where $J(U)=\partial\rho(U)/\partial U$, and $\lambda_k \epsilon(0; 1]$ denotes a damping factor.

Subsequently solving for $\Delta U^{(k)}$ above may utilize the solution of a linear system of equations. If $J(U)$ is chosen as the exact Jacobian, the iteration formula above may be interpreted as the finite element discretization of a linearized equations in coefficient form by applying the settings in 324 of FIG. 10. The coefficients in the coefficient form PDE may be formed as symbolic derivatives of the coefficients in the general form PDE with respect to the solution, and its gradient.

It should be noted that the "Active in this subdomain feature" for selective inclusion or variation of a variable in a system, may be implemented in one embodiment by adding a constraint to the H and R matrices to not-a-number in IEEE arithmetic. One row containing the constraint may be added to H and R for each node point in the deactivated subdomains and dependent variables.

It should also be noted that when the system of PDEs is assembled, for example, according to FIG. 18, the variables not to solved for may be used in the expressions for PDE coefficients and boundary conditions. In one embodiment, the "solve for variable feature" may be implemented by adding a constraint to the H and R matrices that constrains the solution in the node points the value of the previous solution in the same point, one row containing the constraint is added to H and R for each node point and dependent variable.

The foregoing description may be used in forming a multiphysics model and solving for selected variables. Steps of one embodiment may be summarized in the form of a flowchart and accompanying description.

Figure 22:
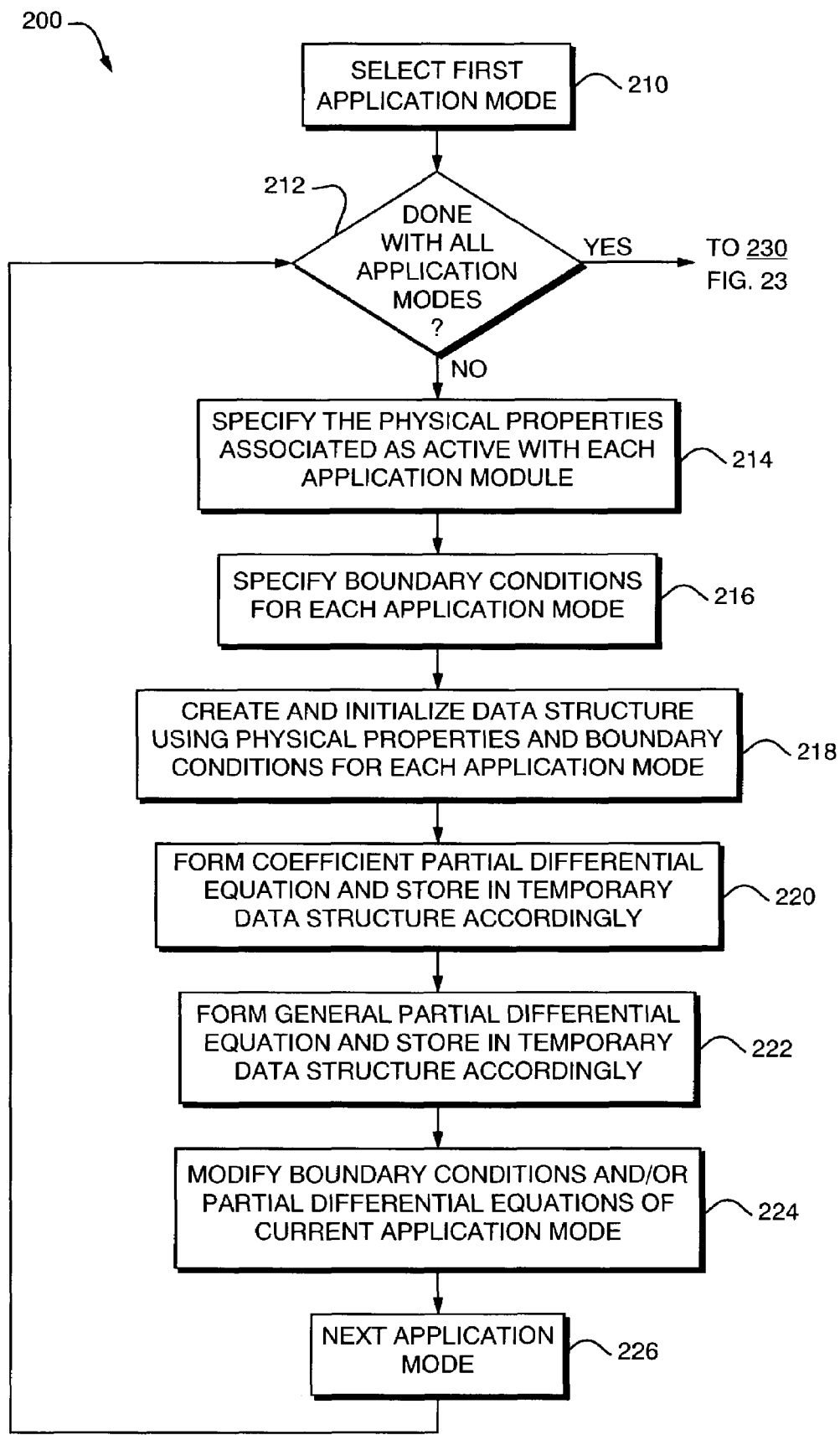
FIG. 22 and FIG. 23 form a flowchart of method steps of one embodiment for specifying one or more systems of partial differential equations, representing them in a combined form, and solving a combined system of partial differential equations.
Figure 23:
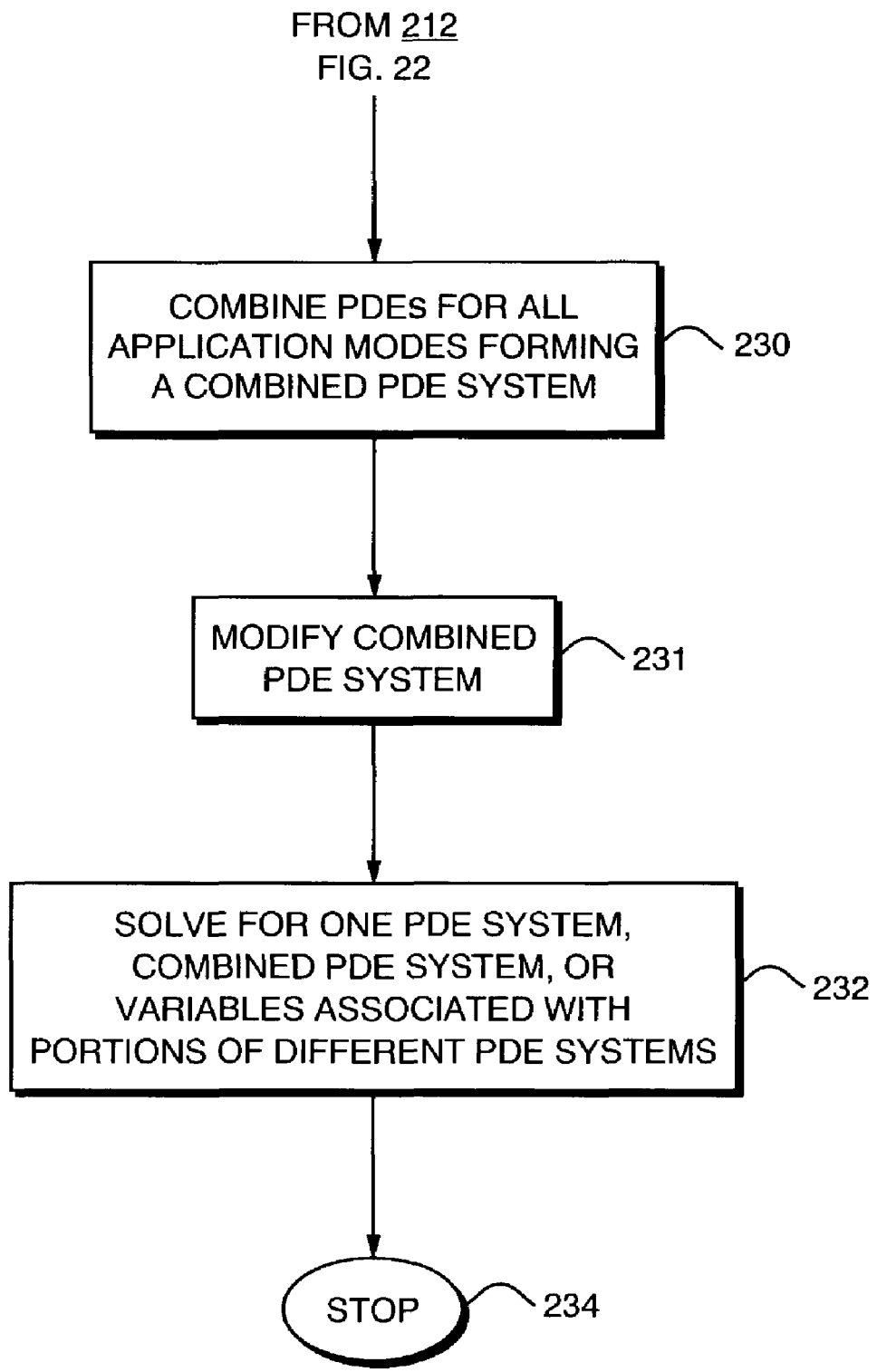

Referring now to FIG. 22 and FIG. 23, shown is an example of an embodiment of a flowchart of steps of one method for automatically specifying one or more systems of PDEs, representing them in a single combined form, and solving a system of PDEs. At step 210, a first application mode is selected. It should be noted that each application mode corresponds to a particular system being modeled. The selection of one or more application modes may be performed, for example, in one embodiment using the GUI 30 of the previously described FIG. 3. At step 212, a determination is made as to whether the processing steps formed by the loop at the top of step 212 are complete for all application modes. If a determination is made at step 212 that processing of all the applications modes selected at step 210, control proceeds to flow point A. Otherwise, control proceeds to step 214, where the physical properties associated as active with the current application mode are determined. The physical properties associated with an application mode may be selected, for example, in connection with GUI 60 of FIG. 4. Control proceeds to step 216, where the boundary condition for the current application mode is determined. The boundary conditions may be determined, for example, using the GUI 70 of the previously described FIG. 5.

Control proceeds to step 218, where data structures are created and initialized using the physical properties and boundary conditions specified for the current application mode in connection with the processing, for example, of steps 214 and 216. At step 220, the coefficient PDEs may be formed using physical property and boundary data obtained in connection with steps 214 and 216, and accordingly stored in the data structure created and initialized at step 218. Recall, as previously described, that the PDE in coefficient view, or form, may be represented as described in connection with the formulae 140 of FIG. 8. Additionally, recall that a temporary data structure may also be used when forming the coefficients for each application mode. At step 222, the general form of the PDE may also be formed. Accordingly, the data structure initially created at step 218 may be updated to include the information about the general form for the PDE system. It should be noted that the general PDE formed at step 222 may be as represented by the formulae 150 previously described in connection with FIG. 9. A temporary data structure may also be used in storing data for the coefficients formed in connection with processing of step 222, similar to that as may be used in connection with step 220.

An embodiment may provide an option to allow for data entry, display and modification in coefficient form, general form, or both of these forms. If more than one is included in an embodiment, there may be a default, or a user selection option. Thus, processing associated with steps 220 and 222 may be optionally performed in accordance with what may be included in an embodiment, and may additionally be in accordance with a user selection. One embodiment provides for data entry, modification, and PDE solving associated with an application mode in either coefficient view or general form. Coefficient view may be selected for data entry and modification with the additional user input selection of producing general form, and solving PDEs using either form. If general form is selected for data entry without coefficient view, PDE solving may be performed, by default, using a system of equation in general form. As known to those of ordinary skill in the art, in accordance with the PDE system being solved, solving using the general form may be more efficient and desired over use of coefficient form. For example, in solving PDE systems for non-linear systems, use of the general form may be more efficient.

At Step 224, an embodiment may include, optionally, functionality to modify the boundary conditions and/or PDEs of the current application mode. It should be noted that if an embodiment includes the function of modifying a PDE for each application mode, the previously described locking mechanism may operate differently since PDEs may change per application mode.

At step 226, a next application mode may be selected. Control proceeds to step 212 where a determination is again made as to whether processing all the application modes is complete.

When all the application modes are selected and done being processed in connection with the processing steps formed by the loop beginning with a decision at step 212, control proceeds to flow point A, step 230, where PDEs for all the previously entered application modes are combined, forming a combined PDE system. In other words, the result is a single PDE system representing the combination of all the previously described systems in connection with all the previously specified application modes. It should be noted that in one embodiment described in more detail elsewhere herein, data associated with the PDE of each application mode may be stored in a temporary structure for each application mode. At step 230, in this instance, the temporary data structures may be used as input for producing the combined PDE system or multiphysics system of PDEs. At step 231, an embodiment may optionally provide for modifying the combined PDE system, or other systems. Control proceeds to step 232, where the PDEs, or variables associated with PDEs, may be solved. An embodiment may provide variations as to what variables or PDEs may be solved for in the processing of step 232. One embodiment may allow the user to select solving for one of the PDEs associated with individual application modes, the combined PDE system, or variables from different PDEs. Control proceeds to step 234 where the processing of the flowchart 200 stops.

What has just been described is the general processing of the overall system for automatically forming one or more sets of PDEs associated with one or more application modes or systems. These systems may be combined into a single, combined PDEs system. A programming module, such as the finite element solver that may be included in the Modeling and Simulation Module 222, may solve a system of PDEs. The finite element solver, for example, may solve a single system of PDE corresponding to a single application mode, may solve for the combined PDE system, for example, as computed or determined in connection with the processing step 230. An embodiment may also solve for one or more variables associated with one or more application mode using any one of a variety of known solving techniques.

What will now be described in more detail is how user defined application modes and user defined applications may be used in the foregoing system and with the techniques described herein. Generally, a user defined application mode in one embodiment may be an equivalent to a predefined application mode, such as heat transfer, described elsewhere herein. An "application mode" is distinguishable from an "application". In this embodiment, an application may be associated with a user defined subclass from a class, for example, that may be associated with an application mode. An application may be defined by a user, for example, when it may be useful to create a specialized or narrower definition of an existing class corresponding to an application mode. In this way, routines and code common in more than an application may be shared since, fore example, in this embodiment, functionality of one or more applications (subclasses) may be inherited from an application mode.

Alternatively, a user-defined application mode rather than a user defined application may be more appropriate, for example, when such functionality is not common or bears little or no relationship in functionality to an existing application mode.

In one embodiment, an application mode may be predefined, such as Diffusion or Heat Transfer included in one embodiment of the software 19, or user-defined. User-defined application modes may be created using an Application Program Interface (API), such as those described in the FEMLAB V1.1 Application Program Interface manual. In contrast to the user defined application mode is the user-defined application. A difference between the user-defined application mode and user-defined application is that a user-defined application may be much more specialized, for example, regarding the geometry, modeling, meshing and the GUI appearance. Use of the API allows users to add new functionality to FEMLAB or remove functionality in order to tailor software of an existing application mode to better fit a particular use as may be associated with a particular user-defined application.

In one embodiment, a user may create and define a user-defined application mode and application. These may be created using classes and subclasses in connection with an object oriented approach in which use of objects and classes allows for the addition of new data types and operations, for example, as may be implemented using MATLAB. The operations and functions that operate on class objects are known as methods collected together in a class directory. The class directory includes a constructor for that class. Generally, a predefined application mode, such as one for heat transfer, may be created as a class. A user defined application may be defined as a subclass of one of these classes. In this manner, the functionality of an existing application mode may be inherited by a new user defined application with additionally having some or all of its functionality overloaded by a subclass allowing for a user to create an application with desired behavior. An application mode may also be defined a the same level as the predefined application modes, such as heat transfer. These user defined application modes may have the same status and use as the predefined application modes. In particular, both predefined and user defined application modes may be used as one of the application modes, for example, when forming a combined multiphysics system as described in more detail elsewhere herein.

An application mode may be created as a class. These classes may be represented in a hierarchical structure. There are a set of base classes at the top of a hierarchy containing the main functionality. The application modes may inherit from base classes, sometimes through convenient intermediate classes that may include methods defining functionality common to several application modes. An example of the class hierarchy may be found in FIG. 24, element 500, as described in more detail elsewhere herein. An application mode may be created by defining parameters on the boundary and the inner domain that will define the equations to be solved, and how to specify these parameters in the GUI. For more streamlined design of the application modes, the available solvers and the initial conditions, post processing expressions, and name of dependent and independent variables may also be modified.

An application mode has a constructor, for example, such as in connection with FIG. 28 described in more detail elsewhere herein. The information for an application mode may be stored in the application mode object and in the fem.appl-structure also described elsewhere herein. Table 510 of FIG. 27 includes properties that may be included in one embodiment of an application mode object. These properties are either inherited from the parent objects, or may also be set explicitly. Table 514 of FIG. 29 includes a listing of the methods that may exist either directly in the application mode class, or in any of the parent classes. The column to the right in this table 514 describes what the methods do.

Additionally, a set of methods may be used by the GUI to set up solvers and dialog boxes as well as submodes for the application modes. In one embodiment, these methods are:

| | |
|---|---|
| bndinfo | sets up boundary conditions dialog box |
| equinfo | sets up PDE coefficients dialog box |
| pdeinfo | contains info about available solvers, solution forms, and submodes |
| sub_conv | gives the relation between old and new variables when changing submode |

Other important methods are the set and get methods that allows for setting and getting of the application mode object properties.

In one embodiment, to define a user-defined application mode, a minimum set of definitions and routines or methods are defined. These include the constructor, appspec, bnd_compute, and equ_compute. appspec is a routine for defining the parameters used in the interior and on the boundaries. Routines equ_compute and bnd_compute define how to set up the equations based on this information from appspec.

In order to use the application mode from the GUI the equinfo and bndinfo methods may be implemented in the application mode class. These methods define how to set up the dialog boxes in the GUI for specifying the parameters.

In contrast to a user-defined application mode is a user-defined application. In the user-defined application, for example, overloading may be performed of some or all of the above methods, in addition to the methods for setting up the GUI, for example, such as fldrawmode, flboundmode, flpdemode, flmeshmode, flsolvemode, fliplotmode in connection with set up some of the menus and toolbars for draw, boundary, PDE, mesh, solve and plotmode, respectively.

Figure 24:
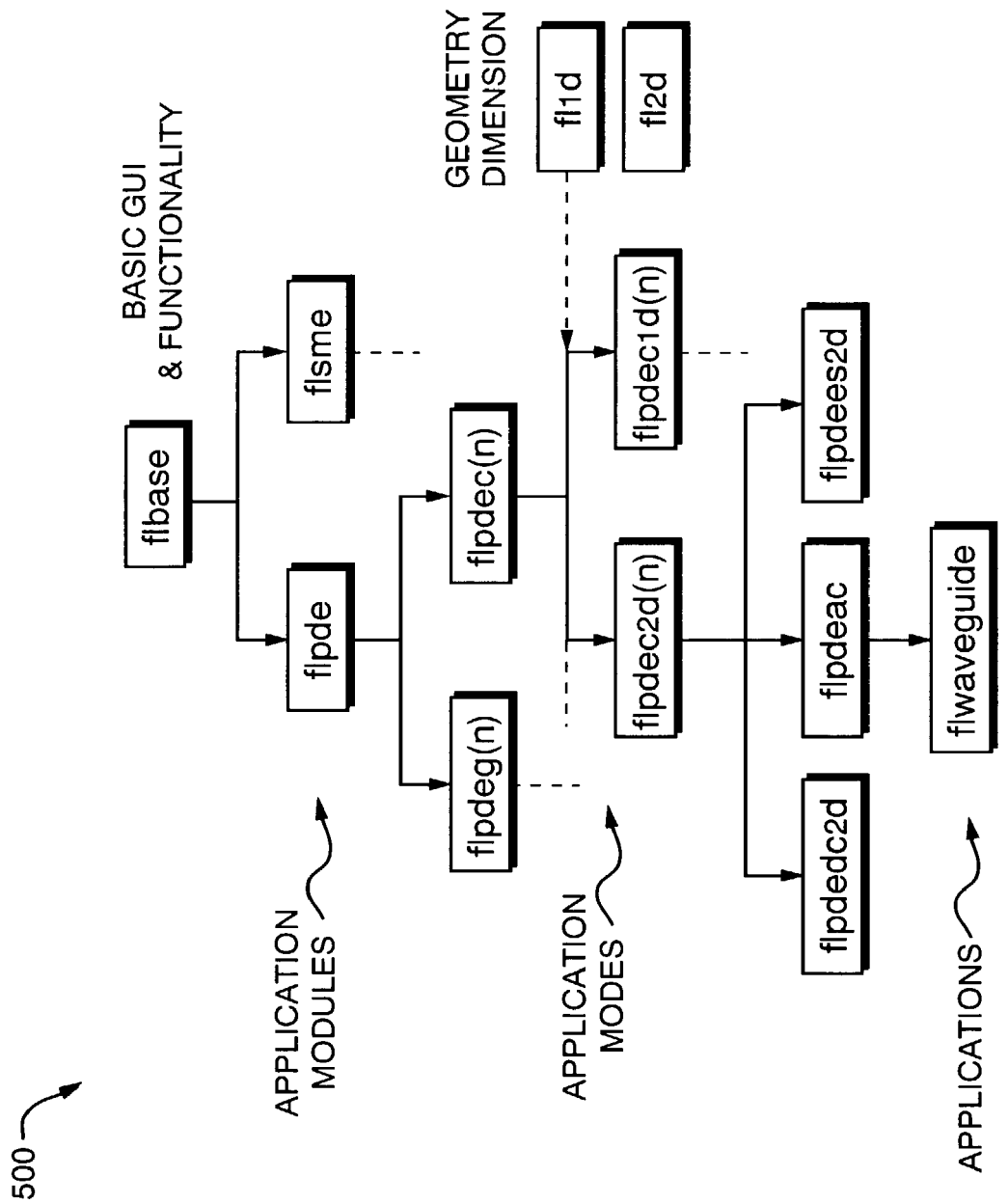
FIG. 24 is an example of a representation of a class hierarchy that may be included in an embodiment in connection with predefined and user defined application modes.

Referring now to FIG. 24, shown is an example of a class structure that may be included in an embodiment in which a user may define application modes. At the base of the class structure is the class flbase to facilitate overloading of generally provided functionality that may be included in an embodiment. The application mode object structure may divide the application mode objects in accordance with two particular criteria: geometry dimension and application modes. For geometry dimension, there are two geometry dimension dependent base classes fld1 and fld2 in which methods may implement dimension dependent functionality, such as draw mode menus, toolbars, mesh drawings, and the like. For application modes, there are three application module base classes of: flpde, which is the parent of all application modes, flsme and flcem which are other classes that may be defined in accordance with other modules and associated functionalities. In flpde, all functionality may reside that is common to all application modes and that is also not dependent on geometry dimension. All application modes may be implemented as subclasses to this class. Additional application-dependent classes may be added to support new applications. They may, for example, be implemented as subclasses of flpde or another application mode. In these class directories, methods that implement application dependent functionality, such as specific dialog box information, and the like may reside. Referring to the structure of the hierarchy illustrated in 500, the application dependent classes take precedence over the geometry dimension classes which also take precedence over the application module class so that, for example, a mesh drawing method in the flpde class may be overridden by the generic 2-D mesh drawing method. Note that the structure 500 may be only a portion of the entire class structure included in an embodiment.

Together with methods, the application objects may define specific properties and behaviors that define an application in the GUI. Referring to FIG. 25, shown are sample 1-D (one-dimensional) application modes 502 and 503. In combination, these two tables may define all predefined application modes included in one embodiment. All 1-D application objects inherit from the application module base class flpde and the geometry class fl1d.

Referring now to FIG. 26, shown are 2-D (two dimensional) application modes that may be defined in an embodiment. The application modes defined in 506 and 508 may include all application modes for 2-D application mode objects. All 2-D application mode objects may inherit from the application module base class flpde and the geometry base class fl2d. All of these classes are subclasses of fl2d and an application mode class. The application mode classes, in turn, are subclasses of flpdec or flpdeg that represent the coefficient and general PDE form, respectively. Note that the PDE mode classes flpdec1, flpdeg1d, flpdec2d and flpdeg2g all accept the number of dependent variables as an input argument thus enabling the creation of PDE modes with an arbitrary number of dependent variables. Calling the constructor function without a dimension argument results in a scalar application mode object.

Referring now to FIG. 27, shown is an example of properties of one embodiment of an application object. Table 510 describes various properties of application objects. Parent is string containing the name of the object class parent. The dim, name and parent properties are initialized explicitly using the application class constructor. Other fields may be inherited by the parent class but may also be initialized using the constructor.

In one embodiment, the application being defined by a user may be a subclass to one of the application mode classes. In one example, suppose a user wants to define a new application, myapp, based on the 2-D heat transfer mode flpdeht2d. A subdirectory may be created in a MATLAB path called @myapp. An example of a constructor may look as in the code snippet 512 of FIG. 28. In this example, the settings for submode, form, tdiff and sdim are from the parent class flpdeht2d. The dim property is explicitly set to be default as may be defined by the method default_dim.

In this embodiment that may use MATLAB, the behavior of MATLAB operators and functions for object arguments may be changed by overloading the relevant functions. This may be accomplished by defining a replacement method with the appropriate name residing in the new class directory at the application level. A user may minimize the number of overloaded methods in an application class being defined by a user by choosing the most appropriate application mode as its parent class. By using the overloading functionality, parts of an existing application may be modified to create application dependent functionality. For example, portions of a GUI, including menus, toolbars, and the like, may be modified to better fit an application as well as methods for overloading the equation definitions.

One embodiment may include a set of methods to provide a portion of the functionality. Referring now to FIG. 29, shown is an example of an embodiment of a portion of functions that may be included in one embodiment. The functions 514 may determine the variables and equations defining a problem. As described in more detail elsewhere herein, it should be noted that the appl field of the fem structure includes application dependent data. Appl is a cell array that contains more than one application mode for multiphysics problems. The foregoing methods may work in connection with a GUI and from the command line. The conversion from the application mode structure in the appl field(s) may be performed by invoking a function called the multiphysics function, which in turn uses another function to compute the equ, bnd, init, dim, usage, border, var, and form fields.

API functions may be included in an embodiment, for example, to allow for adding menus and toolbars to the existing GUI. Additionally, overloading methods may be used, for example, to disable certain functionality associated with a method or provide for an alternative.

Figure 30:
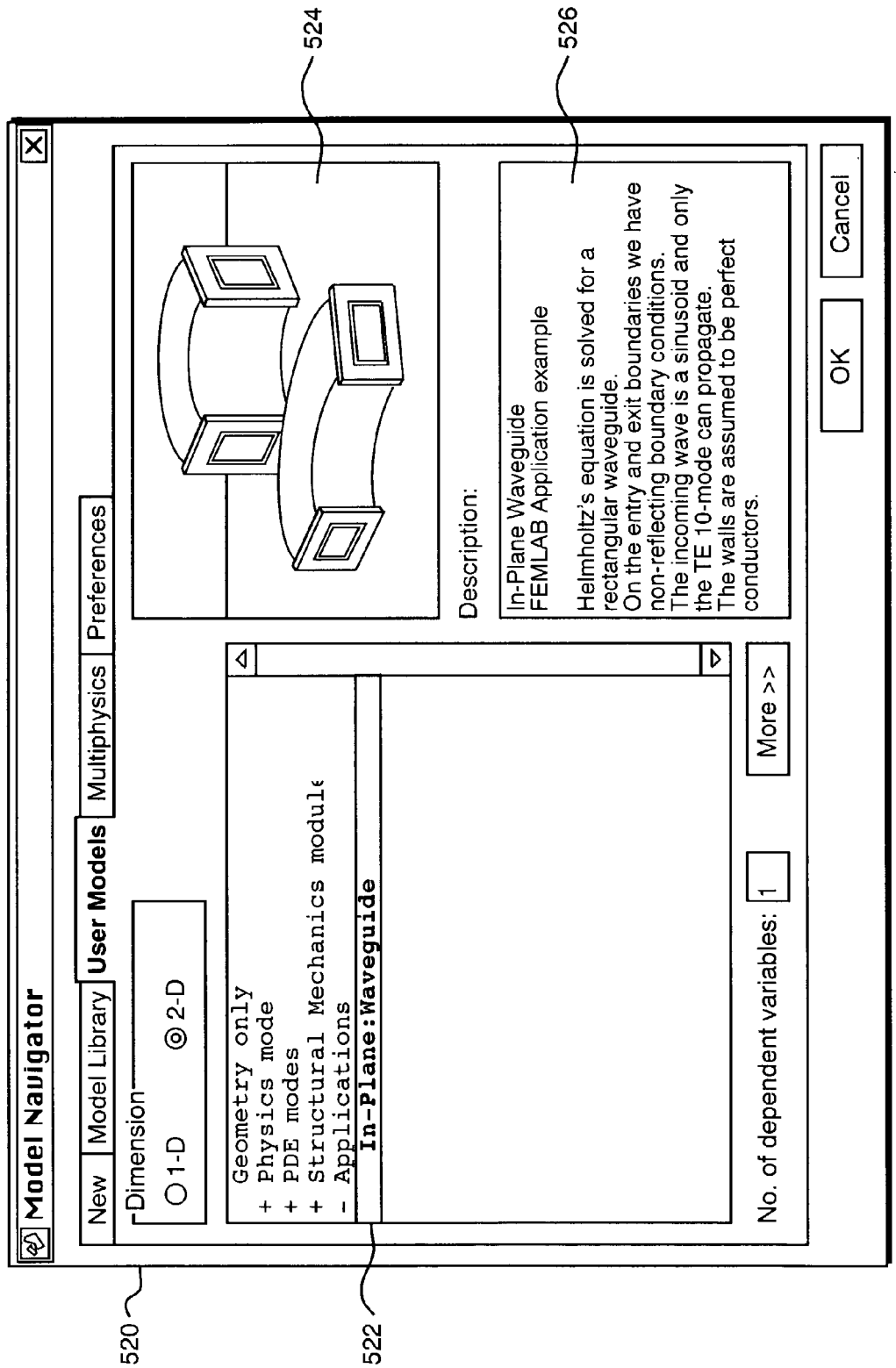
FIG. 30 is an example of a GUI that may be displayed in connection with a user-defined application.

Referring now to FIG. 30, shown is an example of a GUI that may be used in connection with adding an application to the existing GUI. Using the New tab in the GUI 520, a user may browse through the applications. The procedure of adding a new user-defined application may be performed using an API function, for example, fladdappl. Using such an API, an application may be added to the application tree and, optionally, associated text and figure. The description and figure may be displayed when the user defined application is selected. For example, the GUI 520 has a user defined application of "IN-PLANE WAVE GUIDE" selected in 522. Accordingly, an associated image is displayed in 524 and text in 526.

What will now be described is another example of a user-defined application for modeling transmission signals with frequencies in the microwave range, for example, as may be used in the telecom industry. The waves are transmitted through a waveguide with a rectangular cross section. If the wave is bent, the elbow may cause scattering effects preventing the wave from being transmitted through the waveguide. In the following model, a TE wave is modeled in which there is no electric field in the direction of propagation. The dimension of the waveguide and frequency are chosen so that the only mode that can propagate is the $TE_{10}$ mode, that is where the electric field has only one non-zero component that is sinusoidal and vanishes at the walls of the waveguide.

A waveguide may be designed to transmit only frequencies in a narrow band. This band-pass effect may be achieved using a resonance cavity formed by putting conducting posts protruding into the waveguide. The posts may be, for example, metal screws or tuning screws. Equations used to calculate effects may be derived from the wave equation. Time may be eliminated assuming a harmonic planar wave resulting in Helmholtz equation for non-zero electric field component as represented by equation 530 in FIG. 31 in which k is the wave number in the propagating direction. The relation between the wave number k and the frequency f and wavelength $\lambda$ is represented by equation 532 in which c denotes the speed of light.

In this instance, there are three kinds of boundary conditions in the model. At the entrance boundary in which there is a vertical line at x=0, there is an absorbing condition with an incoming sinusoidal wave as in equation 534. The night hand side of 534 is the driving force of the incoming wave. d is the width of the waveguide and yo is the y coordinate of the lower left corner of the waveguide. The wave number depends on the wave number in the direction of propagation ky as in 536. 536 may be derived from solving analytically for a straight waveguide the wave number in the transversal direction may be defined by twice the width of the waveguide. This results in the final expression for the wave number in the propagating direction as a function of the incoming wavelength and width of the waveguide according to 538. At the exit boundary there is an absorbing condition represented as 540 and the walls are assumed to be perfect conductors so that the tangential component of E vanished as in 542. The velocity of light may be calculated from the material parameters and the wavelength is calculated from the frequency and velocity. The cut-off frequency may be calculated from the analytical solution of a straight waveguide as in 544. No waves below this frequency are transmitted through the waveguide.

Using the foregoing waveguide and techniques disclosed herein, the foregoing complexity may be hidden using a GUI. A feature called frequency analysis may be implemented in connection with the waveguide application. What will now be described is an overview of how this may be implemented in one embodiment.

The draw mode for this feature may be implemented using overloading to implement an alternative draw menu and corresponding toolbar buttons. Toolbar icons may be stored in the application class directory as bitmaps. In this example, the draw menu is an alternate menu that includes 5 items: draw mode, straight waveguide, elbow waveguide, geometry parameters and the standard draw menu item Properties. The draw toolbar contains the toolbar buttons straight waveguide, elbow waveguide and geometry parameters. In connection with each of the waveguides, a corresponding figure or image may appear in the GUI. Parameters may be varied in accordance with each of the waveguides by overloading existing methods, for example, by overloading an existing method objdlg in which the geometry is parameterized and the parameters may be stored in a user defined portion of the fem structure on creation. It should be noted that this is a portion of memory allocated for use by the user and not used in this example by the existing methods. Additionally, other functionality may be disabled using overloading, such as to disable importing geometries and cut and paste functionality.

Boundary conditions are "hardwired" according to the equations depending on parameters, for example, as may be defined in the PDE specification GUI. The Boundary menu and related mode buttons may be completely removed using overloading of existing methods. Existing methods are used to define the boundary conditions. Some of the standard PDE mode menu items are removed by overloading the existing method(s). The mesh mode remains the same. Similarly, other modes that are defined and there GUIs, toolbars and the like, may be used and techniques, such as overloading, may be used to implement these as may be desired in accordance with this example and others.

In connection with the waveguide, due to the conversion of time-dependent PDE to a harmonic wave equation, the existing application mode AC Power Electromagnetics mode may be used. The new waveguide application being defined may be implemented, for example, as a subclass to its class, @flp-deac. the waveguide class, named @flwaveguide, may be created on the same directory level as the parent class @flp-deac. An example class constructor is included in 550 of FIG. 32.

Parameters of the waveguide may be specified as in 552 of FIG. 33 and 554 of FIG. 34. The entrybnd and exitbnd fields may be used by a bnd_compute method to set the appropriate boundary conditions. The startpt field may be used to define the incoming sine wave on the entry boundary. The freqs field includes the frequency vector that may be used by the frequency analysis feature.

The geomparam structure is a 2 element structure array including geometry parameters for straight and elbow waveguides that may include fields as in 556 of FIG. 35. The geometry boundaries may be formed by a set of existing objects using the parameters entrylength, exitlength, width and radius. These existing objects may be combined into a single new geometry object using, for example, an API that forms a single object that is a cell array containing the existing objects.

If the resonance cavity is operative, such as by checking a resonance cavity checkbox on one of the GUIs, the protruding posts are subtracted from the geometry. In this instance, the posts may be creates as a set of solid rectangular objects using the specified cavity parameters. The resulting mapping matrices representing this subtraction result may relate the curve and point indices in the input geometries, respectively, to their new indices in the new geometry object. Knowing the order in which the basic object were created to make the new geometry, the index corresponding to each of these basic objects in the final geometry may be calculated and stored in the user structure.

Of the existing methods previously described in connection with 514 of FIG. 29, 6 may be overloaded. These may include, for example: default_equ, equ_compute, default_bnd, bnd_compute, default_var, and posttable. Equ_compute returns the PDE coefficients computed from parameters defined in the appl.equ structure. The ind field includes 1 since there is only one subdomain. Default_bnd method defined default boundary conditions. Bnd_compute computes boundary conditions from the material parameters and the frequency defined in appl.equ. The entrybnd, exitbnd, and startpt fields in the fem.user structure are used to place the correct boundary conditions on the correct boundaries. Default_var returns an empty cell array disabling default scalar variables. It should be noted that this method may have been used to define the incoming frequency as a scalar sub-domain-independent variable instead of as part of the appl.equ structure. In this instance, the frequency may be specified in connection with a different dialog box, such as Application Scalar Variables rather than in connection with the PDE specification dialog box. In posttable, the post processing data is defined. The output variables, descriptions an evaluation expressions may be defined.

Following is an overview of the overloaded GUI methods in the Waveguide application. It should be noted that the following GUI methods may be included in one embodiment. Other embodiments may include other methods or variations of these. Method appspec may be used to define the variable names in the bnd and equ structures of the fem.appl field. appspect for the waveguide may return a structure including fields defining the PDE variables to be scalars and the boundary variables to be boundary coefficients of problem dimension. This information may be used by the appl2fem routine, for example, as described in the FEMLAB V1.1 Reference Manual, FEMLAB V1.1 User's Guide, and FEMLAB V1.1 Model Library, by Computer Solutions (COMSOL) Europe AB. Parts of other functionality described herein may also be fund in the foregoing documentation. This information may also be used by the PDE specification dialog box. The method pdeinfo is used to define the default abbreviation for an application. Only the standard submode, coefficient form and stationary linear solver are available. The equinfo method returns equations, descriptions and parameter names to be displayed in connection with the PDE specification dialog box. The returned cell array of equations in this instance includes one equation due to the stationary linear solver being the only solver. The flboundmode method removes the standard Boundary menu from the GUI and the corresponding boundary mode toolbar is removed from the flviewtbg method. The importing of geometry objects may be disabled by the flimpmenu method returning an empty structure. Flmphmenu removes the multiphysics menu from the GUI by also returning an empty structure of menu handles. The flp-demode method returns a PDE menu structure including only 2 items, PDE mode and PDE specification. flsolvemode method returns a Solve menu structure includes the items solvemode, solveproblem, frequency analysis, and parameters. flmeshcolvtbg replaces the standard restart button with a frequency analysis button in which a corresponding icon is stored as a bitmap in a directory. Similarly, methods in connection with the geometry parameters, initial conditions and the like are modified and/or disabled in accordance with the desired GUIs and functionalities for the waveguide mode. Finally, the waveguide application may be added to the model navigator, such as in connection with the GUI displayed in FIG. 3, by invoking a function. In one embodiment, the following is an example invocation:

fladdappl('flwaveguide', 'In-plane Waveguide')

in which a bitmap flwaveguide.bmp may reside in a class directory. The bitmap may be displayed to the right of the Model Navigator as previously illustrating in connection with GUI 520 of FIG. 30.

In another embodiment, a method is set forth that may be used in connection with specifying non-local couplings of multiphysics systems. This method may also be used in connection with local couplings, for example, as described previously. The method includes a scheme for defining a plurality of variables, as discussed in detail below. A non-local coupling, for example, may be used in coupling a value of a physical quantity from one portion of a domain to another portion of the same domain. In one embodiment, a non-local coupling may be used, for example, to specify couplings when the values of a physical quantity on a boundary of a domain are used in a partial differential equation along parallel lines extending into the domain. Additionally, a non-local coupling may be used, for example, in specifying a coupling when the value of the integral over a portion of a domain is used in the boundary condition of a partial differential equation. Local and non-local couplings as well as the variables that may be used with each type of coupling are described in more detail elsewhere herein.

Furthermore, the method can include an analysis of a multitude of geometries. The data structures used previously can be extended to multiple geometries by storing the previous data structure (fem data structure) in a list in the extended data structure (xfem). Both of these are described in more detail below. Generally, for a geometry number g, the field x in the extended data structure occurs as xfem.fem{g}.x, where xfem.fem{g} is the fem data structure repeated for each geometry in the extended data structure for multiple geometries. When using the multiple geometry data structure, the field xfem.sol contains the solution, and solutions are no longer stored in fem.sol for each geometry. A combined extended mesh for all the geometries is stored in the field xfem.xmesh. The coupling variables are stored in a list in the field xfem.elemcpl. The extended mesh structure xfem.xmesh is described in more detail elsewhere herein.

In one embodiment, there are three different forms of PDEs that may be used, namely, the coefficient form, the general form and the weak form. It should be noted that the coefficient form is most suitable for use with linear or almost linear problems whereas the general form may be used for the non-linear problems. The weak form of an equation is more general than the other two forms, and it is formulated as an equality of integrals. The weak form may be used, for example, in implementing point and line sources. A problem in coefficient form can be converted to general form, and a problem in general form can be converted to weak form. The coefficient form and the general form are described elsewhere herein in more detail.

Assume that there are a number of Euclidean spaces, each equipped with a collection of domains, i.e., volumes, surfaces, curves, or points. The domains may be approximately subdivided into mesh elements, constituting a mesh as described elsewhere herein using standard mesh generation techniques, for example, as described in the text by Frey, P. J. & George, P. L., entitled "*Mesh Generation*, application to finite elements", HERMES Science Publishing, 2000. Commonly used mesh elements, as known to those of ordinary skill in the art, may include, for example, tetrahedrons, triangles, and line segments. On each mesh element, local (barycentric) coordinates may be defined, for example, as described in "*Mesh Generation*, application to finite elements" by Frey et al. Couplings including variables may be used to define relationships between multiple geometries as well as for a single geometry.

The starting point for the finite element method is a mesh, that is, a partition of the geometry into small units of a simple shape. In 1-D, the sub domains are partitioned into smaller mesh intervals or mesh elements. The endpoints of the mesh intervals are called mesh vertices.

In 2-D, the subdomains are partitioned into triangles or mesh elements. This is only an approximation, since a boundary can be curved. The sides of the triangles are called mesh edges and the corners mesh vertices. A mesh edge must not contain mesh vertices in its interior. Similarly, the boundaries defined in the geometry are partitioned (approximately) into mesh edges, boundary elements, which conform with the triangles if there is an adjacent subdomain. There may also be isolated points in the geometry that also become mesh vertices.

Similarly, for 3-D geometries, the subdomains are partitioned into tetrahedrons (mesh elements) having faces, edges and corners that may be respectively referred to as mesh faces, mesh edges, and mesh vertices. The boundaries in the geometry are partitioned into boundary elements (mesh faces). The edges in the geometry are partitioned into mesh edges. Isolated geometry vertices become mesh vertices.

It should be noted that mesh vertices are sometimes called node points. When considering a d-dimensional domain in the geometry, such as a subdomain, boundary, edge or vertex, then by its mesh elements, we mean the d-dimensional mesh elements included in the domain. An embodiment may include a function for creating and initializing a mesh structure described herein.

For each of the geometries described herein, there is a mesh. Once a mesh is defined using techniques also described elsewhere herein, approximations may be introduced for the dependent variables. For example, in considering a single variable u may be approximated with a function that can be described by a finite number of parameters also referred as the degrees of freedom or DOF. This approximation may be inserted into the weak equation to get a system of equations for the DOFs.

As an example, consider a mesh in one dimension consisting of two mesh intervals $0<x<1$ and $1<x<2$. Consider a variable u that is represented with linear finite elements. This means that on each mesh interval, the continuous function u is linear. Therefore, in order to characterize u, it suffices to specify the values of u at the node points $x_1=0$, $x_2=1$, and $x_3=2$. We denote these values $U_1=u(0)$, $U_2=u(1)$, $U_3=u(2)$. These quantities $U_1$, $U_2$, and $U_3$ are called the degrees of freedom. The function u may be represented as:

$$u(x)=U_1f_1(x)+U_2f_2(x)+U_3f_3(x)$$

where $f_1(x)$ are certain piecewise linear functions, called the basis functions. Namely, $f_i(x)$ is the function which is linear on each of the mesh intervals, and is equal to 1 at the ith node point and 0 at the other node points. For example, $$f_1(x) = \begin{cases} 1-x & \text{if } 0 \leq x \leq 1 \\ 0 & \text{if } 1 \leq x \leq 2 \end{cases}$$

The set of functions u(x) constitutes a linear function space, called the finite element space.

If better accuracy is desired, another finite element space corresponding to quadratic elements may also be considered. Functions u in this space are second order polynomials on each mesh interval. To characterize such a function u, node points can be introduced at the mid-point of each mesh interval. For example, $x_4=0.5$ and $x_5=1.5$. Accordingly, corresponding degrees of freedom may also be introduced for each of these points, $U_i=u(x_i)$. Then on each mesh interval, the second degree polynomial u(x) is determined by the degrees of freedom at the end points and the mid-point. Accordingly, $$u(x)=U_1f_1(x)+U_2f_2(x)+U_3f_3(x)+U_4f_4(x)+U_5f_5(x)$$

where the basis functions $f_1(x)$ now have a different meaning. $f_1(x)$ is the piecewise quadratic function that is 1 at the ith node point and a zero at the other node points. For example, $$f_1(x) = \begin{cases} (1-x)(1-2x) & \text{if } 0 \leq x \leq 1 \\ 0 & \text{if } 1 \leq x \leq 2 \end{cases}$$

In general, a finite element space may be specified by giving a set of basis functions. The basis functions can be represented using local coordinates or element coordinates. For example, consider a mesh element of a dimension d in an n-dimensional geometry having space coordinates denoted $x_1, \ldots, x_n$. Also consider the standard d-dimensional simplex represented as:

$$\xi_1 \leftarrow 0, \xi_2 \leftarrow 0, \ldots \xi_d \leftarrow 0, \xi_1 + \cdots + \xi_d \leftarrow 1$$

which resides in the local coordinate space parameterized by the local coordinates $\xi_1 \ldots \xi_d$. If d=1, then the simplex is the unit interval. If d=2, then the simplex is a triangle with two 45 degree angles, and if d=3 it is a tetrahedron. Now our mesh element can be viewed as a linear transformation of the standard simplex. Namely, by letting the global space coordinates $x_i$ be suitable linear functions of the local coordinates $\xi_k$, the mesh element may be the image of the standard simplex. This means that in the local coordinate system, the corners of the mesh element have all $\xi_k=0$, except at for at most one k, for which $\xi_k=1$. When described in terms of the local coordinates, the basis functions may assume one of a few basic shapes, for example, as defined in the fem structure described elsewhere herein. With linear elements in 1-D, any basis function on any mesh element is one of the following:

$$\phi=\xi_1 \quad \phi=1-\xi_1 \quad \phi=0$$

The first two above are the shape functions in this example. For quadratic elements in 1-D, the shape functions are $$\phi=(1-\xi_1)(1-2\xi_1) \quad \phi=4\xi_1(1-\xi_1) \quad \phi=\xi_1(2\xi_1-1)$$

The foregoing examples are special cases of the Lagrange element. To describe the Lagrange element, one needs to fix a positive integer k that is called the order of the Lagrange element. The functions u in the Lagrange finite element spaces are piecewise polynomials of the degree k such that on each mesh element, u is a polynomial of degree k. To describe such a function, it suffices to give its values in the Lagrange points of order k. These are the points whose local coordinates are integer multiples of 1/k. For each of these nodes $p_i$, there is a degree of freedom $U_i=u(p_i)$ and a basis function $f_i$. The restriction of the basis function to a mesh element is a polynomial of degree at most k in the local coordinates such that $f_i=1$ at node i, and 0 at all other nodes. Thus, the basis functions are continuous, and $$u = \sum_i U_i f_i$$

The Lagrange element of order 1 is called the linear element and the Lagrange element of order 2 is called the quadratic element.

What will now be described are different types of variables that may be included in an embodiment for use in defining local and non-local couplings. Other embodiments may include variables having different names and types including the concepts used herein. In one embodiment variables may be used which are functions on the domains. An embodiment may include basic variables, auxiliary variables, glued variables, mapped variables and integrated variables.

Basic variables may be defined and then other types of variables and new variables may be defined in terms of existing variables. For example, the auxiliary variables and the glued variables, which are discussed in detail elsewhere herein, may be used to implement local couplings between existing variables and new variables. A local coupling means that the value of a new variable in a point depends only on the values of the existing variables in the same point. A non-local coupling means that the value of the new variable at a point may depend on values of existing variables in distant points. Mapped variables and integrated variables, which are also discussed elsewhere herein, may be used to define non-local couplings between existing and new variables. In accordance with the method of this embodiment, it is possible to model physical quantities using local and non-local couplings.

In an embodiment, a basic variable V may be defined in terms of a number of basis functions Fi (i is an index). The notion of basis function is the usual one used in finite element analysis, see Zienkiewicz, O. C. & Taylor, R. L., *The Finite Element Method*, vol. 1, McGraw-Hill, 1994.

Each basis function is a function defined on some of the domains. Its restriction to each mesh element is a smooth function (often a polynomial in the local coordinates), and it is nonzero only on a few mesh elements. To each basis function there is associated a parameter Ui, which is called the degree of freedom ("DOF"). The variable V is defined as the sum of Ui*Fi over all indices "i", where the "*" operator denotes a multiplication operation.

In the data structures of this embodiment, the basic variable names and their associated types of basis functions are stored in the fields xfem.fem{g}.shape, where g is the geometry number. This field is a list of shape function objects. Each shape function object defines a number of basic variables, and the basis functions that are used for these variables. In one embodiment using object oriented programming concepts written in, for example, C++, a number of methods may be applied on the shape function objects. For example, there is a method that may compute values of the basis functions which may be characterized as polynomial functions representing a shape function object. The domains of definitions for the basic variables are determined by the fields xfem.fem{g}.*.shape, where * may be equ, bnd, edg, or pnt.

It should be noted that an embodiment may include a shorthand feature for defining which properties, shape function objects, and the like apply to a plurality of domains. The plurality of domains may be referred to as a domain group which is also referred to as the ind group or field described elsewhere herein. For example, a model may be defined in which a first set of material properties applies to 50 domains and a second set of material properties applies to another 50 domains. Rather than repeat the set of properties for each domain, a single set of defined properties may be defined and associated with a group of domains. An embodiment may include the concept of a domain group implemented in any one of a variety of different ways in which a single set of properties is commonly applied to a plurality of domains rather than use a 1-1 relationship to define and associate a single set of properties with a single domain.

Auxiliary variables of an embodiment may be defined by letting V1, V2, . . . , Vn be a number of variables, which are all defined on some domain. The auxiliary variables can be further defined by letting E(V1, V2, . . . , Vn) be a function of these variables (an expression). Then an auxiliary variable W can be defined in the following way: W=E(V1, V2, . . . , Vn).

An embodiment may define glued variables using a number of disjoint domains that are numbered 1, 2, . . . , n. The glued variables can be further defined by letting V1, V2, . . . , Vn be a number of variables, where Vk is defined on domain number k. Then a glued variable W can be defined on the union of the domains in the following way: W=Vk on domain k, for all k.

An embodiment may define the mapped variables by letting F be a mapping from a destination domain to a source domain. The mapped variables can be further defined letting V be a variable defined on the source domain. Then a mapped variable W can be defined on the destination domain by W=V(F).

An embodiment of the integrated variables can be defined by letting V be a variable defined on a d-dimensional domain M in some d-dimensional Euclidean space. The integrated variables can be further defined by letting b<d, and letting P be the projection onto a b-dimensional Euclidean space defined by P(p,y)=p, where p and y are b-tuples and (d-b)-tuples of real numbers, respectively. Here we consider (p,y) as a point in the d-dimensional space. Further assume that the projection of M, P(M), is a domain. Then an integrated variable W can be defined on P(M) in the following way: for each point p in P(M), the value W(p) is defined as the integral of V over the subset of M that is projected onto p by P.

The plurality of variables, as described above, can be combined into any one or more of a plurality of permutations to form other variables. For example, integration along curved domains can be implemented by combining mapped variables and integrated variables. However, it may be clearer if the steps are separated, as described above. In an embodiment, some examples of these combinations of the above variables types, can include Expression variables, Boundary coupled variables, Scalar coupling variables, Extrusion coupling variables and Projection coupling variables, which are each described in detail below.

An embodiment may define Expression variables using a number of disjoint domains that are numbered 1, 2, . . . , n. Let E1, E2, . . . , En be a number of expressions, where Ek is defined on domain number k. Then an expression variable W can be defined on the union of the domains in the following way: W=Ek on domain k, for all k. In this instance, the expression variable can be represented as a glued variable, where the variables that are glued together are auxiliary variables. This is done by introducing names V1, . . . , Vn for the expressions E1, . . . , En. The expression variables are defined in the fields xfem.fem{g}.*.expr, where * is equ, bnd, edg, or pnt, and g is the geometry number. The expr field is a list of alternating variable names and defining expressions. A defining expression can be substituted with a list of expressions, where the nth expression applies to the nth domain group.

An embodiment may define Scalar coupling variables by defining new variables as expressions of variables, which are evaluated somewhere else. The variable is defined as the integral of an expression over some domains. Such a variable can be defined by the following data that may be included in a data structure and associated fields in an embodiment:

c.elem=elcplscalar;
c.src.g= . . . ;
c.src.equ.var= . . . ;
c.src.equ.ind= . . . ;
c.src.bnd.var= . . . ;
c.src.bnd.ind= . . . ;
c.src.edg.var= . . . ;
c.src.edg.ind= . . . ;
c.src.pnt.var= . . . ;
c.src.pnt.ind= . . . ;
c.dst.g= . . . ;
c.dst.equ.ind= . . . ;
c.dst.bnd.ind= . . . ;
c.dst.edg.ind= . . . ;
c.dst.pnt.ind= . . . ;
xfem.elemcpl{iel}=c;

What will now be described are the data fields set forth above. The above described data creates a scalar coupling variable element structure c with index iel with the field c.elem above. The src field defines the new scalar variables in terms of integrals of expressions over geometry src.g (which defaults to 1). Src.equ.var defines variables in terms of integrals over subdomains. Further, src.equ.var is a cell vector with alternating variable names and expressions. The expressions can be numeric constants, strings or cell vector of such. If the expression is a cell vector, then its nth component applies to the nth subdomain group. The subdomain groups are defined by the src.equ.ind field. The default subdomain grouping is that all subdomains are in one group. The variable is defined to have the value obtained by integrating the expression over the subdomain groups. If required, a field src.gporder or src.equ.gporder can be given to specify the order of the quadrature formula to use in numerical integration as described, for example, in Cook, R. D., Malkus, D. S., & Plesha, M. E., *Concepts and Applications of Finite Element Analysis*, Wiley, 1988 and Zienkiewicz, O. C. & Taylor, R. L., *The Finite Element Method*, vol. 1, McGraw-Hill, 1994. The order should be a positive integer, and, in one embodiment, the default is 2.

Similarly, src.bnd, src.edg, and src.pnt define scalar variables as integrals over boundaries, edges, and vertices, respectively an integral over a vertex is just the value of the integrand at the vertex). By default, the variables defined in src can be used everywhere in a geometry under analysis. The optional field dst can be used to specify the domains of definition for the variables in detail. Dst.g specifies the geometry number on which the variables are defined (defaults to 1). The dst.***.ind fields specify on which domains the variables are defined.

A variable defined, as described above, may be referred to as a scalar coupling variable. Such a variable can be seen as a combination, for example, of an expression variable, an integrated variable and a mapped variable, as follows. The expressions in src.***.var define an expression variable. The expression variable may be integrated over its domain of definition, producing an integrated variable that is defined on a zero-dimensional space. The integrated variable may be further mapped to the destination domain using the mapping F that sends all points to the point in the zero-dimensional space.

An embodiment may define Extrusion coupling variables by defining new variables as expressions of variables evaluated somewhere else. The Extrusion coupling variables are defined in a source domain and used in a destination domain. The value of the variable at an evaluation point in the destination domain is found by evaluating an expression at a point in the source domain, where the choice of point in the source domain is dependent on the position of the evaluation point in the destination domain.

An extrusion coupling variable can be defined by the following data fields as may be included in a data structure in an embodiment:

c.elem=elcplextr;
c.src.g= . . . ;
c.src.equ.var= . . . ;
c.src.equ.ind= . . . ;
c.src.bnd.var= . . . ;
c.src.bnd.ind= . . . ;
c.src.edg.var= . . . ;
c.src.edg.ind= . . . ;
c.src.pnt.var= . . . ;
c.src.pnt.ind= . . . ;
c.src.meshp= . . . ;
c.dst.g= . . . ;
c.dst.equ.ind= . . . ;
c.dst.bnd.ind= . . . ;
c.dst.edg.ind= . . . ;
c.dst.pnt.ind= . . . ;
c.dst.ep= . . . ;
xfem.elemcpl{iel}=c;

The foregoing fields will now be described in more detail. The above described data creates an extrusion coupling variable element structure c with index iel with c.elem above. The extrusion coupling variables are similar to scalar coupling variables in that the basic fields in dst and src of the element structure are the same. That is to say, that dst defines the geometry and domains, where the variables are available, and src defines the variable names and associated expressions, and the geometry and domains from which they are defined. For extrusion coupling variables, the main difference is that src has a new field meshp, and dst has a new field ep. These describe the way in which an evaluation point in the destination domain is associated with a point in the source domain.

The src field defines the new variables in terms of expressions on geometry src.g (which defaults to 1). Src.equ.var defines variables in terms of expressions on subdomains. Further, src.equ.var is a cell vector with alternating variable names and expressions. The expressions can be numeric constants, strings or cell vector of such. If it is a cell vector, then its nth component applies to the nth subdomain group. The subdomain groups are defined by the src.equ.ind field, and it has the usual syntax. The default subdomain grouping is that all subdomains are in one group. Similarly, src.bnd, src.edg, and src.pnt define variables in terms of expressions on boundaries, edges, and vertices, respectively. In addition, the term dst.g specifies the geometry number on which the variables are defined (defaults to 1). The dst.***.ind fields specify on which domains the variables are defined.

The expressions in src.***.var may be used to define a number of variables, in the same way as expression variables are defined, in which the variables are defined in the source domain. Consider a variable, v1. What will now be described is how the values of the variable v1 are transferred to the destination domain, thus defining the variable w1 in the destination domain. The field src.meshp as described in more detail elsewhere herein is a cell vector of expressions, one for each space dimension in the source domain. These expressions define the components of a mapping Fs, which maps the source domain into an auxiliary Euclidean space of the same dimension. It is assumed that the inverse of this mapping, Fsi, exists. The inverse Fsi can be computed by search in the image of the source domain mesh under Fs (see Frey, P. J. & George, P.-L., *Mesh Generation*, application to finite elements, HERMES Science Publishing, 2000, pp. 89-90) and linear interpolation, followed by Newton iteration. Similarly, the field dst.ep may be a cell vector of expressions, where the number of expressions is the same as the dimension of the auxiliary Euclidean space. These expressions define the components of a mapping Fd, which maps the destination domain into the auxiliary space. Now the variable w1 is defined on the destination domain by the formula w1(p)=v1(Fsi(Fd(p))), where p denotes points in the destination domain. The variable w1 may be referred to as an extrusion coupling variable. Based on the foregoing, w1 may be obtained as a combination of an expression variable and mapped variables. Namely, first the expression variable v1 is created. Then v1 is mapped to the auxiliary space using the mapping Fsi resulting in a mapped variable in the auxiliary space. Then this is further mapped to the destination domain using the mapping Fd producing a mapped variable, such as w1.

In an embodiment, Projection coupling variables may be defined as line integrals of expressions evaluated somewhere else. The variables are defined in a source domain and used in a destination domain. The value of the variable at an evaluation point in the destination domain is found by evaluating a line integral of an expression at in the source domain, where the choice of line (curve) in the source domain is dependent on the position of the evaluation point in the destination domain.

A projection coupling variable may be defined using the following fields included in a data structure in an embodiment:

c.elem=elcplproj;
c.src.g= . . . ;
c.src.equ.var= . . . ;
c.src.equ.ind= . . . ;
c.src.bnd.var= . . . ;
c.src.bnd.ind= . . . ;
c.src.meshp= . . . ;
c.dst.g= . . . ;
c.dst.equ.ind= . . . ;
c.dst.bnd.ind= . . . ;
c.dst.edg.ind= . . . ;
c.dst.pnt.ind= . . . ;
c.dst.ep= . . . ;
xfem.elemcpl{iel}=c;

The foregoing data fields will now be described in more detail. The above described data defines a projection coupling variable element structure c with index iel with c.elem as defined above. Projection coupling variables are similar to elcplscalar in that the fields included in dst and src of the element structure are the same. In other words, dst defines the geometry and domains where the variables are available, and src defines the variable names and associated expressions, and the geometry and domains from which they are defined. For projection coupling variables, the main difference is that src has a new field meshp, and dst has a new field ep. These describe the way in which an evaluation point in the destination domain is associated with points in the source domain. The fields meshp, and ep are similar to elcplextr, with a few small changes.

The src field defines the new variables in terms of expressions on geometry src.g (which defaults to 1). Src.equ.var defines variables in terms of expressions on subdomains. It is a cell vector with alternating variable names and expressions. The expressions can be numeric constants, strings or cell vector of such. If it is a cell vector, then its nth component applies to the nth subdomain group. The subdomain groups are defined by the src.equ.ind field, and it has the usual syntax. The default subdomain grouping is that all subdomains are in one group. Similarly, src.bnd, src.edg, and src.pnt define variables in terms of expressions on boundaries, edges, and vertices, respectively.

Dst.g specifies the geometry number on which the variables are defined (defaults to 1). The dst.***.ind fields specify on which domains the variables are defined. They have the usual syntax.

The expressions in src.***.var may be used to define a number of variables, in the same way as expression variables are defined, in the source domain. Consider one of these variables v1. What will now be described is how the values of the variable v1 may be transferred to the destination domain, thus defining the variable w1 in the destination domain. The field src.meshp is a cell vector of expressions, one for each space dimension in the source domain and may be used in defining the components of a mapping Fs, which maps the source domain into an auxiliary Euclidean space of the same dimension. It is assumed that the inverse of this mapping, Fsi, exists. The inverse Fsi may be computed by searching in the image of the source domain mesh under Fs (see Frey, P. J. & George, P.-L., *Mesh Generation*, application to finite elements, HERMES Science Publishing, 2000, pp. 89-90) and linear interpolation, followed by Newton iteration. A temporary variable, v2, may be defined in the auxiliary space by the formula v2(p)=v1(Fsi(p)), where p denotes points in the auxiliary space. The field dst.ep may be a cell vector of expressions, where the number of expressions is one less than the dimension of the auxiliary Euclidean space in which the expressions define the components of a mapping Fd, which maps the destination domain into a subspace of the the auxiliary space. This subspace is defined as the subspace in which the last coordinate is zero. Define a further variable v3 on this subspace as the integrated variable obtained from v2 by integration along lines orthogonal to the subspace. Finally, the variable w1 is defined on the destination domain by the formula w1(p)=v2(Fd(p)), where p denotes points in the destination domain. Based on the foregoing, the variable w1 may be referred to as aprojection coupling variable. Also based on the foregoing, w1 may be obtained as a combination of an expression variable (v1), a mapped variable (v2), an integrated variable (v3), and a mapped variable (w1).

An embodiment can define Boundary coupled variables on boundaries in the following manner. Given is an expression E defined on a subdomain. Then a Boundary coupled variable W can be defined by W=E on a boundary that touches this subdomain. Thus a Boundary coupled variable is a special case of a mapped variable (of an auxiliary variable), where the mapping F is the identity mapping from a boundary into an adjacent subdomain. Optionally, one can start with two expressions Eu and Ed that are defined on the two adjacent subdomains to a boundary, respectively. Then a Boundary coupled variable W can be defined on the boundary as W=(Eu+Ed)/2. In this case, W is the mean value of two mapped variables. The data structure that defines Boundary coupled variables can have the form c.elem=elcplbnd; /**this represents the boundary coupled variable type of structure */
    c.g=g;
    c.bnd.varu=varu;
    c.bnd.vard=vard;
    c.bnd.varm=varm;
    c.bnd.ind=ind;
    xfem.elemc{i}=c;
    where the foregoing fields are described in following paragraphs. The above creates a boundary coupled variable element structure c with index i. The variable definitions given by varu, vard, and varm will be active only in geometry number g. If the ind field is given, the definitions will apply only in the specified boundary groups-.Varu, vard, and varm are cell vectors
    {vamame1 expr1 varnme2 expr2 ... } with alternating variable names and defining expressions. The expressions can be numerical constants, strings, or cell vectors of numerical constants and strings. In the case of a cell vector, its nth component applies to the nth group of boundaries given by ind (if an ind field is not given, the first entry of the cell vector applies to all boundaries). Otherwise, the expression applies to all boundary groups.

For varu and vard, the value of the variable is the expression evaluated in the upper/lower subdomain, or zero if there is no upper/lower subdomain. For varm, the value is the mean of the upper and lower values on an inner boundary, the adjoining value on an outer boundary, and NaN if there is no subdomain on either side.

An embodiment of the method may further include a scheme for numerical computation of the values of a variable in accordance with each type as one of a basic variable, an auxiliary variable, a glued variable, a mapped variable, and an integrated variable. For example, assume that a user wants to compute the values of the variable W in the points p1, p2, ..., pm, given values Ui for the DOFs. The points pj are specified by giving the values of the local coordinates, and the mesh elements in which they reside. The result can be represented as a row vector, where the jth component is W(pj). Depending on what type of variable W is, there are five possible cases, e.g., W is a basic variable, W is an auxiliary variable, W is a glued variable, W is a mapped variable and W is an integrated variable, which are described in detail below. If W is a basic variable, its values can be computed directly. If W is any of the other types of variables, the values of the variables occurring in the definition of W should first be computed. Thus, a recursive scheme is set forth for computation of the values.

In the case where W is a basic variable, as described above, W is the sum of Ui*Fi over all indices i. Values are given by W(pj)=sum of Ui*Fi(pj) over all i. Since pj is given in local coordinates, and Fi is a polynomial, it is easy and well known how to evaluate Fi(pj).

In the case where W is an auxiliary variable, W=E(V1, V2, ..., Vn), as described above, the values of the variables V1, V2, ..., Vn in the points pj are determined. The values of W may then be computed as W(pj)=E(V1(pj), V2(pj), ..., Vn(pj)), by evaluating this expression. Note: if the expressions are parsed on the fly, it is wise to carry out the evaluation on a large set of points in parallel, in order to save computation time.

In the case where W is a glued variable, W(pj)=Vk(pj) for those points pj, which are in domain k, as described above. For each k, let the vector Ik contain the indices j of the points pj that lie in domain k. First compute the values of the variables V1, V2, ..., Vn. In other words, compute the values of the variable Vk in the points pj, where j is in Ik. Subsequently, define W(pj)=Vk(pj) for j in Ik.

In the case where W is a mapped variable, W(pj)=V(qj), where qj are the points qj=F(pj), as described above. These points are computed in the following way: First, the global coordinates for the points pj are computed, and the global coordinates for the points qj are computed by the formula qj=F(pj). Then, a search algorithm may be used to find the mesh elements in which the points qj reside in, and the corresponding local coordinates. Such search algorithms are known to those of ordinary skill in the art, for example, at pages 89-90 of "Mesh Generation Application to Finite Elements" by Frey et al. also referenced elsewhere herein. Subsequently, the variable V is computed in the points qj. The result is identical with the requested values, namely the values of W in the points pj.

In the case where W is an integrated variable, W(pj) is the integral of V(pj,y) over all y such that (pj,y) lies in the domain of V, as described elsewhere herein. This integral is approximated with a quadrature formula in the standard way, i.e., W(pj) is approximated with the sum of V(pj,yjk)*wjk over some indices k (the index set can depend on j), see for example, Zienkiewicz, O. C. & Taylor, R. L., *The Finite Element Method*, vol. 1, McGraw-Hill, 1994. The numbers wjk are called the weights. Let q1, q2, ... be the points (pj,yjk) in some order, and let w1, w2, ... be the corresponding ordering of the weights wjk. Create the index vector J in the following way: J(1) is the index j for which q1=(pj,yjk) (for some k). Thus J maps from indices of the points q1, q2, ... to indices of the projected points pj. Now compute the values of the variable V in the points q1, q2, .... The result is represented by a row vector R. The values for the variable W can be now be computed as follows. W(pj)=sum of R(1)*w(1), where the sum is taken over all 1 such that J(1)=j.

An embodiment may also include a format for numerical representation of the Jacobian of a variable. The Jacobian of a variable V may be defined as the vector consisting of the first partial derivatives of V with respect to the DOFs, denoted as a vector U=[U1, ... Un] where n is the number of DOFs. The partial derivative of V with respect to Ui is denoted DiV. Assume that we want to evaluate the Jacobian of V in a number of points p1, p2, . . . , pm. The Jacobian of V in these points can be represented by a number of contributions J1, J2. The number of contributions used in computing the Jacobian of a variable may vary in accordance with each variable's type and complexity. It should be noted that in the following description, the references to VAL, DOF and EP are variables used and referenced elsewhere herein in processing steps when computing the Jacobian. Each contribution Jk consists of three things: A matrix Jk.VAL, a matrix Jk.DOF, and a row vector Jk.EP. For a fixed index k, the matrices Jk.VAL and Jk.DOF have the same size, and they have the same number of columns as Jk.EP. The DOF matrix contains degree of freedom indices, and the VAL matrix contains the corresponding contributions to the value of the partial derivative. The EP vector contains evaluation point indices. More precisely, this means that the partial derivative DiV(pj) is equal to the sum of Jk.VAL(r,c), where the sum is taken over all k, r, and c such that Jk.DOF(r,c)=i and Jk.EP(c)=j. Note that r and c denote the row and column indices, respectively, in the matrices. Often, the vector Jk.EP is [1 2 . . . m]. In order to conserve memory space, the EP vector can be omitted in this case.

It should be noted that the Jacobian of a variable with respect to the degrees of freedom should not be confused with the stiffness matrix described elsewhere herein in which the stiffness matrix is the Jacobian matrix of the residual with respect to the degrees of freedom.

The points p1, p2, . . . , pm may be uniformly distributed in the mesh elements. In other words, the first b points lie in the first mesh element, the next b points lie in the second mesh element, etc. In this case, the local coordinates may also be the same in all mesh elements. This type of local point data may be referred to as structured point data, and the general case is called unstructured point data. For a basic variable, structured point data means that the matrices Jk.DOF can be compressed. Namely, the first b columns of Jk.DOF are identical, the next b columns of Jk.DOF are identical, etc. A more compact format can be realized by keeping only every bth column of Jk.DOF. This compact format can be preserved as long as only basic variables, auxiliary variables, and glued variables are used. In using "structured" data, element coordinates for the evaluation points are the same for all mesh elements. With unstructured point data, element coordinates are specified for each evaluation point individually.

Additionally, an embodiment may also include a scheme for a numerical computation of the Jacobian of a variable. Assume that it is desired to compute the Jacobian of a variable W in the points p 1, p2, . . . , pm, given values for the DOFs Ui. The points pj are specified by giving the values of the local coordinates, and the mesh elements in which they reside. The result can be represented in the format described above. Depending on what type of variable W is, there are five possible cases, e.g. W is a basic variable, W is an auxiliary variable, W is a glued variable, W is a mapped variable or W is an integrated variable, which are discussed in detail below. If W is a basic variable, the Jacobian can be computed directly. If W is any of the other types of variables, the Jacobians of the variables occurring in the definition of W must first be computed. Thus, a recursive scheme is set forth for computation of the Jacobian.

In the case where W is a basic variable, recall that W is the sum of Ui*Fi over all indices i. Thus, the partial derivatives are DiV(pj)=Fi(pj). The Jacobian can represented with just one contribution J1. The vector J1.EP may be represented as a vector [1 2 3 . . . m]. Consider the mesh element in which the point pj lies. Only a few basis functions are nonzero on this mesh element. The indices i of these basis functions constitute the jth column of the matrix J1.DOF. The corresponding values Fi(pj) make up the jth column of the matrix J1.VAL. Since pj is given in local coordinates, and Fi is a polynomial, it is easy and well known how to evaluate Fi(pj).

In the case where W is an auxiliary variable, recall that W=E(V1, V2, . . . , Vn). By the chain rule, $$D_i W(p_j) = \sum_k \frac{\partial E}{\partial V_k}(p_j) D_i V_k(p_j).$$

First compute the Jacobians of the variables Vk, k=1, 2, . . . , n. These are represented by the contributions Jkl, for each variable "k" having one or more "l" contributions (where the index l can run over different sets for the different k). Compute the partial derivatives of E symbolically, for example, as described in Davenport, J. H., Siret, Y. & Tournier, E., *Computer Algebra*, systems and algorithms for algebraic computation, Academic Press, 1993, and evaluate the partial derivatives in the points pj, using the algorithm described above. Store the result in the vectors Ck:

$$C_k(j) = \frac{\partial E}{\partial V_k}(p_j)$$

Now the Jacobian of W can be represented by the contributions Kkl, which are computed as follows. The EP and DOF matrices are the same as for the variables Vk: Kkl.EP=Jkl.EP and Kkl.DOF=Jkl.DOF. The VAL matrices are computed as follows: Kkl.VAL(r,c)=Ck(Jkl.EP(c))*Jkl.VAL(r,c). The calculated contributions Kkl should then be reindexed in terms of just one index.

In the case where W is a glued variable, recall that W(pj)=Vk(pj) for those points pj which are in domain k. For each k, let the vector Ik contain the indices j of the points pj that lie in domain k. First compute the Jacobians of the variables V1, V2, . . . , Vn. More precisely, compute the Jacobian of the variable Vk in the points pj, where j is in Ik. This Jacobian is represented by the contributions Jkl (where the index l can run over different sets for the different k). Now the Jacobian of W can be represented by the contributions Kkl, which are computed as follows. The VAL and DOF matrices are unchanged: Kkl.VAL=Jkl.VAL and Kkl.DOF=Jkl.DOF. Kkl.EP is obtained from Jkl.EP by Kkl.EP=Ik(Jkl.EP). The calculated contributions Kkl should then be reindexed in terms of just one index.

In the case where W is a mapped variable, recall that W(pj)=V(F(pj)). Thus, the partial derivatives are DiW(pj)=DiV(qj), where qj are the points qj=F(pj). These points are computed in the following way: first, the global coordinates for the points pj are computed, and the global coordinates for the points qj are computed by the formula qj=F(pj). Then, a search algorithm is used to find the mesh elements in which the points qj reside in, and the corresponding local coordinates. Now the Jacobian of the variable V can be computed in the points qj. The result is identical with the requested Jacobian, namely the Jacobian of W in the points pj.

In the case where W is an integrated variable, recall that W(pj) is the integral of V(pj,y) over all y such that (pj,y) lies in the domain of V. This integral is approximated with a quadrature formula in the standard way, i.e., we approximate W(pj) with the sum of V(pj,yjk)*wjk over some indices k (the index set can depend on j). Thus, the partial derivative DiW (pj) can be obtained as the sum of DiV(pj,yjk)*wjk over k. Let q1, q2, . . . be the points (pj,yjk) in some order, and let w1, w2, . . . be the corresponding ordering of the weights wjk. Create the index vector J in the following way: J(1) is the index j for which q1=(pj,yjk) (for some k). Thus, J maps from indexes of the points q1, q2, . . . to indices of the projected points pj. Now the Jacobian for the variable V can be computed in the points q1, q2, . . . . The result is represented by the contributions Jk. The Jacobian for the variable W can be represented by the contributions Kk, which are computed as follows. The DOF matrices are unchanged, Kk.DOF=Jk.DOF. The VAL matrices are transformed according to Kk.VAL(r,c)=Jk.VAL(r,c)*wc. The new EP vectors are constructed by Kk.EP(c)=J(Jk.EP(c)).

An embodiment may also provide an optimization using a cache, for example, when using the above recursive algorithms for computing values and Jacobians of variables, it often happens that one computes the same variable several times at different levels of the recursion tree. To save computing time, the results of the evaluations may be stored in the cache data structure for later use. In the cache, each result is stored together with a key, which identifies which variable was evaluated, and whether it was values or the Jacobian that was computed. To search among the keys, hashing can be used. It is important also to keep track of the evaluation points. Each time one switches from one set of evaluation points to another set, one must make sure that either the cache is cleared, or, that the cache is pushed. In the latter case the cache works as a stack where each level corresponds to a set of evaluation points. When a user is done with one set of evaluation points, the user can return to the previous set by popping the cache.

An embodiment may further include assembling the residual vector of a weak equation. For example, consider a weak term, that is, an expression of the type V_test*W, where V and W are variables. The residual vector L corresponding to the weak term is a column vector defined by L(r)=integral of DrV*W over some domain, where we have assumed some given values of the DOFs Ui. To compute the residual vector numerically, we approximate this integral with a quadrature formula: L(r)=sum of DrV(pj)*W(pj)*wj over certain indices j=1, 2, . . . , m. Thus, the method may begin by computing the Jacobian of V and the values of W in the points pj using the above methods. Assume that the Jacobian of V in the points pj is represented by the contributions Jk. For simplicity, assume that the variable V is constructed from basic variables, only using auxiliary variables. Thus, the contributions Jk all have Jk.EP=[1 2 . . . m]. Compute the row vector C as C(j)=W(pj)*wj. Now the residual vector L can be computed as follows: start with L as the zero vector. Loop over all k, then over all columns j of Jk.DOF, and then over all rows r of Jk.DOF, and add Jk.VAL(r,j)*C(j) to L(Jk.DOF(r,j)).

It should be noted that a weak term can in general have the form V_test*E(V1,V2, . . . , Vn). To simplify the presentation, a name W can be introduced for the expression E(V1, V2, . . . , Vn), which is possible by using an auxiliary variable. V_test is described elsewhere herein in more detail.

A weak expression may be defined as a sum of weak terms. A weak equation is obtained by summing a number of integrals of weak expressions, and putting the result equal to zero. FIG. 41 shows the weak formulation. The integrals can be taken over different domains. Partial differential equations can be reformulated as weak equations.

FIG. 42 describes the conversion from a general form problem to a weak form. A weak equation is the starting point for the finite element method. Therefore, it is important to be able to compute the residual vector corresponding to a weak equation. The residual vector can be obtained as the sum of the residual vectors of the underlying weak terms. The stiffness matrix corresponding to a weak equation is the Jacobian of its residual vector. Therefore, the stiffness matrix can be computed as the sum of the stiffness matrices of the underlying weak terms. Computation of the stiffness matrix is discussed in further detail below.

An embodiment may further include assembling the stiffness matrix of a weak equation. For example, consider a weak term, that is, an expression of the type V_test*W, where V and W are variables. The stiffness matrix S corresponding to the weak term is defined by S(r,c)=integral of DrV*DcW over some domain. To compute the stiffness matrix numerically, an approximation is made of this integral with a quadrature formula: S(r,c)=sum of DrV(pj)*DcW(pj)*w(j) over certain indices j=1, 2, . . . , m. Thus, the method of assembling the stiffness matrix of a weak equation is commenced by computing the Jacobians of V and W using the above method. Assume that these Jacobians are represented by the contributions J1 and Kk, respectively. For simplicity, assume that the variable V is constructed from basic variables, only using auxiliary variables. Thus, the contributions J1 all have J1.EP=[1 2 . . . m]. Now form the matrices COLk, ROWlk, and the three-dimensional arrays VALlk as follows. Put COLk=Kk.DOF and ROWlk(r,c)=J1.DOF(r,Jk.EP(c)). The array VALlk is defined by VALlk(r,c,s)=J1.VAL(r,Jk.EP(s)) *Kk.VAL(c,s)*w(Jk.EP(c)). Now the arrays COLk, ROWlk, and VALlk constitute a kind of sparse matrix representation of S. More precisely, S(r,c)=sum of VALlk(i,j,s), where the sum is taken over all l, k, s, i, and j such that r=ROWlk(i,s) and c=COLk(j,s).

An embodiment may further include assembling the constraints of a weak equation. For example, consider a constraint W=0 on some domain, where W is a variable. The constraint is discretized by requiring that W=0 holds in a finite number of points pj, j=1, 2, . . . , m. Often, the points pj are uniformly distributed in each mesh element on the domain. The constraint residual vector M is defined as the column vector with the components Mj=W(pj). This vector can be computed with the method for evaluating the variable W described above.

The constraint matrix C is the Jacobian of M with respect to the degrees of freedom, namely, Cji=DiMj=DiW(pj). The constraint matrix C can be computed by computing the Jacobian of W in the points pj using the method described above. The result is a list of contributions Jk. Now the partial derivative DiW(pj) can be computed as the sum of Jk.VAL(r,c), where the sum is taken over all k, r, and c such that Jk.DOF (r,c)=i and Jk.EP(c)=j.

In understanding the assembly and solution process, it is helpful to understand how the discretization of a stationary PDE problem is formed. The starting point is the weak formulation of the problem in FIG. 41 and then with the discretization of the constraints:

$$0 = R^{(2)} \text{ on } \Omega$$

$$0 = R^{(1)} \text{ on } B$$

$$0 = R^{(0)} \text{ on } P$$

The constraints on subdomains, boundaries, and vertices are stored in the sub-fields equ.constr, bnd.constr, and pnt.constr, respectively, of xfem.fem{g}. Consider the constraints on boundaries B. For each mesh element in B (i.e., mesh edge in B), consider the Lagrange points of some order k (i.e., the points whose local coordinates are a multiple of 1/k). Denote them by x(1)mj, where m is the index of the mesh element. Then the discretization of the constraint is $$0 = R^{(1)}(x_{mj}^{(1)})$$

that is, the constraints are required to hold point-wise, at the Lagrange points. The Lagrange point order k can be chosen different for different components of the constraint vector $R^{(1)}$, and it can also vary in space (this is determined by the field xfem.fem{g}.bnd.cporder). The k is denoted by cporder that may be included in a data structure described elsewhere herein. The constraints on subdomains W and points P are discretized similarly (nothing needs to be done with the points P). We can collect all these point-wise constraints in one equation 0=M, where M is the vector consisting of all the right-hand sides.

The dependent variables are approximated with functions in the chosen finite element space(s). This means that the dependent variables are expressed in terms of the degrees of freedom as $$u_l = \sum_i U_i \varphi_i^{(l)}$$

where $\varphi_i^{(l)}$ are the basis functions for variable $u_l$. Let U be the vector with the degrees of freedom $U_i$ as the components. This vector is called the solution vector, since it is what is to be computed. Now M only depends on U, so the constraints can be written 0=M(U). Now consider the weak equation:

$$0 = \int_\Omega W^{(2)} dA + \int_B W^{(1)} ds + \sum_P W^{(0)} - \int_\Omega v \cdot h^{(2)T} \mu^{(2)} dA - \int_B v \cdot h^{(1)T} \mu^{(1)} ds - \sum_P v \cdot h^{(0)T} \mu^{(0)}$$

The integrands W(2), W(1), and W(0) are stored in the subfields equ.weak, bnd.weak, and pnt.weak, respectively, of xfem.fem{g}. The integrands W(2), W(1), and W(0) are weak expressions. To discretize this equation, we express the dependent variables in terms of the DOFs as above. Similarly, the test functions are approximated with the same finite elements (this is the Galerkin method):

$$v_l = \sum_i V_i \varphi_i^{(l)}$$

Since the test functions occur linearly in the integrands of the weak equation, it is enough to require that the weak equation holds when we choose the test functions as basis functions:

$$v_l = \varphi_i^{(l)}$$

When substituted into the weak equation, this gives one equation for each i. Now the Lagrange multipliers have to be discretized. Let $$\Lambda_{mj}^{(d)} = \mu^{(d)}(x_{mj}^{(d)}) w_{mj}^{(d)}$$

where x(d)mj are the Lagrange points define above, and w(d)mj are certain weights, see below. The term $$\int_B \varphi_i \cdot h^{(1)T} \mu^{(1)} ds$$

is approximated as a sum over all mesh elements in B. The contribution from mesh element number m to this sum is approximated with the Riemann sum $$\sum_j \varphi_i(x_{mj}^{(1)}) \cdot h^{(1)T}(x_{mj}^{(1)}) \mu^{(1)}(x_{mj}^{(1)}) w_{mj}^{(1)} = \sum_j \varphi_i(x_{mj}^{(1)}) \cdot h^{(1)T}(x_{mj}^{(1)}) \Lambda_{mj}^{(1)}$$

where w(1)mj is the length (or integral of ds) over the appropriate part of the mesh element. The integral over W and the sum over P is approximated similarly.

All this means that the discretization of the weak equation can be written $$0 = L - N^T \Lambda$$

L is the vector whose ith component is $$\int_\Omega W^{(2)} dA + \int_B W^{(1)} ds + \sum_P W^{(0)}$$

evaluated for v1=ph(1)i. LAMBDA is the vector containing all the discretized Lagrange multipliers LAMBDA(d)mj. N is a matrix whose ith column is a concatenation of the vectors $$h^{(d)}(x_{mj}^{(d)}) \varphi_i(x_{mj}^{(d)})$$

To sum up, the discretization of the stationary problem is $$0 = L(U) - N(U)^T \Lambda$$

$$0 = M(U)$$

The objective is to solve this system for the solution vector U and the Lagrange multiplier vector LAMBDA. L is called the residual vector, M is the constraint residual vector and C=−N is the constraint matrix. Note that M is redundant in the sense that some pointwise constraints occur several times. Similarly, L is redundant. This redundancy is removed by the solvers. The solution of the discrete system is obtained by using Newton's iterative method, i.e. by solving a number of linearized problems (see below).

The integrals occurring in the components of the residual vector L (as well as the stiffness matrix S) are computed approximately using a quadrature formula. Such a formula computes the integral over a mesh element by taking a weighted sum of the integrand evaluated in a finite number of points in the mesh element. The order of a quadrature formula is the maximum number k such that it integrates all polynomials of degree k exactly. Thus, the accuracy of the quadrature increases with the order. On the other hand, the number of evaluation points also increases with the order. As a rule of thumb one can take the order to be twice the order of the finite element that is used. The order of the quadrature formula is denoted by gporder in the data structures (gp stands for Gauss points).

In time-dependent problems, the discretization of a time-dependent problem is similar to the stationary problem:

$$D(U,t)\frac{dU}{dt} = L(U,t) - N(U,t)^T \Lambda$$
$$0 = M(U,t)$$

where now U and LAMBDA depend on time t. The matrix D is called the mass matrix. This matrix is assembled in a similar way as the stiffness matrix, but from data in the fields xfem.fem{g}.\*\*\*.dweak instead of xfem.fem{g}.\*\*\*.weak. It is assumed that the constraint is linear, i.e., M depends linearly on U. The solution of the above system of differential-algebraic equations can be obtained by using standard DAE-solvers.

In considering a linearized stationary problem, the linearization "point" corresponds to a solution vector $U_0$. The discretization of the linearized problem is $$K(U_0)(U-U_0) + N(U_0)^T \Lambda = L(U_0)$$

$$N(U_0)(U-U_0) = M(U_0)$$

where S=−K is called the stiffness matrix. The solution of this linear system can be obtained by standard direct or iterative methods.

In Eigenvalue problems, the discretization of the eigenvalue problem is $$-\lambda D(U_0)U + K(U_0)U + N(U_0)^T \Lambda = 0$$

$$N(U_0)U = 0$$

where $U_0$ is the solution vector corresponding to the linearization "point". The solution to this eigenproblem can be obtained by standard methods.

Figure 36:
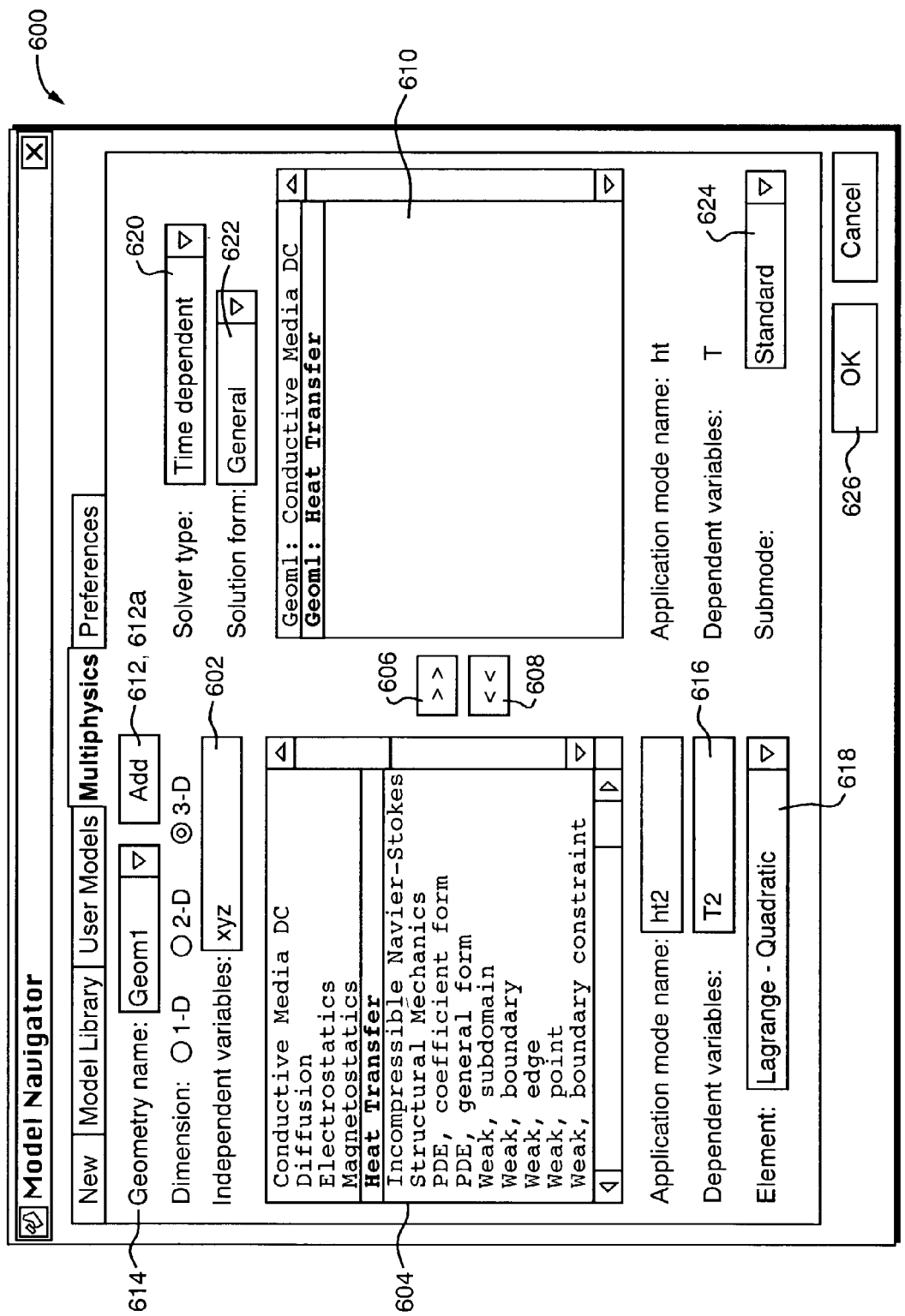
FIG. 36 is an example of another embodiment of a user interface that may be used in connection with specifying local and non-local couplings of multiphysics systems.

Referring now to FIG. 36, shown is an example of another embodiment of a user interface or GUI 600 that may be used in connection with specifying local and non-local couplings of multiphysics systems. The GUI 600 is similar in features and operation as the GUI 30 of FIG. 3 and further includes an option to add geometries, which is discussed in detail below. On the GUI 600, a user can start a multiphysics model that consists of several application modes and several different geometries. The user can start in the top left part of the GUI 600 by specifying space dimension (1-D, 2-D, or 3-D) and the user can elect to edit the names of the independent variables in the Independent variables dialog box 602. The user can also select application modes from the left-most list box 604 and add them to the model by pressing the >> button 606 or by double-clicking them. Application modes can be removed from the list by pressing << button 608 or double-clicking on them. When the last application mode is removed from a geometry, the geometry is still left in the right list box 610. This corresponds to a geometry only model where you can draw a geometry and then add application modes later on. The user can also press the << button 608 once more to remove the geometry. There is always one geometry available in the right list box 610. A user can add additional geometries to the model by pressing the >> button 612a after selecting from the Geometry name drop-down list box 614 (the Add button 612 changes to a >> button 612a after clicking it, and thus adds geometry to the Geometry name drop-down list box 614). Each geometry can also have a different space dimension.

Prior to the user adding an application mode, as described above, the user can edit the name of the application mode. Additionally, the user can also edit the name of the application mode's dependent variables and the element type used for modeling. Each application mode in the model is given a unique name, which is used to identify the origin of the variables in the multiphysics model. The user can edit the dependent variables' names, but the names are required to be valid variable names (e.g., they are required to start with a letter). If the application mode contains more than one dependent variable, the user can enter all of the variable names as space-separated entries in the Dependent variables edit field 616. In the PDE modes, where more than one dependent variable is possible, the user can determine the number of equations in the model by entering one or more space-separated variable names.

In the Element drop-down list box 618, the type of element used for the modeling is selected. Each application mode has a set of predefined elements. The element selection of the Element drop-down list box 618 can also be changed during the modeling process using the Element page 802 in the Subdomain Settings dialog box 800 (FIG. 38).

On the right-hand side of the GUI 600 of FIG. 36, a user can set the solver type (stationary, time-dependent, etc.) and solution form (coefficient, general, or weak form) for the multiphysics model by respectively selecting a solver type from the solver type of drop-down list 620 and selecting a solution from the Solution form drop-down list 622. In the list box 610 located below the solution form drop-down list 622, all the application modes that have been added to the model appear. The name and the dependent variables for the selected application mode are displayed below the list box 610. A user can select any of the model's application modes and change its submode by selecting from the elements listed in the Submode drop down list 624. In addition to the Standard submode displayed in the Submode drop-down list 624 of the GUI 600, for example, there is also a Wave-Extension submode (not shown) for some application modes. The Wave-Extension submode extends the standard time-dependent equation to a wave equation (using a second derivative with respect to time). Pressing OK 626 starts a new multiphysics model with all the added application modes, as described above. The application mode that is selected in the right list box 610 becomes the active application mode when the user continues the modeling.

Figure 37:
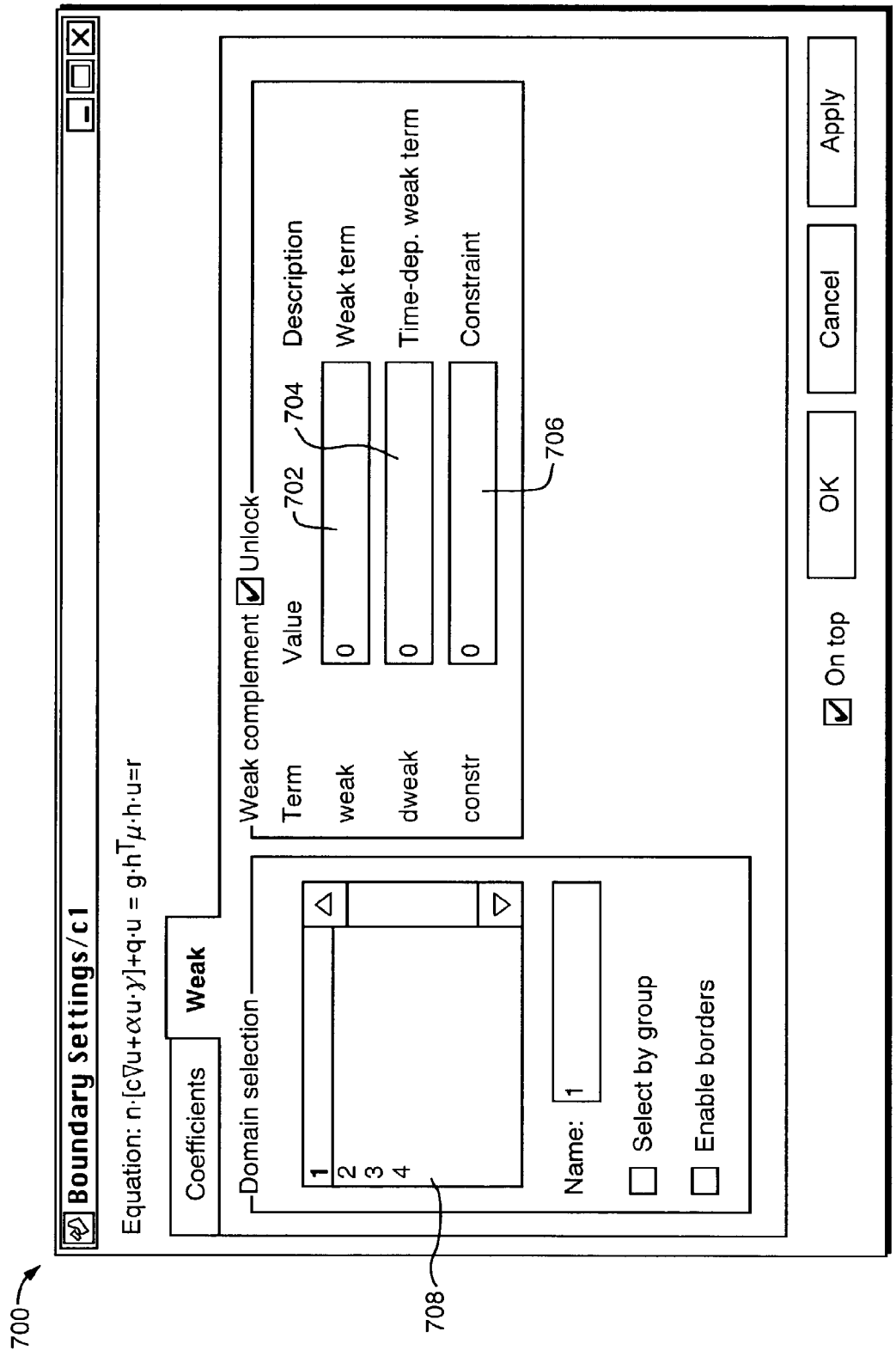
FIG. 37 is an example of a Boundary settings dialog box.

Referring to FIG. 37, shown is an example Boundary settings dialog box 700 that provides a user the ability to access the weak form. In the Boundary settings dialog box 700, a user can enter weak, dweak, and constr coefficient information in the respective weak 702, dweak 704, and constr 706 fields corresponding to the fields xfem.fem{g}.bnd.weak, xfem.fem{g}.bnd.dweak, and xfem.fem{g}.bnd.constr, respectively, in the data structure. The dialog box also sets the domain grouping xfem.fem{g}.bnd.ind. The Boundary settings dialog box 700 further includes a Domain selection list 708 that permits a user to select domain related information associated with the weak solution form. The Boundary settings dialog box 700 can also be made available in coefficient view, and also directly in the application mode, for PDE oriented application modes.

Figure 38:
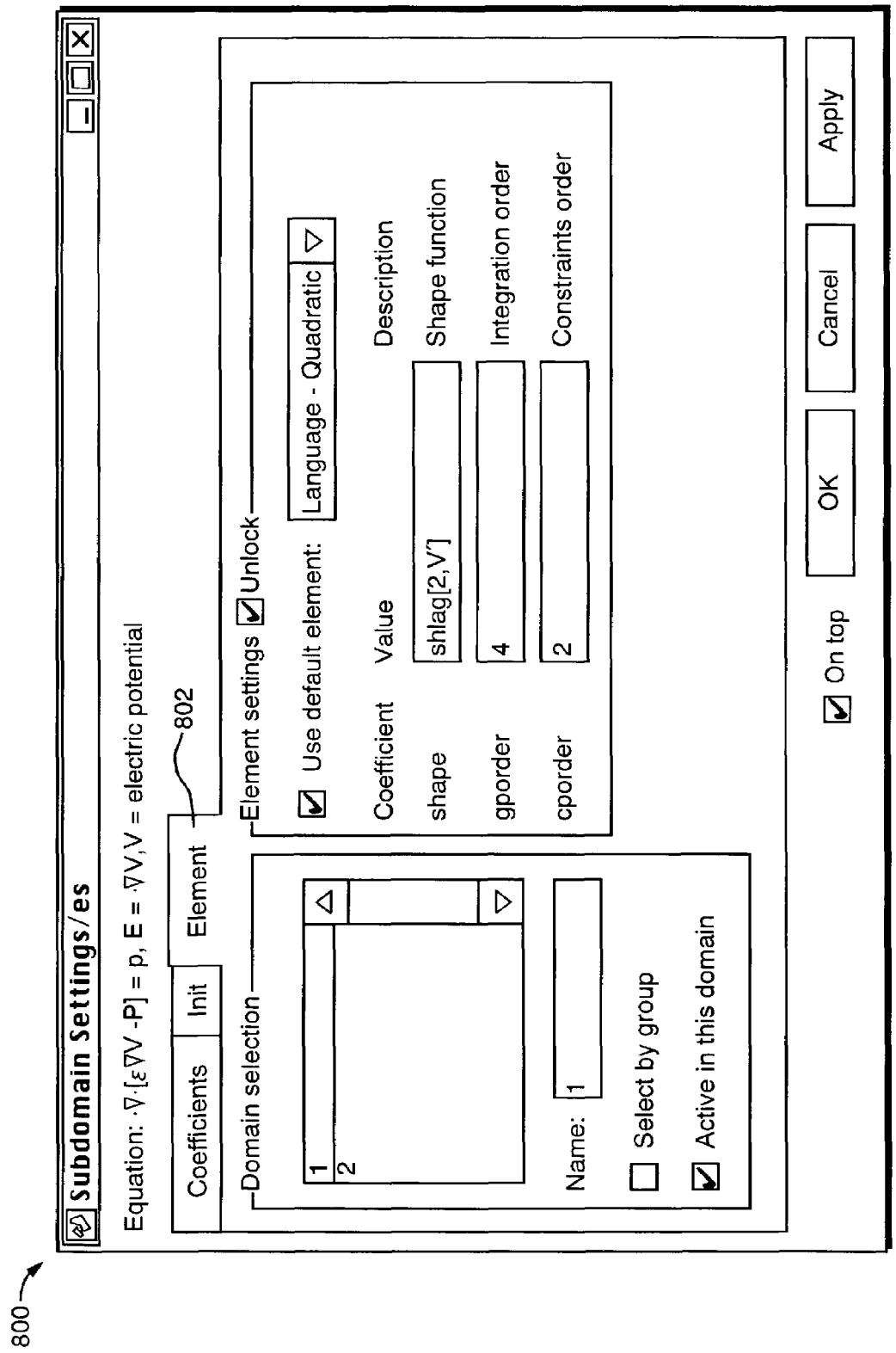
FIG. 38 is an example of a Subdomain Settings dialog box.

Referring to FIG. 38, shown is an example of a Subdomain Settings dialog box 800, which enables a user thereof to set shape function object, integration order, and constraint order, corresponding to the fields xfem.femf{g}.equ.shape, xfem.femf{g}.equ.gporder, and xfem.fem{g}.equ.cporder, respectively, in the data structure. The dialog box also sets the domain grouping xfem.femf{g}.equ.ind. The shape function object, integration order, and constraint order data structures are defined below. In a typical application mode, the element type is only set on a subdomain level, but can be modified in coefficient view, boundary level, edge level, and point level. It is possible that an application mode has no subdomain extent, and thus is defined only on a boundary level and/or below. Then, in one implementation, for example, the application mode can set element types on a boundary level and allow modification of coefficient on edge level and point level.

Figure 39:
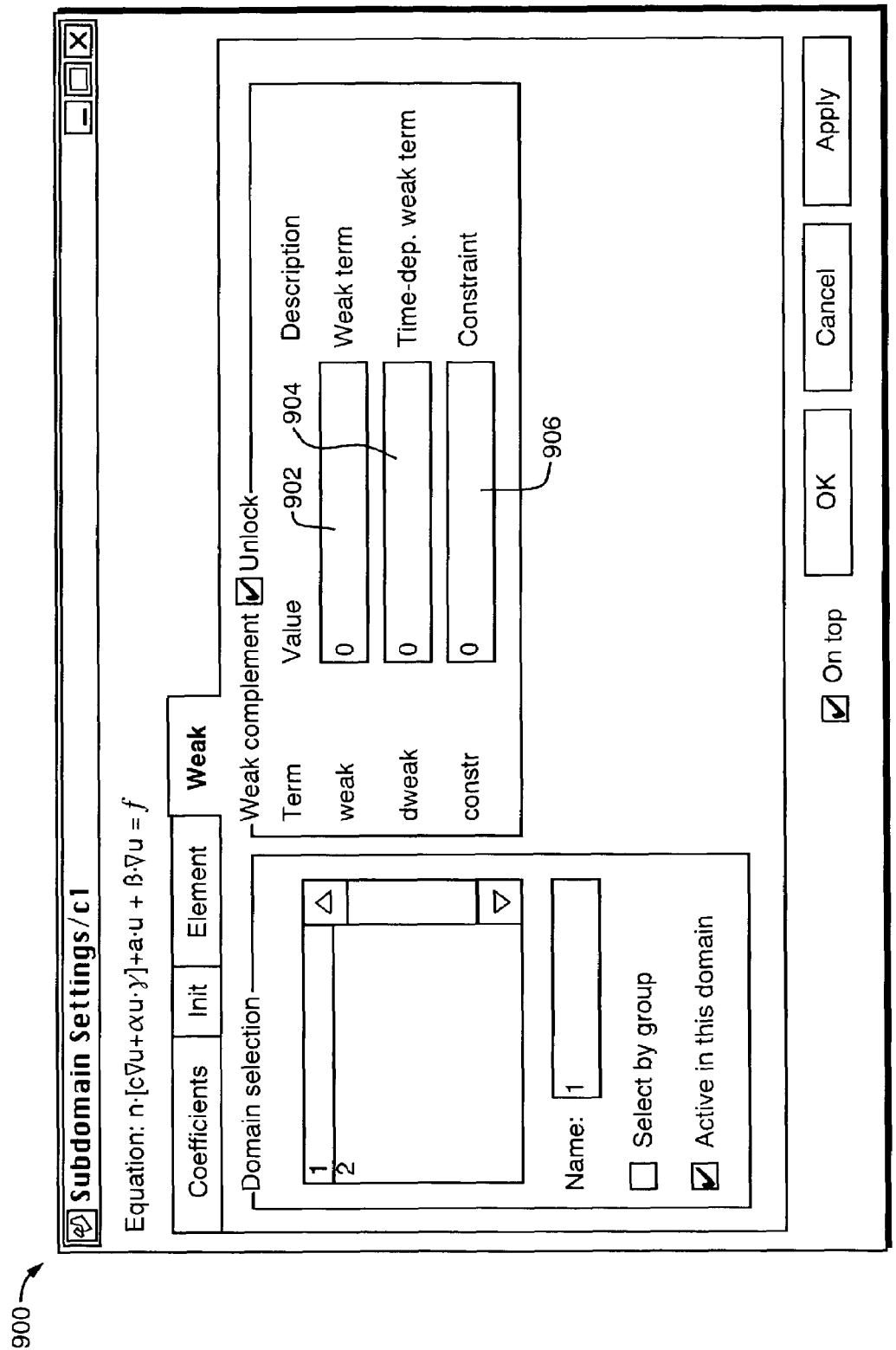
FIG. 39 is another example of a Subdomain Settings dialog box.

Referring to FIG. 39, shown is another example of a Subdomain Settings dialog box 900, which permits a user to enter weak, dweak, and constr coefficient information for respective weak 902, dweak 904, and constr 906 fields corresponding to the subfields of the xfem.femf{g} data structure. The dialog box 900 may also be used to specify domain groupings, for example, stored in the xfem.fem{g}.equ.ind field. The dialog box can be made available in coefficient view, and also directly in the application mode, for PDE oriented application modes.

Figure 40:
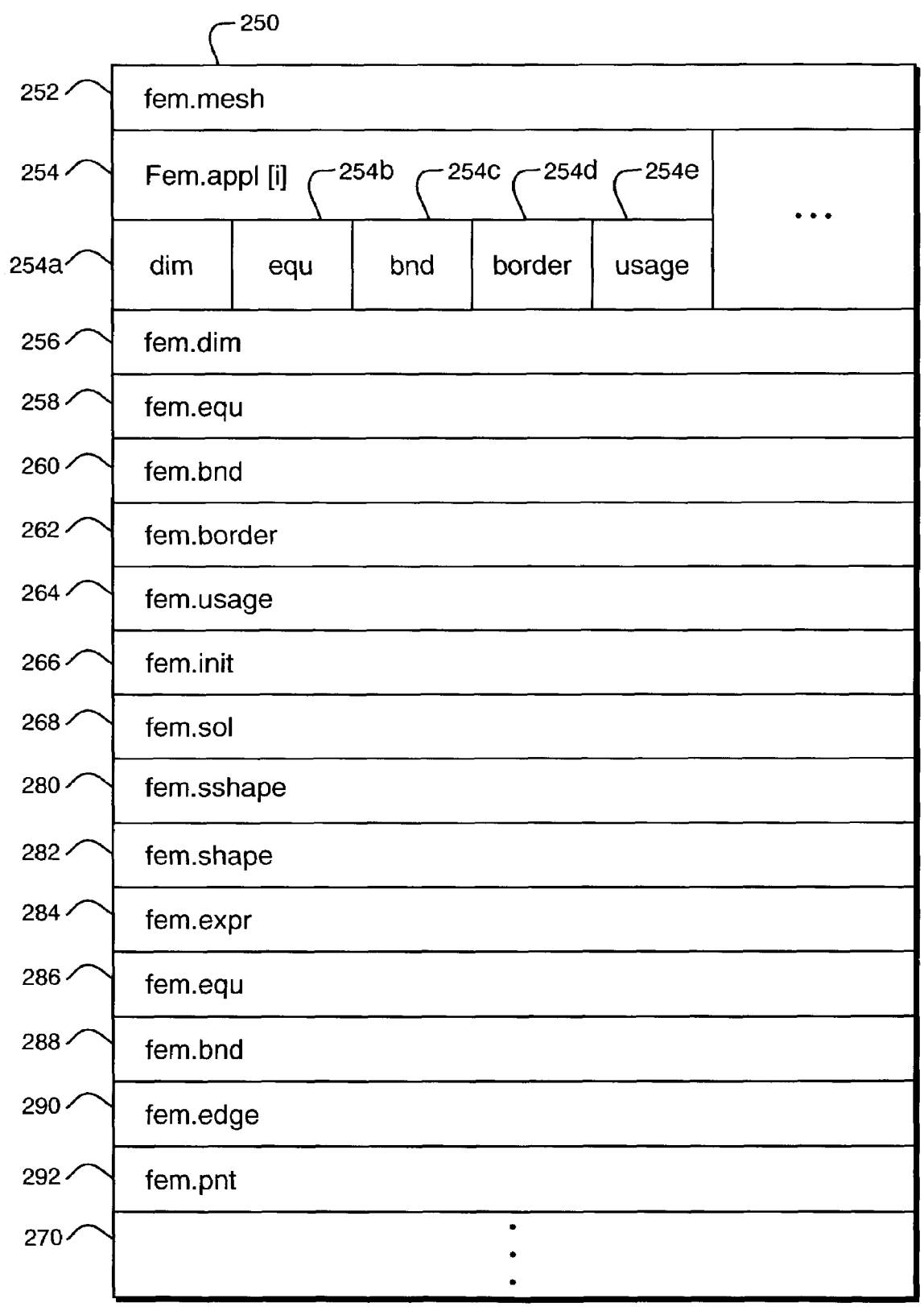
FIG. 40 is an example of a representation of the data structure that may be included in an embodiment in connection with storing data in connection with the PDEs selected and combined.

Referring to FIG. 40, shown is an example of a representation of the data structure 1000 that may be included in an embodiment in connection with storing data in connection with the PDEs selected and combined. The data in the data structure 1000 may include data used in connection with the mutliphysics model, which is associated with local and/or non-local coupling variables.

The data structure 1000 can include the following fields:

| Data field | Description |
| --- | --- |
| fem.mesh | Finite element mesh |
| fem.appl{i} | Application mode i |
| fem.appl{i}.dim | Dependent variable name |
| fem.appl{i}.equ | Domain physical data |
| fem.appl{i}.bnd | Boundary physical data |
| fem.appl{i}.submode | Text string containing submode setting |
| fem.appl{i}.border | Border on or off |
| fem.appl{i}.usage | Matrix of subdomain usage |
| fem.dim | Multiphysics dependent variable names |
| fem.equ | PDE coefficients |
| fem.bnd | Boundary conditions |
| fem.border | Vector of border on or off |
| fem.init | Initial value |
| fem.sol | Finite element solution |
| fem.sshape | Geometry approximation order |
| fem.shape | Shape functions |
| fem.expr | Definition of variables as expressions |
| fem.equ | Variables, equations, constraints, and initial values on subdomains |
| fem.bnd | Variables, equations, constraints, and initial values on boundaries |
| fem.edg | Variables, equations, constraints, and initial values on edges |
| fem.pnt | Variables, equations, constraints, and initial values on vertices |

As previously described, the data structure 1000 above can be extended for use with multiple geometries by storing the above data structure for geometry g in a list entry xfem.fem{g}.

The data structure 1000 is similarly constructed and arranged as the data structure 250, as described above, and further includes the additional fields: fem.sshape 280, fem.shape 282, fem.expr 284, fem.equ 286, fem.bnd 288, fem.edg 290 and fem.pnt 292, as described above. The global coordinates are polynomials in the local element coordinates of a certain degree k. This degree k can be specified in the field fem.sshape 280. For instance, fem.sshape=2; uses quadratic shape functions for the global space coordinates. This makes it possible for the mesh elements at the boundary to be curved, and thus come closer to the true geometric boundary. The default k is equal to the maximum order of the shape function objects in fem.shape 282, where k is called the geometry shape order. The field fem.shape 282 is a cell vector with shape function objects. For example, fem.shape={shlag(1, 'u') shlag(2,'u') shvec('A')}; defines three shape function objects. A user can choose on which domains these objects will be active, by using the fields fem.equ.shape, fem.bnd.shape, fem.edg.shape, fem.pnt.shape, as discussed in detail below.

In the fields fem.equ.shape, fem.bnd.shape, fem.edg.shape, and fem.pnt.shape, a user can specify where the shape function objects in fem.shape are to be used. For example, fem.shape={shlag(1,'u')  shlag(2,'u')  sharg_2_5('v')}; fem.equ.shape={[1 3] [2 3] [ ]3}; means that on the first subdomain group, only the first and third shape function objects (shlag(1,'u') and sharg_2_5('v')) are active. On the second subdomain group, the second and third shape function objects are active. On the third subdomain group, no shape function objects are defined, while on the fourth subdomain group only sharg_2_5('v') is active. Thus, the variable u will be defined on subdomain groups 1 and 2, having linear elements in subdomain group 1, and quadratic elements in subdomain group 2. If these subdomains groups are adjacent, this will cause problems since "hanging nodes" can appear. Thus, the user should not mix elements for the same variable in adjacent subdomains. If the field fem.equ.shape is not given, then all shape function objects in fem.shape 282 apply in all subdomain groups.

Similarly, the field fem.bnd.shape is a cell vector, which specifies for each boundary group which shape function objects are active. If fem.bnd.shape is not given, then it is inherited from fem.equ.shape. This means that a shape function object, which is active in a subdomain, is also active on the boundary of that subdomain (as well as boundaries lying within the subdomain).

In 3-D, the field fem.edg.shape similarly specifies the usage of shape function objects on edge groups. If the usage of shape function objects is not given, it is inherited from the usage on subdomains and boundaries. That is, a shape function object which is active on some subdomain or some boundary, is also active on all edges that touch this subdomain or boundary. In 2-D and 3-D, the field fem.pnt.shape similarly specifies usage on vertices. Specifying usage on vertices is defaulted by inheritance from subdomain, boundaries, and edges.

The fields fem.usage and fem.border mentioned earlier can be implemented in terms of the fem.*.shape fields by not assigning a shape function object to a subdomain, boundary, edge or point. Thus with the fields fem.*.shape, the fields fem.border and fem.usage are no longer necessary.

The additional fields cporder, gporder, weak, dweak, constr, and expr are available in the fields fem.equ 286, fem.bnd 288, fem.edg 290, and fem.pnt 292. A user can define new field variables in terms of others in the fields fem.expr 284, fem.equ.expr, fem.bnd.expr, fem.edg.expr, and fem.pnt.expr. This may provide an advantage if included in an embodiment, for example, in which an equation may include the same expression several times.

In the field fem.expr 284 a user can put variable definitions that apply on all domain groups (of all dimensions). The field fem.expr 284 is a cell vector of alternating variable names and expressions. In fem.equ.expr a user can put variable definitions that are in force on subdomains. For example, fem.equ.expr={'W' 'B*H/2' 'div' 'ux+vy'}; defines W=B*H/2, and div=ux+vy on all subdomain groups. The defining expressions in the fem.equ.expr cell vector can be cell vectors, for instance fem.equ.expr={'v'{'a+b' 'a−b'} 'w' 'pi*x*b'}. This defines v to be a+b on subdomain group 1, and a−b on subdomain group 2. The use of an empty vector [ ] instead of an expression means that the variable is not defined on the corresponding subdomain group. For example, fem.equ.expr={'v'{'a+b'[ ]}}; means that v=a+b on subdomain group 1, and v is undefined on subdomain group 2. Similarly, variable definitions on boundaries, edges, and vertices are put in fem.bnd.expr, fem.edg.expr, and fem.pnt.expr, respectively.

The integrals occurring in the assembly of the matrices are computed numerically using a quadrature formula. The order of this quadrature formula is specified in the fields fem.equ.gporder, fem.bnd.gporder, fem.edg.gporder, and fem.pnt.gporder. The fem.***.gporder fields are entered in the dialog box of FIG. 38 for subdomains. There are similar dialog boxes for boundaries, edges and points. The field fem.equ.gporder gives the order for integrals over subdomains. Fem.equ.gporder can be a number or a cell vector. In the first case, fem.equ.gporder applies to all subdomain groups. In the second case, fem.equ.gporder{i} applies to the ith subdomain group. Fem.equ.gporder{i} can be a number or a cell vector of numbers. In the latter case, fem.equ.gporder{i}{k} applies to the kth equation in coefficient or general form, and the kth integrand fem.equ.weak{i}{k} in the weak formulation.

Similarly, fem.bnd.gporder, fem.edg.gporder, and fem.pnt.gporder gives the order for integrals over boundaries, edges, and vertices, respectively. The default value of the gporder fields is twice the maximum order of the shape functions being used.

The pointwise constraints are enforced in the Lagrange points of a certain order. This order is given in the fields fem.equ.cporder, fem.bnd.cporder, fem.edg.cporder, and fem.pnt.cporder. These fields have the same syntax as the gporder fields. The field fem.equ.cporder gives the order for constraints on subdomains. Fem.equ.cporder can be a number or a cell vector. In the first case, fem.equ.cporder applies to all subdomain groups. In the second case, fem.equ.cporder{i} applies to the ith subdomain group. Fem.equ.cporder{i} can be a number or a cell vector of numbers. In the latter case, fem.equ.cporder{i}{k} applies to the kth constraint on subdomain group i. Similarly, fem.bnd.cporder, fem.edg.cporder, and fem.pnt.cporder gives the order for constraints on boundaries, edges, and vertices, respectively. The default value of the cporder fields is equal to the maximum of the orders of the shape functions being used. The fem.***.cporder fields are entered in the dialog box of FIG. 38 for subdomains. There are similar dialog boxes for boundaries, edges and points.

Equations may be represented in weak form are stored in the fields fem.equ.weak, fem.bnd.weak, fem.edg.weak, and fem.pnt.weak. In one embodiment, the field fem.equ.weak contains the integrand in the integral over subdomains. Fem.equ.weak can be a string expression or a cell vector. In the first case the expression applies to all subdomain groups. In the second case, fem.equ.weak{k} applies to the kth subdomain group. Fem.equ.weak{k} can be an expression or a cell vector of expressions. In the latter case, the expressions in the cell vector are added. In the expressions representing the integrand, the test function corresponding to a variable v is denoted v_test. Then v_test will have the same shape functions as v. Similarly, the fields fem.bnd.weak, fem.edg.weak, and fem.pnt.weak contain integrands that are integrated over boundaries, edges, and points, respectively. All these integrals may be included on the right-hand side of the weak equation.

It should be noted that the function v_test as used herein is described in finite element literature, for example, as in Claes Johnsson, "Numerical Solution of Partial Differential Equations by the Finite Element Method", Studentlitteratur, ISBN 91-44-25241-2, Lund, Sweden, 1987.

For a time-dependent problem, the terms containing time derivatives may be stored in fem.equ.dweak, fem.bnd.dweak, fem.edg.dweak, and fem.pnt.dweak. These have the same syntax as the weak fields, except that the time derivatives must enter linearly. The time derivative of a variable v is denoted v_time. The integrals defined by the dweak fields are put on the left-hand side of the weak equation. The FIGS. 39, 37, 44, and 43 shows the dialog boxes for entering the fields weak and dweak for subdomains, boundaries, edges, and points, respectively.

Eigenvalue problems are specified like time-dependent problems. Then v_time may be interpreted as minus the eigenvalue times v.

The constraints in the weak problem formulation are stored in the fields fem.equ.constr, fem.bnd.constr, fem.edg.constr, and fem.pnt.constr. These constraints are implemented pointwise. The constraints on subdomains (R(n), where n is the space dimension) are given in the field fem.equ.constr. This field can be an expression or a cell vector. In the first case, the expression fem.equ.constr is constrained to be zero on all subdomain groups. In the second case, fem.equ.constr{k} applies to the kth subdomain group. Fem.equ.constr{k} can be an expression or a (possibly empty) cell vector of expressions. These expressions are constrained to be zero on the kth subdomain group. Similarly, constraints on boundaries, edges, and vertices are defined in fem.bnd.constr, fem.edg.constr, and fem.pnt.constr, respectively.

It should be noted as described elsewhere herein that the equations, constraints (such as the boundary conditions), and the initial conditions of the PDE problem, are stored in the fields fem.equ, fem.bnd, fem.epg and fem.pnt. The field fem.equ contains information pertaining to the subdomains, i.e., geometric domains of the same dimension as the space. For a 3-D geometry, a field fem.edg is related to the edges (curves) and for both a 2-D and 3-D geometry there can be a field fem.pnt which corresponds to vertices (points). As described elsewhere herein, equations represented within this data structure may be given in a "strong" form of PDE, or in a "weak" form as an equality of integrals. The strong form has two variants, coefficient form or general form, suitable for linear and nonlinear problems, respectively. The form of this equation is specified in fem.form as described elsewhere herein. After the PDE problem is specified, the extended mesh structure fem.xmesh can be constructed. The extended mesh includes a low-level description of the PDE problem. In one embodiment, such an extended mesh may be produced, for example, by invoking a particular function. The solution to a particular set of PDE's may be computed by invoking one of the solvers as described elsewhere herein in accordance with the particular type of PDE specified, for example, time-dependent or eigenvalue PDE's.

The solution vector or the solution matrix is stored in the subfield u of the data structure field fem.sol. Additionally, other fields within the subfield fem.sol for the solution may include fields used, for example, when there are time-dependent or eigenvalue solutions produced. In other words, the data structure, for example an instance of the data structure 250, may use different fields in accordance with the different type of PDE solution formed.

It should be noted that an embodiment can also include any one or more of a variety of different software tools for the visualization and processing of data. For example, tools may be included which provide for evaluation of a particular integral or expression for a particular set of points.

As also described elsewhere herein, there are both local and nonlocal couplings that may be included in an embodiment. Generally, variables may be evaluated locally which is to say that their value at each evaluation point may be computed using information at that particular evaluation point. It is also possible to define nonlocal coupling variables for which the value at each evaluation point is the result of a computation carried out elsewhere in the same geometry or within another geometry. These variables may then be used, for example, in the PDE coefficients or during post processing. These types of variables may be referred to as the non-local dependencies.

Referring to FIG. 41, shown is an example of a weak formulation 1100 or weak solution form. The first equation 1102 is the weak equation, and the others are the constraints 1104. Here W is the subdomains, B is the boundaries (including outer and internal boundaries), and P is the vertices (points) defined in the geometry. The integrands $W^{(i)}$ are scalar expressions involving the dependent variables $u_1$, $u_2, \ldots, u_N$ as well as the test functions $v_1, v_2, \ldots, V_N$, and their derivatives. The test functions and their derivatives enter linearly.

Referring to FIG. 42, shown is a conversion from general form to weak form. Moreover, conversion from general form to weak form is performed according to the formula 1200, as shown in FIG. 42, where there is an implicit summation over the k and i indices in each product, and n is the space dimension. Affected fields are therefore ga, f, weak, da and dweak from equ and g, weak, r and constr from bnd, with weak, dweak and constr, which are the only fields remaining. Other fields within equ and bnd, such as shape, init, etc., remain unchanged.

In addition, when converting to weak form, according to FIG. 42, fem.border can be taken into account. That is to say that if fem.border is not 1 or on, there may be borders on which boundary conditions should not be applied. In order to decide in which subdomains each dependent variable is in use, and hence decide on which boundaries and borders to apply conditions, a comparison is made between the variable names in fem.dim and the field variables defined by the shape function objects being used.

Figure 48:
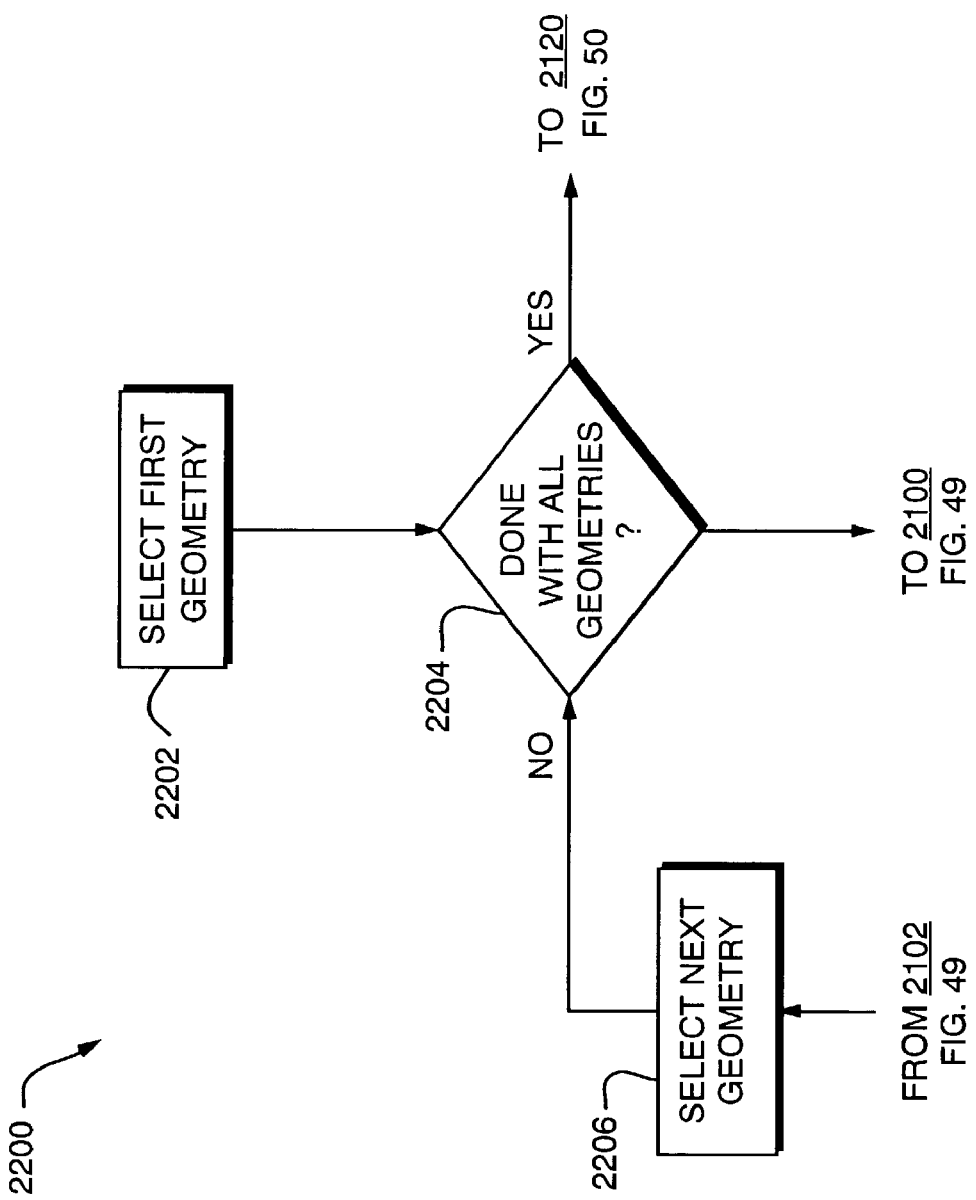
FIGS. 48-50 are flowcharts of processing steps in one embodiment for forming and solving a system of partial differential equations of a combined system.
Figure 49:
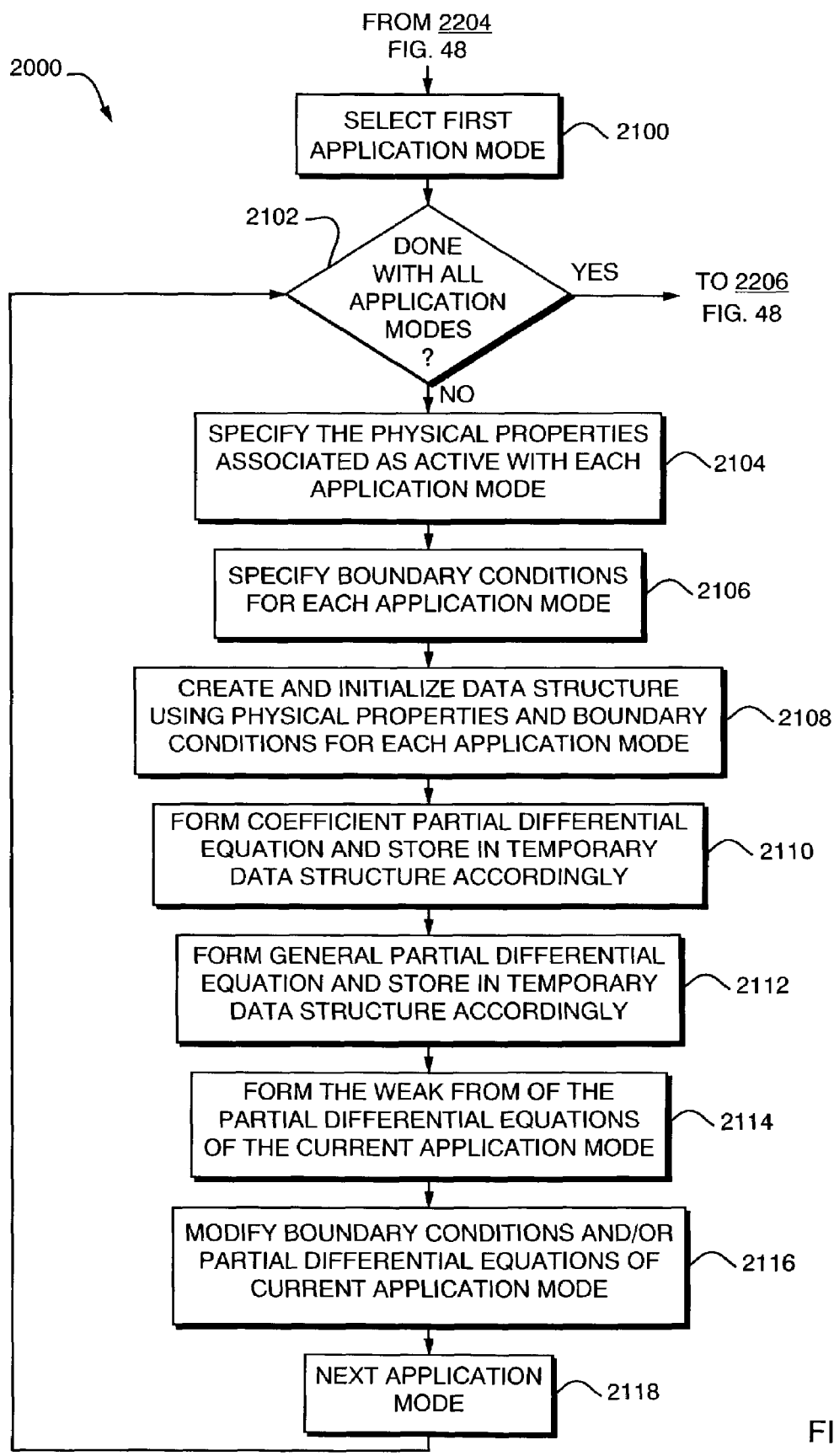
Figure 50:
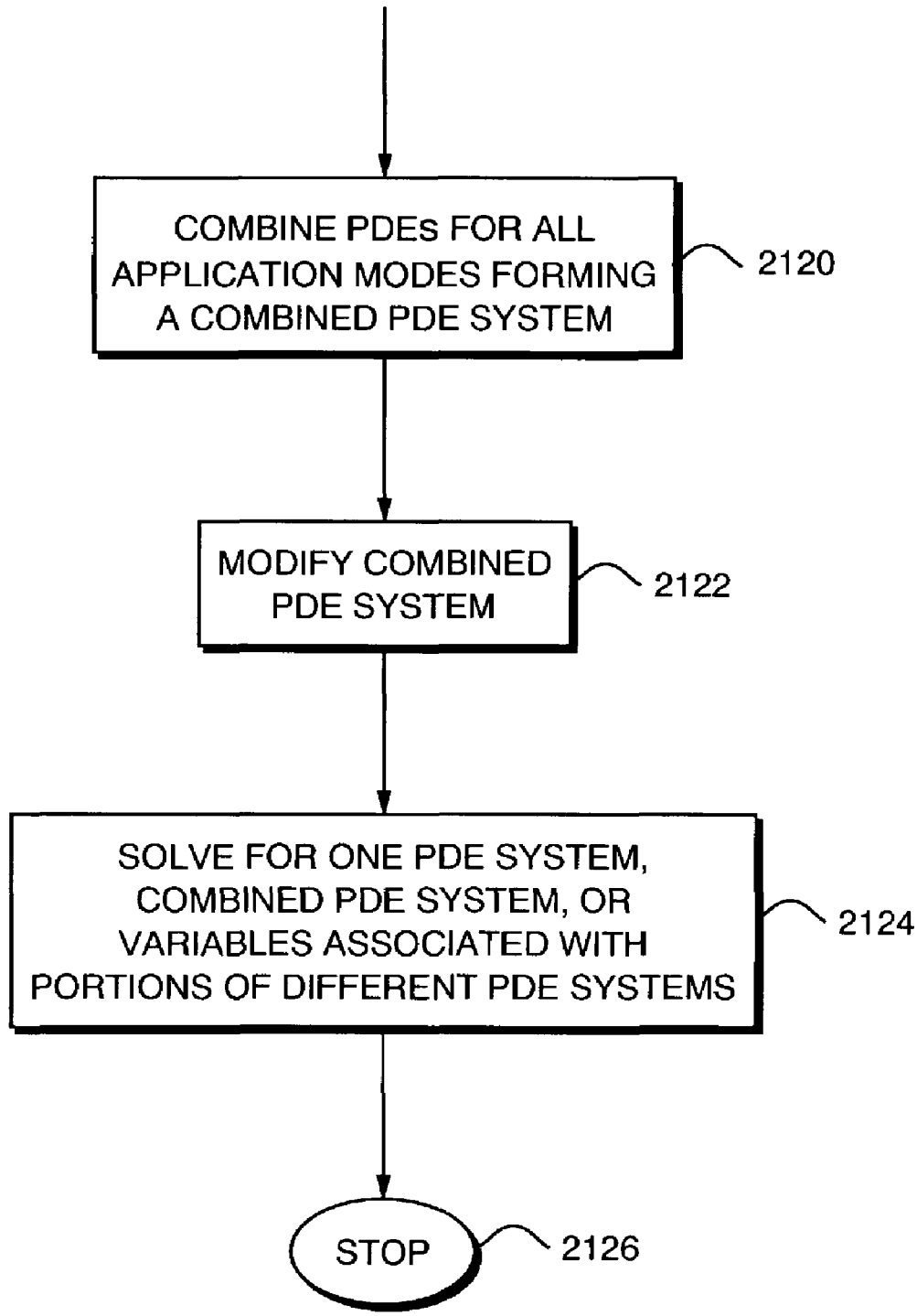

Referring to FIGS. 48-50, shown is an example of another embodiment of a flowchart of steps of one method for automatically specifying one or more systems of PDEs, which PDEs are associated with non-local coupling of variables, representing the PDEs in a single combined form, and solving a system of PDEs. Many of these steps are similar to those described in connection with, for examples, FIGS. 22 and 23 described elsewhere herein. What will now be described are a highlight of additional steps with respect to other descriptions in connection with FIGS. 22 and 23.

Referring now to FIG. 48, the flowchart 2200 at step 2202, a first geometry is selected. At step 2204, a determination is made as to whether all geometries are processed. If not, control proceeds to step 2100. If all geometries are processed, control proceeds to step 2120. Generally, the processing steps set forth in FIG. 49, flowchart 2000 may be performed for each geometry of interest and are similar to other processing steps described elsewhere herein in connection with other figures However, the processing steps of FIG. 49 utilize PDEs in the weak form. Thus, step 2114 provides for forming the weak form of the equations from the general form of step 2112.

Figure 51:
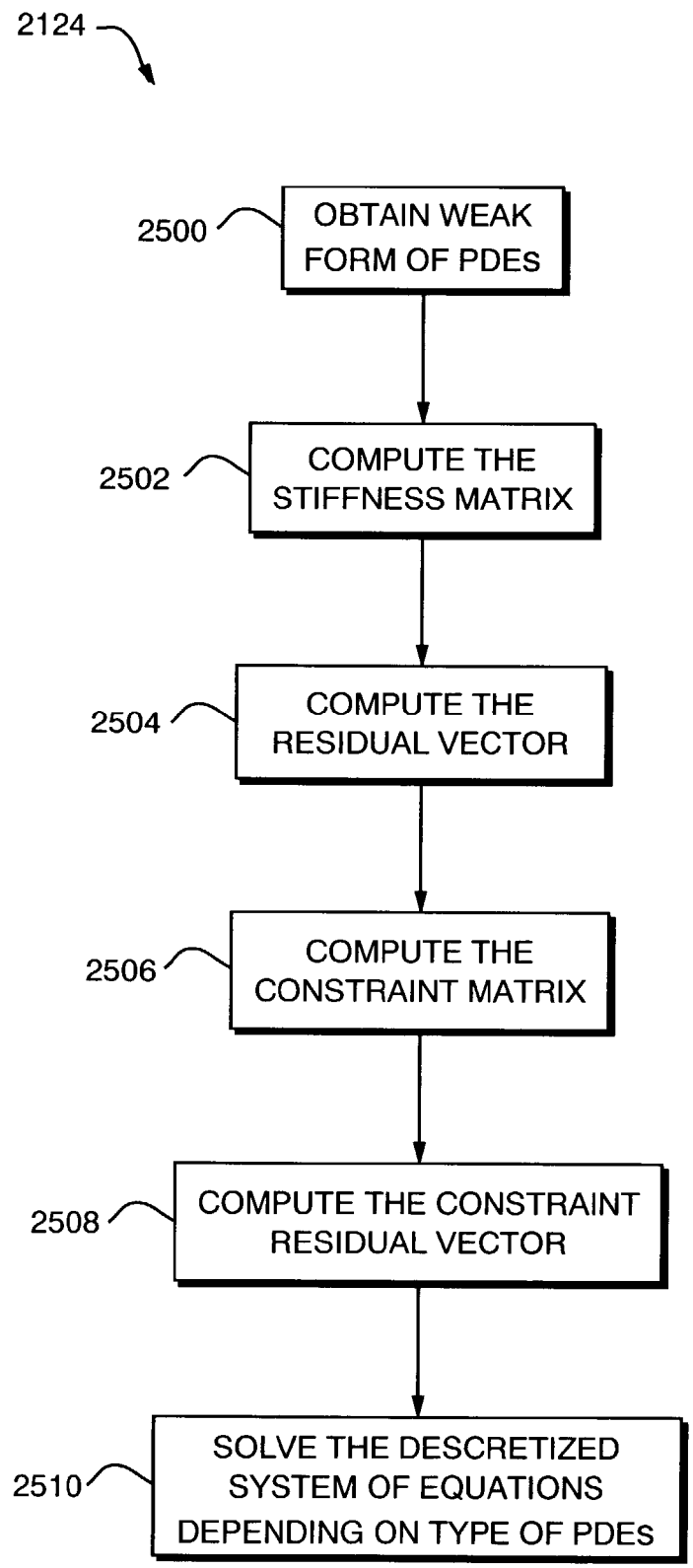
FIG. 51 is a flowchart of processing steps in an embodiment for solving a system of PDEs.

Referring now to FIG. 51, shown is a flowchart of steps that may be included in one embodiment in forming and solving for a solution of PDE's. The flowchart 2124 begins with step 2500 where the weak form of PDE's are formed. At step 2502, a stiffness matrix is determined. At step 2504, a residual matrix is determined. At step 2506, a constraint matrix is determined. At step 2508, a constraint residual is determined.

At step 2510, the discretized system of PDE's may be solved in accordance with the type of the system of PDE included. Depending on the type of PDE's being solved, different outputs of the various processing steps 2502-2508 may be used. This is described in more detail elsewhere herein.

Figure 52:
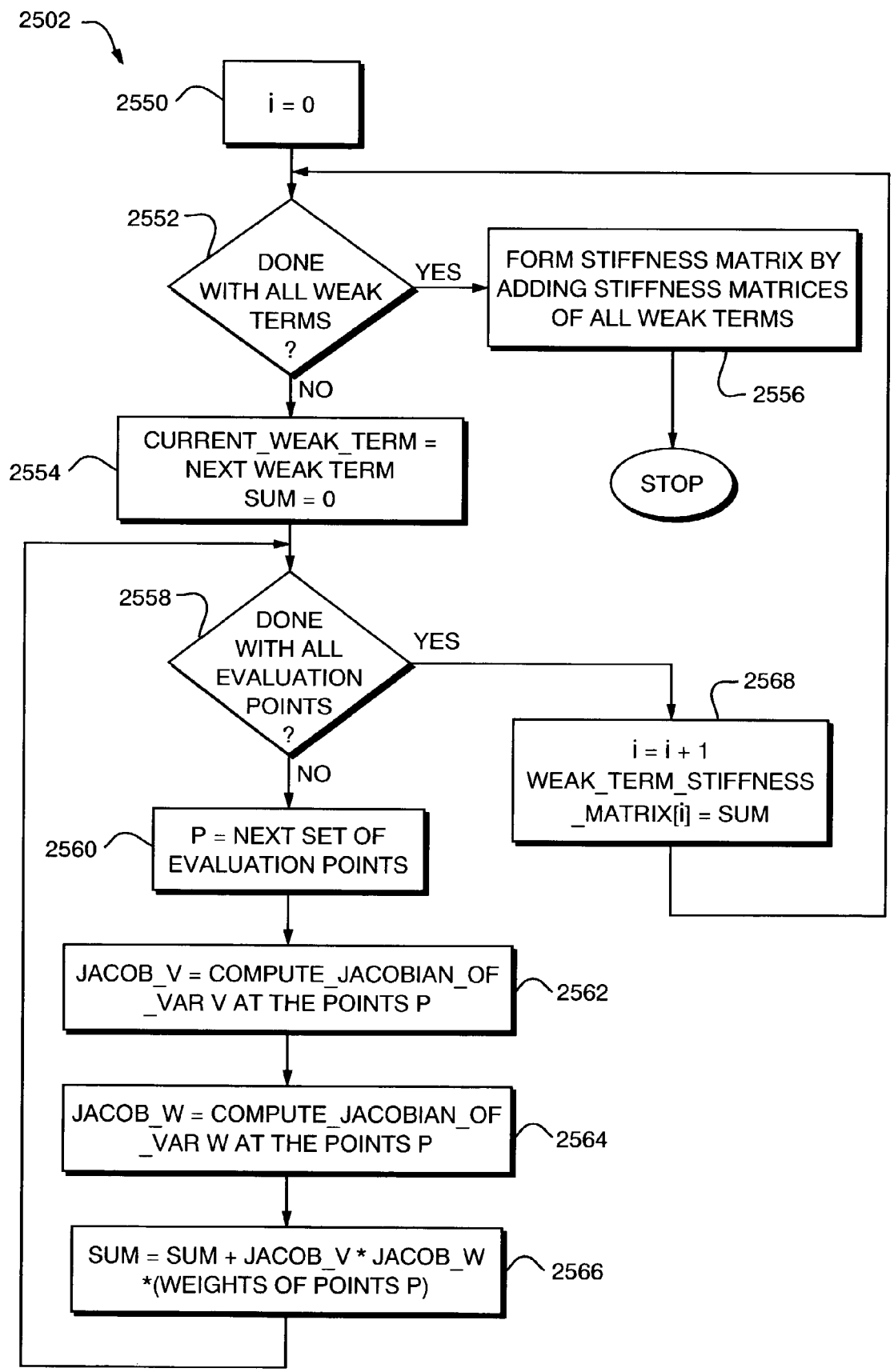
FIG. 52 is a flowchart of processing steps in an embodiment for computing the stiffness matrix.

Referring now to FIG. 52, shown is a flowchart of steps of one embodiment for computing a stiffness matrix. At step 2550, a loop counter variable i is initialized to 0. At step 2552, a determination is made as to whether all weak terms have been processed. If a determination is made that all weak terms have been processed, control proceeds to step 2556 where the stiffness matrix is formed by adding together all the stiffness matrices for the weak terms.

If a determination is made at step 2552 that all weak terms have not been processed, control proceeds to step 2554 where the current weak term is assigned to be the next weak term and the variable sum is initialized to 0. At step 2558, a determination is made as to whether all evaluation points have been processed. If not, control proceeds to step 2560 where P is assigned the next set of one or more evaluation points.

The total set of evaluation points may be determined using the quadrature formula. The number of points in one set of evaluation points may be chosen to optimize performance that may vary in accordance with each embodiment. For example, in an interpreted environment, such as MATLAB, the parsing of an expression can have a high computational cost. One might therefore choose a high number of points. On the other hand, processing many points "in parallel" costs lots of memory, so the number of points may also be limited in accordance with the amount of available memory.

At step 2562, Jacob_V is assigned to be the computed Jacobian of variable V at the points included in P. It is at step 2562 at which a recursive nature of this technique may be observed such that the appropriate routine is called to compute the Jacobian in accordance with the type of Variable V. Control proceeds to step 2564 where the variable Jacob_W is assigned the computed Jacobian of the variable W at the points included in P. As with step 2562, processing of step 2564 is also recursive in this embodiment of the processing steps included in flowchart 2502. Control proceeds to step 2566 where the variable sum is updated to include the product of the Jacobian of V and W multiplied by the weights of the points in P. Weights may be determined using techniques known to those of ordinary skill in the art, for example, using the quadrature formula as described in, for example, the *Finite Element Method volume* 1, by Zienkiewicz et al. described elsewhere herein.

Control proceeds to the determination at step 2558 where a further determination is made as to whether all evaluation points have been processed. If so, control proceeds to step 2568 where the variables weak_term_stiffness_matrix[i] and i are updated. Control proceeds to step 2552 to determine whether all weak terms have been processed.

Figure 53:
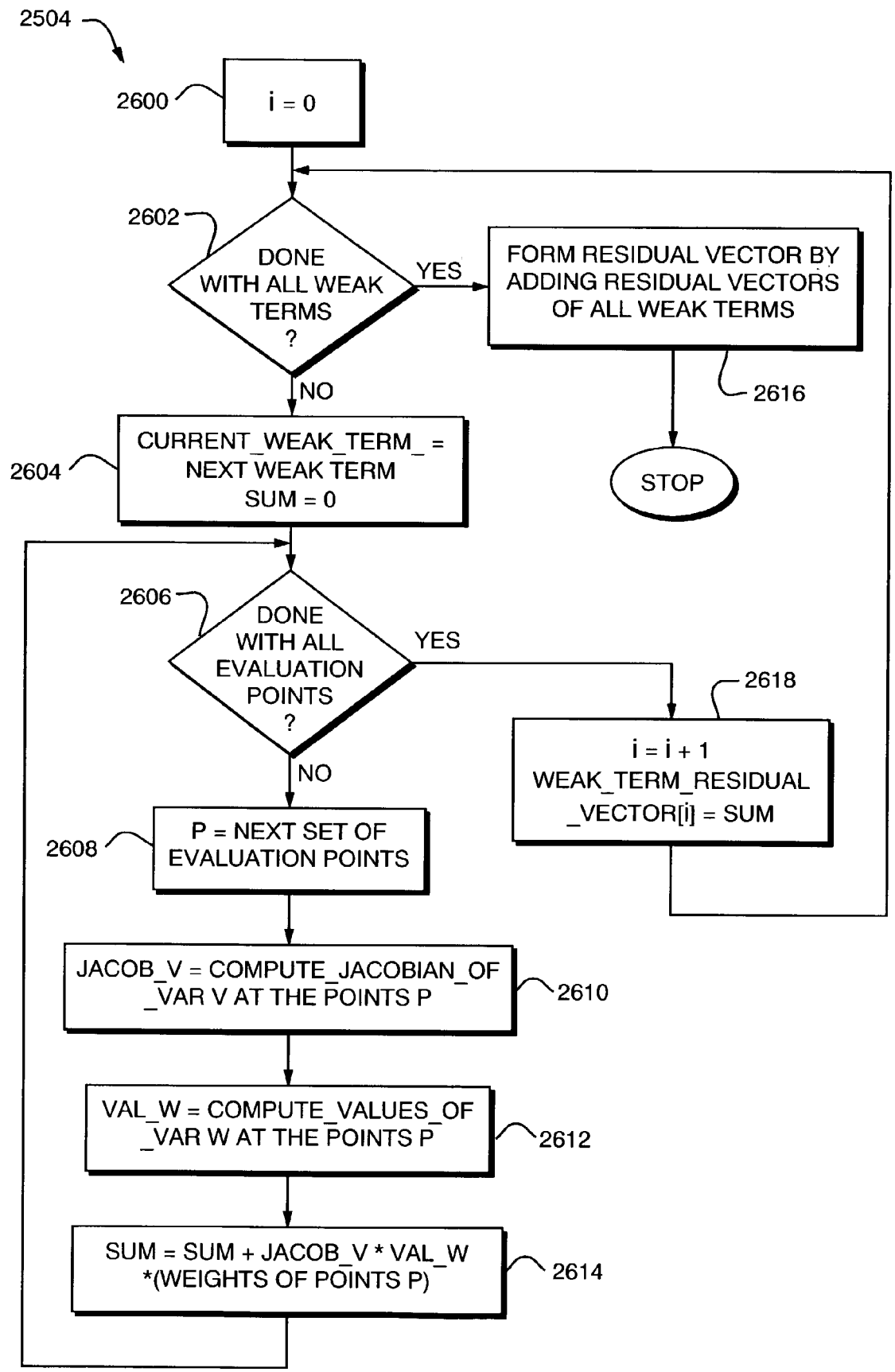
FIG. 53 is a flowchart of processing steps in an embodiment for computing the residual matrix.

Referring now to FIG. 53, shown is a flowchart of one embodiment for computing a residual vector. The steps in flowchart 2504 are more detailed processing steps with reference to step 2504 of flowchart 2124. At step 2600, a variable i is initialized to 0. At step 2602, a determination is made as to whether all weak terms have been processed. If so, control proceeds to step 2616 where the residual vector is formed by adding all residual vectors for the weak terms. If all weak term processing is not complete, control proceeds to step 2604 where sum is initialized to 0 and the current weak term is assigned the next weak term to be processed. Control proceeds to step 2606 where a determination is made as to whether all evaluation points have been processed. If not, control proceeds to step 2608 where P is assigned the next set of one or more evaluation points. At step 2610, the Jacobian of variable V is computed at all points in P. At step 2612, values of variable W are computed for the points in P. Steps 2610 and 2612 include recursive processing in order to determine the Jacobian and value, respectively, in accordance with variable type. At step 2614, sum is updated by the product Jacobian of V * Value of W * weight of the points P. The points P and weight may be determined using techniques described elsewhere herein. Control proceeds to step 2606 where a determination is made if all evaluation points have been processed. If so, control proceeds to step 2618 where the following variables are updated: weak_term_residual_vector[i] to store the results from the current weak term, and i.

Figure 54:
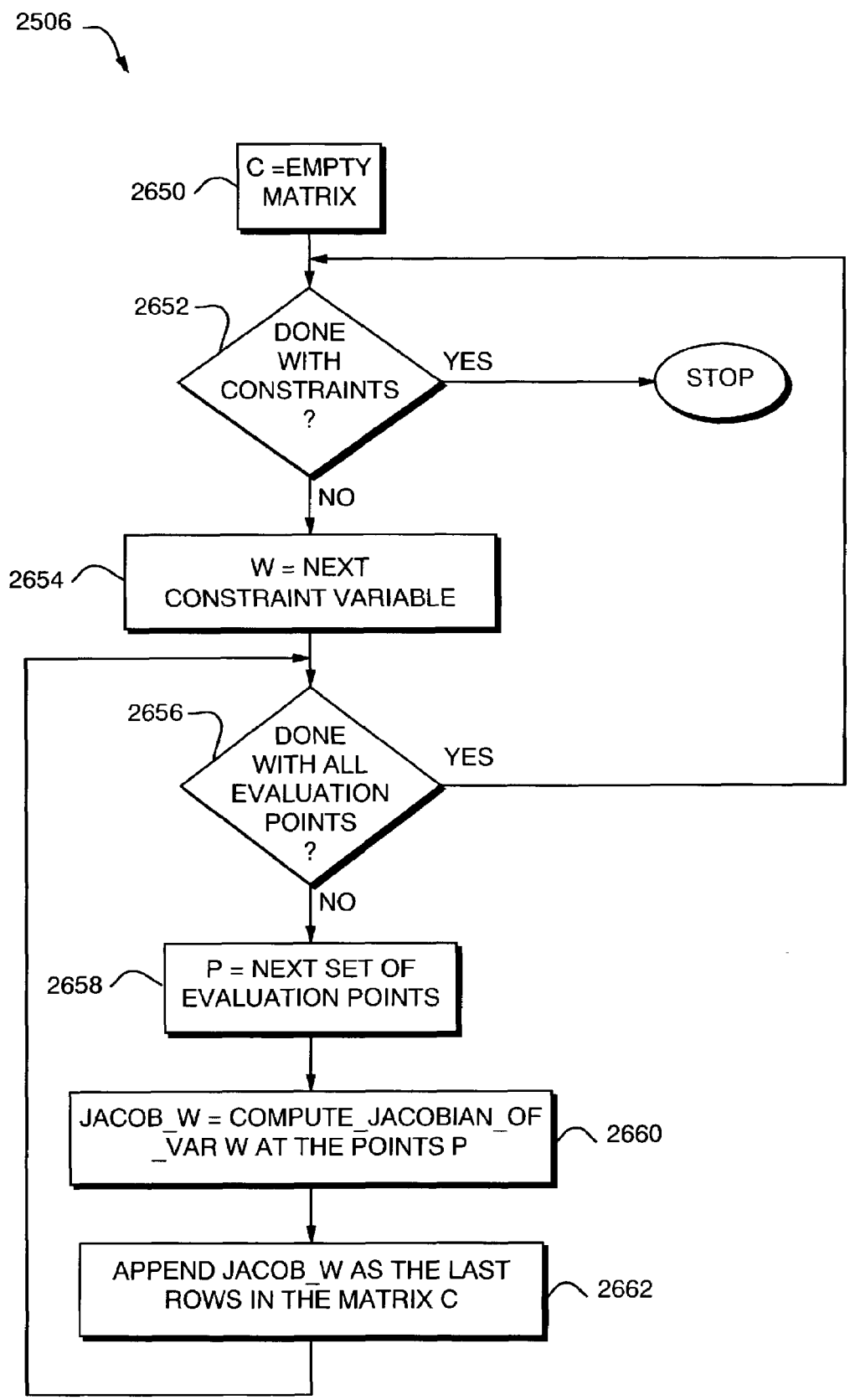
FIG. 54 is a flowchart of processing steps in an embodiment for determining the constraint matrix.

Referring now to FIG. 54, shown is a flowchart 2506 of more detailed processing steps for determining a constraint matrix that may be included in an embodiment. At step 2650, the matrix C is initialized. At step 2652, a determination is made as to whether all constraint variables have been processed. If so, processing stops. Otherwise, control proceeds to step 2654 where W is assigned the next constraint variable. At step 2656, a determination is made as to whether all evaluation points have been processed. If so, control proceeds to step 2652. Otherwise, control proceeds to step 2658 where P is assigned the next set of one or more evaluation points. The evaluation points may be determined in accordance with values specified in the cporder field of the xfem data structure described elsewhere herein. At step 2660, the Jacobian of W is computed at the points P and the vector of partial derivatives comprising the computed Jacobian are appended as the last rows in the matrix C at step 2662. Control proceeds to step 2656.

Figure 55A:
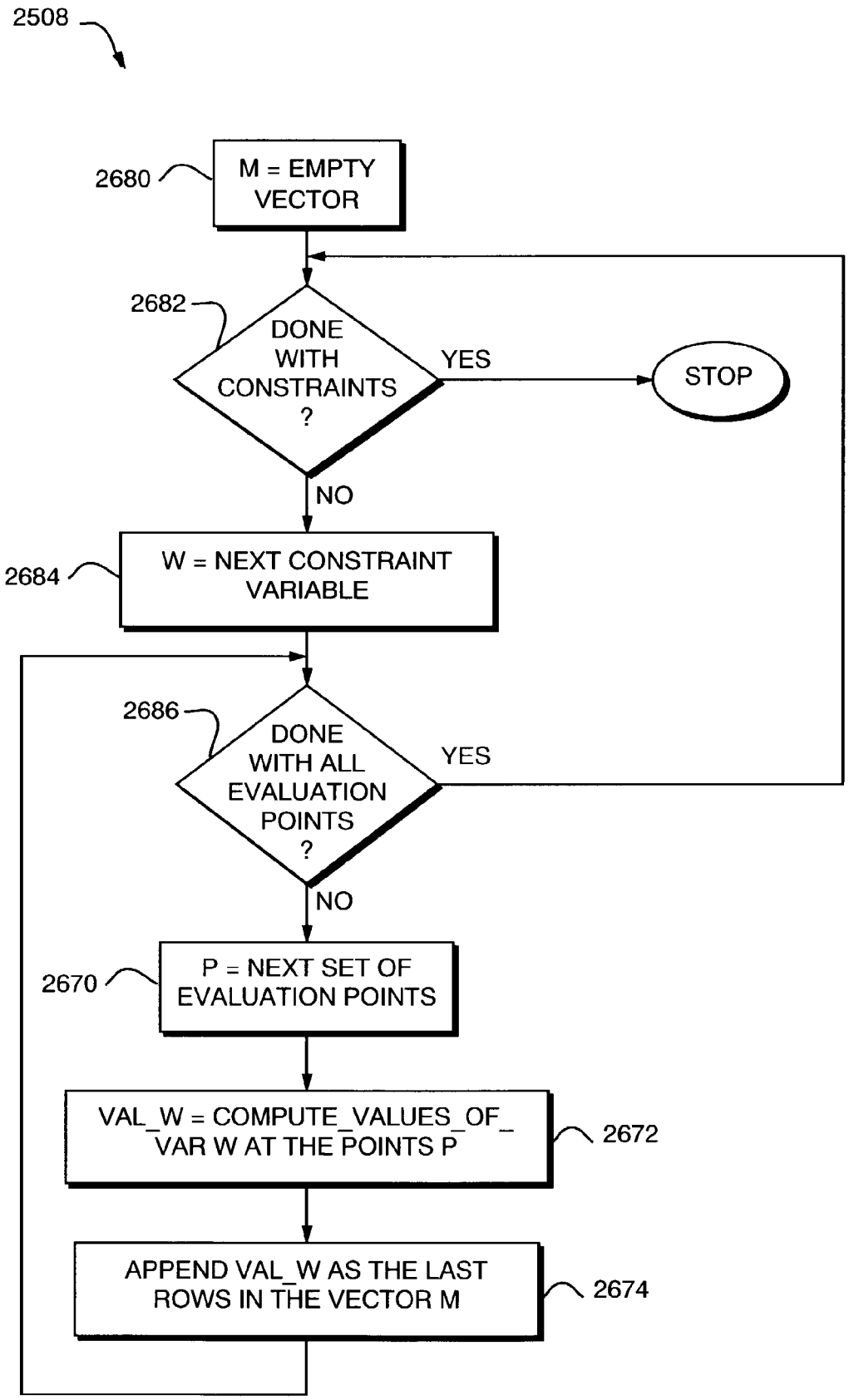
FIG. 55A is a flowchart of processing steps in an embodiment for determining a constraint residual.

Referring now to FIG. 55A, shown is a flowchart of steps of an embodiment that may be used in determining a constraint residual vector. At step 2680, M is initialized as the empty vector. At step 2682, a determination is made as to whether all constraint variables have been processed. If so, processing stops. Otherwise, control proceeds to step 2684 where W is assigned the next constraint variable. Control then proceeds to step 2686 where a determination is made as to whether all evaluation points have been processed. If so, control proceeds to step 2682. Otherwise, control proceeds to step 2670 where P is assigned the next set of evaluation points. At step 2672, values of variable W are computed at the points P and assigned to Val_W. At step 2674, Val_W is appended as the last rows in the vector M. Control proceeds to step 2686.

Figure 55B:
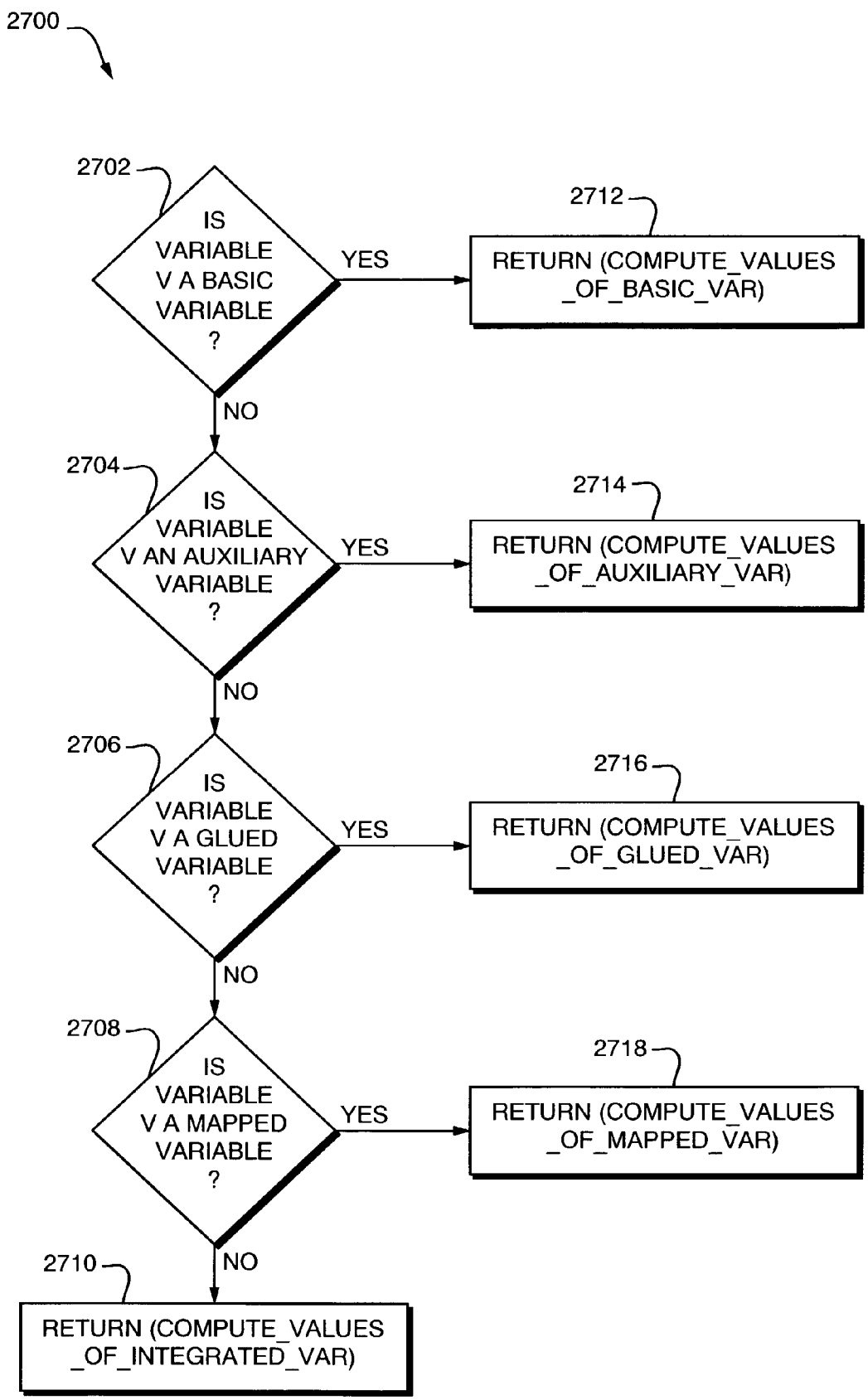

Referring now to FIG. 55B, shown is a flowchart of steps of an embodiment that may be used in determining the value of a variable at a set of points P. At step 2702, a determination is made as to whether the variable V is a basic variable. If so, control proceeds to step 2712 where the values of the basic variable V at points P are determined. Otherwise, control proceeds to step 2704 where a determination is made as to whether the variable V is of the auxiliary type. If so, control proceeds to step 2714 where values for the auxiliary variable are determined. Otherwise, control proceeds to step 2706 where a determination is made as to whether the variable V is a glued variable. If so, control proceeds to step 2716 where the value of glued variable V is determined. Otherwise, control proceeds to step 2708 where a determination is made as to whether the variable V is a mapped variable. If so, control proceeds to step 2718 for computing the value of the mapped variable V. Otherwise, the variable is an integrated type variable and its value is accordingly determined.

Referring now to FIG. 55C, shown is a flowchart of steps of an embodiment that may be used in determining the values of a basic variable at a set of points P. At step 2720, the values for a set of points are determined and returned. A vector of values is returned in which a jth element of the vector corresponds to a sum for a single point pj.

Figure 55D:
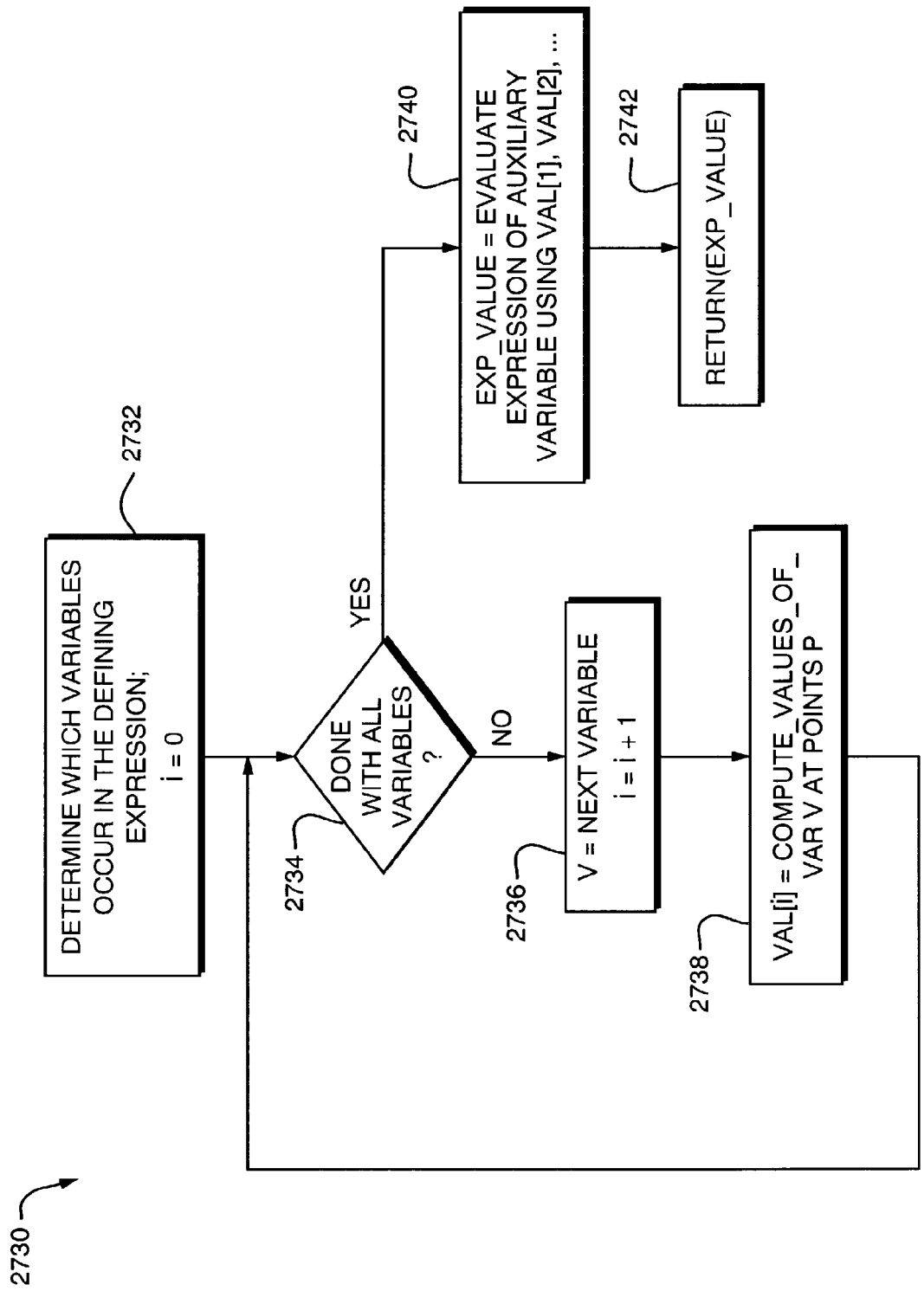

Referring now to FIG. 55D, shown in is a flowchart of steps of an embodiment that may be used in determining the values of an auxiliary variable at a set of points P. At step 2732, it is determined which variables occur in the defining expression for the auxiliary variable. Additionally, the variable i is initialized to 0. At step 2734, a determination is made as to whether all variables have been processed. If not, control proceeds to step 2736 where V is assigned the next variable and i is updated. At step 2738, the values of the variable V are determined at points P. VAL[i] is a vector of values where the jth component of VAL[i] corresponds to the jth point in P. Control proceeds to step 2734 where a determination is made as to whether all variable processing is complete. If so, control proceeds to step 2740 where the defining expression of the auxiliary variable is evaluated using VAL[i], for all entries in VAL. It should be noted that an expression may be evaluated, for example, using procedures available for use with the commercially available product MATLAB that parse the expression and apply appropriate mathematical functions to the operands. Control proceeds to step 2742 where the expression value is returned as a vector of values.

Referring now to FIG. 55E, shown is a flowchart of steps of an embodiment that may be used in determining the values of a glued variable at a set of points P. At step 2752, a determination is made as to which variables comprise the glued variable. Additionally k and VAL are initialized. Control proceeds to step 2754 where a determination is made as to whether all variable processing is complete. If so, control proceeds to step 2760 where the vector VAL is returned that includes an element for each evaluation point. Otherwise, control proceeds to step 2756 where k and V are updated. I is determined as the indices of points pj included in P that are within the domain k. Note that k indexes both the domains and the corresponding variables. At step 2758, VAL[j] is assigned the computed values of variable V at points pj included in I. In other words, the values of V are computed for those points pj for which j belongs to I. In this example at step 2758, this is performed by a call to compute_values_of_var. The returned values are then placed in the appropriate indices j of the vector VAL. Control proceeds to step 2754.

Figure 55F:
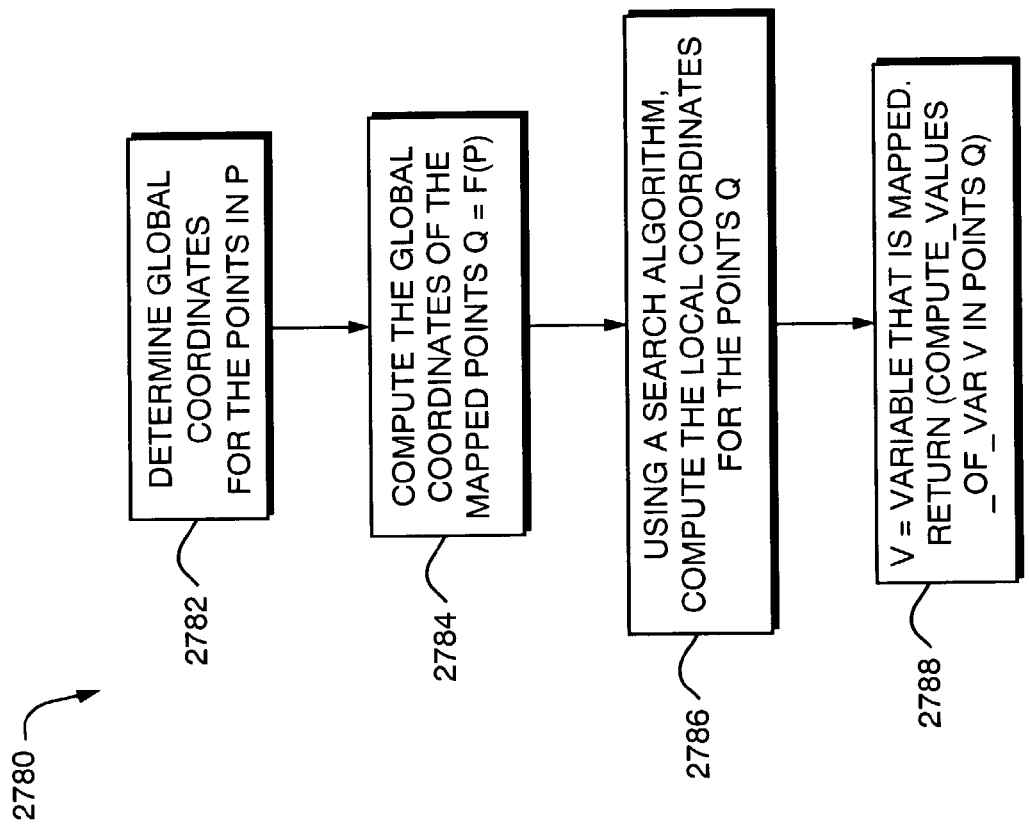

Referring now to FIG. 55F, shown in is a flowchart of steps of an embodiment that may be used in determining the values of a mapped variable at points in a set P. At step 2782, global coordinates of the points in P are determined. At step 2784, the global coordinates of the mapped points are determined. At step 2786, using a search technique, the local coordinates for points Q are determined. At step 2788, V is the variable that is mapped and the values of the variable V are determined at points in Q.

Figure 55G:
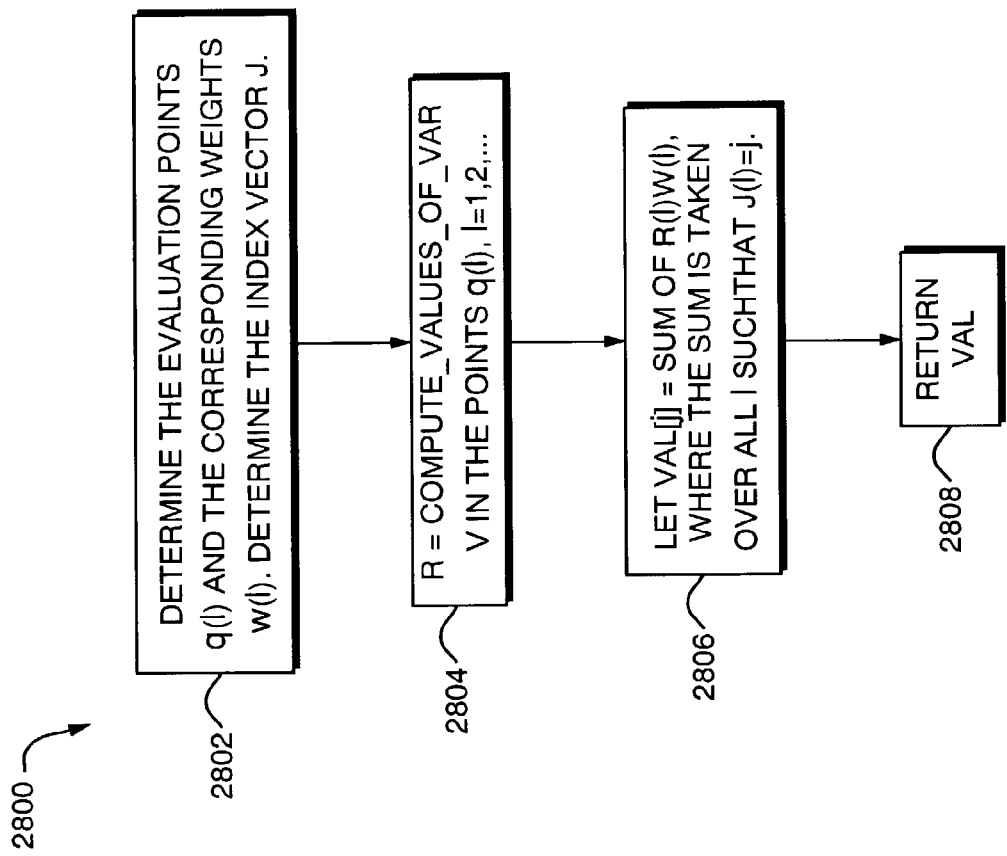

Referring now to FIG. 55G, shown is a flowchart of steps of one embodiment for determining the values of an integrated variable at a set of points P. At step 2802, the evaluation points q(l) and the corresponding weights are determined as described elsewhere herein. The index vector J is also determined as described elsewhere herein. At step 2804, R is assigned the computed values of variable V at points q(l), l=1, 2, . . . At step 2806, VAL[j] is determined. R is a vector including values of V at all points q(l), l=1, 2, . . . A single entry VAL[j] corresponds to the value of the integrated variable at the jth point. At step 2808, VAL is returned as the vector of values.

Figure 55H:
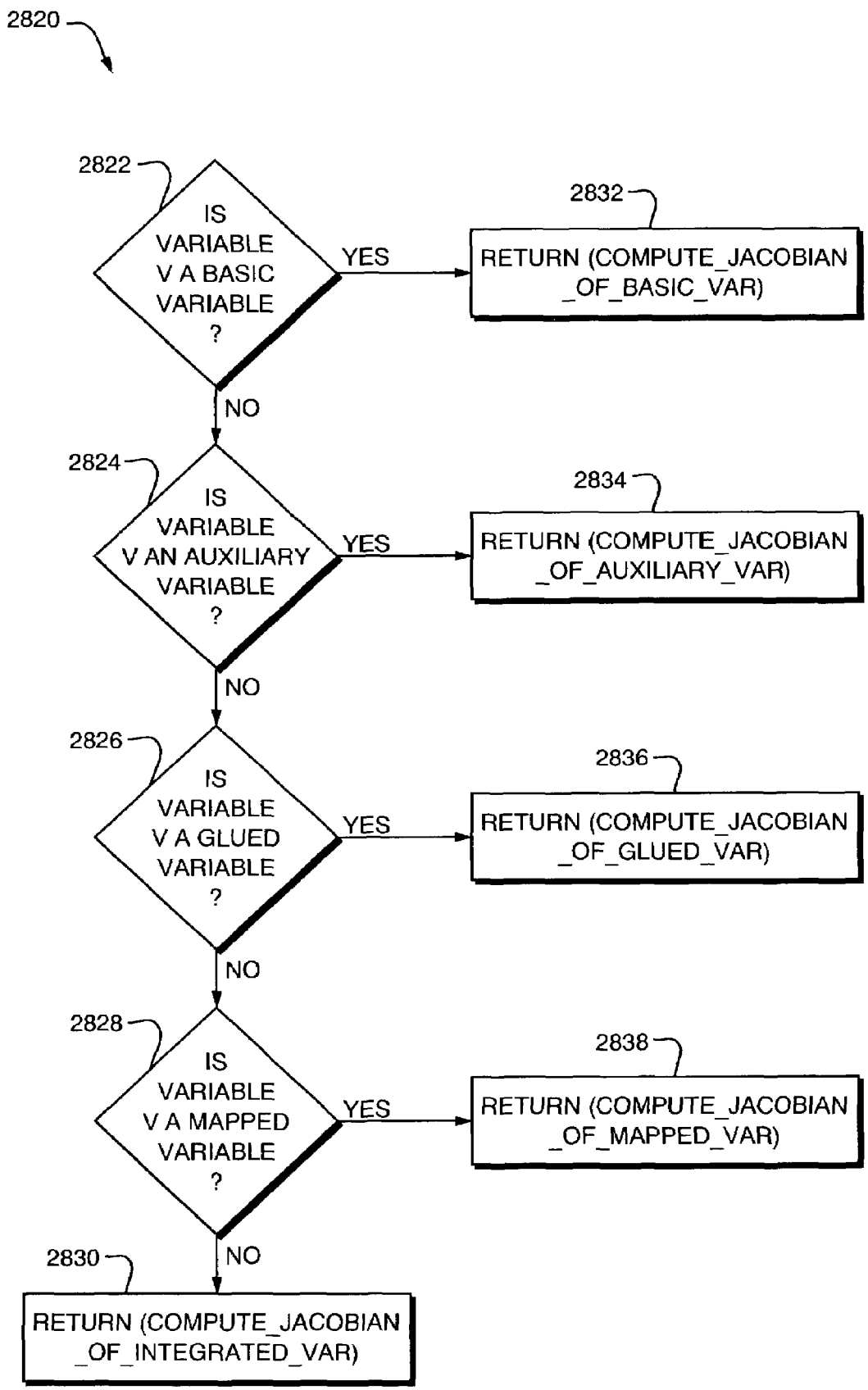

Referring now to FIG. 55H, shown is a flowchart of steps of an embodiment for computing the Jacobian of a variable V at a set of points P. At step 2822 a determination is made as to whether V is a basic variable. If so, the Jacobian of the basic variable is determined at step 2832. Otherwise, control proceeds to step 2824 where a determination is made as to whether V is an auxiliary variable. If so, control proceeds to step 2834 where the Jacobian of the auxiliary variable V is determined. Otherwise, control proceeds to step 2826 where a determination is made as to whether V is a glued variable. If so, control proceeds to step 2836 where the Jacobian of the glued variable V is determined. Otherwise control proceeds to step 2828 where a determination is made as to whether V is a mapped variable. If so, control proceeds to step 2838 where the Jacobian of the mapped variable V is determined. Otherwise, the variable is an integrated variable and the Jacobian of the integrated variable V is determined at step 2830.

Referring now to FIG. 55I, shown is a flowchart of steps of an embodiment for computing the Jacobian of a basic variable V at points P. At step 2852, J1.DOF is determined. At step 2854, J1.VAL is determined. At step 2856, J1.EP is determined. At step 2862, the J1 is returned.

It should be noted that as described herein, for all the functions that compute the Jacobian, what is returned is not the Jacobian matrix in this embodiment. Rather, a representation of the Jacobian is returned. This representation is a list of so-called "contributions", according to the data format for the Jacobian as described elsewhere herein.

Figure 55J:
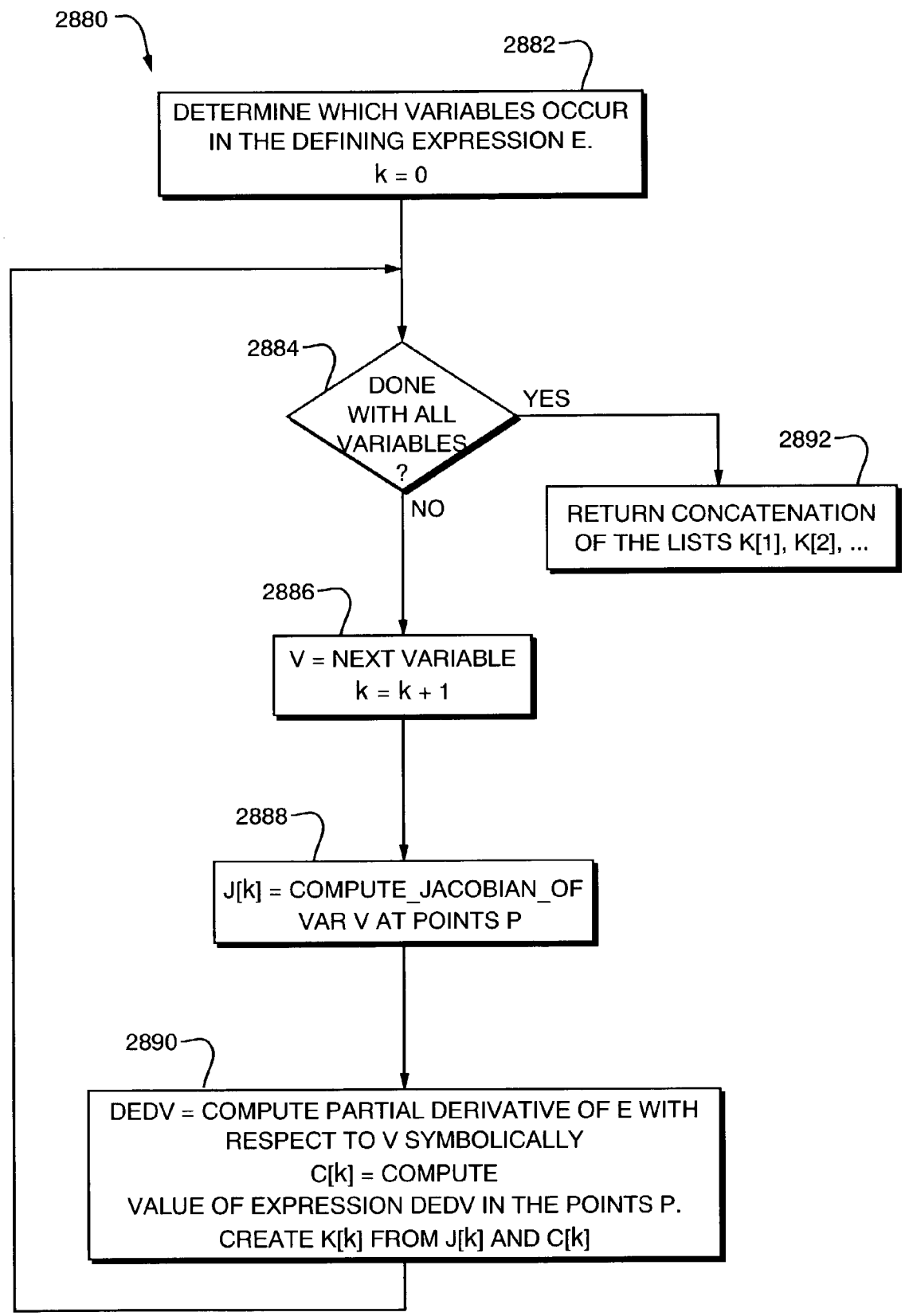

Referring now to FIG. 55J, shown is a flowchart of steps of an embodiment for computing the Jacobian of an auxiliary variable. At step 2882, k is initialized to 0 and it is determined which variables occur in the defining expression E of the auxiliary variable. Control proceeds to step 2884 where a determination is made as to whether all variables have been processed. If not, control proceeds to step 2886 where V is assigned the next variable to be processed and k is updated. At step 2888, J[k] is assigned the computed Jacobian of the variable V at points in P. At step 2890, the partial derivative of the expression with respect to V is determined symbolically and then evaluated at points included in P. An embodiment may utilize the compute_values_of_var routine as described in connection with FIG. 55B in evaluating the expression of the partial derivative noted as DEDV in step 2890 in accordance with variable types. Other routines, compute_values_of_XXX_var, are called recursively in accordance with variable type. K[k] is determined from J[k] and C[k] as described elsewhere herein. Control proceeds to step 2884 where a determination is made as to whether all variables have been processed. If so, control proceeds to step 2892 where the concatenation of K[k] for all k is performed and returned as the Jacobian.

Figure 55K:
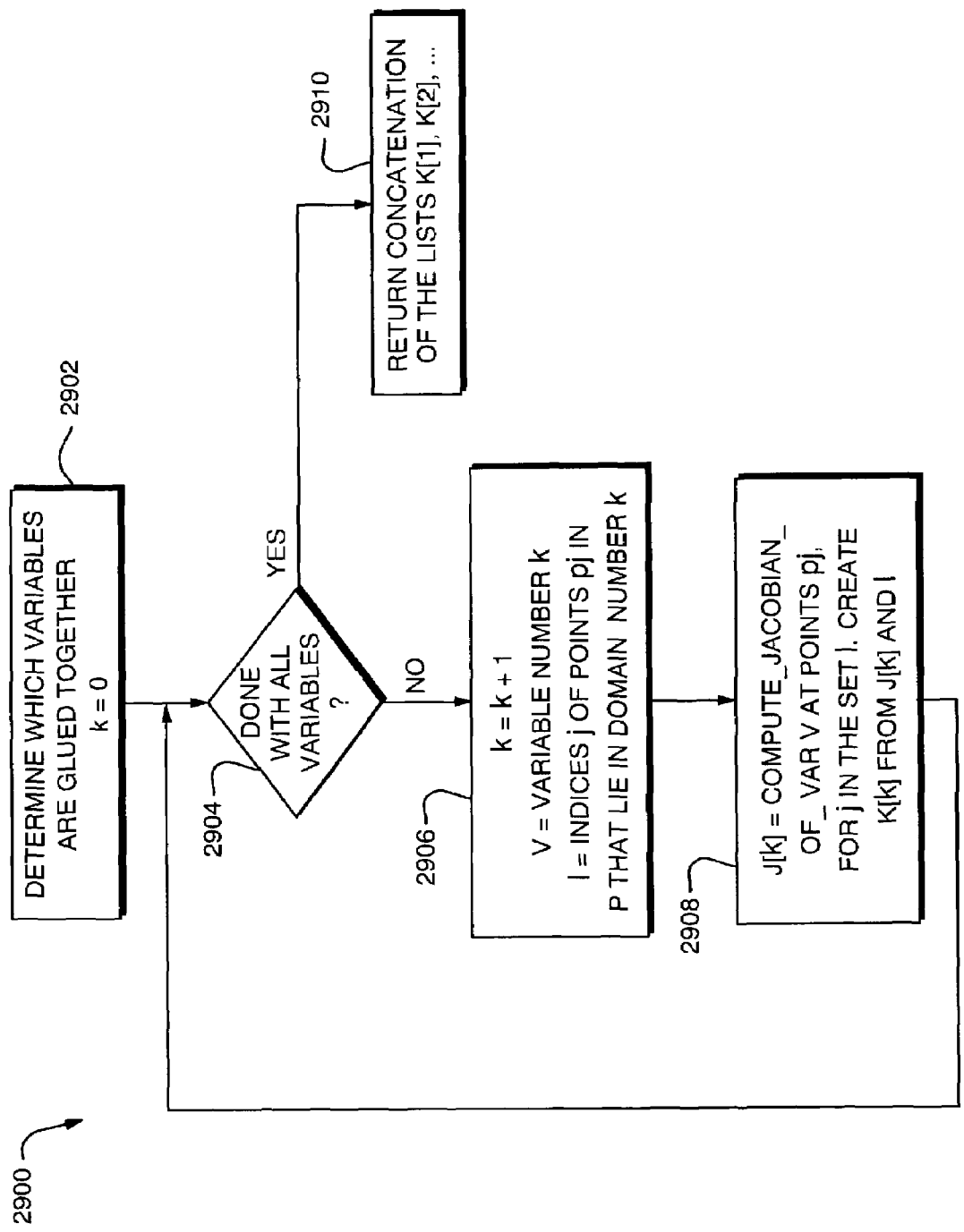

Referring now to FIG. 55K, shown is a flowchart of steps of an embodiment for computing the Jacobian of a glued variable at a set of points P. At step 2902, it is determined which variables comprise the glued variable. Additionally, k is initialized to be 0. At step 2904, a determination is made as to whether all variables have been processed. If not, control proceeds to step 2904 where k and V are updated. Additionally, I is assigned all indices j of the points pj in P that are in the domain k. At step 2908, J[k] is determined as the computed Jacobian of V at points pj for all j in the set I. Additionally, K[k] is created from J[k] and I. Control proceeds to step 2904 where a determination is made as to whether all variable processing is done. If so, control proceeds to step 2910 where all of K[m] for all m are concatenated and returned.

Figure 55L:
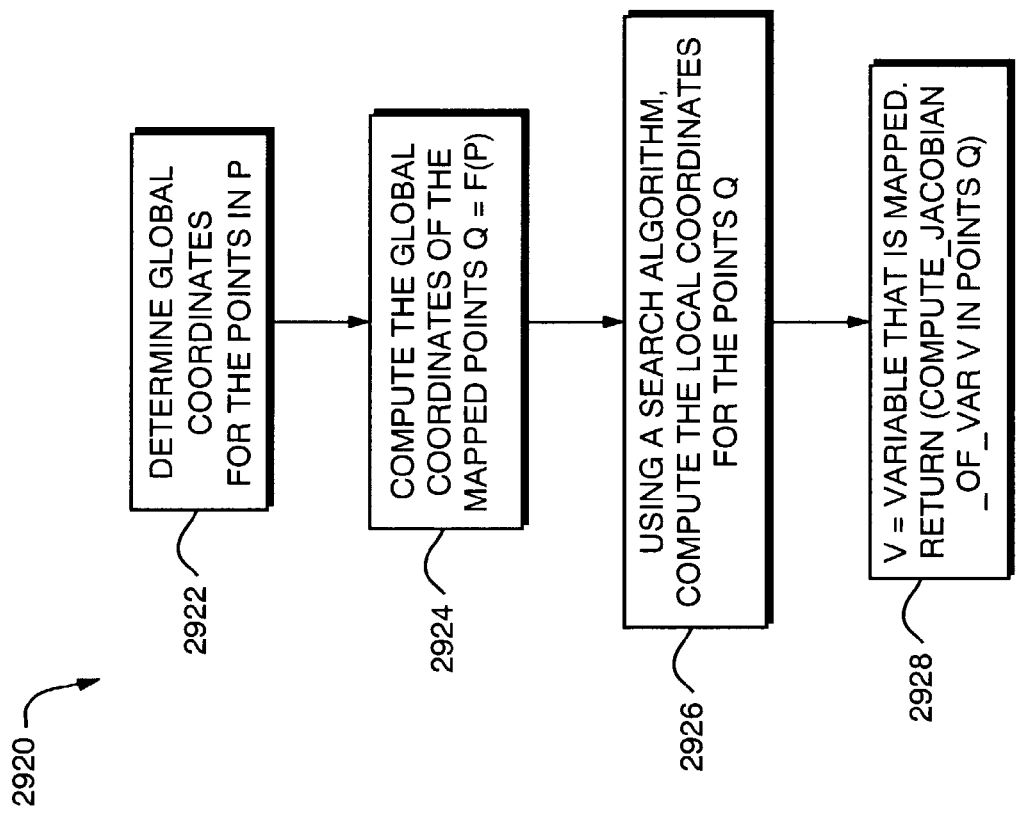

Referring now to FIG. 55L, shown is a flowchart of steps of an embodiment for determining a Jacobian of a mapped variable at a set of points P. At step 2922, the global coordinates for P are determined. At step 2924, the global coordinates of the mapped points are determined. At step 2926, using a search technique, the local coordinates of the mapped points Q are determined. At step 2928, the Jacobian for V is determined at points Q where V is the variable that is mapped.

Figure 55M:
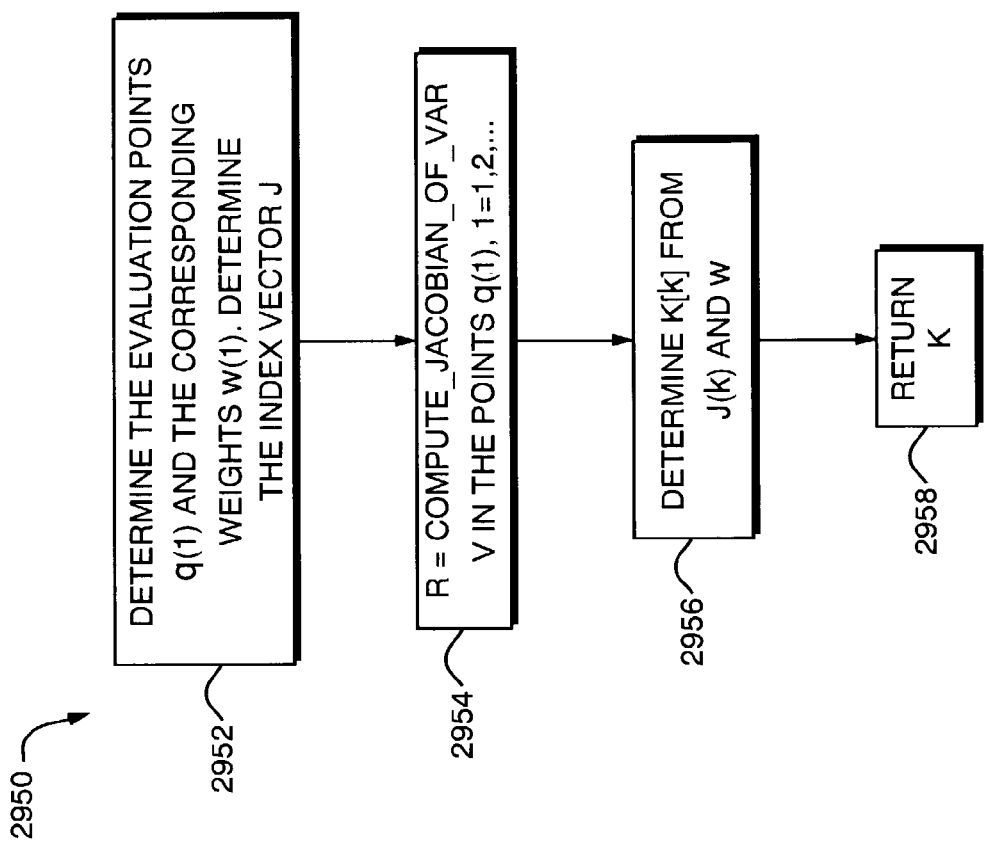

Referring now to FIG. 55M, shown is a flowchart of steps of an embodiment for determining the Jacobian of an integrated variable at a set of points P. At step 2952, evaluation points q(1) are determined and corresponding weights. Index vector J is determined. Determination of evaluation points, weights and index vector J is described elsewhere herein in more detail. At step 2954, the Jacobian of V is determined for points q(1), 1=1, 2, . . . At step 2956, K[k] is determined from J[k] and w, as also described in more detail elsewhere herein. At step 2958, K is returned.

Figure 56:
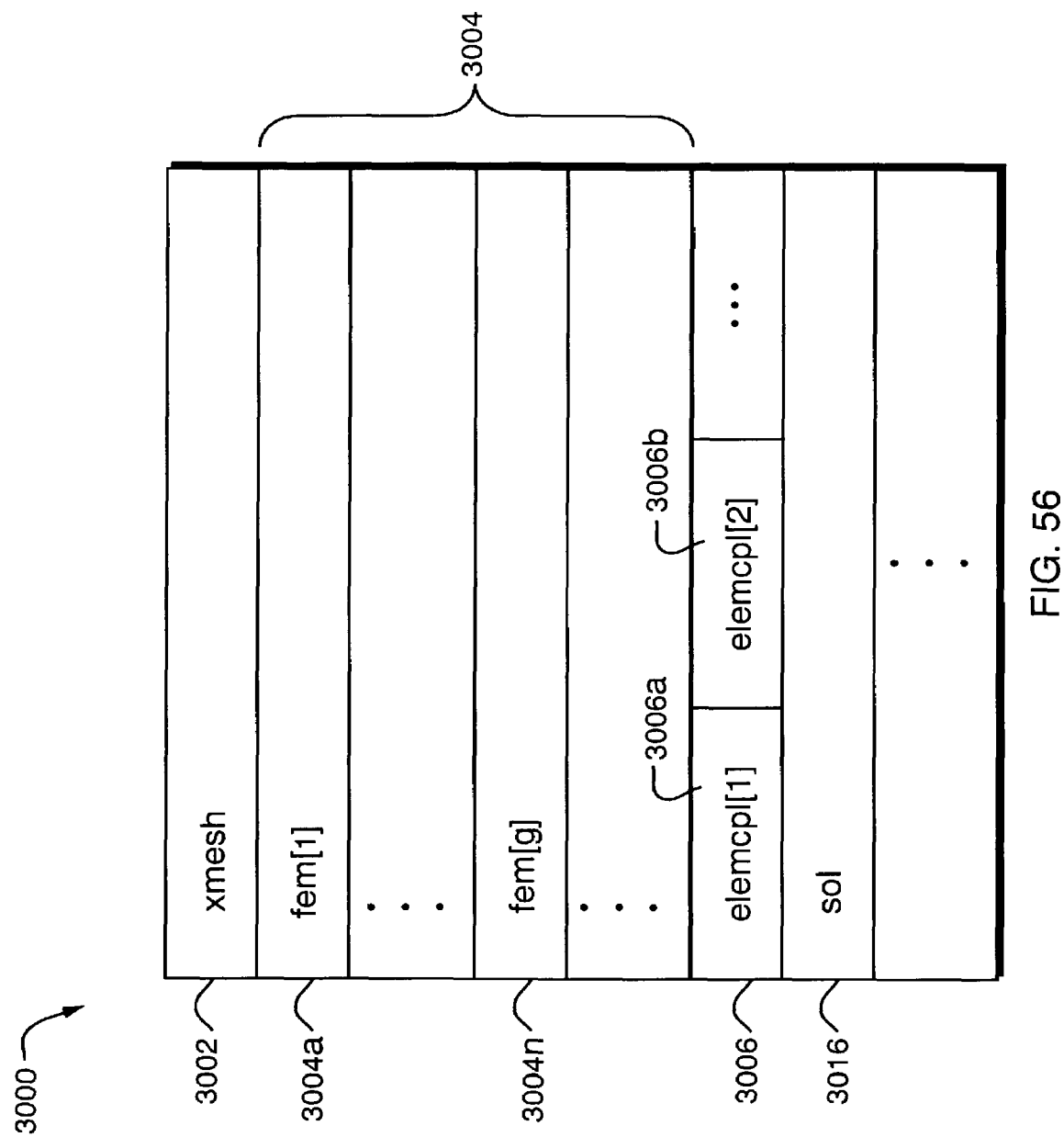
FIGS. 56-57 are examples of data structures that may be included in an embodiment in connection with the extended mesh structure for multiple geometries.

Referring now to FIG. 56, shown is an example of an embodiment of a data structure that may be used in representing a plurality of geometries that are coupled.

The data structure 3000 is headed by a pointer xfem. Included in the data structure 3000 is an extended mesh or xmesh structure 3002. For each of the geometries, a fem data structure instance such as 3004a-3004n is included. It should be noted that each instance of the fem data structure such as 3004a may be an instance of the data structure 1000 described in connection with FIG. 40. The field 3006 may include one or more elements that are used to define the different types of variables in non-local couplings. It should be noted that an embodiment may also include non-local couplings which are not between geometries but specified within a single geometry also within a single fem structure. Also shown in the data structure 3000 is the sol or solution field 3016. The sol field is a structure with a subfield u, which is a solution vector or a solution matrix. Each column in the solution matrix or vector contains the values of all the degrees of freedom. If u is solution matrix, then each column corresponds to the solution at a certain time value or eigenvalue. For time-dependent or eigenvalue problems, sol can have additional subfields containing the time values or eigenvalues. It should be noted that an embodiment may also include other fields in the data structure of FIG. 56.

Figure 57:
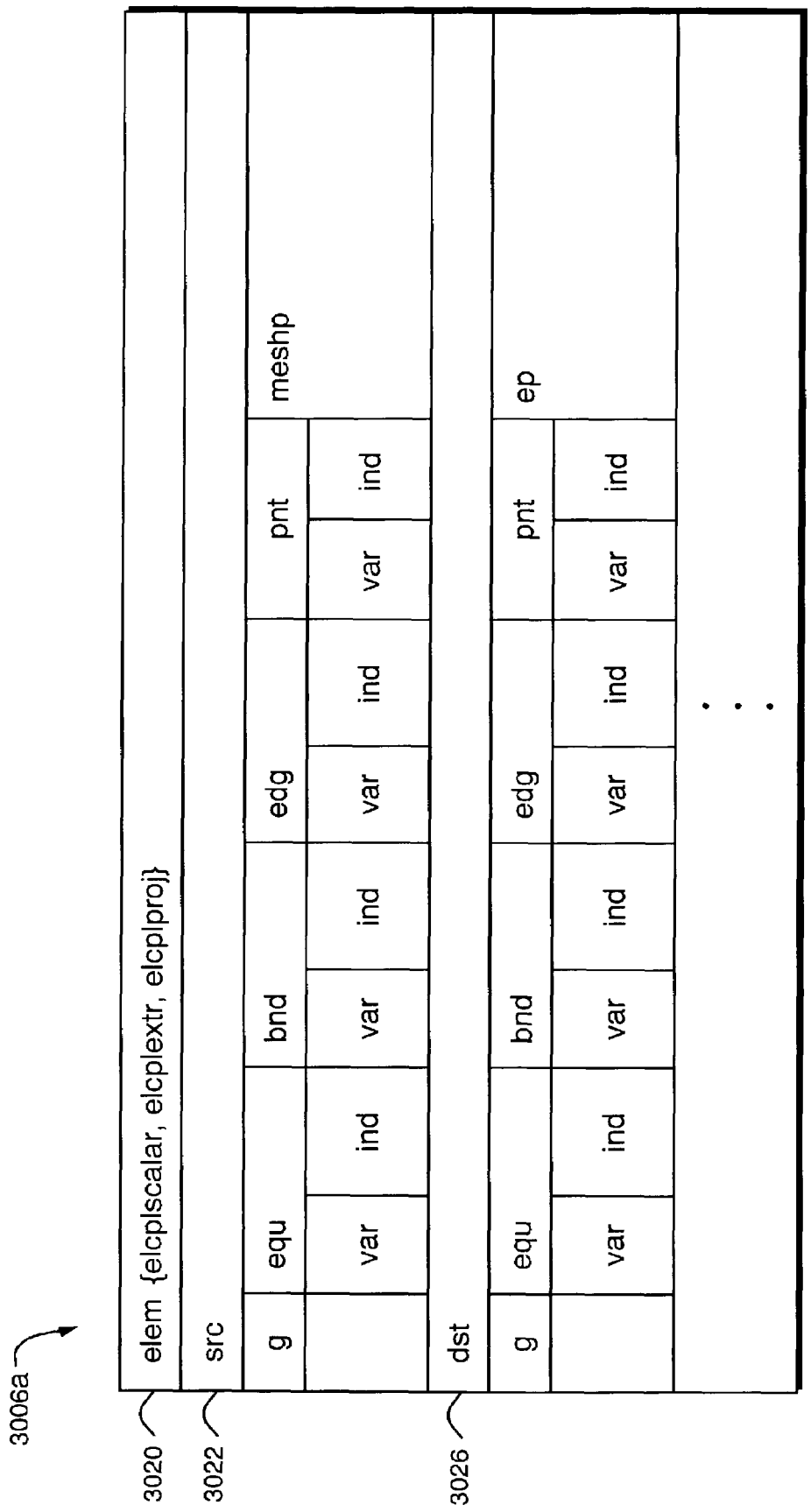

Referring now to FIG. 57, shown is an instance of a non-local variable or coupling specified such as 3006a. It should be noted that each instance of a non-local coupling included in the field 3006 may have a similar structure to that of FIG. 57. A particular instance of elemcpl for a non-local coupling variable may include an elem field which is elcplscalar, elcplextr, or elcplproj, indentifying either a scalar coupling, an extrusion coupling, or a projection coupling, respectively, as described elsewhere herein. Other embodiments may also include other types of couplings. Also included is an src (source) field 3022 and its subfields as well as a dst (destination) field 3026. It should be noted that other data fields shown in connection with FIG. 57, such as meshp and ep, are described elsewhere herein in more detail.

It should be noted that various fields of the data structure 3006a may be used in accordance with the different types specified in field 3020. In other words, for a scalar coupling type, different fields of the data structure may be used in contrast to when the type specified in field 3020 is one corresponding to a projection coupling. Uses of different fields included in the data structure 3006a, for example, are described in more detail elsewhere herein in accordance with each of the different of the different types of non-local couplings and variables.

In one embodiment, the extended mesh data structure, referred to as xfem.xmesh herein, may be created by invoking a function meshextend which creates the xmesh data structure in accordance with the PDE problem as described in the xfem structure. In one embodiment, the routine meshextend may be invoked after an instance of fem structure is defined for each geometry, and may perform the following:

1. The PDE problem specification is translated to an intermediate form, which is stored as a cell vector xmesh.el. Each entry in this cell vector is an object, called an element object. An element object defines a part of the PDE problem, like variables, equations, or constraints. An element object also has a number of methods that can perform various tasks.

2. The element objects xmesh.el{i} may introduce a number of new node points within the mesh elements, in addition to the mesh vertices contained in the basic meshes xfem.fem{g}.mesh. The function meshextend organizes all these node points in the data structures in xmesh.

3. Each element object xmesh.el{i} introduces a partition of (a subset of) the domains of dimension edim. Meshextend finds the common refinement of these partitions, the mesh domain groups. This means that a mesh domain group is a maximal collection of domains that belong to the same group, for all of the partitions given by the element objects.

4. The element objects xmesh.el{i} can introduce degree of freedom names. Meshextend collects all these names in the cell vector xmesh.name. Meshextend also collects all local degrees of freedom created by the element objects into a list of global degrees of freedom. Each global degree of freedom is given a number. A degree of freedom is a pair consisting of a degree of freedom name and a node point. When the node point is specified by giving its location relative to a mesh element (that is, in local coordinates), the degree of freedom may be referred to as a local degree of freedom. When the node point is specified in global coordinates, it may be referred to as a global degree of freedom. Note that two local degrees of freedom for adjacent mesh elements can correspond to the same global degree of freedom.

5. The element objects can introduce variables that can be computed. Meshextend collects this information into a table that tells which element object computes which variable.

What will now be described is a more detailed description of the xfem.xmesh data structure follows. xmesh is a structure with the following fields:

| Field name | Description |
| --- | --- |
| el | Cell vector of element objects, which describe different aspects of the PDE problem. |
| p | Node points for the extended mesh in all geometries. p is a cell vector of matrices. p{g} is a matrix whose columns are the global coordinates for all node points in geometry number g. |
| elmesh | Mesh data relating to the individual element structures xmesh.el{i}. The field elmesh is a nested cell vector of so-called "element mesh structures". More precisely, elmesh{i}{edim + 1} is a structure containing mesh data related to mesh elements of dimension edim and the element object xmesh.el{i} described below. |
| dmesh | Domain mesh data, that is, mesh data not specific to individual element structures. dmesh is a cell vector of "domain mesh structures". In other words, dmesh{edim+1} is a structure containing mesh data related to mesh elements of dimension edim, described below. |
| name | name{g} is a cell vector containing the degree of freedom names in geometry number g. |
| gdof | Numbering of the global degrees of freedom. gdof is a cell vector of matrices. The matrix gdof{g} contains global degree of freedom numbers for node points in geometry g. That is, gdof{g}(n,iname) is the number of the global degree of freedom that corresponds to node point number n and name number iname. Here n is the second index in xmesh.p{g}, and iname is the index into xmesh.name{g}. If there is no degree of freedom associated to the pair (n,iname), we have gdof{g}(n,iname) = 0. |

What will be described in following text are fields in the "domain mesh structure" xmesh.dmesh{edim+1} which in this embodiment includes the fields g, ind, n, np, ix, and elvars.

| Field Name | Description |
| --- | --- |
| g | cell vector with geometry numbers. g{imdomgrp} is the number of the geometry that the mesh domain group imdomgrp (in dimension edim) resides in. |
| ind | cell vector with mesh domain groups in dimension edim. That is, ind{imdomgrp} is a vector containing the numbers of the domains (of dimension edim) that belong to mesh domain group number imdomgrp. |
| n | cell vector of matrices containing node point numbers for the mesh elements. The columns of n{imdomgrp} contains the node point numbers for the mesh elements within mesh domain group number imdomgrp in dimension edim. That is, n{imdomgrp}(mp,me) is the global node point number (second index into xmesh.p{g}) for node point number mp within mesh element number me in mesh domain group imdomgrp. |
| np | cell vector containing local coordinates for node points. More precisely, np{imdomgrp} is a matrix whose columns are the local coordinates for the node points in mesh elements in mesh domain group imdomgrp in dimension edim. In other words, np{imdomgrp}(1:edim,mp) are the local coordinates for node point number mp. (This is the same for all mesh elements within the mesh domain group imdomgrp.) |
| ix | cell vector containing indices into the basic mesh xfem.fem{g}.mesh. ix{imdomgrp} is a vector with basic mesh element indices for the mesh elements within mesh domain group imdomgrp in dimension edim. ix{imdomgrp}(me) is the number for the mesh element in the basic mesh xfem.fem{g}.mesh that corresponds to mesh element me in mesh domain group imdomgrp. |
| elvars | cell vector of cell matrices, containing information about variables. elvars{imdomgrp} is cell matrix with 3 rows that contains information about which variables can be computed in mesh domain group imdomgrp in dimension edim. The first row contains variable names. The second row contains the corresponding indices i for the element objects that compute these variables. The third row contains the corresponding mesh domain group indices idomgrp specific to these element objects, see below. |

Now we describe the fields of the "element mesh structure" elmesh{i}{edim+1}. This structure has the fields mind, elind, rows, and name.

| Field | Description |
| --- | --- |
| mind | cell vector containing the indices imdomgrp for those mesh domain groups that are subsets of any domain group of dimension edim defined by element object number i. The index into mind is denoted idomgrp. |
| elind | cell vector containing the element domain group indices corresponding to the indices idomgrp. This means that the mesh domain group with number mind(idomgrp) is a subset of the domain group with number elind(idomgrp) defined by element object number i in dimension edim. |
| rows | Defines which rows in the mesh matrix dmesh{edim + 1}.n{imdomgrp} are used by element object number i. The field rows is a matrix. For the mesh domain group mind(idomgrp), and an element node point number elp (for element object number i and dimension edim), the corresponding mesh element point number mp is given by mp = rows(elp, idomgrp). |
| name | Specifies a mapping from names for local degrees of freedom to names for global degrees of freedom. The field name is a vector. Consider a variable that occurs as local degree of freedom for element object number i in geometry g and dimension edim. Let idim be its index in the variable list defined by the element object. Let iname be its index in the global list xmesh.name{g}. Then iname = name(idim). |

Following are additional screenshots that may be included in an embodiment. In particular, these screenshots may be included in an embodiment in which equations in weak form may be utilized.

Figure 58:
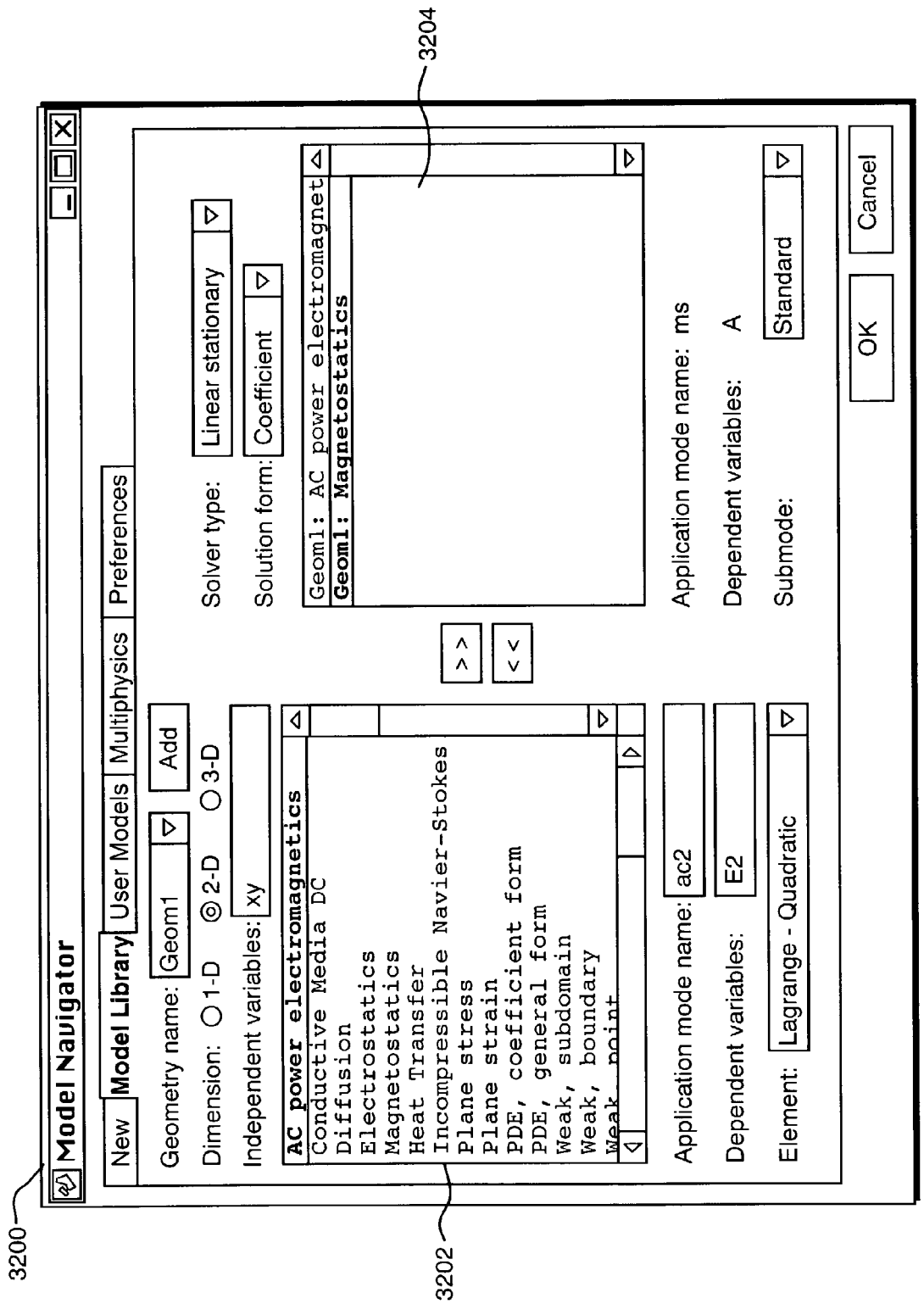

Referring now to FIG. 58, shown is a screen shot 3200 that may be used in connection with defining a multiphysics model that consists of several application modes and one or more different geometries. One may start in the top left portion of the screen 3200 by specifying the space dimensions such as one, two or three dimensional and edit the names of the independent variables. Application modes may then be selected from screen portion 3202 and added to the model causing them to appear on the right hand portion of the screen 3204.

It should be noted that in connection with this figure and others described in following text, similarities may be seen between features described here and in previous figures in connection with other screen shots.

Figure 59:
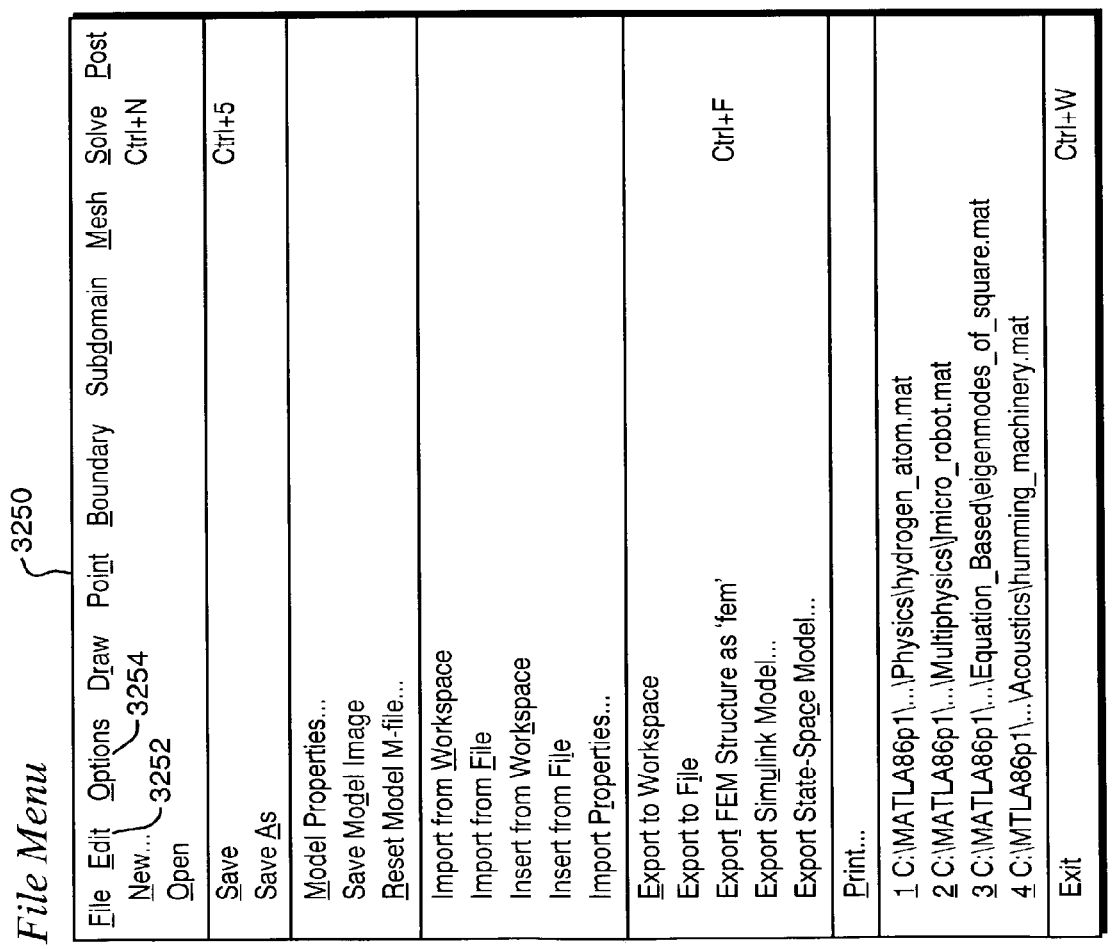

Referring now to FIG. 59, shown is an example of different file menu options that may be included in an embodiment of the model navigator, for example, as shown in connection with screen shot 3200 of FIG. 58. In connection with the file menu 3250, various options may be included in an embodiment, for example, to start a new model, open a model file already existing, and save the currently created model. Additionally, model properties may be edited and stored in the file. An embodiment may also include an option to import model data from, for example, an application such as MATLAB or from a workspace or another file. Similarly, options may exist to export the model or portions thereof to other applications or a file. What will now be described are some options that may be used in connection with the options selection tag 3254 from the screen shot menu 3250.

Figure 60:
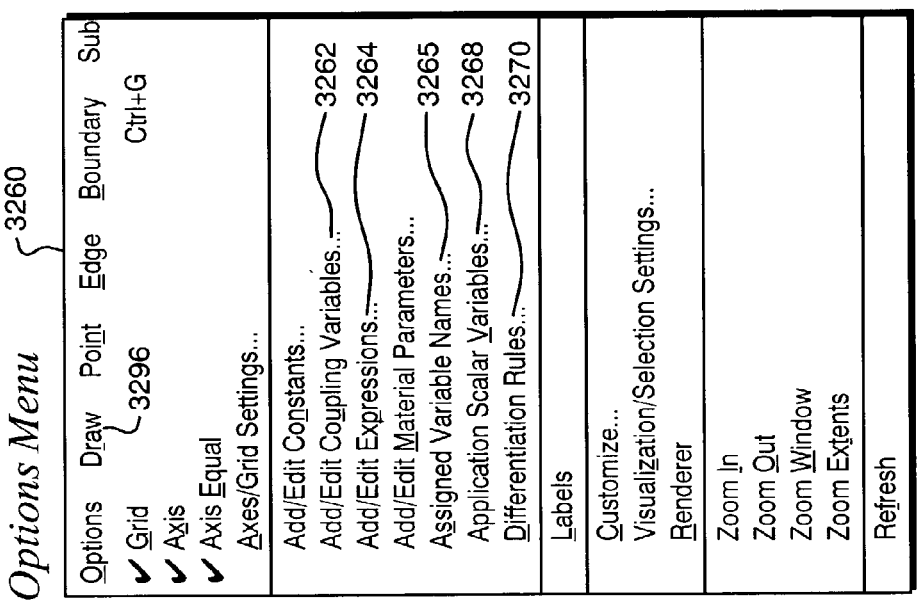

Referring now to FIG. 60, shown is an example of an embodiment of an options menu 3260 that may be included in an embodiment. The options menu may include, for example, certain features related to display items such as a grid or an access display as well as adding and editing constants, variables, expressions, and the like.

What will now be described are functionalities that may be included with adding and editing coupling variables 3262.

Figure 45A:
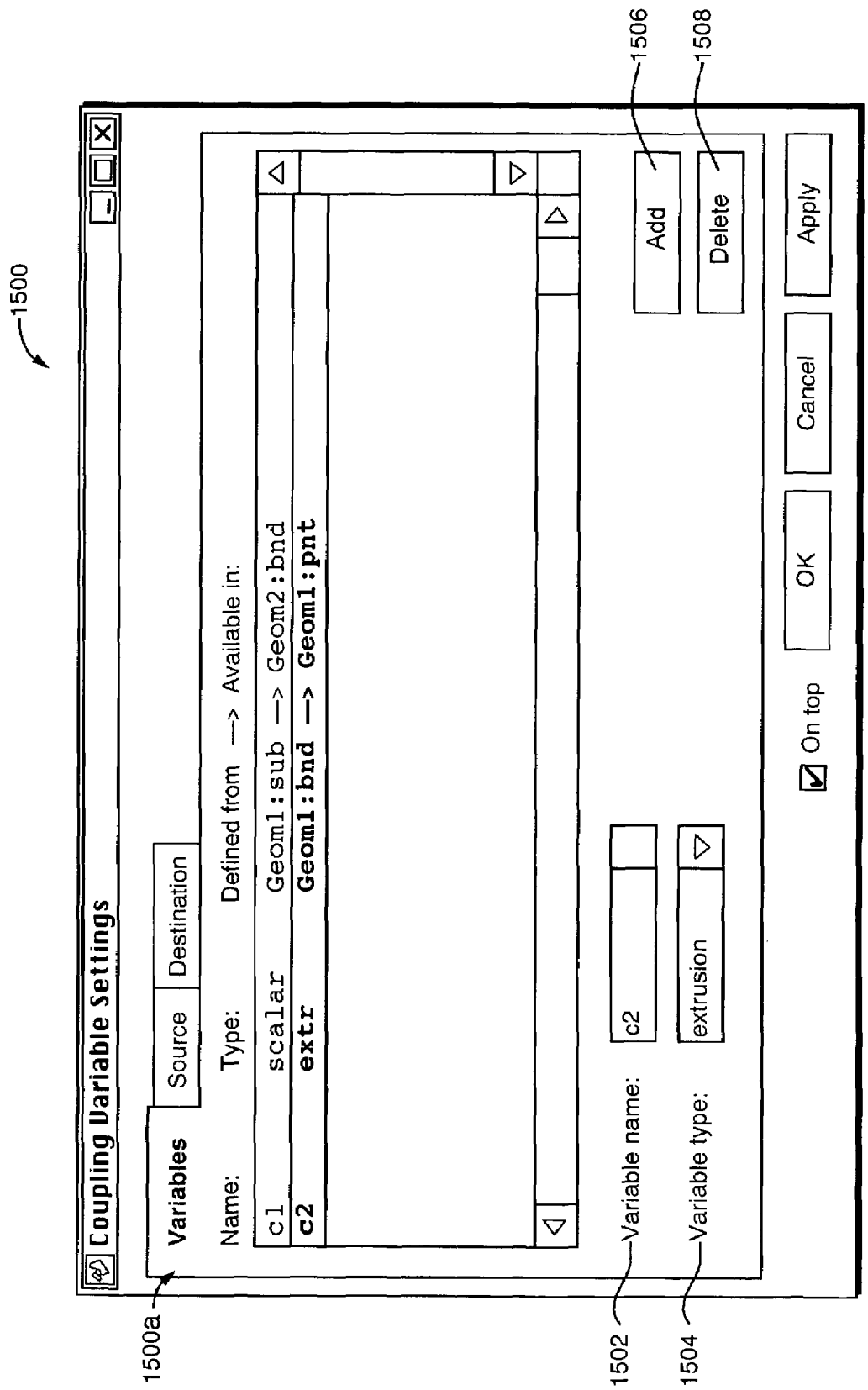
FIGS. 45A-C show various pages of a Coupling Variable Settings dialog box, respectively showing a Variables page, Source page and Destination page.
Figure 45B:
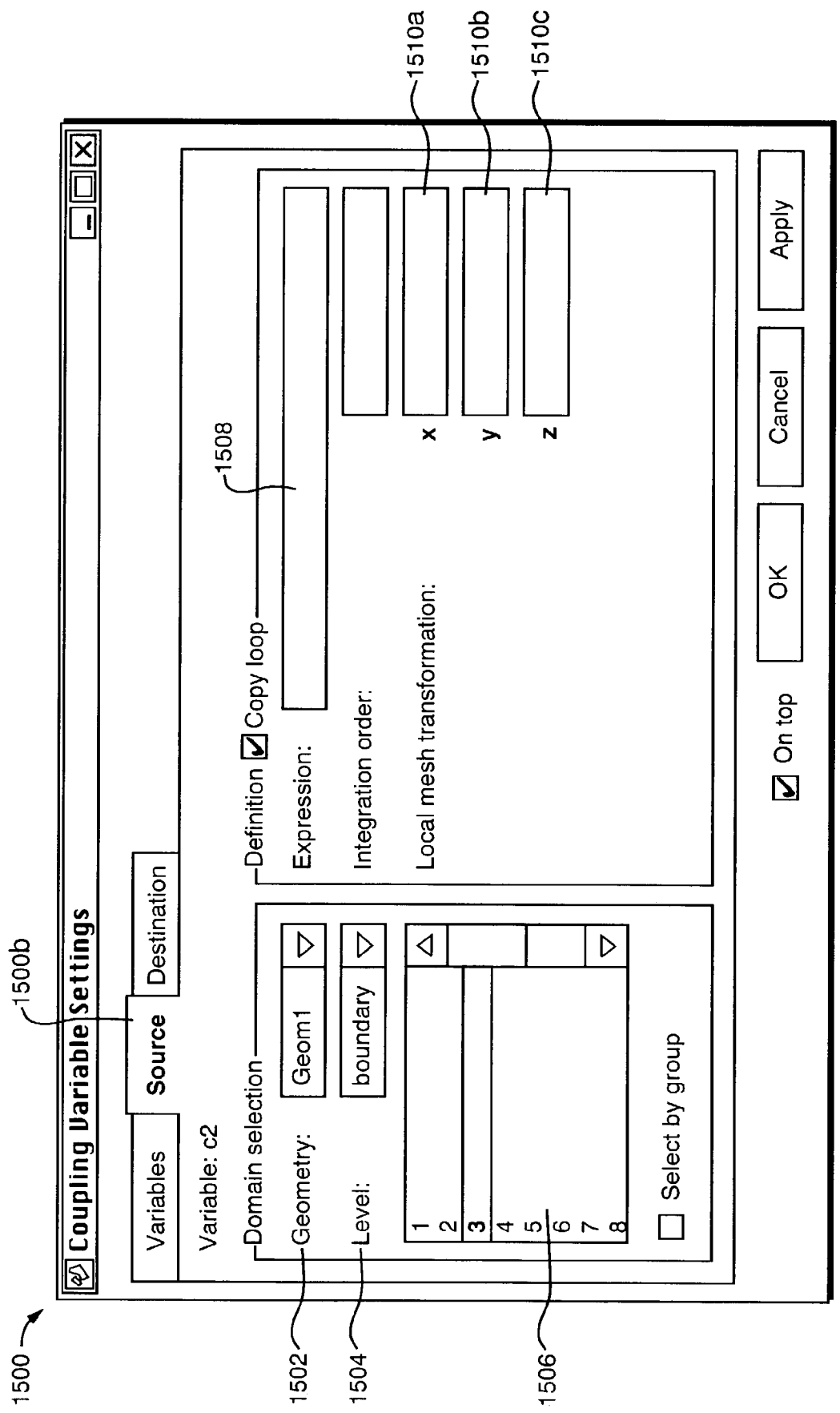
Figure 45C:
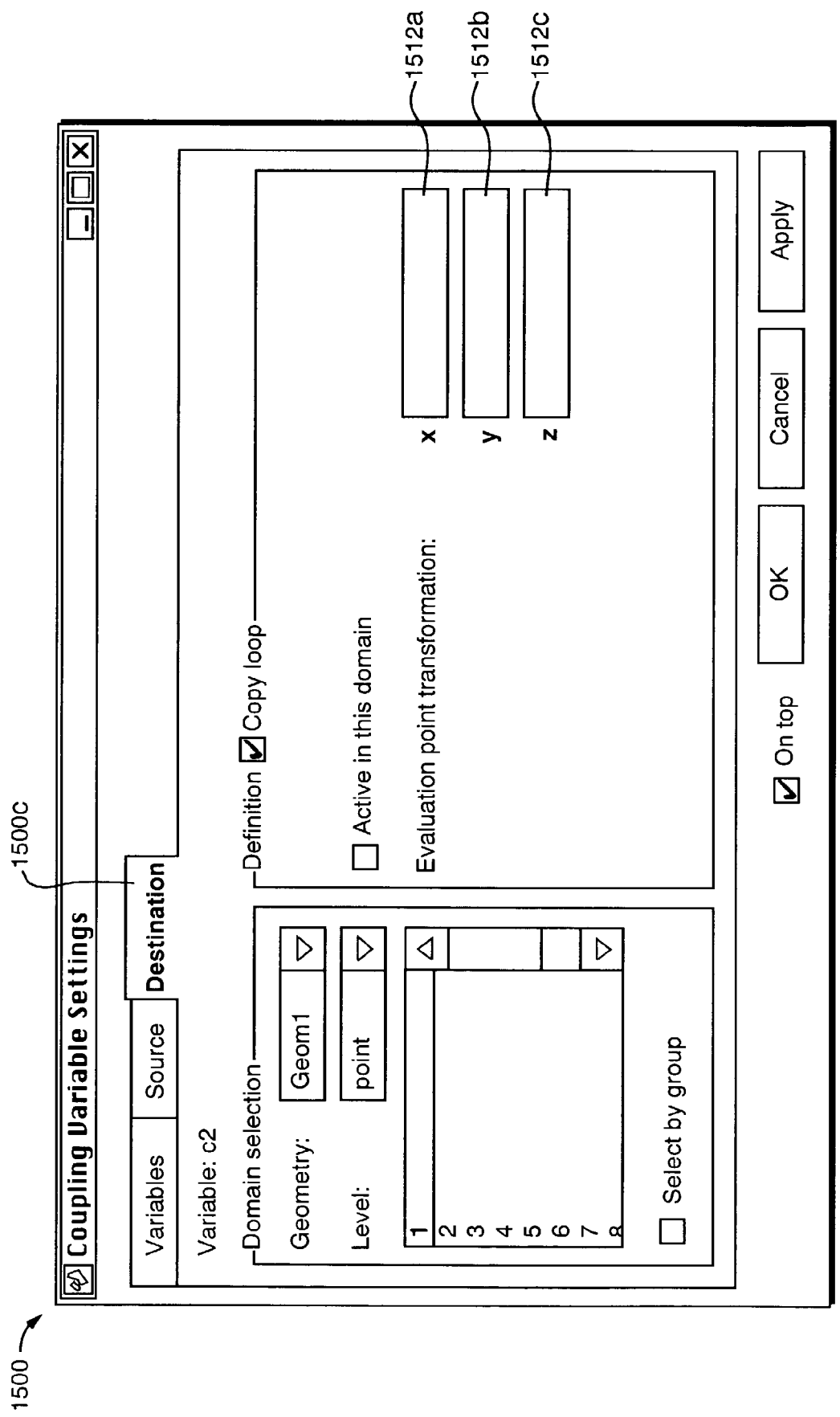

Referring to FIGS. 45A, 45B and 45C, shown are various pages of a Coupling Variable Settings dialog box 1500, respectively showing a Variables page 1500a, Source page 1500b and Destination page 1500c. In the Coupling Variable Settings dialog box 1500 a user can specify non-local coupling variables. On the Variables page 1500a shown in FIG. 45A, a user can specify the name of the coupling variable in the Variable name edit field 1502. The type of coupling is specified in the Variable type drop-down list box 1504. A user can select scalar, extrusion or projection variables from the Variable type drop-down list box 1504. After a user has entered a new variable name, the user can click Add 1506 to add the new variable name to the list of coupling variables. The user can also click Delete 1508 to delete the highlighted variable in the list.

On the Source page 1500b, as shown in FIG. 45B, the source of the coupling is specified, i.e. the details of the evaluation undertaken. The evaluation may take place in any geometry in one or more of the domains at one of the levels subdomain, boundary, edge, or point. The levels which may be used are partly dependent on the geometry selected in the Geometry drop-down list box 1502, and partly dependent on variable type being used, so not all levels will always be available in the Level drop-down list box 1504.

When selecting geometry and domain level, the Source page 1500b will enter the corresponding mode. Domains are then selected either from the list box 1506 or by clicking on the domains in the GUI. For extrusion variables, the expression given in the Expression edit field 1508 will be the one which is evaluated within the selected domain(s). For scalar and projection variables, the Expression edit field 1508 is replaced by an Integrand edit field (not shown), and the Integration order edit field (not shown), which gives the order of the Gauss quadrature rule which is used for integrating the variables over the source domains for the scalar variable, along the projection curve for projection variables.

The Local mesh transformation edit fields x 1510a, y 1510b, and z 1510c may only be used when defining an extrusion or projection variable. The fields 1510a, 1510b and 1510c contain expressions of the space coordinates, e.g. x, y, and z, or local mesh parameters, e.g. s, s1, or s2, which are then applied to create a new source mesh for use in interpolating or setting the position and direction of lines used for evaluating line integrals. The number n of these edit fields, which are enabled, depends on the dimensionality of the domain(s) used as the source. For example, n is 2 if using boundaries in a 3-D geometry, because such boundaries are 2-D surfaces. These edit fields may correspond to the cell vector src.meshp, for example, in the data structures described herein for extrusion and projection coupling variables.

On the Destination page 1500c, as shown in FIG. 45C, a user can define where the variable is to be made available. The destination geometry and domain are specified in the same way as the source geometry, level, and domain are specified on the Source page 1500B. For scalar variables, a user may use the "Active in this domain" checkbox in order for the specified variable to be available in the selected domain. For extrusion and projection variables, defining an Evaluation point transformation in the edit fields x 1512a, y 1512b, z 1512c activates the variable in the selected domain. If n of the mesh transformation edit fields were enabled on the Source page 1500b, there will be respectively n and n−1 evaluation point transformation edit fields enabled on the Destination page 1500c for extrusion and projection variables. Again the mesh transformation edit fields x 1512a, y 1512b and z 1512c should be expressions of the space coordinates or local mesh parameters. These edit fields may correspond, for example, to the cell vector dst.ep in the data structure for extrusion and projection coupling variables.

For extrusion variables the user can set the interpolation points within the source mesh. For projection variables the evaluation for each destination evaluation point is a line integral. The position of the line is given as follows; the first n−1 coordinates in the source mesh are specified by the evaluation point transformation(s) applied to the destination evaluation point, and the n-th coordinate is allowed to vary.

Figure 61:
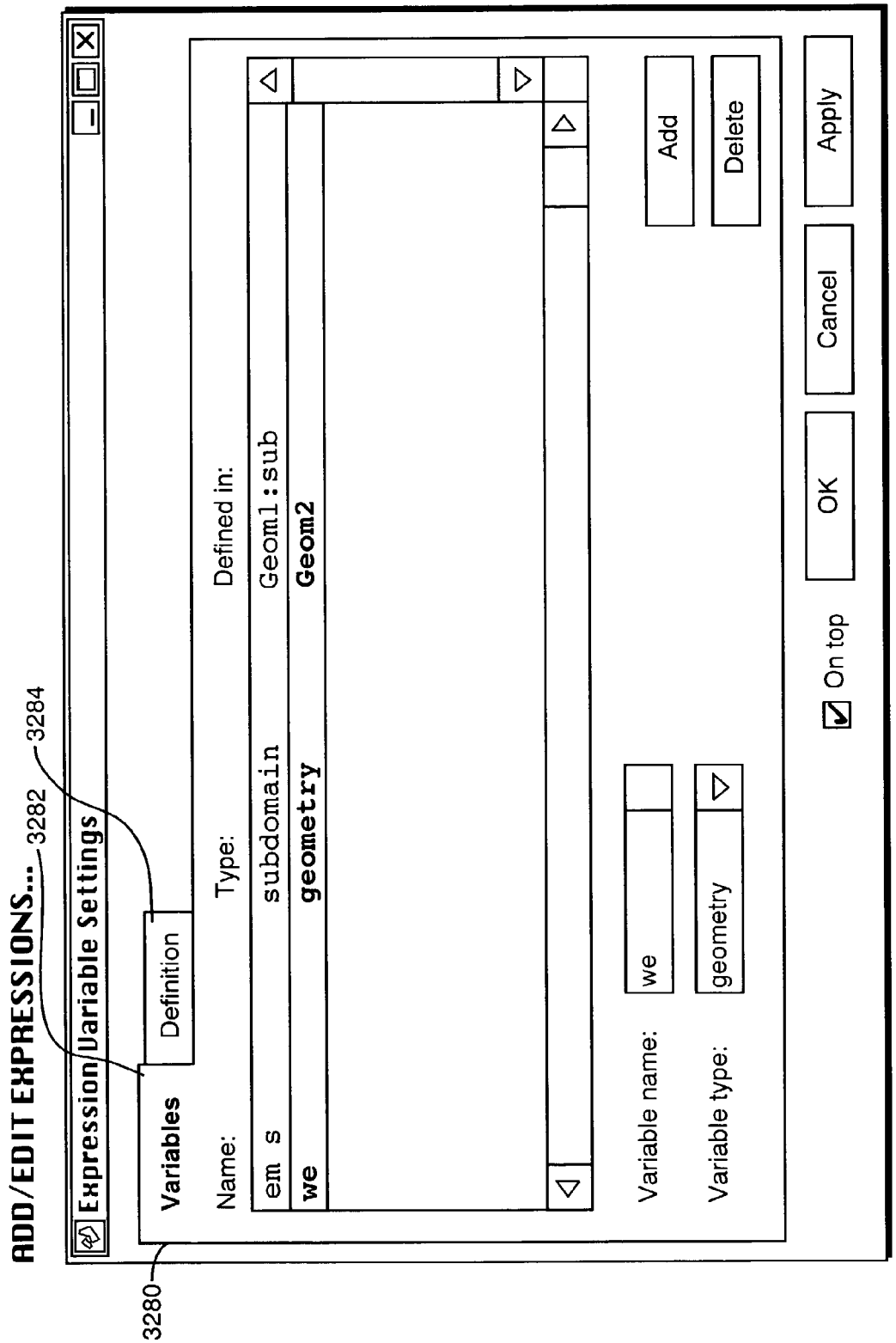

Referring now to FIG. 61, shown is an example of a dialog box 3280 that may be displayed in connection with defining expressions to be used in a model. This may be used, for example, in introducing shortenings for complicated expressions for entering parameters used in the model. An embodiment may also use expression variables in post processing, for example, if a user wants to plot a quantity on a graph defined by different application modes in different domains, an expression variable may be defined that uses the correct expression in the different domains and may be used to plot that expression variable. Displayed in a dialog box 3280 is a variables tab 3282 and a definition tab 3284.

What will now be described is the dialog box that may be used in connection with expression variable settings for the definition tab 3284.

Figure 46:
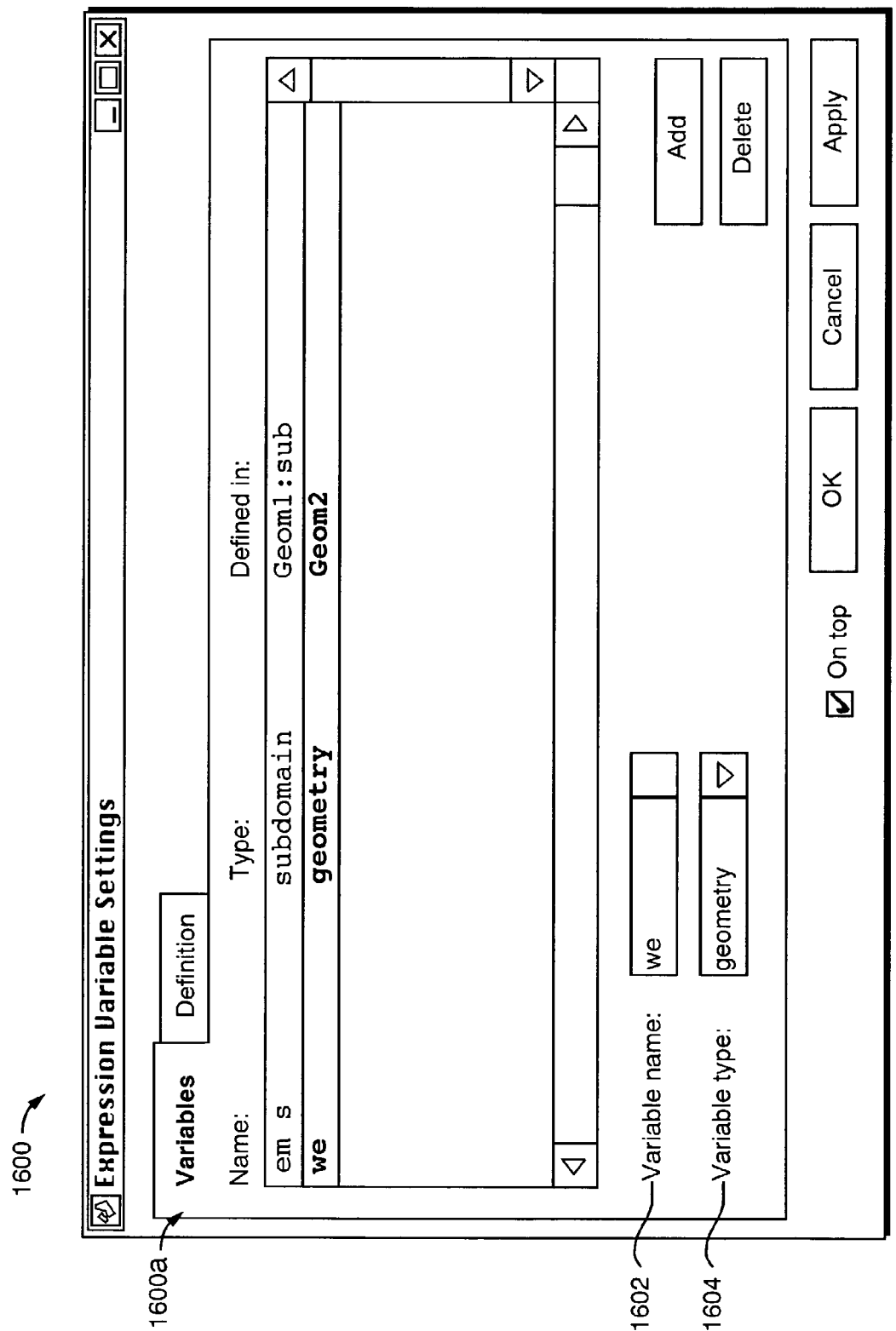
FIGS. 46 and 47 respectively show examples of a Variables page and a Definition page of an Expression Variable Settings dialog box.
Figure 47:
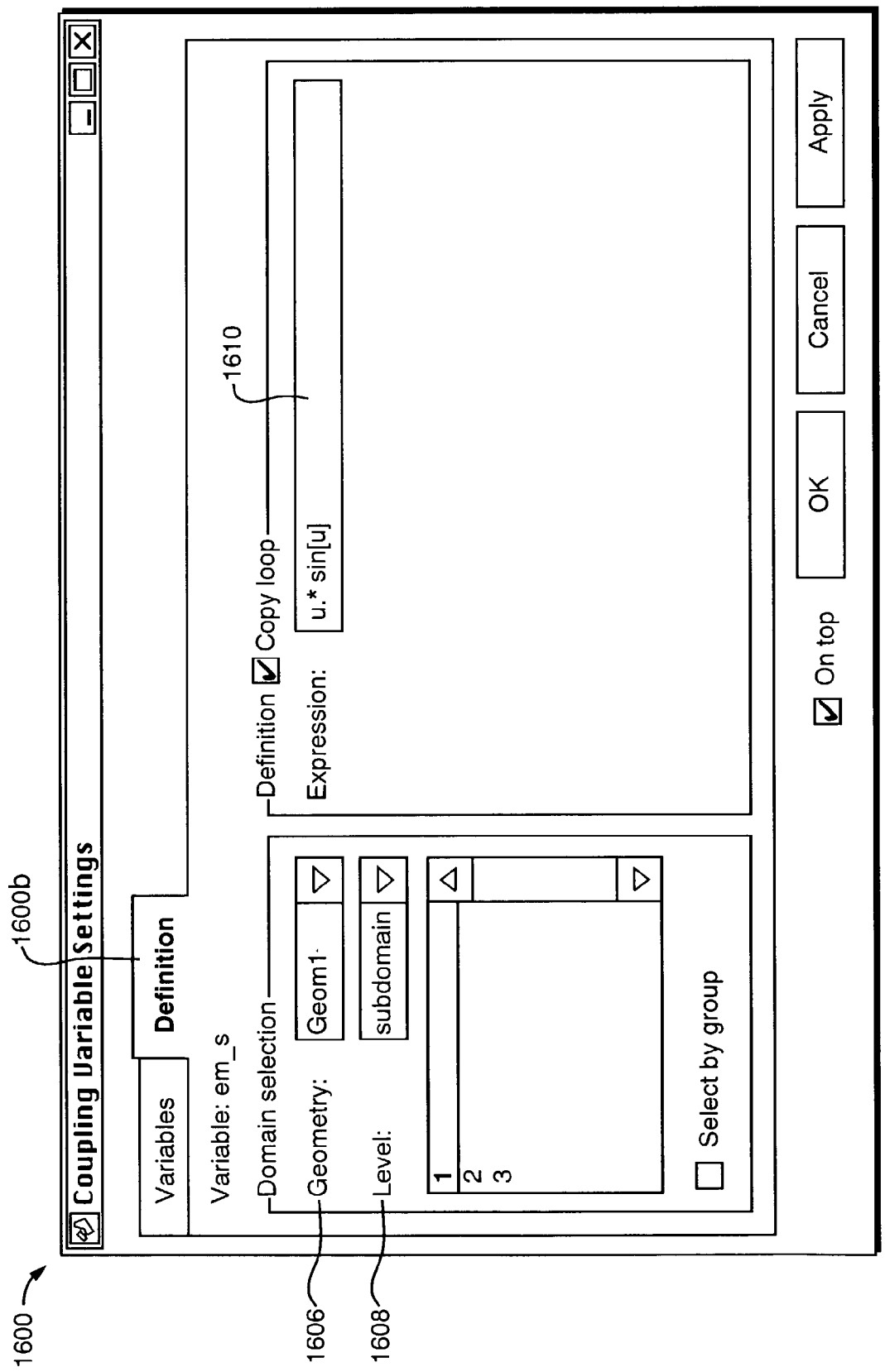

Referring to FIGS. 46 and 47, respectively shown are examples of a variables page 1600a and a Definition page 1600b of an Expression Variable Settings dialog box 1600. In the Expression Variable Settings dialog box 1600, the user can define expressions to be used in a model. The Expression Variable Settings dialog box 1600 provides a convenient way to introduce short names for complicated expressions that the user wants to use when entering parameters for the model. Another use for expression variables is in post processing, where if the user wants to plot some quantity that is defined by different application modes, which are in different domains, the user can define an expression variable that uses the correct expression in the different domains and then plot the expression variable.

On the Variables page 1600a, as shown in FIG. 46, the user can enter the name of the variable in the Variable name field 1602 to define an expression. Expressions can be either domain-based, i.e. at subdomain/boundary/edge/point level, or geometry-based, i.e., the expression is defined everywhere on the geometry. This variable type can be specified in the Variable type drop-down list box 1604.

On the Definition page, as shown in FIG. 47, the user can specify in which geometry and in which domain the expression should be defined by respectively selecting from the Geometry drop-down list 1606 and the Level drop-down list 1608. In the Expression edit field 1610, the user can enter the expression to be defined by the specified variable. The definitions are recorded in the fields fem.expr, fem.equ.expr, fem.bnd.expr, etc. in the data structure (FIG. 40) for the appropriate geometry. Where a definition is not given in the dialog for a subdomain, the corresponding entry in fem.equ.expr will be the empty matrix, which means that it is not defined, this similarly holds true for bnd, edg, and pnt.

Figure 62:
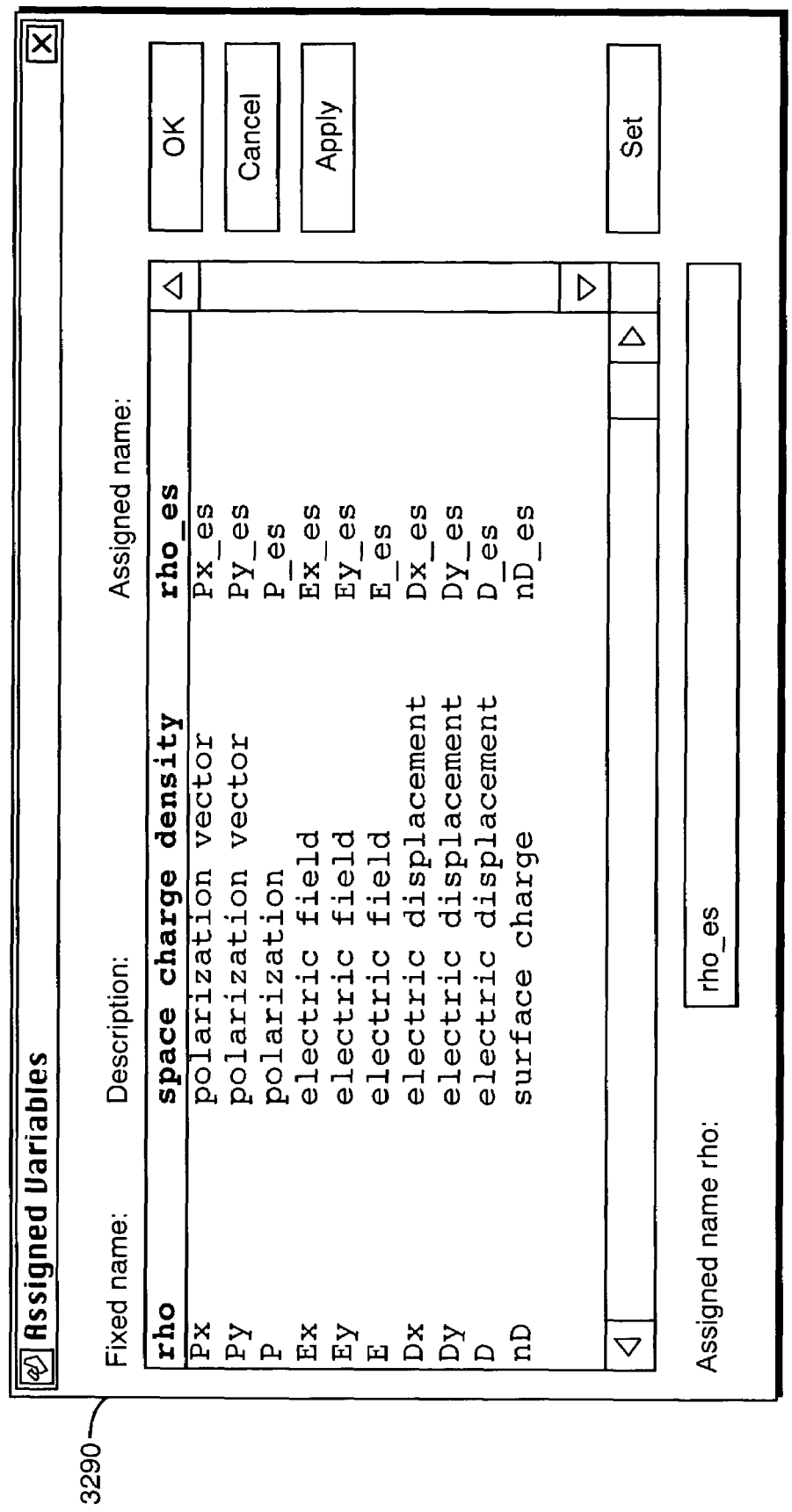

In connection with the assigned variable names selection of the options menu 3266, an assigned variable names dialog box may be displayed as shown in connection with FIG. 62.

Referring now to FIG. 62, shown is an example of a dialog box 3290 that may be displayed in connection with assigning variables. The assigned variables dialog box may be used to edit assigned variable names for all variables belonging to application modes in a current model. Assigned variables may be used for post processing. They may be created automatically and based on a fixed name each of them gets a unique name.

In connection with application scalar variables as included in options menu item number 3268, an application scalar variable dialog box may be displayed.

Referring now to FIG. 63, shown is an example of an embodiment of an application scalar variable dialog box 3292. In some applications, scalar variables may exist that take part in mathematical model but are independent of the geometry and material for example. The value of such application specific scalar variables may be set using this dialog box. Scalar variables may be included, for example, in predefined application modes. For example, in one embodiment, in connection with an application mode related to AC power electromagnetics, scalar variables such as omega may be used in representing angular frequency. Additionally, some of the modes in which the optional electromagnetics module and structural mechanics module may be included and may also include such scalar variables. It should be noted that an embodiment may disable this menu if no such quantities exist.

In connection with the differentiation rules option menu 3270, a differentiation rules dialog box may be displayed and used in an embodiment.

Figure 64:
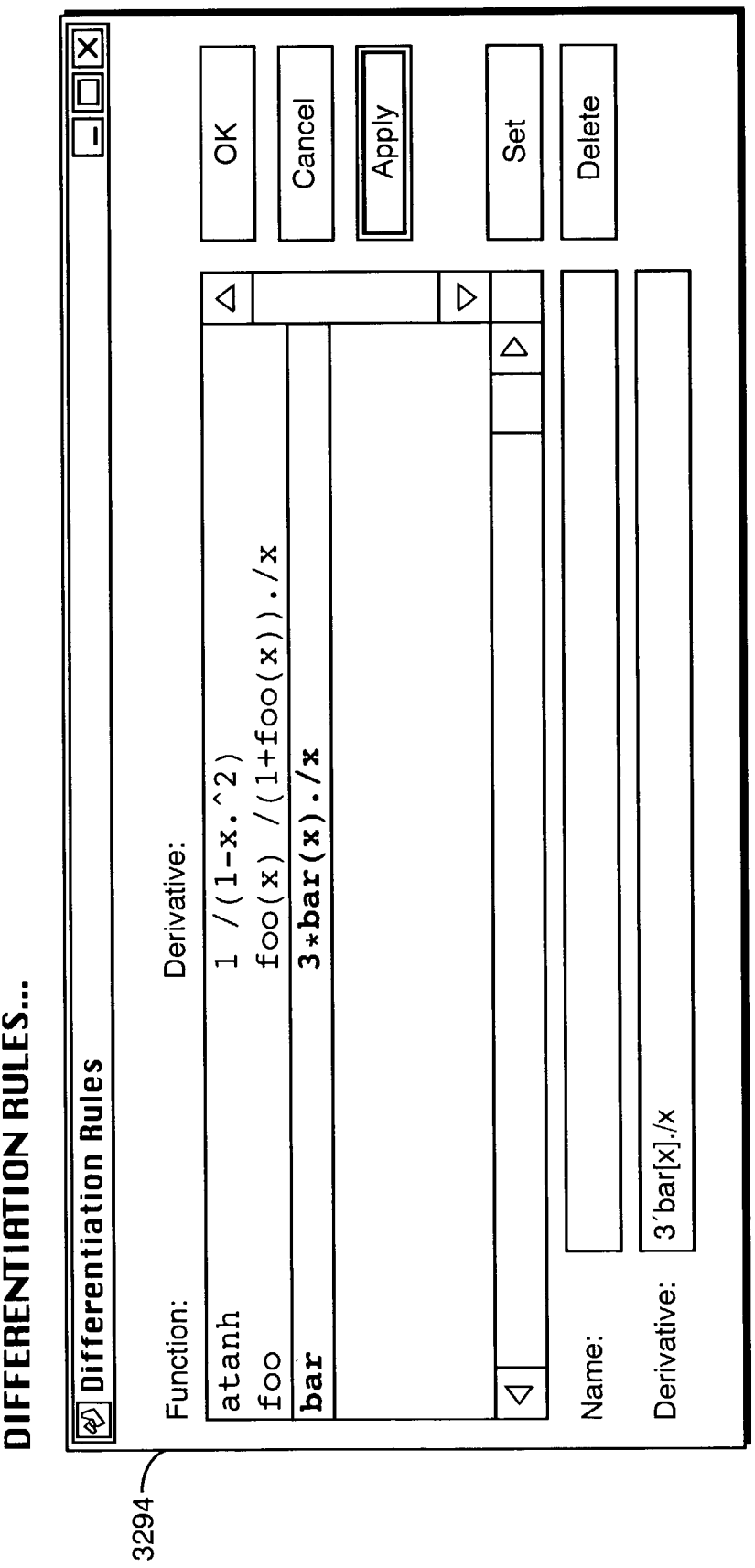

Referring now to FIG. 64, shown is an example of an embodiment of a dialog box 3294 that may be used in connection with specifying additional differentiation rules. In particular, these rules may be used to symbolically differentiate coefficients and a PDE in a general form, and to compute the Jacobian of a variable.

In connection with the draw menu 3296 as displayed, for example, in FIG. 60, different options may be available in connection with a particular dimension of the geometry of the model.

Figure 65:
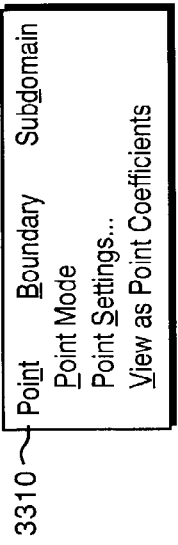

Referring now to FIG. 65, shown is an example of an embodiment of a point menu 3310. In this example, the point menu 3310 may include three options or items including point mode, point settings, and an option to view point data as point coefficients. The point mode option may be used to enter or indicate point mode. Point settings may be used to specify point settings for selected points. The "view as point coefficients" option may be used to view or edit application specific point settings as generic point settings.

Figure 43:
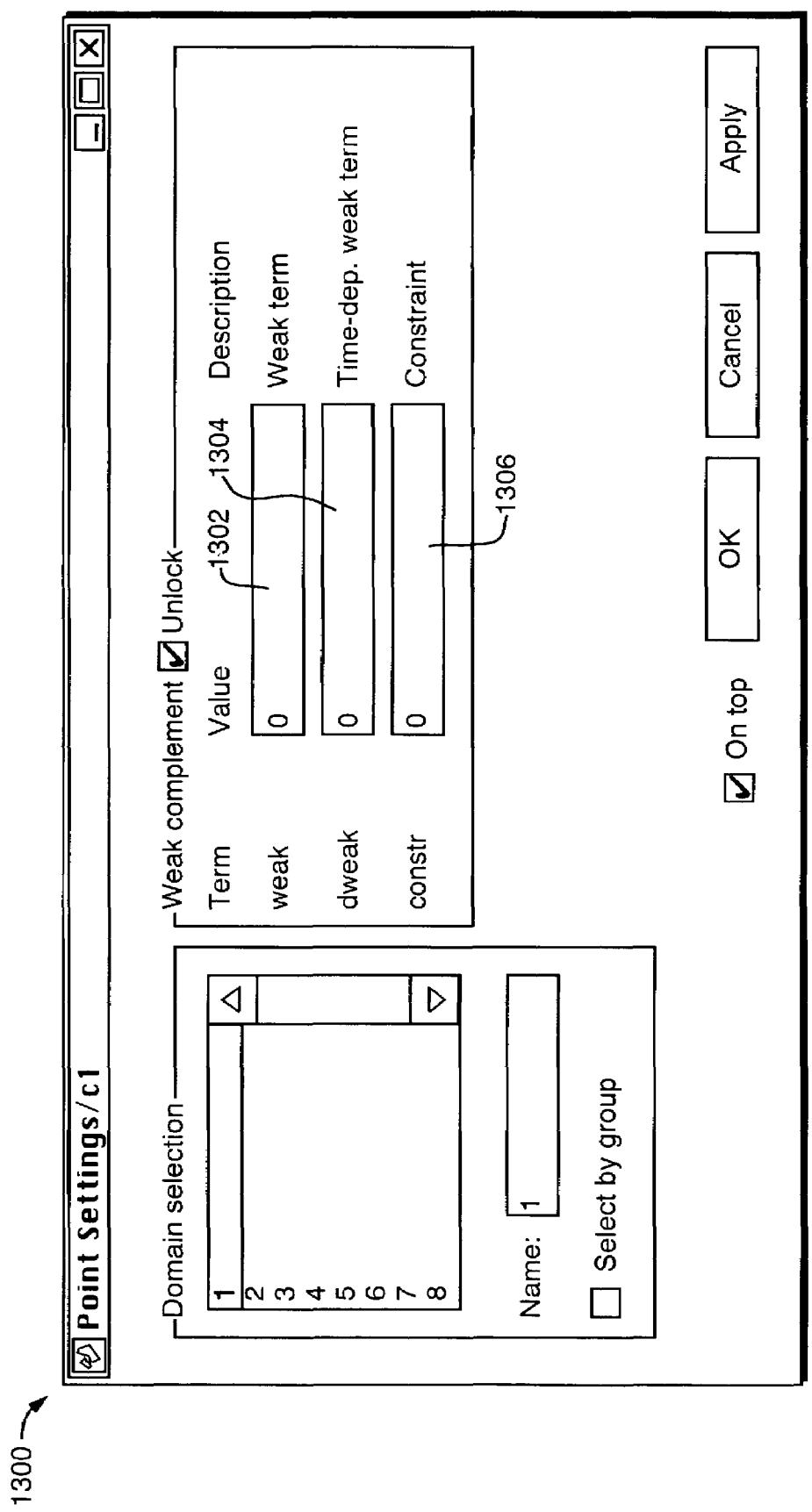
FIG. 43 is an example of a Point Settings dialog box.

Referring to FIG. 43, shown is an example of a Point Settings dialog box 1300. The Point Settings dialog box allows 1300 permits entry of fem.pnt.weak, fem.pnt.dweak and fem.pnt.constr fields on each point in the respective weak 1302, dweak 1304, and constr 1306 fields of the dialog box 1300.

Figure 66:
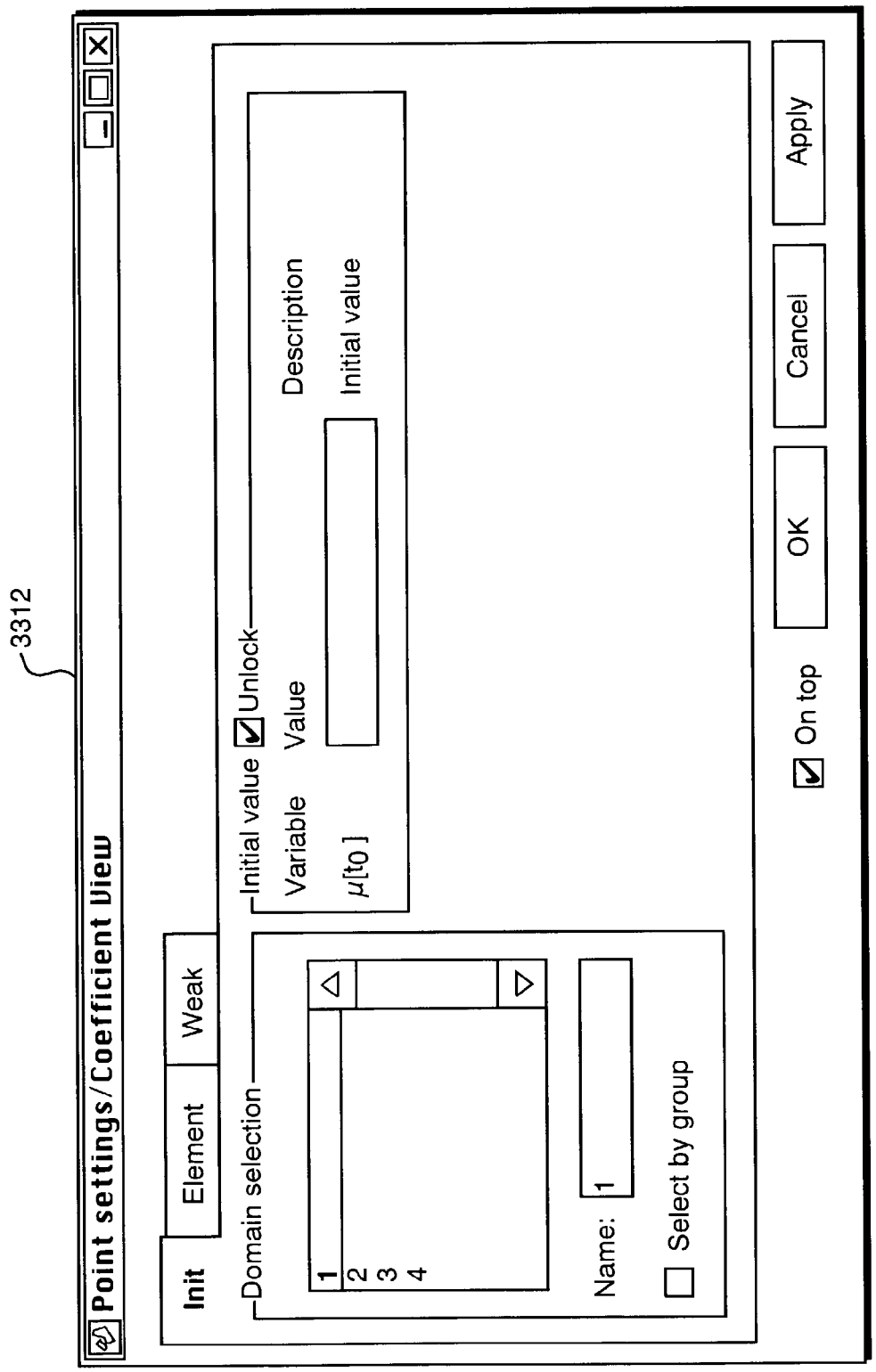

Referring now to FIG. 66, shown is an example of a dialog box 3312 that may be used in connection with displaying point settings in coefficient view. When this option is turned on, point settings open a new tab dialog box, such as 3312. Using this dialog box, initial values may be specified and shape functions may also be specified on the init and elements page, respectively, in addition to the weak terms on the weak page.

Figure 67:
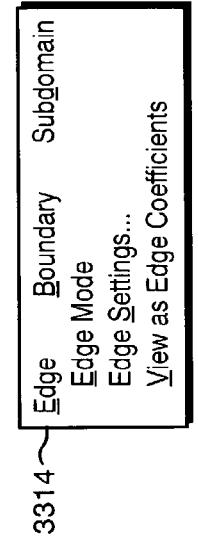

Referring now to FIG. 67, shown is an example of an embodiment of a menu for edge options that may be used in connection with three dimensional models in this embodiment. The edge menu 3314 in this example contains three options. The first option is edge mode where edge mode is enable or indicated. In the edge settings option which will be explained in more detail below, edge settings may be specified for selected edges. Additionally, an option in this embodiment may be included to view application specific edge settings as generic edge settings.

Figure 44:
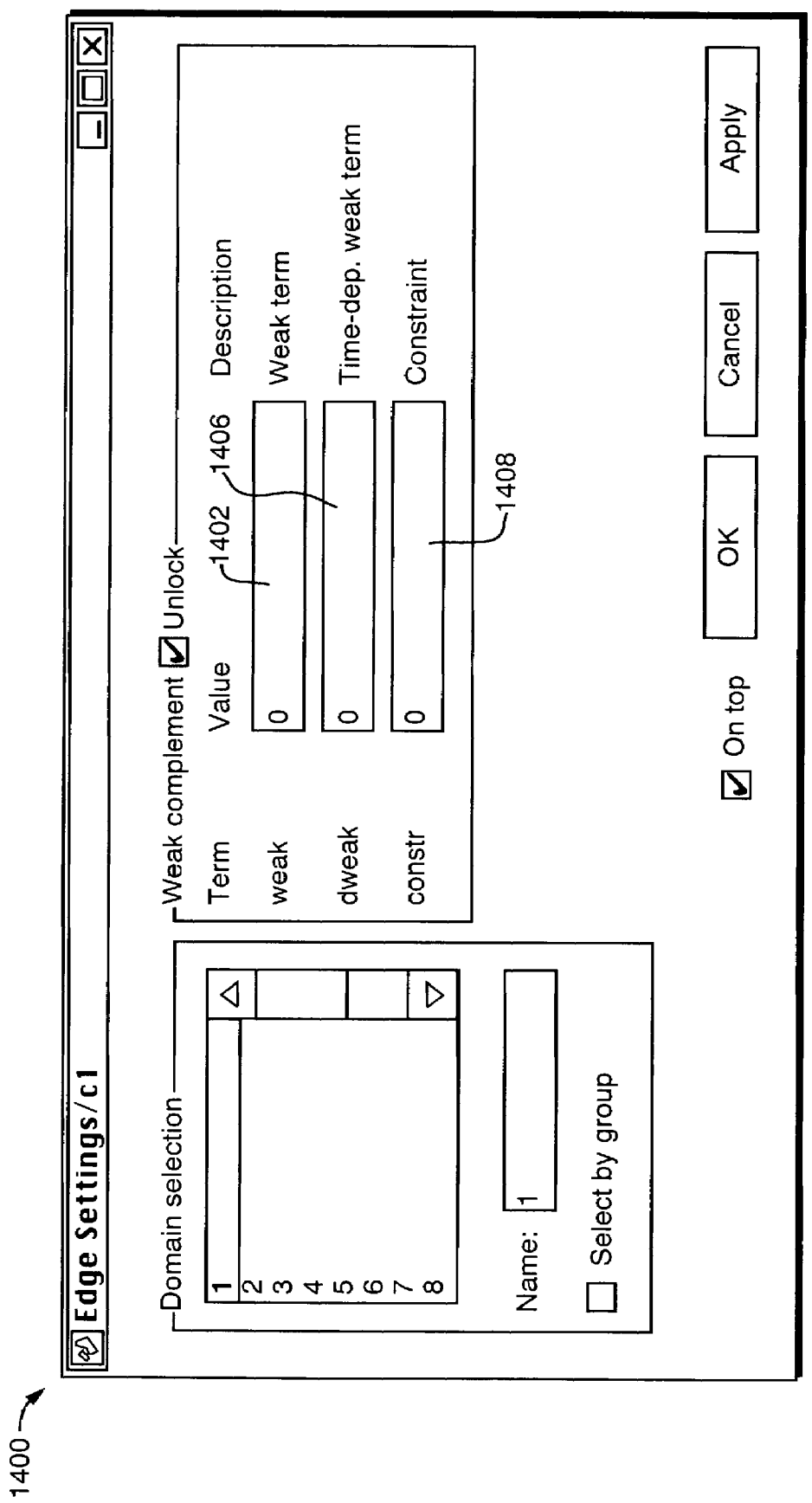
FIG. 44 is an example of an Edge Settings dialog box.

Referring to FIG. 44, shown is an example of an Edge Settings dialog box 1400. The Edge Settings dialog box 1400 permits entry of fem.edg.weak, fem.edg.dweak, and fem.edg.constr fields on each edge (in 3-D) in the respective weak 1402, dweak 1404 and constr 1406 fields of the dialog box 1400. In coefficient view, there are similar user interfaces for adding weak, dweak, and constr contributions on boundary and subdomain level.

Figure 68:
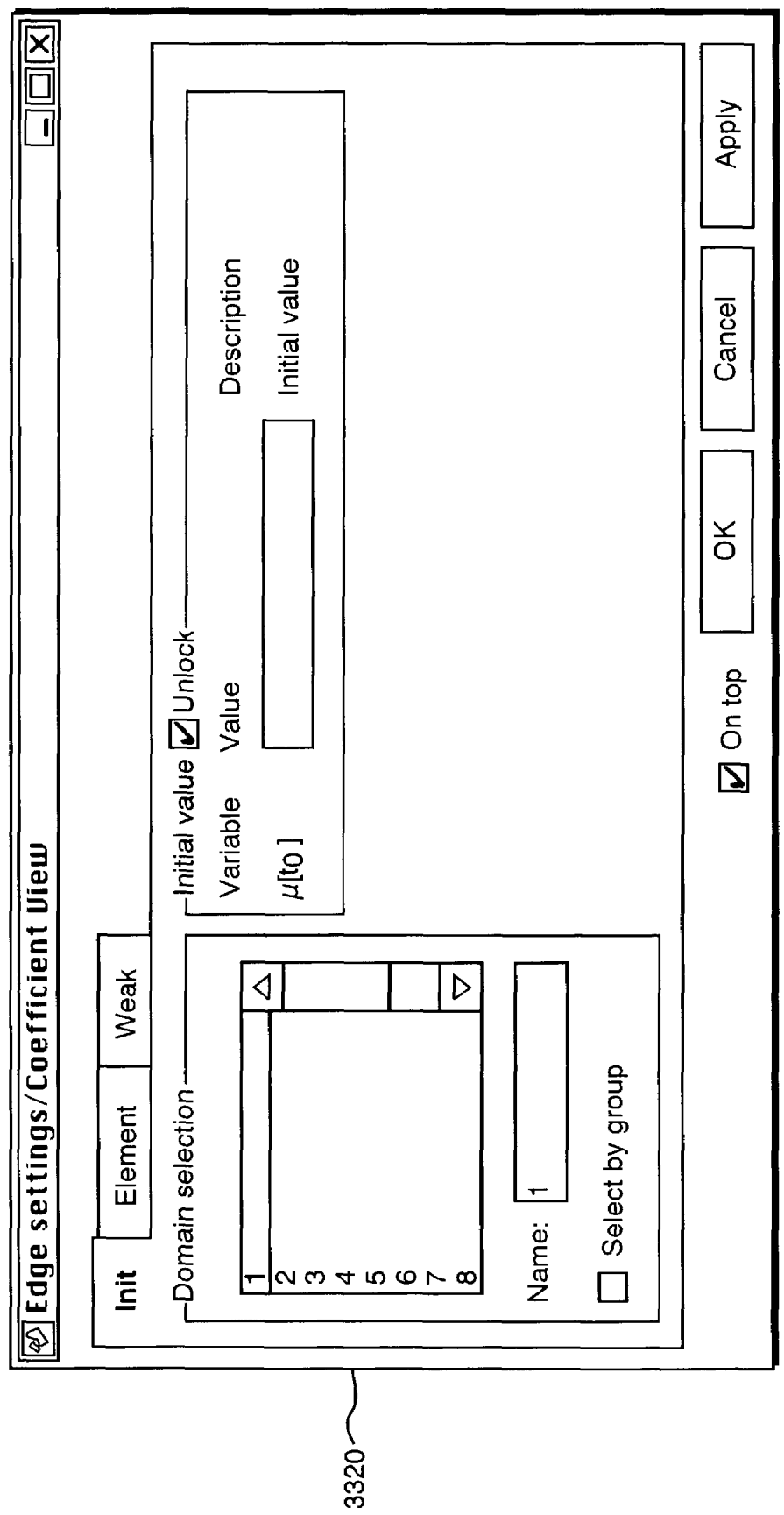

Referring now to FIG. 68, shown is an example of a dialog box 3320 that may be used in connection with edge settings. In connection with the different tabs included, initial values may be specified with the init tab. Shape functions may be specified with the elements tab. Additionally, weak terms may be specified on the weak tab.

Figure 69:
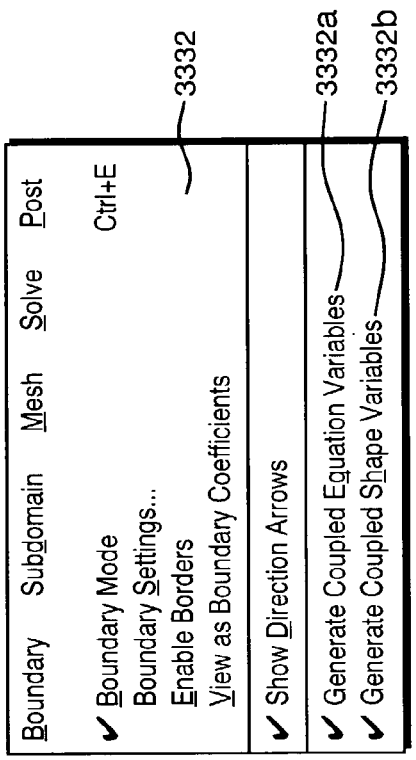

Referring now to FIG. 69, shown are examples of boundary menu options that may be enabled in connection with different dimensional geometries. In particular, the boundary menu may appear as in 3332 in connection with one and two dimensional geometries and may appear as in 3334 for three dimensional objects or geometries.

The boundary mode option may be used to enable or indicate boundary modes. The boundary settings option may be used to specify boundary conditions for selected boundaries. Enable borders may be used to enable or disable the assembly of boundary conditions on subdomain borders. View as boundary coefficients may be used to view or edit application specific boundary conditions as generic boundary conditions. The show direction arrows option may be used to show direction arrows for the different boundaries. It should be noted that certain menu options may be enabled in accordance with the dimensions of a geometry. The option for generating coupled equation variables is used to enable or disable the automatic generation of the equation-based variables on boundaries. Similarly, the generate coupled-shaped variables may be used to enable or disable the automatic generation of shape function-based variables on boundaries.

In one embodiment, one can generate boundary-coupled variables corresponding to the basic variables and their derivatives, and call them boundary shape variables, such as for example in connection with menu option 3332a. In an embodiment, one may also be able to generate boundary-coupled variables corresponding to the terms in an equation on coefficient or general form, and call them equation-based boundary variables, for example, as in connection with option 3332b.

Figure 70:
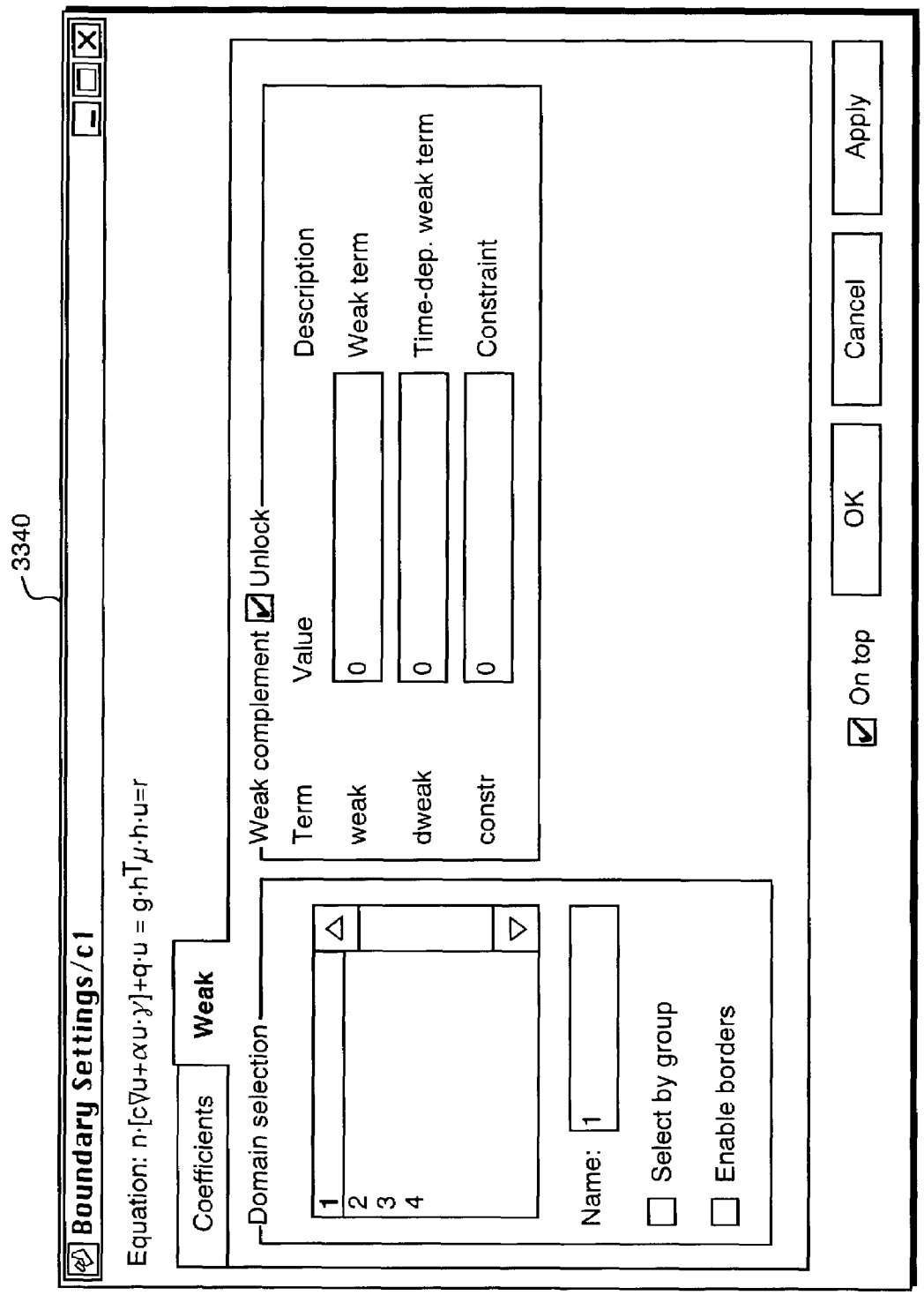

Referring now to FIG. 70, shown is an example of a dialog box 3340 that may be used in connection with boundary settings. In particular, the weak tab in 3340 is displayed which may be used to specify weak terms and constraints in connection with specifying boundary conditions.

Figure 71:
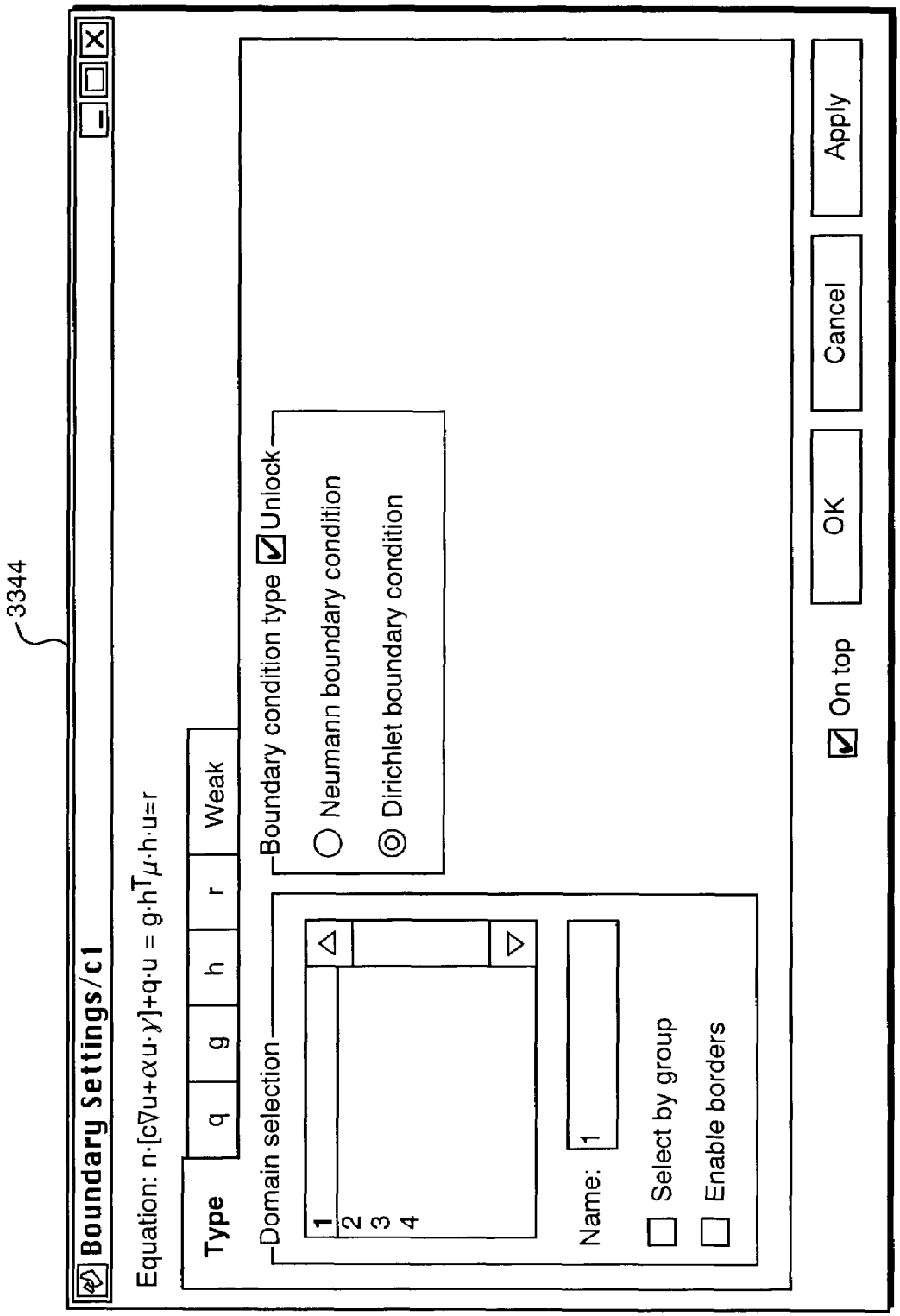

Referring now to FIG. 71, shown is an example of a dialog box 3344 that may be used in connection with PDE models having more than one dependent variable. The dialog box shows the boundary settings for coefficient form PDE with two dependent variables. One may select boundaries from the list box, or using other techniques that may be included in an embodiment.

Figure 72:
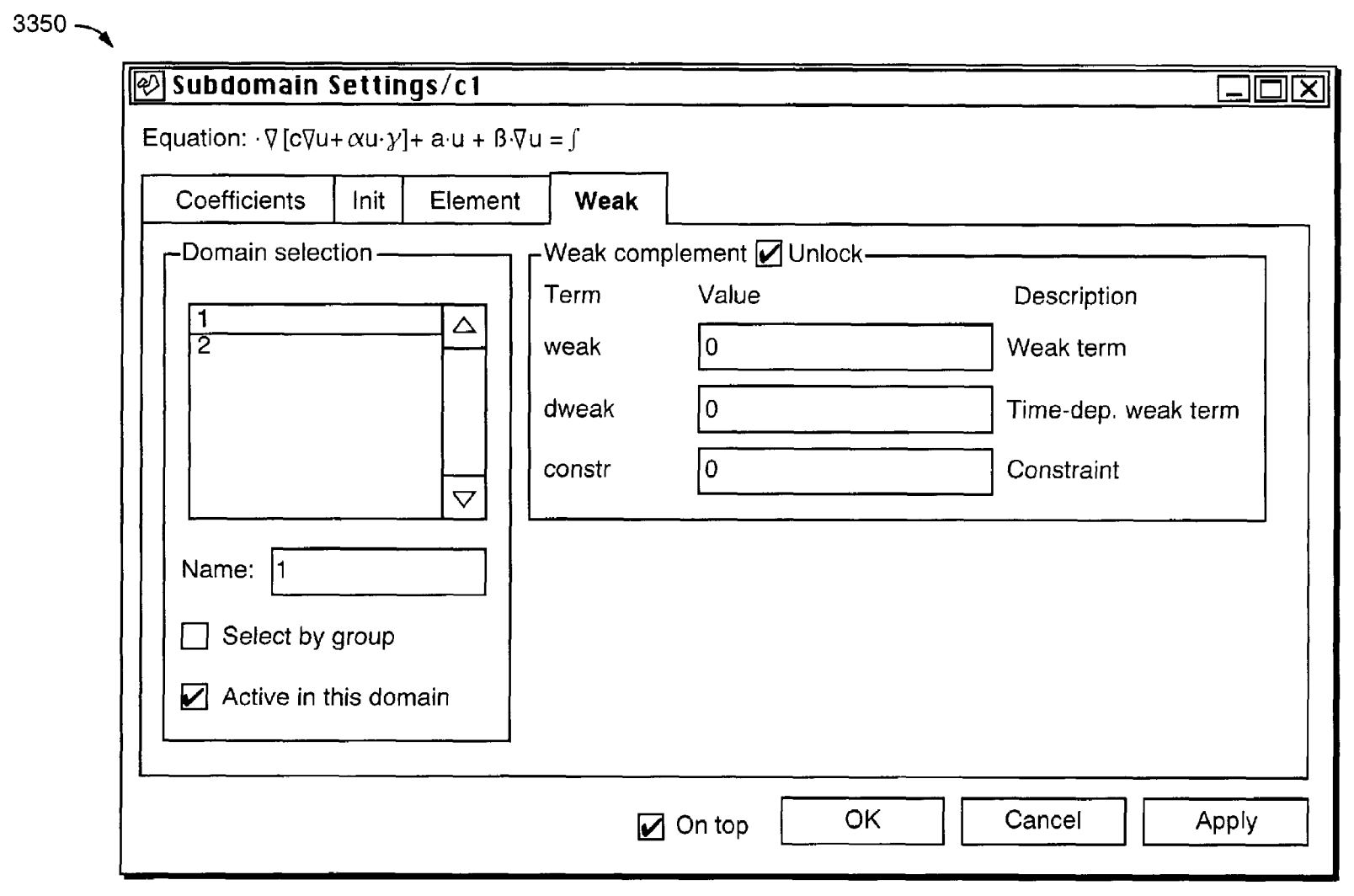

Referring now to FIG. 72, shown is an example of a dialog box that may be used in connection with the subdomain settings. In particular, when the weak tab is activated as shown in the dialog box 3350, weak terms may be specified on selected subdomains.

Figure 73:
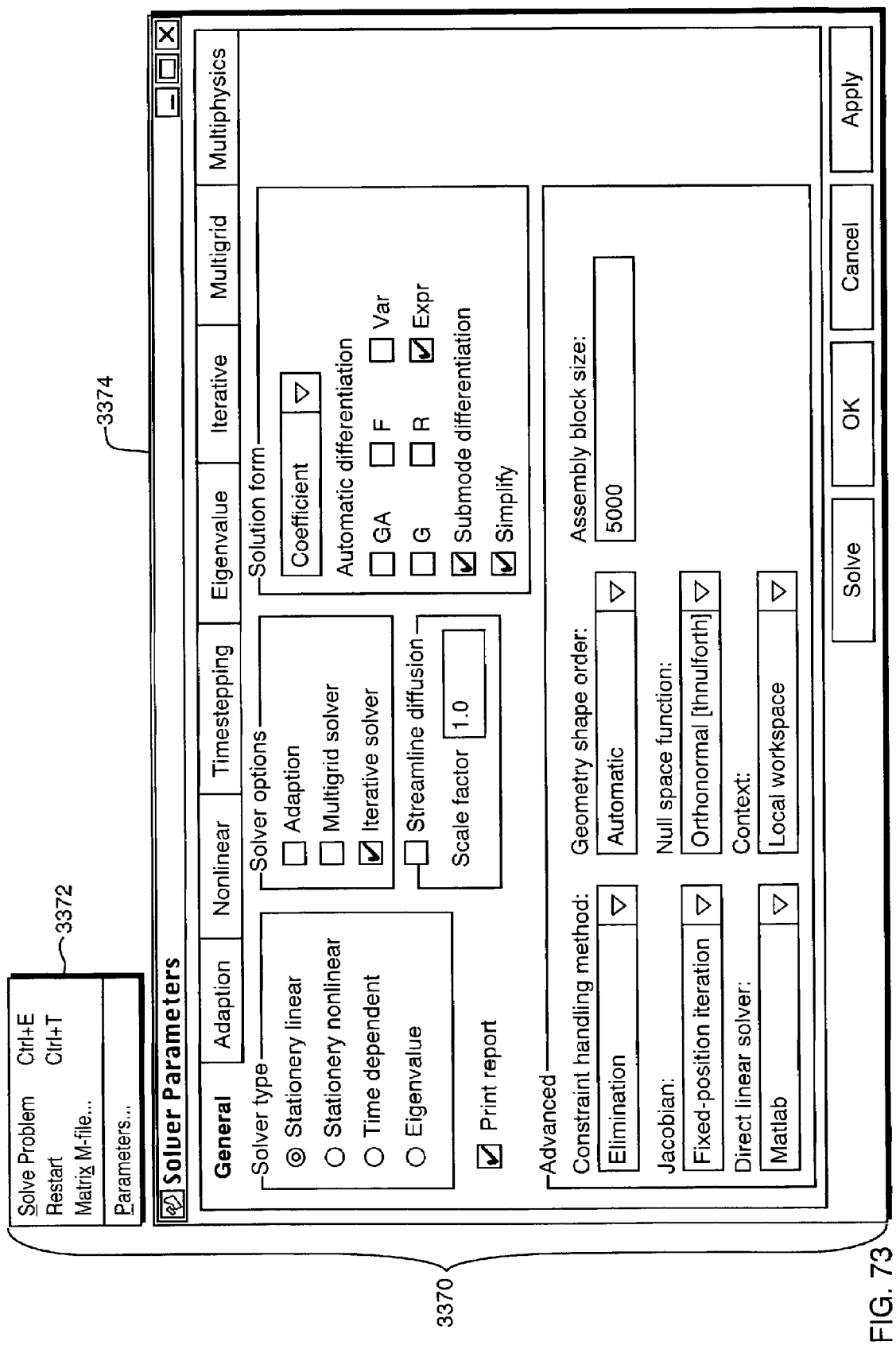

Referring now to FIG. 73, shown is an example of an embodiment of menus and dialog boxes that may be displayed in connection with a solve or solutions menu that may be used in connection with specifying options for partial differential equation solutions and solving methods. In particular, the solve menu options may be included as in 3372. In connection with the parameters option, the dialog box for solver parameters 3374 may be displayed.

Figure 74:
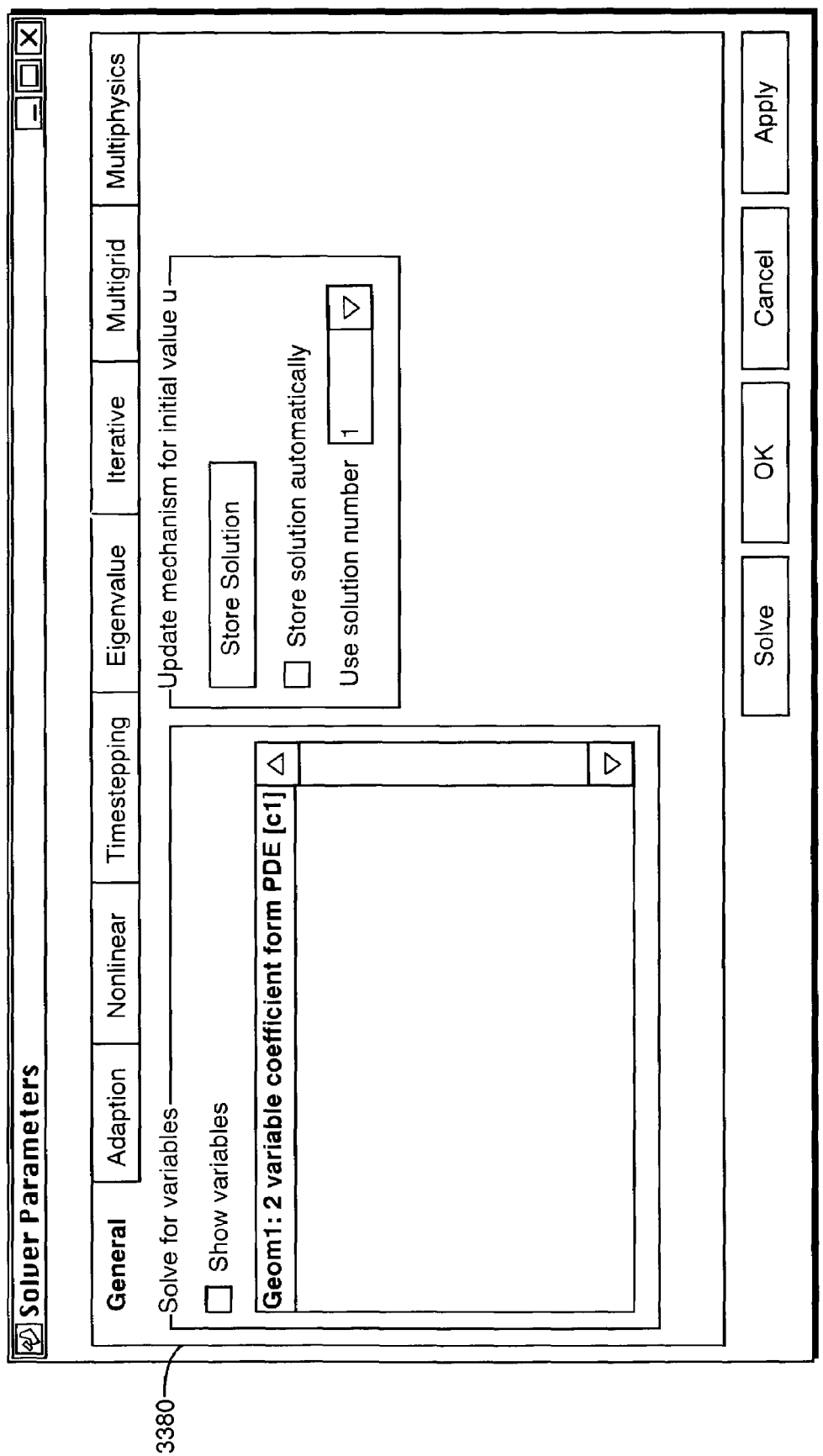

Referring now to FIG. 74, the multiphysics page or tab in connection with the solver parameters option may cause dialog box 3380 to be displayed. Using this multiphysics tab, the user may control how to solve a multiphysics model which is specified. For example, this dialog box 3380 may be used to specify which variables to solve for and how initial value should be updated if you want to solve using an iterative approach where the previous solution becomes the initial values in a next iteration. In the solve for variables section, a list of all application modes may be displayed. The solver may solve all variables in all selected application modes. By default, an application mode in the model is selected. If the show variables option is checked, the list shows all of the variables in the model and you may individually select among all of the variables in the application modes. In the update mechanism for the initial value U section, it may be specified how to update the solution used as an initial value. For example, if the store solution button is active, the solution used for the initial value or valuation is updated using the current solution. In selecting the storage solution automatically option, this causes the solution used for the initial value to be stored automatically when a new solution has been computed. From the use solution number drop-down box, a user may select which solution to use. For time-dependant models, the default is to use the solution at the last output time.

Figure 75:
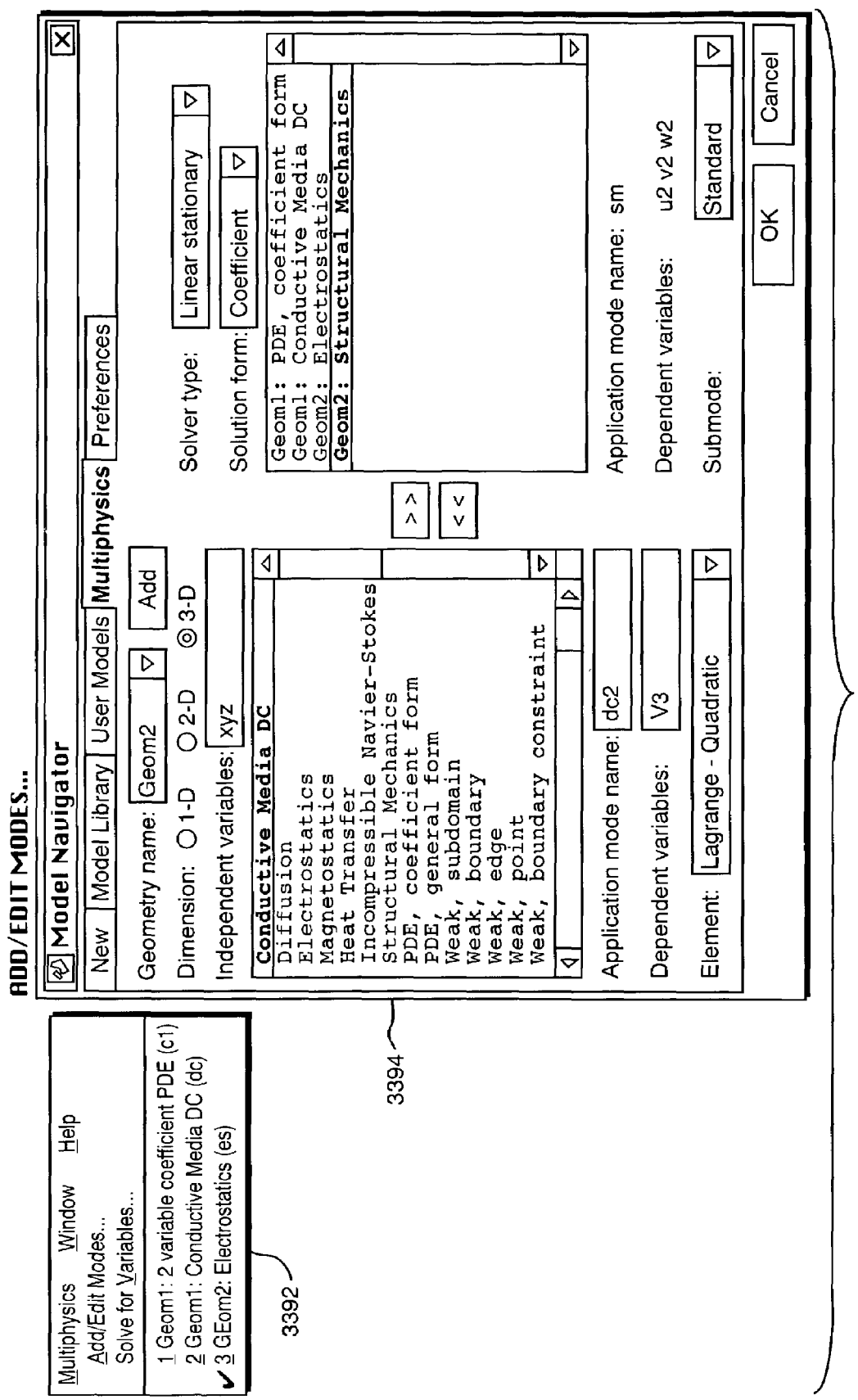

Referring now to FIG. 75, shown are examples of a menu and dialog box that may be used in connection with a multiphysics menu option. The dialog box 3394 may be used to select application modes for a current multi-physics model. It should be noted that for PDE modes, an embodiment may have more than one dependent variable. The space dimension of the model may be determined by entering one or more space-separated variable names. For example, in the screen dialog box 3394, three independent variables, X, Y and Z, are entered and it is considered a 3-D geometry.

In reference to the foregoing dialog boxes, user interfaces, and the like, data may be entered for each geometry. In this embodiment, there are menu options and items used in connection with weak equations that may be stored in fields and subfields of the fem data structure, for example as shown in FIG. 40, and the xfem data structure, for example, as shown in FIG. 56. In particular, data used in connection with the weak dialog tabs may be stored in fem.\*\*\*.weak, fem.\*\*\*dweak, and fem.\*\*\*.constr fields. Data used in connection with the "Expression Variables" dialogs as described herein may be used in adding variables, for example, to the fields fem.expr and fem.\*\*\*.expr in data structures described herein.

An embodiment may associate particular functionality described herein with particular functions or methods. In one embodiment, each of the following is associated with a particular method: computing the values of a variable, computing the Jacobian of a variable, assembling the residual vector of a weak term, assembling the stiffness matrix, assembling the constraint residual vector, and assembling the constraint Jacobian.

It should be noted that as described elsewhere herein, an embodiment may include functions, routines or methods in accordance with each particular implementation that embody functionality described herein. For example, in one embodiment, an object oriented scheme may be used in which, geometry objects may be predefined in a class structure as, may be included in an embodiment using a C++ programming language for example. Additionally, as also described elsewhere herein, different methods may be invoked in accordance with each particular class.

Several specific examples, as set forth herein, include a scalar coupling example, an extrusion coupling example, and a projection coupling example, followed by a discussion of the Weak solution form and the Solvers; Sparsity of Jacobian and Non-Local Dirichlet Boundary Conditions. In addition, other specific examples, as set forth herein, include a Packed Bed Reactor example and a Magnetic Brake example.

EXTENDED MULTIPHYSICS

Coupling Variables

Variables in FEMLAB are generally evaluated locally-their value at each evaluation point is computed using information only from that evaluation point. In contrast, the value of a coupling variable is the result of a computation carried out elsewhere in the geometry or even in another geometry altogether. When used in the PDE and boundary conditions, the result is the introduction of non-local dependencies-extended multiphysics-as opposed to ordinary multiphysics, which refers to dependencies between variables in same geometric location.

The coupling variables are extremely powerful in their ability to make the values of an expression available non-locally. The coupling variables are not only useful for modeling coupled problems-they can also be used solely for post processing and visualization purposes.

All coupling variables are defined in two steps. First define the source, i.e., the domains in which the evaluation takes place, the nature of that evaluation, and the name given to the resulting variable; secondly define the destination, i.e. the domains within which it is possible to use the resulting variable.

There are three kinds of coupling variables implemented: scalar, extrusion, and projection.

Specifying Non-Local Couplings

Figure 76:
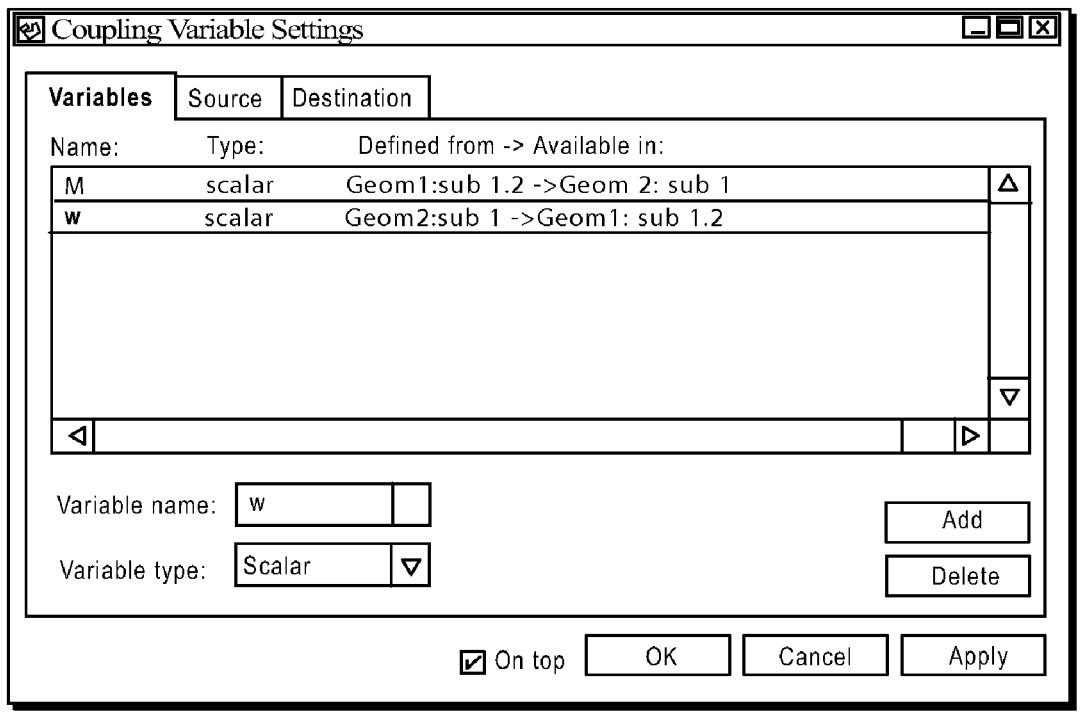
FIG. 76 is a screen shot of a graphical user interface for a coupling variables settings dialog box.

In the graphical user interface you can define coupling variables by using the Coupling Variable Settings dialog box from the Options menu as shown in FIG. 76.

The Source and Destination tabs allow you to define the source and destination details and the Variable type gives the choice of scalar, extrusion, or projection variables.

Scalar Couplings

Use scalar coupling variables to make scalar values available elsewhere in your model. The source of the scalar value can be an expression in a vertex. In addition, the source of the scalar value can be the integral of an expression over one or several subdomains, boundaries, or edges. The destination of the scalar variable can be the full geometry, one or several subdomains, boundaries, edges, or vertices.

SCALAR COUPLING EXAMPLE

Figure 77:
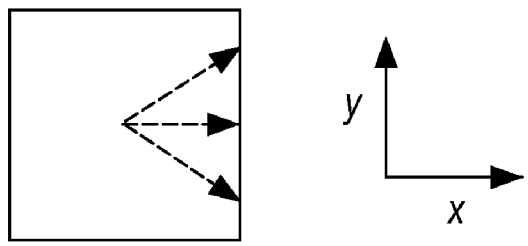
FIG. 77 is a graph of an example of Poisson's equation on a single rectangular domain.

As a simple example, consider the case of Poisson's equation on a single rectangular domain as shown in FIG. 77. The integral of the square of the solution is used as in-flux in a Neumann boundary condition on the right boundary. There is a Dirichlet boundary condition on the left boundary, and the top and button boundaries have zero in-flux. The problem is nonlinear so you have to use the nonlinear solver. The right boundary condition contains the scalar coupling variable in a coefficient, so the weak solution form must be used.

$$\Delta u = 1 \quad \text{on } \Omega$$

$$u = x \quad \text{on } \partial\Omega_1$$

$$\frac{\partial u}{\partial n} = 0 \quad \text{on } \partial\Omega_{2,3}$$

$$\frac{\partial u}{\partial n} = -\int_\Omega u^2 d\Omega \quad \text{on } \partial\Omega_4$$

Model Navigator

Start FEMLAB and select the 2-D, Coefficient, Nonlinear, PDE mode in the Model navigator. Use the Lagrange - Quadratic element type. Press the More button, and select solution form Weak.

Draw Mode

Draw a single rectangle of any size.

Boundary Mode

Change the following boundary coefficients:

| BOUNDARY | 1 | 2-3 | 4 |
|---|---|---|---|
| Type | Direchlet | Neumann | Neumann |
| r | x | | |
| g | | 0 | int2 |

Subdomain Mode

Use the default PDE coefficients (Poisson's equation).

Open the Add/Edit Coupling Variables dialog box.

Enter the variable name int2, and choose the default type Scalar. Press Add.

Go to the Source page and select subdomain 1. Enter -u∧2 in the Expression field, and enter 4 in the Integration order field.

As a simple rule, the integration order can be the maximum of the quadrature order for the integration of the shape functions of the variables in the expression.

On the Destination page, select boundary 4 and check Active in this domain.

Return to the Variables page to check the definition. Finally, press OK.

Solve Problem

Press the Solve Problem button to start the simulation.

Post Mode

Open the Subdomain Integration item on the Post menu. Type - u∧2 in the expression field. Select subdomain 1 and press Apply. The integral of the solution is displayed in the message log.

Open the Plot Parameters dialog box. Check Contour and uncheck Surface. Press the Contour tab. Change the Contour expression to ux. Click in the GUI on the right boundary, and verify that the in-flux is equal to the integral.

BRIEF EXAMPLES OF SCALAR COUPLINGS

Figure 78A:
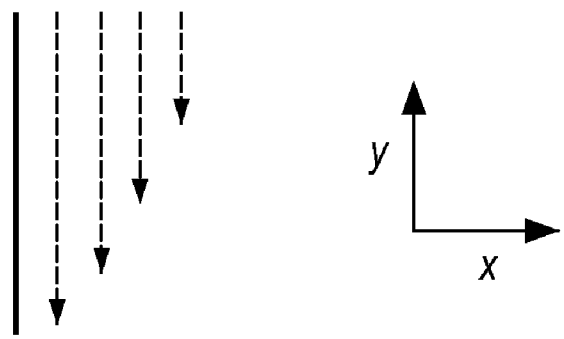
FIGS. 78A-78B are graphs of examples of scalar couplings.

One example of scalar couplings is to use scalar values from a vertices on the adjacent boundary as shown in FIG. 78A. In structural mechanics, you can use this type of coupling to formulate displacement constraints along a boundary in terms for the displacements of the end point.

Figure 78B:
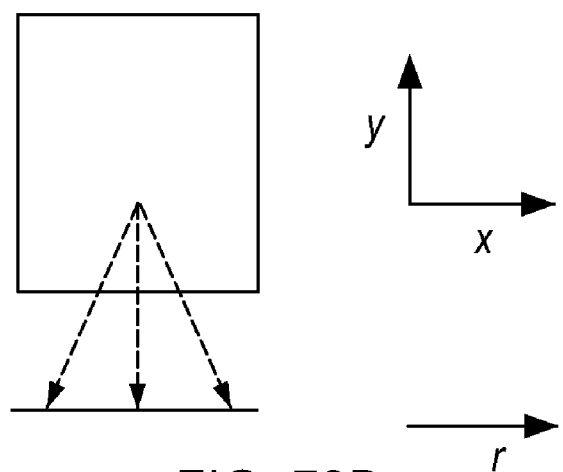

Another example is to use the integral over a subdomain in a 2-D geometry along a subdomain in another 1-D geometry as shown in FIG. 78B. This is useful for process industry models, where two different processes interact.

Extrusion Couplings

An extrusion coupling variable takes values from the source domain(s) by interpolation of an expression at points that are dependent in some way on the position of the evaluation points in the destination domain(s).

When the destination domain has more space dimensions than the source domain, the variable performs extrusion of values. The extrusion coupling variable can also be used for mapping values from the source to the destination. This is applicable when the source and destination domains have the same number of space dimensions.

The method employed is that first a one-to-one transformation is applied to the mesh of the source domain(s). This transformation may be trivial and leave the coordinates unchanged, but it can also be used to rescale, stretch, bend, or reflect the mesh. Then a second transformation is applied to the evaluation points in the destination domain(s), and the resulting points are used for the interpolation of an expression at points in the transformed source mesh.

EXTRUSION COUPLING EXAMPLE

Consider the case of a single rectangular domain, where the source term in Poisson's equation comes from the inward flux over the right boundary for the corresponding y coordinate.

$$\Delta u = \frac{\partial}{\partial n} u(x_2, y) \quad \text{on } \Omega$$
$$u = xy \quad \text{on } \partial\Omega$$

Figure 79:
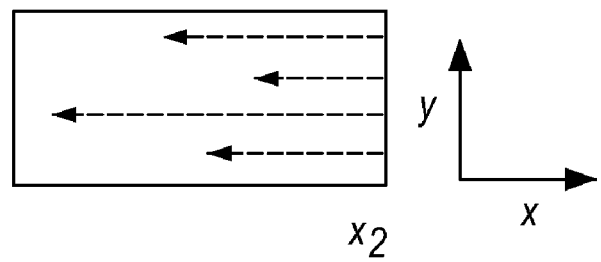
FIG. 79 is a graph of another example of Poisson's equation on a single rectangular domain.

The figure shown in FIG. 79 illustrates the extrusion process. The values of the in-flux on the boundary become available throughout the domain by extrusion along the y-axis. The source transformation mapping is y, and the destination transformation mapping is y.

The problem is linear so you can use the linear solver. We use the weak term to specify the source term in the Poisson equation, so we do not have to use the weak solution form.

Model Navigator

Start FEMLAB and select the 2-D, Coefficient, Linear, PDE mode in the Model navigator. Use the Lagrange - Quadratic element type.

Draw Mode

Draw a single rectangle of any size.

Boundary Mode

In boundary mode, select all boundaries. Set the r coefficient to x·X·y.

Subdomain Mode

On the Weak tab, set the subdomain 1 weak term to u_test·X·flux. (Poisson's equation with source flux).

Open the Add/Edit Coupling Variables dialog box.

Enter the variable name flux and choose the default type Extrusion and press Add.

Go to the Source page and select boundary 4. Enter ncu in the Expression field, and set local mesh transformation to y.

On the Destination page, select subdomain 1, and set local mesh transformation to y.

Return to the Variables page to check the definition. Finally, press OK.

Solve Problem

Press the Solve Problem button.

Post Mode

On the Surface tab, change Surface expression to flux.

On the Line tab, check Line plot, and select ncu as Line expression.

Press OK.

The plot shows both the value of the flux variable on the destination domain and the source ncu on the boundary.

BRIEF EXAMPLES OF EXTRUSION COUPLINGS

Figure 80A:
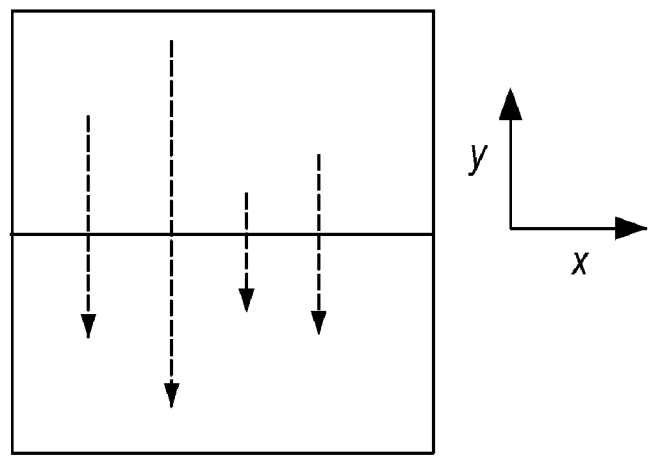
FIGS. 80A-80C are graphs of examples of extrusion couplings.

One application of extrusion couplings is to mirror the solution in the x-axis as shown in FIG. 80A. This can be very useful for post processing. The source transformation mapping is x, y, and the destination transformation mapping is x, -y.

Figure 80B:
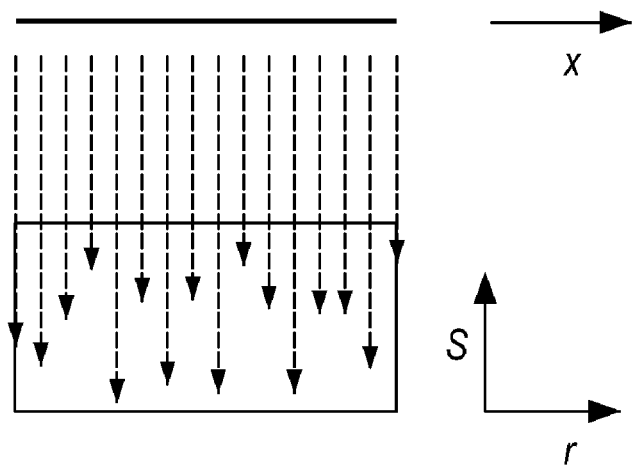

Another example is to extrude the solution in the 1-D geometry to the 2-D along the s axis as shown in FIG. 80B. The source transformation mapping is x, and the destination transformation mapping is r.

Figure 80C:
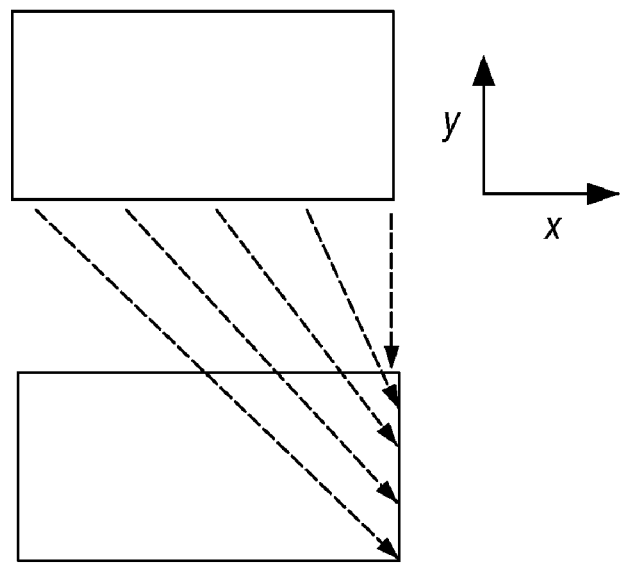

Yet another example is to map values on the lower boundary to the right boundary on the same rectangle as shown in FIG. 80C. The source transformation mapping is (x+1)/2 and the destination transformation mapping is y.

Projection Couplings

A projection coupling variable takes values from the source domain(s) by evaluating a series of line integrals within the source domain(s), where the line positions are dependent on the positions of the evaluation points in the destination domain(s). In this way you can evaluate the average of a variable over one space variable at a range of different points along the other space axis, giving a result which varies over the latter space variable.

The method employed is that first a one-to-one transformation is applied to the mesh of the source domain(s). The last space dimension in the transformed mesh is the one integrated over, so the lines used to integrate are vertical in the transformed source mesh. The placement of the vertical lines in the transformed source mesh is given by the positions of the transformed destination evaluation points. The integrals are then carried out in the source domain(s) over lines which correspond to the vertical lines in the transformed source mesh.

Then a second transformation is applied to the evaluation points in the destination domain(s), and the resulting points are used for the interpolation of an expression at points in the transformed source mesh.

BRIEF EXAMPLES OF PROJECTION COUPLINGS

Figure 81A:
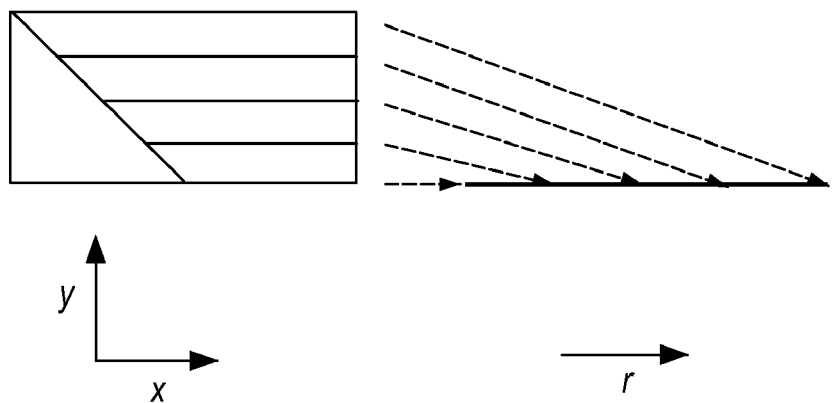
FIGS. 81A-81C are graphs of examples of projection couplings.
Figure 81B:
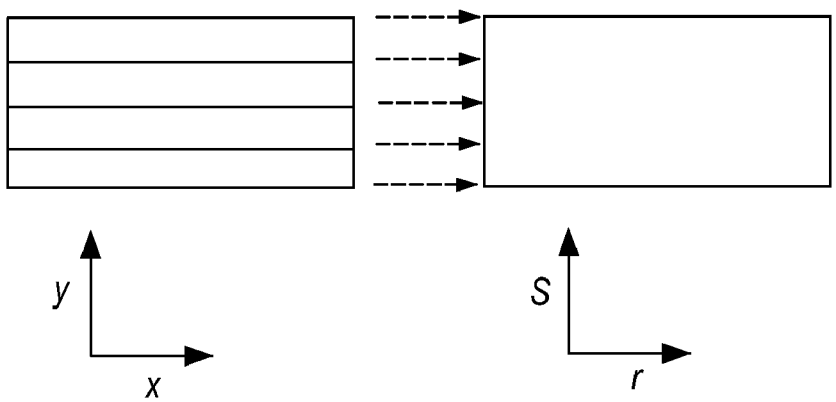
Figure 81C:
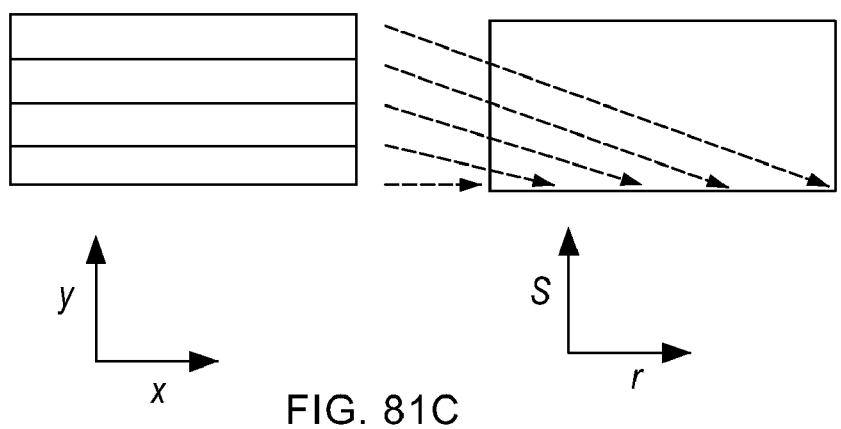

Referring to FIGS. 81A-81C, for each point r return $$v(r) = \int_{\substack{y=r/2 \\ (x,y)\in s_2}} u(x, y) dx$$

The source transformation mapping is y, x, and the destination transformation mapping is r/2.

For each point (0,s) return $$v(0, s) = \int_{\substack{y=s \\ (x,y)\in s_2}} u(x, y) dx$$

The source transformation mapping is y, x, and the destination transformation mapping is s.

For each point (r,0) return $$v(r, 0) = \int_{\substack{y=r/2 \\ (x,y)\in S_2}} u(x, y) dx$$

The source transformation mapping is y, x, and the destination transformation mapping is r/2.

Also non-rectangular domains can be swept by the integration. Only the source domains will be included in the integrals. Other domains and the external area will be excluded from the integrals.

The Weak Solution Form and the Solvers

FEMLAB computes the exact Jacobian contribution for the coupling variables when the coupling variables are evaluated as weak terms. The easiest way of achieving this is by using solution form Weak. It can also be achieved by with solution form Coefficient or General by specifying all coupling variables in weak terms on the Weak tabs.

If you use a coupling variable in a coefficient, without using solution form Weak, the Jacobian is likely to be incorrect-and the nonlinear solver might not converge even for linear couplings.

For stationary problems with coupling variables, you should always use the nonlinear solver-it can sometimes be difficult to see if the problem is nonlinear or not. If you are sure about the linearity of the problem, and coupling variables only occur in weak terms, the linear solver can be safely used.

Sparsity of Jacobian

The Jacobian for problems formulated using the finite element method is usually large, but rather sparse, i.e., with relatively few nonzero elements. This is because the solution at each node in the mesh can be dependent at most on the degrees of freedom from the neighboring mesh elements. If however coupling variables are introduced, non-local dependencies are introduced, filling up the rows and columns of the affected source and destination nodes. This extra filling may make the Jacobian matrix slightly less sparse (in which case the solution speed is only slightly affected) or it may make it a great deal less sparse (in which case the memory use and CPU time involved in solving the problem may be increased a great deal). For this reason care should be taken when introducing non-local couplings.

Non-Local Dirichlet Boundary conditions

When using coupling variables in Dirichlet boundary conditions, the constraint is handled by adjusting both the source and the destination values until the constraint is satisfied. This corresponds approximately to how periodic boundary constraints are handled in FEMLAB, and this may be appropriate in the context of the problem being modeled. Often, however, it is more appropriate to leave the source unaffected and constrain only the destination.

MULTIDISCIPLINARY MODELS

Magnetic Brake

Figure 86:
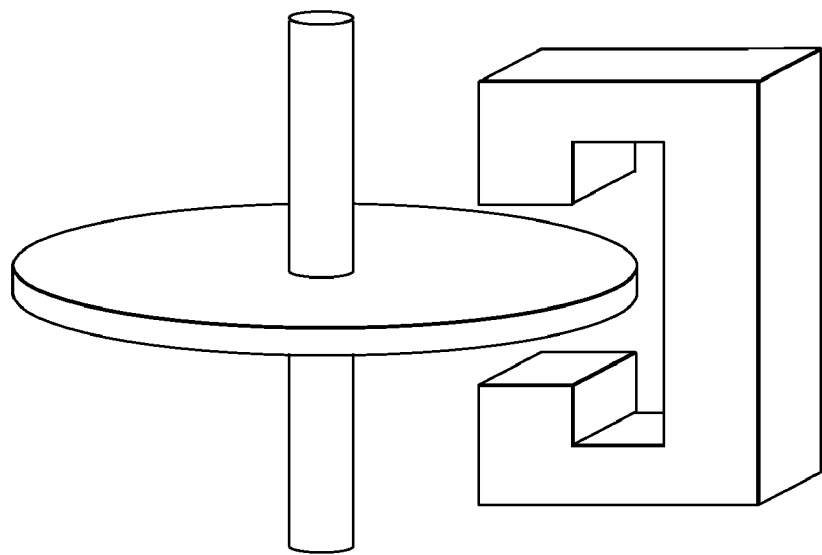
FIG. 86 is a perspective view of a magnetic brake.

This example studies a magnetic brake that slows down a copper disk rotating in the magnet's air gap as illustrated in FIG. 86. The rotation induces currents, and forces along the current lines impede the disk's motion.

This time-dependent problem will be solved in two different ways: first using FEMLAB's extended multiphysics feature, and second as a Simulink simulation. In both cases the stationary problem of computing the magnetic field in the disk given a certain angular velocity $\omega$ will be solved first.

Assume the disk rotates around the z-axis with angular velocity $\omega$. The velocity v at a point (x,y) is then $$v = \omega(-y, x, 0).$$

When the disk is inserted in the air gap and it encounters the magnetic field $B_0$, the configuration induces a current density j according to Lorentz' equation:

$$\begin{cases} E + v \times (B + B_0) = \frac{1}{\sigma d} j \\ \nabla \times E = 0 \\ \nabla \times B = \mu j. \end{cases}$$

In these equations, B represents the magnetic field, E the electric field, $\mu$ the permeability, $\sigma$ the electric conductivity, and d the plate's thickness. This example uses the Dirichlet boundary condition B=0.

In this model the magnetic flux B has only a vertical component and the currents and electric field have no z-components. Solving for B gives the following scalar partial differential equation:

$$-div(\nabla B + \mu \sigma d \omega (B+B_0)(\ )) = 2$$

where B is the z-component of B and $B_0$ equals the z-component of $B_0$.

Now consider how the system evolves over time. The disc is slowed down by the induced torque and an ordinary differential equation (ODE) must be set up to model the angular velocity $\omega$.

To obtain the time derivative of the angular velocity $\omega$, the torque arising from the induced currents must be computed. For a small surface element, the force equals $$dF = j \times (B+B_0) dx dy$$

and integrating over the disk gives the total torque:

$$M = \int_{Disk} \frac{1}{\mu} r \times ((\nabla \times B) \times (B + B_0)) dx dy.$$

In this case, M has only a z-component with the value $$M = \int_{Disk} \frac{1}{\mu} \left( y \frac{\partial B}{\partial x} - x \frac{\partial B}{\partial y} \right) \cdot (B + B_0) dx dy.$$

Thus the ODE for $\omega$ may be formulated as $$J \frac{d\omega}{dt} = M$$

where the moment of inertia J for a disk with radius r equals $$J = m \frac{r^2}{2} = \frac{\rho d r^4 \pi}{2}.$$

Model library FEMLAB/Multidisciplinary/magnet_brake

USING THE GRAPHICAL USER INTERFACE - FIXED $\omega$

Before solving the time-dependent problem, consider first the problem where $\omega$ is fixed.

Select the 2-D, Coefficient, Linear stationary PDE mode in the Model Navigator. Click on the button marked More, change the Dependent variable name to B and then click OK.

Options and Settings

To help when drawing the geometry, set axis and grid settings:

| AXIS | | GRID | |
|---|---|---|---|
| X min | −0.15 | X spacing | 0.05 |
| X max | 0.15 | Extra X | 0.03 0.07 |
| Y min | −0.1 | Y spacing | 0.2 |
| Y max | 0.1 | Extra Y | |

Enter the following constants:

| NAME | EXPRESSION |
|---|---|
| K | 4e − 7 * pi * 5.00e7 * 0.02 |
| w | 2 * pi * 100 |

The variable w represents the fixed angular velocity $\omega$. The variable K is the product of $\mu$, $\sigma$ and d.

Draw Mode

Draw a circle centered at (0,0) with a radius of 0.1.

Figure 87:
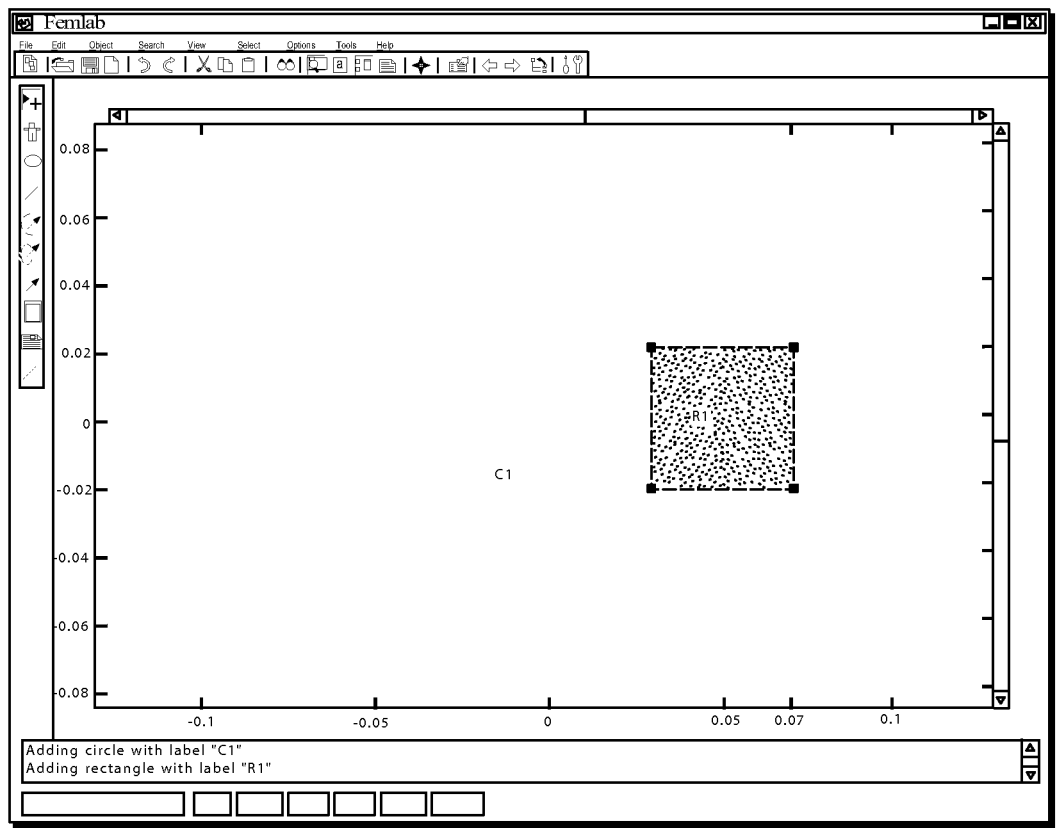
FIG. 87 is a screen shot of a graphical user interface for a draw mode.

Draw a square centered at (0.05,0) with each side 0.04 units long as shown in FIG. 87.

Boundary Mode

Check that the boundary settings are:

| BOUNDARY | 5,6,7,8 |
|---|---|
| Type | Dirichlet |
| h | 1 |
| r | 0 |

Subdomain Mode

Enter PDE settings as shown:

| SUBDOMAIN | 1,2 |
|---|---|
| c | 1 |
| a, f, $d_a$ | 0 |
| $\alpha$ | K * w * y   −K * w * x |
| $\gamma$ | −K * w * B0 * y   K * w * B0 * x |

Figure 88:
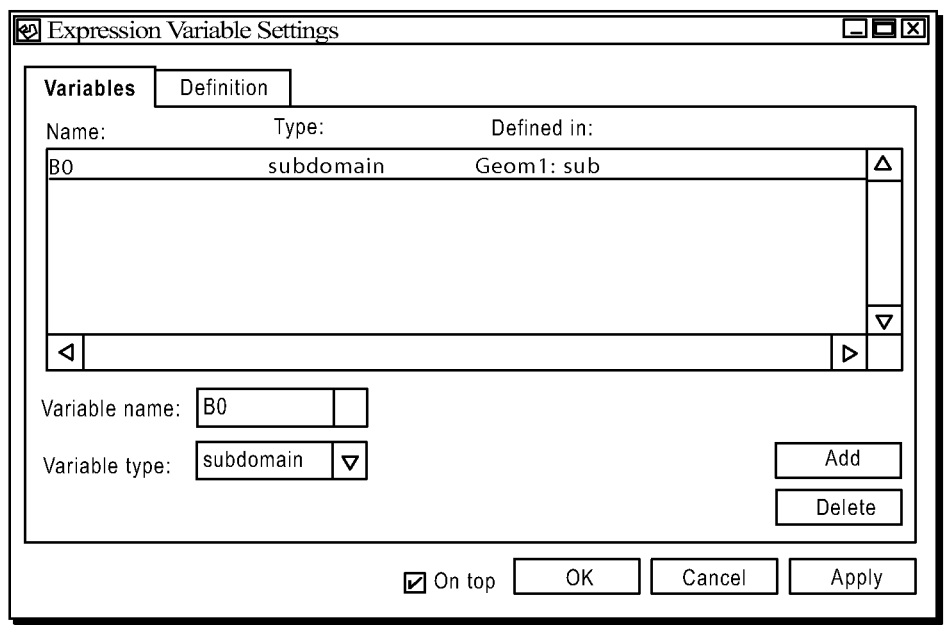
FIG. 88 is a screen shot of a graphical user interface for an expressions variable settings.

The applied field $B_0$ is used here and it has not been defined. It is different in the two subdomains, so it's best to use the Add/Edit Expressions dialog Enter the name B0, select type subdomain and click Add in FIG. 88.

Click the Definition tab, select subdomain 1 and enter the expression 0

Figure 89:
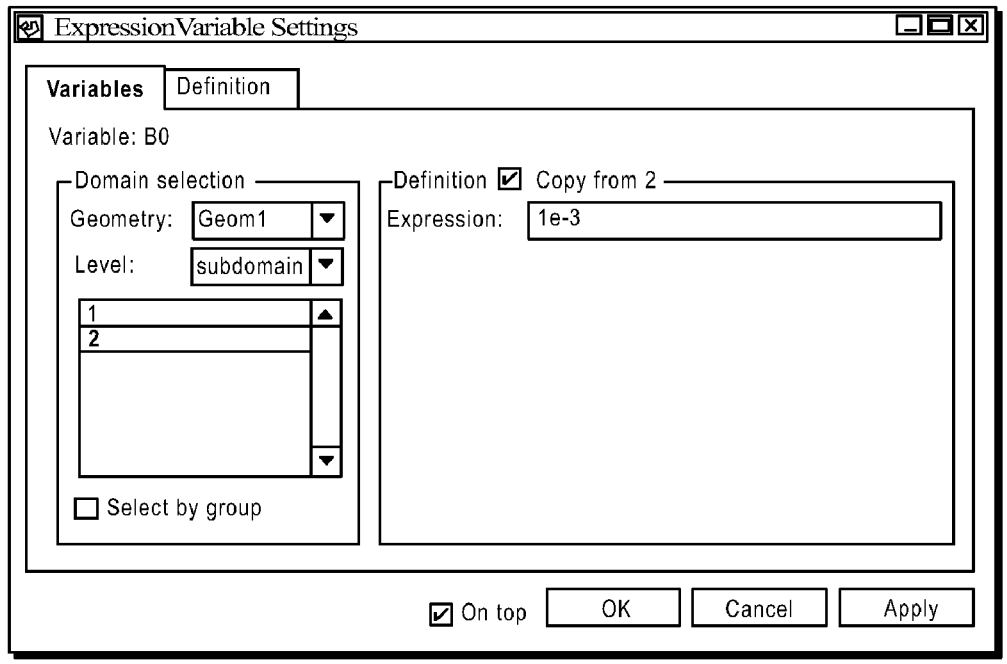
FIG. 89 is a screen shot of a graphical user interface for an expressions variable settings.

Select subdomain 2 and enter the expression 1e -3. Then press OK in FIG. 89.

Mesh Mode

Open the Mesh Parameters dialog box by selecting Parameters... from the Mesh menu and set Max. edge size, general to 0.04.

Figure 90:
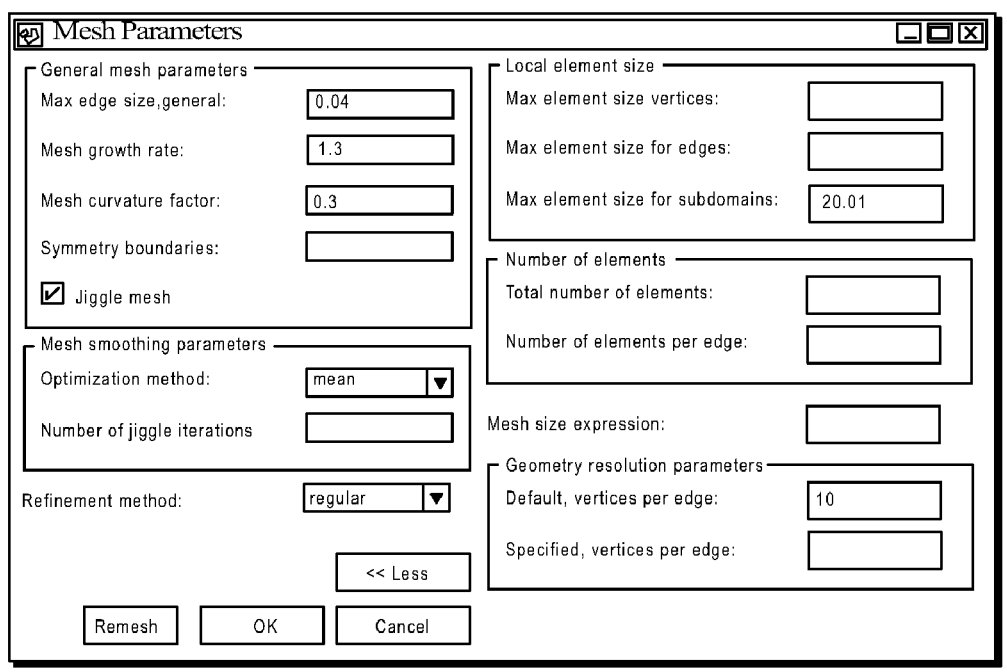
FIG. 90 is a screen shot of a graphical user interface for mesh parameters.

Click on More and enter 20.01 in the Max element size for subdomains box as shown in FIG. 90.

Press OK and then press the Initialize Mesh button.

Press the Refine mesh button.

Solve Problem

Figure 91:
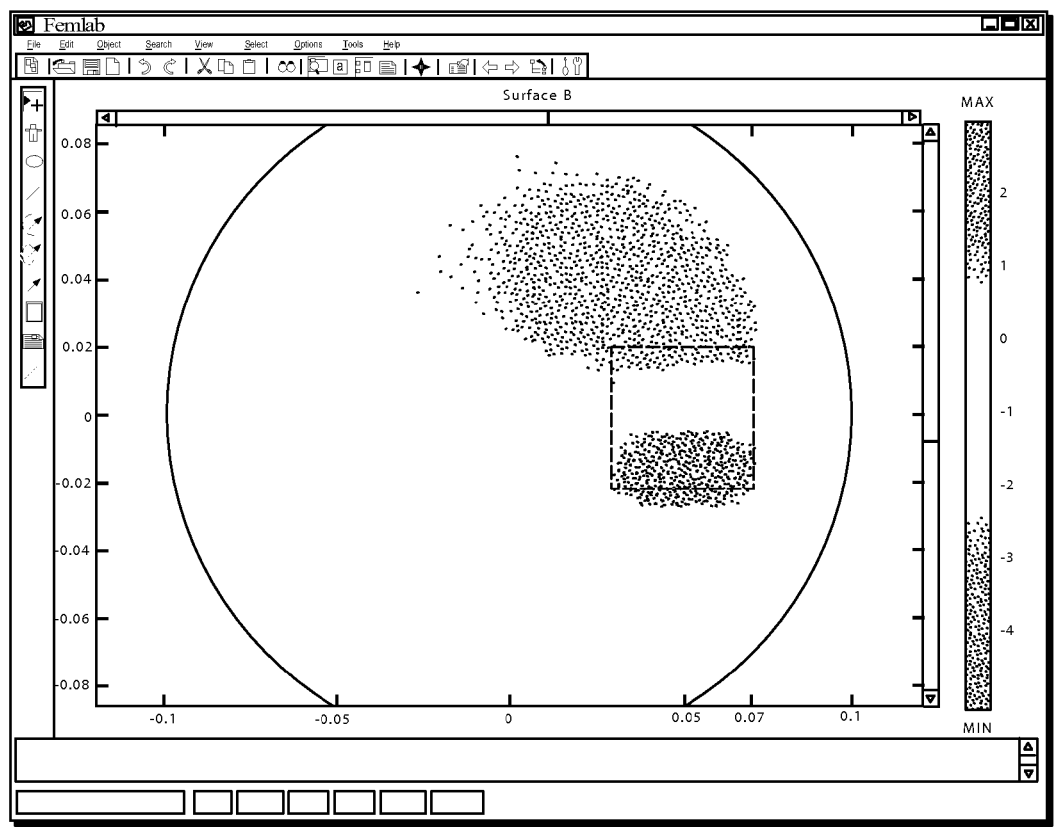
FIG. 91 is a screen shot of a graphical user interface for a solution to the entered parameters in FIG. 90.

Press the Solve Problem button to solve the problem. (Time to solve: 5 s) as shown in FIG. 91.

---

USING THE PROGRAMMING LANGUAGE - FIXED $\omega$

% Clear the FEM structure, set the variable name and
% choose quadratic elements.
clear fem
fem.dim='B';
fem. shape=2;
% Specify the constants K and w.
fem. variables={'K',4e−7*pi*5.99e7*0.02,...
    'w',2*pi*1001;
% Create the geometry.
fem.geom=circ2(0,0,0.1 )+rect2(0.03,0.07,−0.02,0.02);
% Specify the boundary conditions, i.e. homogeneous Dirichlet
% conditions at the edge of the disk (boundary elements 5, 6, 7 % and 8).
fem.bnd.h=1;
fem.bnd.r=0;
fem.bnd.ind={5:8};
% Specify the PDE coefficients.
fem.equ.c=1;
fem.equ.al={{{'K*w*y' '−K*w*x'}}};
fem.equ.ga={{{'−K*w*B0*y' 'K*w*B0*x1'}};
fem.equ.expr-{'B0' {'0' '1e−3'}};
% Generate the mesh.
fam.mesh=meshinit(fem, 'hmax',{0.04 [ ] [ ] [2 0.01]});
fem.mesh=meshrefine(fem);
% Solve the problem and plot the solution.
fem.xmesh=meshextend(fem);
fem.sol=femlin(fem);
postplot(fem,'tridata', 'B', 'tribar', 'on',...
    'trirefine',10, 'axisequal', 'on');

---

USING THE GRAPHICAL USER INTERFACE - TIME-DEPENDENT $\omega$

In this section FEMLAB's extended multiphysics feature will be used to solve the time-dependent problem.

The approach taken here will be to set up a second geometry to handle the ODE for angular velocity $$J\frac{d\omega}{dt} = M$$

and then use extended multiphysics element structures to allow variables from each geometry to be made available when solving the problem in the other geometry.

Note An alternative approach is to use only one geometry and introduce a new variable w, active at a single point within that geometry using a Point weak form, application mode. In this alternative the same coupling variables M and w are used but the source and destination domains would have to be suitably altered. The ODE for w would then be specified using the coefficients on the Weak tab in the Point settings dialog; first multiply both sides of the ODE by the test function for w, then set dweak and weak to be the left and right hand side respectively, i.e. J·X·w_time·X·w_test and m·X·w_test.

Options

Add the following constants to the variable list which already includes K and w:

| NAME | EXPRESSION |
|------|------------|
| j    | 8960 * 0.02 * 0.1 ^ 4 * pi/2 |
| mu   | 48 − 7 * pi |

Select the variable w in the list and Delete it so the list consists only of K, J and mu. The variable w here will be replaced by the dependent variable w from the ODE.

In the Add/Exit Expressions dialog box, select the variable B0 in the list and change its definition in subdomain 2 to 0.1

Add Geometry

Now add the new geometry to handle the ODE. An ODE can be thought of as a zero-dimensional PDE, so in principle a zero-dimensional geometry is all that is required here, but since there is no support for this in the graphical user interface, a trivial one-dimensional geometry will be used instead. In addition, the use of coupling variables means weak solution form must be used.

From the Multiphysics menu, choose Add/Edit Modes.

Change the Solver type to Time dependent and the Solution form to Weak.

Click on the button marked Add to the right of the Geometry name list.

Select 1-D using the Dimension radio buttons.

From the list on the left, select PDE, coefficient form.

Change the Dependent variable name to w.

Click on the >> button in the middle of the dialog box to add this mode and geometry to the model.

Change the Solution form to Weak for this new geometry as well.

Click OK.

Draw Mode

From the Draw menu, choose Specify geometry.

Enter 0 and 1 in the Start and Stop fields respectively.

Click OK.

Define Coupling Variables

There are two extended multiphysics couplings in this model. In other words, two variables which are to be made available beyond the domains in which they exist naturally.

Firstly, the source term M in the ODE described in geometry 2 was defined earlier to be $$M = \int_{Disk} \frac{1}{\mu}\left(y\frac{\partial B}{\partial x} - x\frac{\partial B}{\partial y}\right) \cdot (B + B_0) dx dy.$$

so the result of this integral over subdomains 1 and 2 in geometry 1 must be made available in geometry 2 as the variable M.

Secondly, the angular velocity variable w is used in the coefficients α and γ the PDE in geometry 1. Previously w was defined in the Add/Edit Constants dialog box, but this time it must be taken from geometry 2. Thus the dependent variable w in geometry 2 must be made available in the subdomains of geometry 1.

Define M first

Open the Add/Edit Coupling Variables dialog

Enter the variable name M and select the default type scalar

Figure 92:
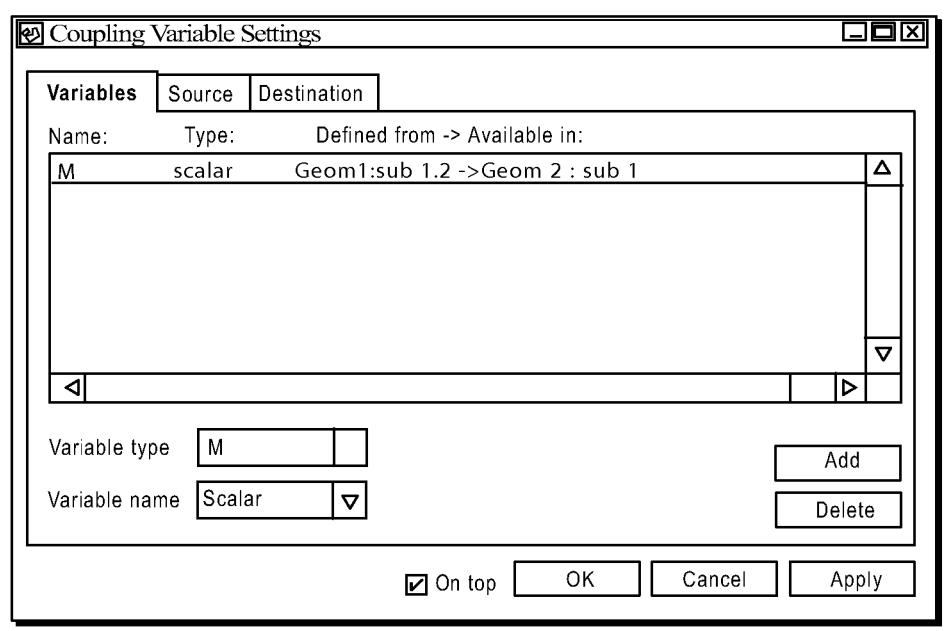
FIGS. 92-95 are screen shots of graphical user interfaces for the coupling variables settings.

Press Add in FIG. 92.

Click on the Source tab and then select Geom1, subdomain level as the source

Figure 93:
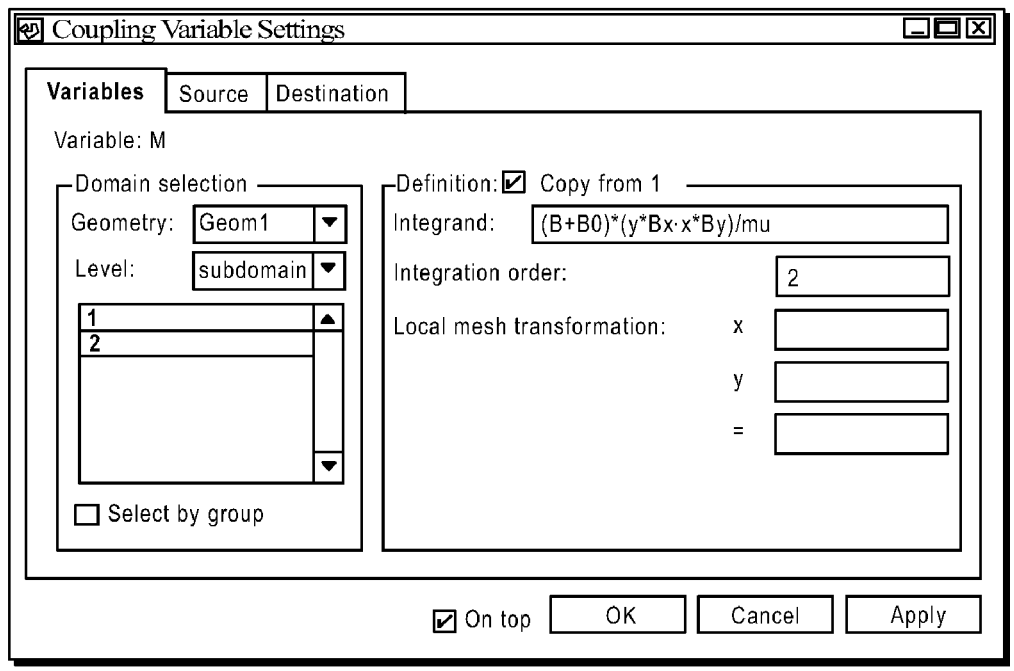

Select subdomains 1 and 2 and set the integration order to 2 and the integrand $(B+B0)\cdot\dot{X}\cdot(yBx-xBy)$/mu as shown in FIG. 93.

Click on the Destination tab and select Geom2, subdomain level

Figure 94:
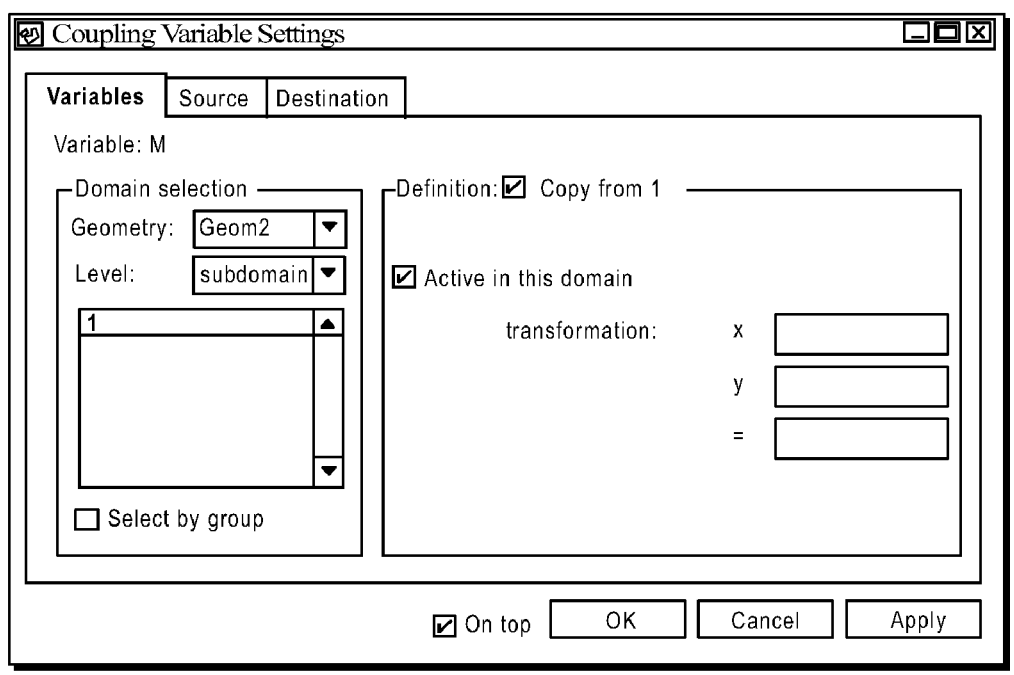

Select subdomain 1 and check the Active ... box as shown in FIG. 94.

Now make w available in geometry 1

From the Variables tab, add a scalar variable with the name w

On the Source tab set the source as Geom2, subdomain 1, with an integrand w and integration order 1.

Set the Destination as Geom1, subdomains 1 and 2

Press Apply.

Figure 95:
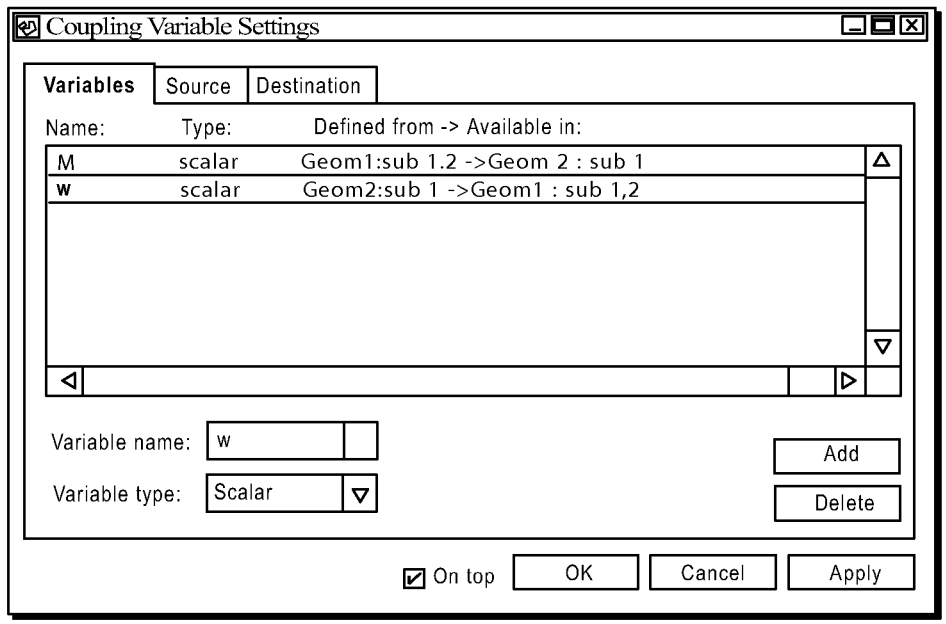

To check the variables have the correct source and destination domains, click on the Variables tab in FIG. 95.

Note that the definition of w here means 'use the integral of w over subdomain 1 in geometry 2', but since w will be constant over the whole subdomain and the subdomain has length 1, this is the same as simply taking the value w at any point in the subdomain.

Boundary Mode

Set the boundary settings:

| BOUNDARY | 1,2 |
|----------|-----|
| Type     | Neumann |
| q        | 0 |
| g        | 0 |

Subdomain Mode

Enter PDE settings as shown:

| SUBDOMAIN | 1 |
|-----------|---|
| c, a, α, β, γ | 0 |
| $d_a$     | J |
| f         | M |
| init      | 2 * pi * 200 |

Mesh Mode

Open the Mesh Parameters dialog box by selecting Parameters... from the Mesh menu and set Max. edge size, general to 1.

Press OK and then press the Initialize Mesh button.

Select Geometry 1 from the Multiphysics menu.

Press the Initialize Mesh button. This resets the mesh to a coarser mesh than the one used in the fixed ω case in order to shorten the solution time for the time dependent case.

Solve Problem

Open the Solve parameters dialog box and turn to the Timestepping page.

Set the Output times to 0 8, and select fldae as the Timestepping algorithm, with Relative tolerance 1e-3 and Absolute tolerance 1e -5.

Click OK.

Press the Solve Problem button on the toolbar.

Plot Mode

Once the problem has been solved, the results can be visualized in a number of ways.

An animation of the dissipation of B over time can be shown by pressing the Animate button.

Figure 96:
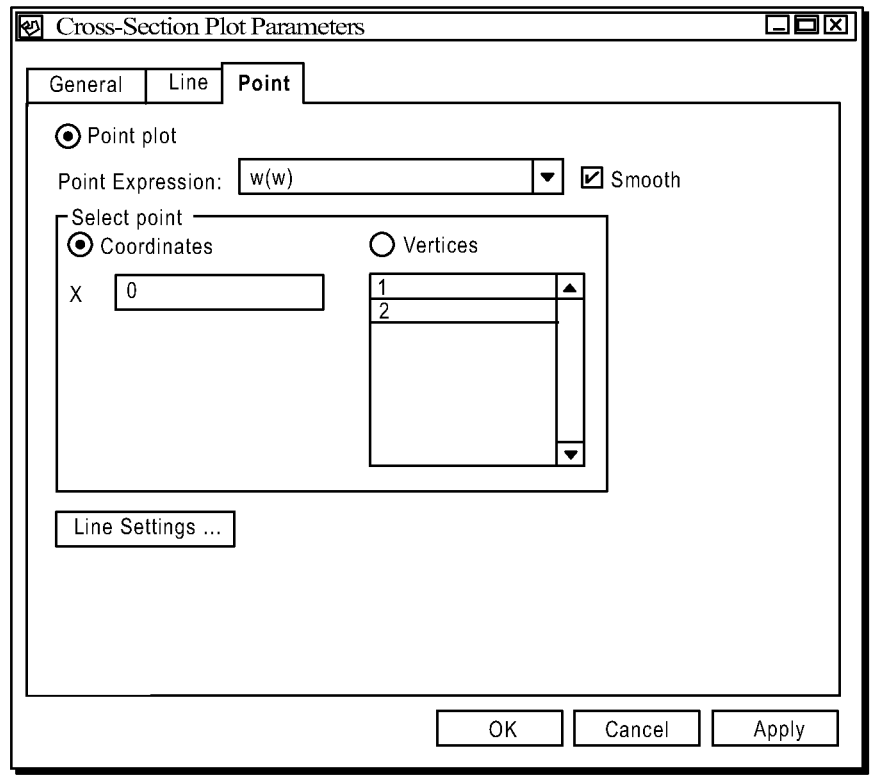
FIG. 96 is a screen shot of a graphical user interface for cross-section plot parameters.

For a graph of the ω against time, select Geometry 2 from the Multiphysics menu and open the Cross-section plot parameters dialog box from the Post menu. Select all the time steps in the list box and select Point plot. Then, on the Point sheet, make sure that the Point expression is w and click OK as shown in FIG. 96.

For a graph of dω/dt against time, follow the same procedure as for ω, but set the Point expression to M/J instead.

Results

Figure 97A:
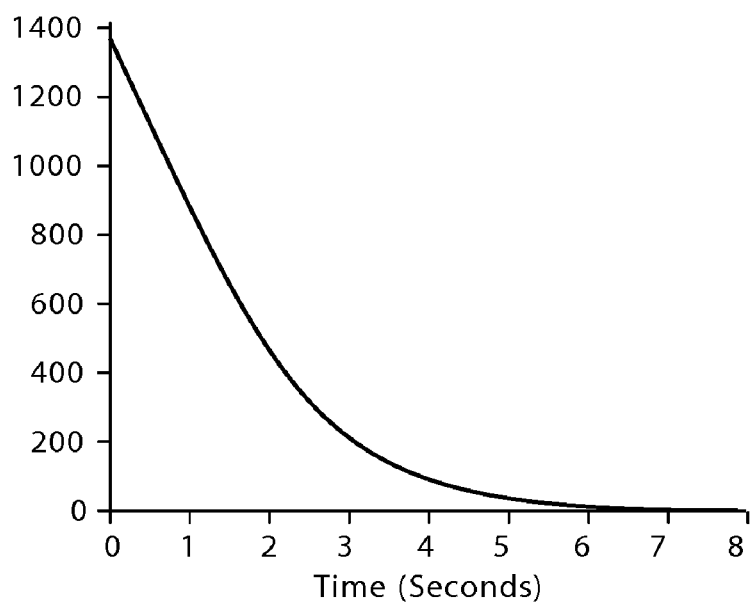
FIGS. 97A-97B are graphs of plots for $\omega$ and $d\omega/dt$.
Figure 97B:
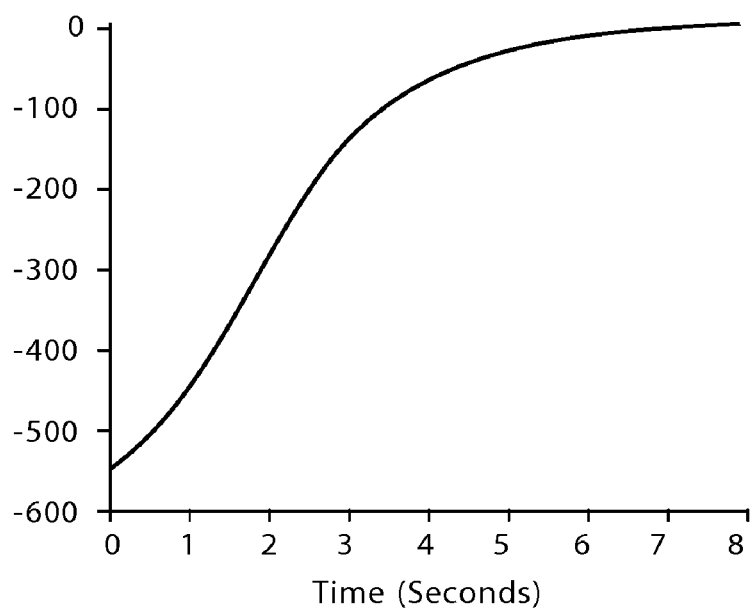

The plots for ω and dω/dt against time are shown in FIGS. 97A-97B.

Packed Bed Reactor

Figure 82:
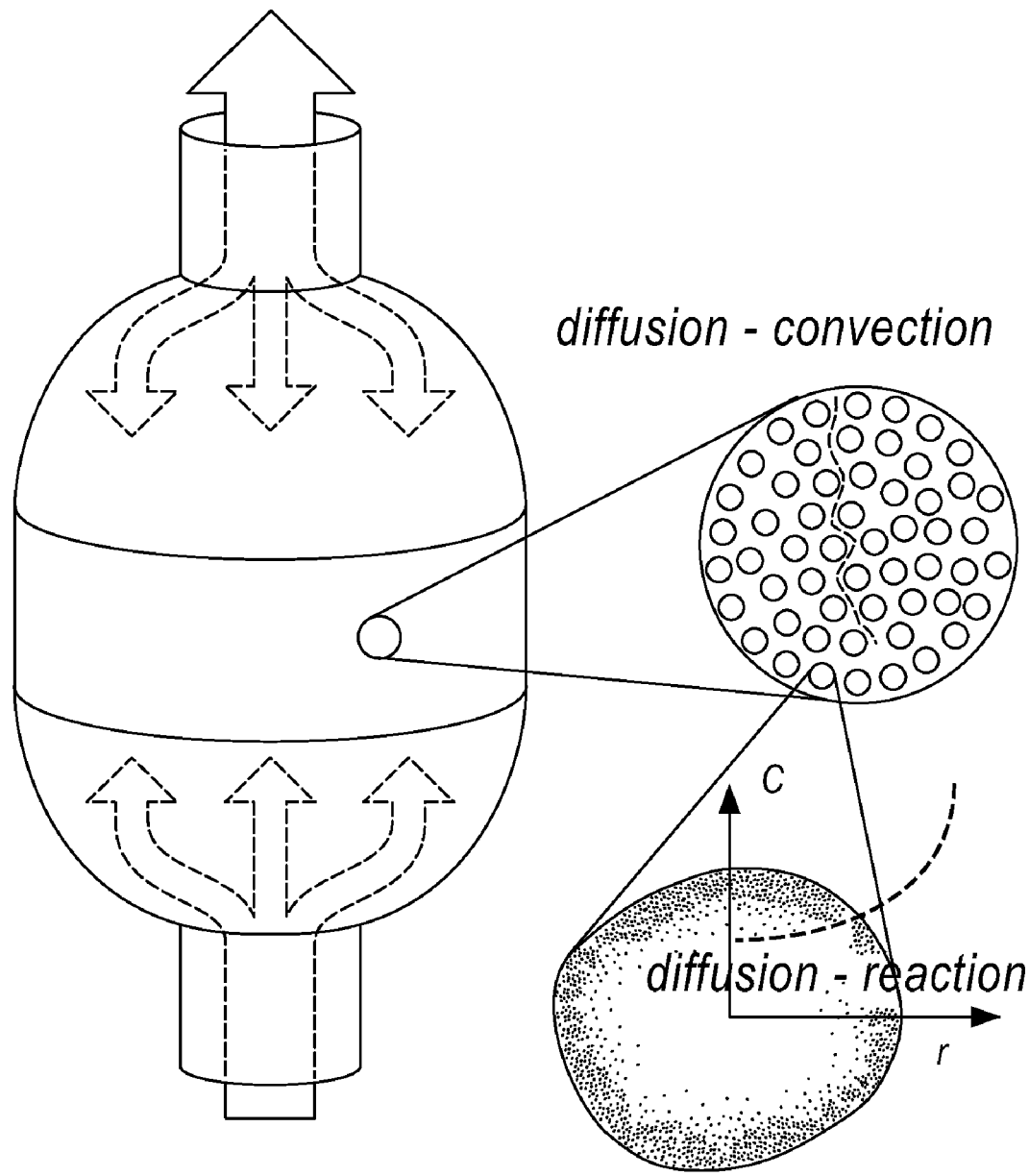
FIG. 82 is a diagram of a packed bed in a reactor.

One of the most common reactors in the chemical industry, for use in heterogeneous catalytic processes, is the packed bed reactor as shown in FIG. 82. This type of reactor is used both in synthesis as well as in effluent treatment and catalytic combustion. The reactor consists in essence of a container filled with catalyst particles. These particles can be contained within a supporting structure, like tubes or channels, or they can be packed in one single compartment in the reactor.

The structure that is formed by the packed catalyst particles makes the modeling of mass and energy transport in the reactor a challenging task. The difficulty lies in the description of the porous structure, which gives transport of different orders of magnitudes within the particles and between the particles. In most cases, the structure between the particles is described as macro porous and the pore radius can be of the order of magnitude of mm. When a pressure difference is applied across the bed, convection arises in the macro pores. The pores inside the catalyst particles form the microstructure of the bed. The pore radius in these particles is often between one and ten mm.

This model presents a simple and fast alternative for studying macro- and micro-mass balances in packed beds and other heterogeneous rectors with bimodal pore distribution. The simulation gives the mass and reaction distribution, and the same type of approach for the heat balance accounts for the temperature profile in the reactor. The equations are based on simple mass balances for the macro and micro systems.

The mass balance for the macro system are based on the equation for convection- diffusion-reaction:

$$\nabla \times (-D\nabla c + cu) + R = 0$$

In the above equation D denotes the diffusion coefficient ($m^2\ s^{-1}$), c concentration (mol $m^{-3}$), u the velocity vector (m $s^{-1}$) and R denotes the reaction term (mol $m^{-3}\ s^{-1}$). The solution of the above equation requires proper boundary conditions:.

$$\tau = \tau_0 \text{ at } \partial\Omega_{inlet}$$

$$-D\nabla c \times n = 0 \text{ at } \partial\Omega_{outlet}$$

$$(-D\nabla c + cu) \times n = 0 \text{ at all other boundaries}$$

At a first glance, these equations look simple to solve, especially if the velocity vector is given by an analytical expression, which is the case for plug flow in a packed bed reactor. However, the reaction term, R, depends on the transport in the micro particles, which in general is obtained by calculating the flux into the particles, at the outer surface of the particle, times the available outer surface area of the particles per unit volume:

$$R = A_p N(r=R_p) \times n$$

In this equation, $A_p$ denotes the outer surface area of the particle per unit volume ($m^2\ m-3$), N denotes the flux vector (mole $m^{-2}\ s^{-1}$), in this case the flux in the porous particle, r the independent variable for the radius of the particle (m), $R_p$ the radius of the particle, and n the normal vector to the particle surface.

To solve the equations above, the reaction term, R, has to be calculated. This implies the formulation of a new mass balance in micro scale. Such a mass balance is expressed by the equation below:

$$\nabla \times (-D'\nabla c) + kc'^\gamma = 0$$

Here, D' is the effective diffusion coefficient in the particle, c' is the concentration in the particle, and k the reaction rate constant for the heterogeneous reaction in the particle ($mol^{\gamma-1} s^{-} m^{3(\gamma-1)}$) In this case, transport takes place by diffusion only.

The diffusion-reaction equation, combined with the boundary conditions for the particle, give the concentration distribution in the particle.

$$-D\nabla c \times n = 0 \text{ at } r = 0$$

$$c = rc$$

where ϵ denotes the porosity of the particle. This implies symmetry in the middle of the particle. In addition, the concentration at the surface of the particle is equal to the concentration outside of the particle compensated by the fact that part of the particle volume is occupied by solid catalyst support.

The concentration distribution in the particle gives the flux at every point in the particles. This implies that the reaction term for the catalyst bed is given by the solution of the micro mass balance:

$$R = A_p(-D\nabla c \times n)$$

The complication in solving this system of equations is that the macro balance and the micro balance are defined in different coordinate systems. This problem is general for many chemical reaction engineering applications and is often solved by using analytical approximations of the solution to the micro balance. One possibility is to use Thiele modulus in the effectiveness value formulation. However, this approach cannot be used for complicated reaction mechanisms involving several reacting species. The solution exemplified here is general and can be used for very complex reaction mechanisms involving a large number of species.

Input data for the model are the following:

| EXPRESSION | VALUE |
|---|---|
| D | 1e – 6 |
| D' | 1e – 7 |
| c0 | 3 |
| u | 0 |
| Ap | 4e3 |
| k | 100 |
| ϵ | 0.6 |
| Rp | 1e – 3 |
| γ | 1.5 |

Model Library Chemical_Engineering/Mass_Transport/packed_bed_reactor

SOLVING THE PROBLEM USING THE GRAPHICAL USER INTERFACE

The approach here will be to model the bed as a 1-D model with independent variable x. At each x-coordinate there is also a model of one particle typical of all of the particles at that position in the packed bed. Since the particles are spherically symmetric and the surface concentration c is to all intents and purposes constant around each particle, a 1-D model with independent variable r can be used for each of the particles. In order to model particles for each position along the packed bed, many such 1-D models can be placed side by side creating effectively a 2-D geometry with independent variables x and r.

In this 2-D model all of the particles can be modeled independently. There is therefore a 2-D geometry for the particles and a 1-D geometry for the packed bed. Two couplings are used in the model. The packed bed concentration is used in the boundary condition for the particles and the flux at the surface of the particles is used in the reaction term in the packed bed.

Firstly switch to the Multiphysics window in the Model Navigator. Select the 2-D, ChEM: Diffusion application mode. Name the dependent variable c 1 whilst setting the independent variables to x and r respectively. Press Add and select Solution form: Weak.

Now choose a Weak, boundary constraint from the list, name the dependent variable lambda and Add the mode. This mode is added because coupling variables appearing in Dirichlet boundary conditions should usually be handled with weak boundary constraints.

Press the topmost Add button to select a new geometry. Use 1-D as the dimension and press the top Add button once more.

Select the ChEM: Convection and diffusion application mode. Name the Dependent variable to C and then Add the mode.

Select Solution form: Weak, Solver type: Nonlinear stationary and press OK.

Draw Mode

Choose 1 Geom1: Diffusion (di) from the Multiphysics menu.

Draw a unit square with it's lower left corner at (0,0).

Mesh Mode

Select Parameters from the Mesh menu and enter $2e-1$ in the Max edge size, general field.

Press the More button and enter $3\ 1\ e-2$ in the Max element size for edges field. This makes the mesh very fine on boundary 3 which represents the outer surfaces of all of the particles, near which the concentration changes rapidly. Press Remesh and then OK.

Draw Mode

Choose 3 Geom2: Convection and Diffusion (cd) from the Multiphysics menu.

Double click on the line and specify a geometry from 0 to 1.

Mesh Mode

Select Parameters from the Mesh menu, enter $2e-2$ in the Max edge size, general field, press Remesh and then OK.

Options and Settings

Enter the following variable names for use later, in the Add/Edit Constants window under the Options menu.

| NAME | EXPRESSION |
|---|---|
| gamma | 1.5 |
| D1 | 1e−7 |
| D | 1e−6 |
| C0 | 3 |
| k | 100 |
| epsil | 0.6 |
| Ap | 1e3 |
| rp | 1e−3 |
| u | 0.4 |

Enabling the extended multiphysics couplings

First define a variable C_x to be available on boundary 3 in the particle geometry (the outer surfaces of the particles) to be equal to the packed bed concentration C at the corresponding x- coordinate.

Open the Add/Edit Coupling Variables dialog under the Options menu.

Enter C_x in the Variable name edit field and select extrusion from the Variable type drop-down menu. Then press Add.

Switch to the Source tab and select the Geometry Geom2 at the subdomain Level. Then select 1 in the window.

Enter C in the Expression field and enter x for the Local mesh transformation coordinate x.

Switch to the Destination tab, select Geom1 for the Geometry, boundary for the Level and choose boundary 3. Enter x in the Evaluation point transformation x field.

Press Apply.

Now define a variable Ndotn_x to be the normal surface flux for the particles at position x, and make this variable available in the packed bed geometry.

Figure 83:
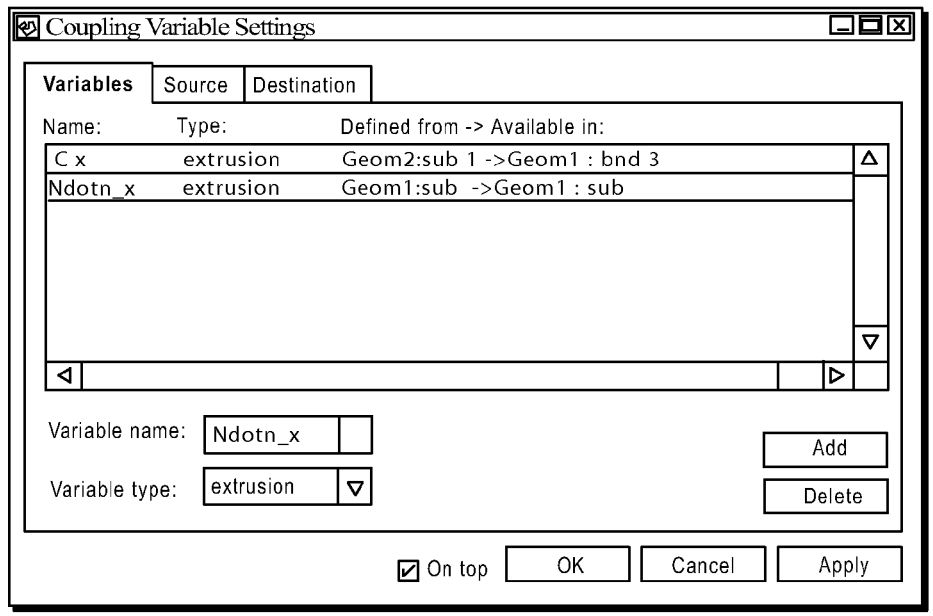
FIG. 83 is another screen shot of a graphical user interface for the coupling variables settings dialog box.

Switch back to the Variables. Referring to FIG. 83, name the variable Ndotn_x and choose extrusion for its Variable type, then press Add.

Go to the Source tab and select Geom1 at the boundary Level. Select boundary number 3 and enter D1·X̣·cir/rp as the Expression and x as the Local mesh transformation x coordinate.

Switch to the Destination tab and select Geom2 for the Geometry at the subdomain Level. Select 1 and enter x as the Evaluation point transformation x.

Press OK and the coupling variables have been defined.

Subdomain Mode

Choose 1 Geom1: Diffusion (di) from the Multiphysics menu.

Enter subdomain settings according to the following table.

| SUBDOMAIN | 1 |
|---|---|
| $D_1$ (anisotropic) | 0 0 0 (Dl/rp^2) * r^2 |
| $R_i$ | −k * r^2 * cl^gamma |

Note that the diffusion is only in the r direction because the 2-D geometry is not a physically 2-D domain, merely a more efficient way of handling a large number of 1-D models set one beside the other.

Boundary Mode

First select Insulation/symmetry conditions for boundaries 1, 2 and 4. The third boundary should be a Concentration boundary with epsil·X̣·C$_{\_x\ as\ its\ value}$.

Switch to the second Multiphysics mode: 2 Geom1: 1 variable weak constraint mode (w1). Open the Boundary Settings dialog and select boundary 3. Make it Active in this domain by selecting this checkbox and enter c1 as the Constraint variable. Press OK to make it active.

Subdomain Mode

Choose 3 Geom2: Convection and Diffusion (cd) from the Multiphysics menu.

Enter subdomain settings according to the following table.

| SUBDOMAIN | I |
|---|---|
| $D_1$ | D |
| $R_i$ | -Ap * Ndotn_x |
| u | u |

Boundary Mode

First select a Convection>> Diffusion condition for boundary 2.

Boundary 1 should be a Concentration boundary with C0 as its value. Finish by pressing the OK button Solve Problem Press the Solve button to start the simulation.

Post mode

Figure 84:
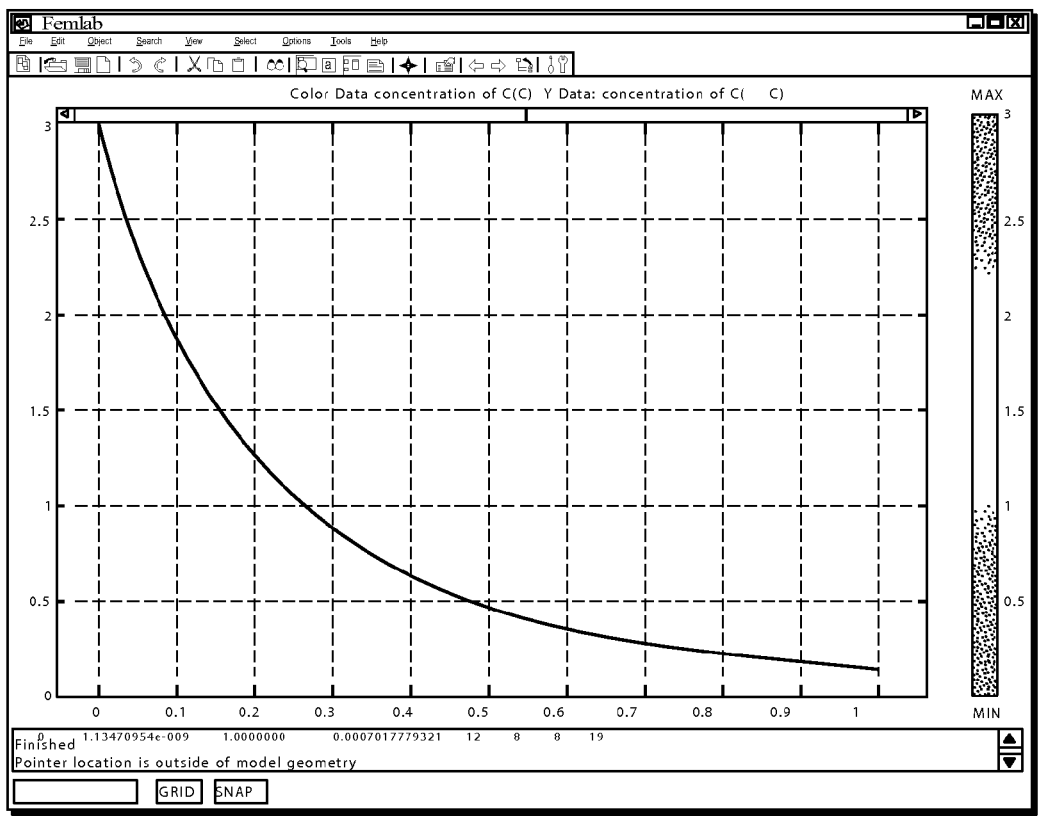
FIG. 84 is a screen shot of a graphical user interface for a concentration plot.

The default plot will give the view of the concentration depicted in FIG. 84.

Figure 85:
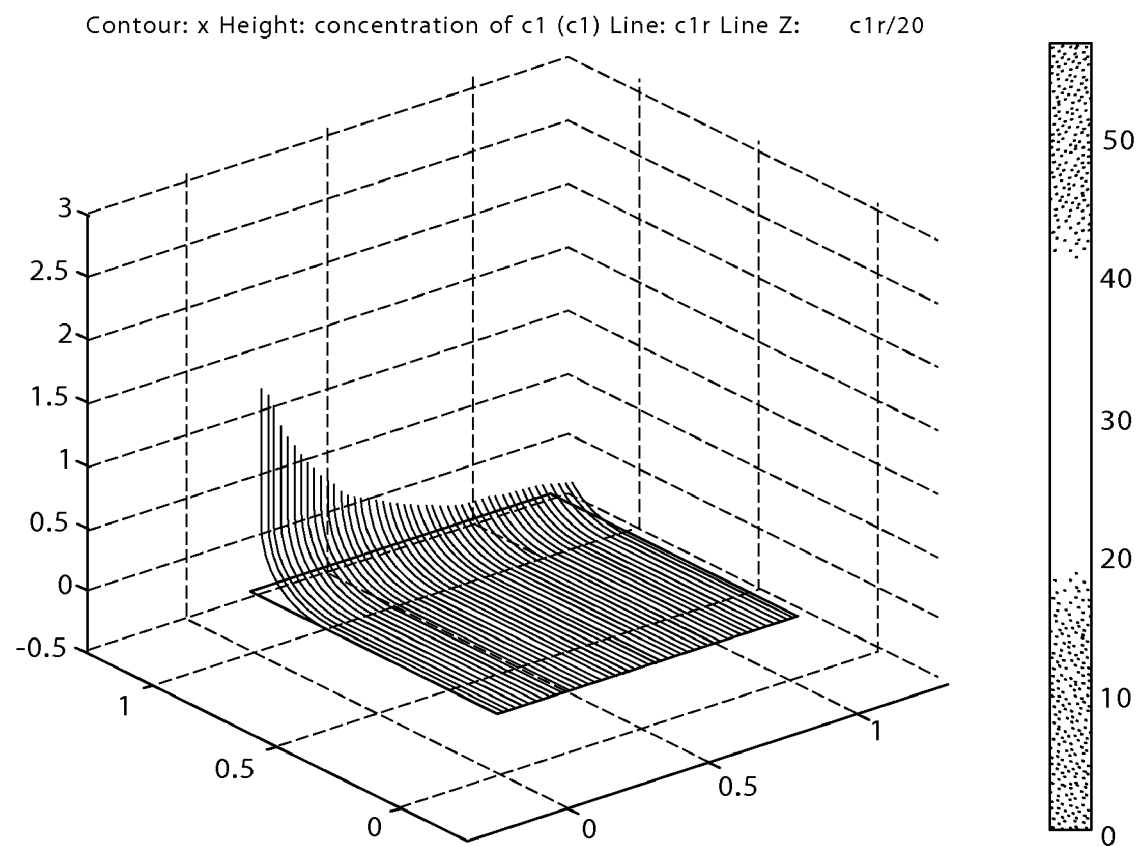
FIG. 85 is a graph of a three-dimensional plot.

For the particles (Multiphysics 1) it is interesting to see a contour plot. Open the Plot Parameters dialog. Deselect the Surface plot and instead select Countor plot, then switch to the Contour tab. Specify x as the Contour expression and concentration of c1 (c1) as the Height expression. Enter 40 in the Contour levels field and deselect the Color bar. The effect of this is to lay 40 lines across the geometry at 40 different x-coordinates and show the concentration distribution along each line. Each one therefore represents the concentration distribution within a single particle. It is also interesting to see how the value of the normal flux which is a multiple of c1r, changes as x changes, so switch to the Line tab and activate the line plot. Enter c1r in the Line expression field and c1r/20 in the Z expression field and press OK. The /20 is simply to rescale the curve to be able to see it on the same axes as the contour plot. The following plot results are shown in FIG. 85.

While the invention has been disclosed in connection with preferred embodiments shown and described in detail, their modifications and improvements thereon will become readily apparent to those skilled in the art. Accordingly, the spirit and scope of the present invention should be limited only by the following claims.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method executed in a computer system for producing a model of a combined physical system having physical quantities by representing physical quantities of the combined system in terms of partial differential equations, said method comprising:

representing each of a plurality of systems as an application mode modeling in up to three space dimensions said physical quantities of each system, wherein said application modes are configured to model said physical quantities of at least one of a structural system, a fluids system, and an electromagnetic system;

determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;

determining, using said processor or another processor, a solution to said model of said combined physical system using said partial differential equations corresponding to said plurality of systems, said model representing a mathematical expression of said physical quantities of said combined physical system; and storing in a computer readable memory or in a computer readable data storage system said solution to said model.

2. The method of claim 1 wherein said non-local coupling defines a value from a first domain in a first geometry to another domain in a second geometry.

3. The method of claim 2, further comprising: forming, for each of said first and second geometries, a system of partial differential equations each having associated coupling variables.

4. The method of claim 2, wherein at least one of said partial differential equation systems uses at least one local coupling.

5. The method of claim 2, wherein said first and second geometries are the same.

6. The method of claim 2, wherein said first and second geometries are different.

7. The method of claim 1, further comprising:

defining a non-local coupling wherein a value of a quantity on a boundary of a first domain is referenced on parallel lines extending into said first domain.

8. The method of claim 2, further comprising:

defining a non-local coupling in which a boundary condition associated with said first domain is defined using a value of an integral over a portion of one of: said first domain and said second domain.

9. The method of claim 1, further comprising:

defining a non-local coupling using at least one of: a mapped variable and an integrated variable.

10. The method of claim 4, further comprising:

defining a local coupling using at least one of: a basic variable, an auxiliary variable, and a glued variable.

11. The method of claim 1, further comprising:

defining a non-local coupling variable using at least one of: an extrusion variable, a projection variable, and a scalar coupling variable.

12. The method of claim 1, further comprising:

determining a stiffness matrix by determining at least one of a Jacobian of a variable and a value of a variable in accordance with a type of said variable wherein said combined system of partial differential equations is in weak form, said stiffness matrix being a Jacobian matrix of a residual vector with respect to a number of degrees of freedom, said Jacobian of a variable being represented as at least one contribution determined in accordance with a number of degrees of freedom; and determining said residual vector by determining at least one of a Jacobian of a variable and a value of a variable in accordance with a type of said variable wherein said combined system of partial differential equations is in weak form.

13. The method of claim 12, further comprising:
converting said combined system of partial differential equations from general form to weak form.

14. The method of claim 12, wherein said determining said stiffness matrix further comprises:
determining at least one of a Jacobian of a variable and a value of a variable in accordance with points included in a quadrature formula and with other points in accordance with coupling variables.

15. The method of claim 14, wherein said determining said residual vector further comprises:
determining at least one of a Jacobian of a variable and a value of a variable in accordance with points included in a quadrature formula and with other points in accordance with coupling variables.

16. The method of claim 1, further comprising:
determining a value of a variable in accordance with a type of said variable used in at least one of said partial differential equation systems.

17. The method of claim 16, wherein variables are recursively evaluated in accordance with variable type.

18. The method of claim 17, wherein said determining a value of a variable in accordance with a type is used in determining at least one of a: stiffness matrix, constraint matrix, residual vector and a constraint residual vector.

19. The method of claim 18, wherein said type is one of: a basic variable, an auxiliary variable, a glued variable, a mapped variable, and an integrated variable.

20. The method of claim 1, further comprising:
determining a Jacobian of a variable in accordance with a type of said variable used in at least one of said partial differential equations wherein said Jacobian of a variable is represented in accordance with a number of degrees of freedom.

21. The method of claim 20, wherein a Jacobian of a variable is recursively evaluated in accordance with variable type.

22. The method of claim 21, wherein said determining a Jacobian of a variable in accordance with a type is used in determining at least one of: a stiffness matrix, a residual vector, constraint residual vector, and a constraint matrix.

23. The method of claim 22, wherein said type is one of: a basic variable, an auxiliary variable, a glued variable, a mapped variable, and an integrated variable.

24. The method of claim 1, wherein said at least one non-local coupling includes a variable having a dependency on another variable at least one distant point.

25. The method of claim 24, wherein said other variable is in the same geometry as said variable.

26. The method of claim 24, wherein said other variable is in a different geometry from said variable.

27. The method of claim 4, wherein said local coupling includes a variable having a dependency only on values of other variables at the same point.

28. The method of claim 1, further comprising:
defining a non-local coupling used in at least one of a: subdomain, boundary, edge, and point that obtains a value at one of: a subdomain, boundary, edge, and point.

29. The method of claim 4, further comprising:
defining a local coupling using at least one of: an expression variable and a boundary coupled variable.

30. The method of claim 1, further comprising:
defining a non-local coupling wherein a value of an integral of a variable along parallel lines extending into a first domain is used on a boundary on said first domain.

31. The method of claim 1, further comprising:
defining a boundary condition on one boundary in terms of a value of a variable on another boundary wherein said value is mapped in accordance with a coordinate transformation.

32. The method of claim 1, further comprising:
defining a boundary condition in terms of a variable defined at a single point.

33. A computer readable medium having computer executable instructions stored thereon which when executed by at least one processor cause the processor to accomplish steps comprising:
representing each of a plurality of systems as an application mode modeling said physical quantities of each system, wherein said application modes are configured to model said physical quantities of at least one of a structural system, a fluids system, and an electromagnetic system;
determining, using said processor or another processor, a representation of a partial differential equation system for each application mode corresponding to one of said plurality of systems using at least one non-local coupling, said at least one non-local coupling determining a value in at least one portion of a domain depending on a value from at least one other portion of a domain; and
outputting a model by forming a combined system of partial differential equations using partial differential equation systems associated with said plurality of systems, wherein said output of said model is configured to be stored in a computer readable memory or in a computer readable data storage system.

34. The computer readable medium of claim 33, wherein said non-local variable defines a value from a first domain in a first geometry to another domain in a second geometry.

35. The computer-readable medium of claim 34, further comprising:
forming, for each of said first and second geometries, a system of partial differential equations each having associated coupling variables.

36. The computer readable medium of claim 34, wherein at least one of said partial differential equation systems uses at least one local coupling.

37. The computer readable medium of claim 34, wherein said first and second geometries are the same.

38. The computer readable medium of claim 34, wherein said first and second geometries are different.

39. The computer readable medium of claim 33, further comprising:
defining a non-local coupling wherein a value of a quantity on a boundary of a first domain is referenced on parallel lines extending into said first domain.

40. The computer readable medium of claim 34, further comprising:
defining a non-local coupling in which a boundary condition associated with said first domain is defined using a value of an integral over a portion of one of said first domain and said second domain.

41. The computer readable medium of claim 33, further comprising:
defining a non-local coupling using at least one of: a mapped variable and an integrated variable.

42. The computer readable medium of claim 36, further comprising:

defining a local coupling using at least one of: a basic variable, an auxiliary variable, and a glued variable.

43. The computer readable medium of claim 36, further comprising:
defining a non-local coupling variable using at least one of: an extrusion variable, a projection variable, and a scalar coupling variable.

44. The computer readable medium of claim 33, further comprising:
determining a stiffness matrix by determining at least one of a Jacobian of a variable and a value of a variable in accordance with a type of said variable wherein said combined system of partial differential equations is in weak foam, said stiffness matrix being a Jacobian matrix of a residual vector with respect to a number of degrees of freedom, said Jacobian of a variable being represented as at least one contribution determined in accordance with a number of degrees of freedom; and
determining said residual vector by determining at least one of a Jacobian of a variable and a value of a variable in accordance with a type of said variable wherein said combined system of partial differential equations is in weak form.

45. The computer readable medium of claim 44, further comprising:
converting said combined system of partial differential equations from general form to weak form.

46. The computer readable medium of claim 44, wherein said determining said stiffness matrix further comprises:
determining at least one of a Jacobian of a variable and a value of a variable in accordance with points included in a quadrature formula and with other points in accordance with coupling variables.

47. The computer readable medium of claim 34, wherein said determining said residual vector further comprises:
determining at least one of a Jacobian of a variable and a value of a variable in accordance with points included in a quadrature formula and with other points in accordance with coupling variables.

48. The computer readable medium of claim 33, further comprising:
determining a value of a variable in accordance with a type of said variable used in at least one of said partial differential equation systems.

49. The computer readable medium of claim 48, wherein variables are recursively evaluated in accordance with variable type.

50. The computer readable medium of claim 49, wherein said determining a value of a variable in accordance with a type is used determining at least one of a: stiffness matrix, constraint matrix, residual vector and a constraint residual vector.

51. The computer readable medium of claim 50, wherein said type is one of: a basic variable, an auxiliary variable, a glued variable, a mapped variable, and an integrated variable.

52. The computer readable medium of claim 33, further comprising:
determining a Jacobian of a variable in accordance with a type of said variable used in at least one of said partial differential equations wherein said Jacobian of a variable is represented in accordance with a number of degrees of freedom.

53. The computer readable medium of claim 52, wherein a Jacobian of a variable is recursively evaluated in accordance with variable type.

54. The computer readable medium of claim 52, wherein said determining a Jacobian of a variable in accordance with a type is used in determining at least one of: a stiffness matrix, a residual vector, constraint residual vector, and a constraint matrix.

55. The computer readable medium of claim 54, wherein said type is one of: a basic variable, an auxiliary variable, a glued variable, a mapped variable, and an integrated variable.

56. The computer readable medium of claim 40, wherein said at least one non-local coupling includes a variable having a dependency on another variable at least one distant point.

57. The computer readable medium of claim 56, wherein said another variable is in the same geometry as said variable.

58. The computer readable medium of claim 56, wherein said other variable is in a different geometry from said variable.

59. The computer readable medium of claim 42, wherein said local coupling includes a variable having a dependency only on values of other variables at the same point.

60. The computer readable medium of claim 40, further comprising:
defining a non-local coupling used in at least one of a: subdomain, boundary, edge, and point that obtains a value at one of: a subdomain, boundary, edge, and point.

61. The computer readable medium of claim 42, further comprising:
defining a local coupling using at least one of: an expression variable and a boundary coupled variable.

62. The computer readable medium of claim 34, further comprising:
defining a non-local coupling wherein a value of an integral of a variable along parallel lines extending into a first domain is used on a boundary on said first domain.

63. The computer readable medium of claim 40, further comprising:
defining a boundary condition on one boundary in terms of a value of a variable on another boundary wherein said value is mapped in accordance with a coordinate transformation.

64. The computer readable medium of claim 34, further comprising:
defining a boundary condition in terms of a variable defined at a single point.

65. The method of claim 1 wherein said representing of said plurality of systems as an application mode further includes modeling said physical quantities of said systems in a time dimension.

66. The method of claim 33 wherein said representing of said plurality of systems as an application mode further includes modeling said physical quantities of said systems in a time dimension.

67. A method executed in a computer apparatus for creating a model of a combined physical system having physical quantities by representing physical quantities of the combined physical system in terms of a combined set of partial differential equations, the method comprising:
representing at least one of a plurality of systems as two or more selected application modes modeling physical quantities of the at least one of the plurality of systems, wherein at least one of the two or more selected application modes is configured to model said physical quantities of at least one of a structural system, a fluids system, and an electromagnetic system;
determining a set of partial differential equations for each of the two or more selected application modes, parameters of the partial differential equations being physical quantities of corresponding ones of the plurality of systems;

forming the combined set of partial differential equations using the determined sets of partial differential equations associated with the at least one of the plurality of systems;

determining, using a processor or another processor, a solution to the model of the combined physical system based on the combined set of partial differential equations for the two or more selected application modes for the at least one of the plurality of systems, the model representing a mathematical expression of the physical quantities of the combined physical system; and storing in a computer readable memory or in a computer readable data storage system the solution to the model.

68. The method of claim 67 wherein said representing of said at least one of said plurality of systems as two or more selected application modes further includes modeling said physical quantities of said at least one of said plurality of systems in a time dimension.

69. A computer readable medium having stored thereon instructions for creating a model of a combined physical system having physical quantities by representing physical quantities of the combined physical system in terms of a combined set of partial differential equations comprising machine executable code which when executed by at least one processor, causes the processor to perform steps comprising:

representing at least one of a plurality of systems as two or more selected application modes modeling physical quantities of said at least one of said plurality of systems, wherein said application modes are configured to model physical quantities of at least one of a structural system, a fluids system, and an electromagnetic system;

determining a set of partial differential equations for each of said two or more selected application modes, parameters of said partial differential equations being physical quantities of corresponding ones of said plurality of systems;

forming said combined set of partial differential equations using sets of partial differential equations associated with said at least one of said plurality of systems;

determining, using said at least one processor or another processor, a solution to said model of said combined physical system based on said combined set of partial differential equations for said two or more selected application modes for said at least one of said plurality of systems, said model representing a mathematical expression of said physical quantities of said combined physical system; and outputting said solution to said model in a format configurable for display on a graphical user interface.

70. A method executed in a computer system for creating a model of a combined physical system having physical quantities by representing physical quantities of the combined physical system in terms of solving a set of partial differential equations comprising:

defining a plurality of user-defined application modes modeling physical quantities of an associated model having up to three space dimensions, wherein the application modes are configured to model the physical quantities of at least one of a structural system, a fluids system, and an electromagnetic system;

selecting two or more of the user-defined application modes;

determining, using a processor, sets of partial differential equations for the selected two or more user-defined application modes of the associated model, parameters of the partial differential equations being physical quantities of an associated model;

determining, using the processor or another processor, a solution to the model based on a combination of the determined sets of partial differential equations for the two or more selected user-defined application modes for the associated model, the model representing physical quantities of the combined physical system;

storing in a computer readable memory or in a computer readable data storage system the solution to the model; and outputting the solution to the model in a format configurable for display on a graphical user interface.

71. The method of claim 70 wherein the application modes are further configured to model the physical quantities in a time dimension.

72. A computer readable medium having stored thereon instructions for creating a model of a combined physical system having physical quantities by representing physical quantities of the combined physical system in terms of solving a system of partial differential equations comprising machine executable code which when executed by at least one processor, causes the processor to perform steps comprising:

defining a plurality of user-defined application modes modeling physical quantities of an associated model, wherein the application modes are configured to model the physical quantities of at least one of a structural system, a fluids system, and an electromagnetic system;

selecting two or more of the user-defined application modes;

determining sets of partial differential equations for said selected two or more user-defined application modes of said associated model, parameters of the partial differential equations being physical quantities of corresponding systems; and determining, using said at least one processor or another processor, a solution to the model based on a combination of the determined sets of partial differential equations for the two or more selected user-defined application modes for the associated model, the model representing a mathematical expression of the physical quantities of the combined physical system.

\* \* \* \* \*

UNITED STATES PATENT AND TRADEMARK OFFICE
CERTIFICATE OF CORRECTION

PATENT NO. : 7,596,474 B2  Page 1 of 1
APPLICATION NO. : 10/042936
DATED : September 29, 2009
INVENTOR(S) : Langemyr et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 801 days.

Signed and Sealed this

Twenty-eighth Day of September, 2010

David J. Kappos
*Director of the United States Patent and Trademark Office*

(12) EX PARTE REEXAMINATION CERTIFICATE (8847th)
United States Patent
Langemyr et al.

(10) Number: US 7,596,474 C1
(45) Certificate Issued: Feb. 7, 2012

(54) METHOD FOR ASSEMBLING THE FINITE ELEMENT DISCRETIZATION OF ARBITRARY WEAK EQUATIONS INVOLVING LOCAL OR NON-LOCAL MULTIPHYSICS COUPLINGS

(75) Inventors: Lars Langemyr, Stockholm (SE); Daniel Bertilsson, Sollentuna (SE); Arne Nordmark, Stockholm (SE); Per-Olof Persson, Cambridge, MA (US); Jerome Long, Middx (GB)

(73) Assignee: Comsol AB, Stockholm (SE)

Reexamination Request:
No. 90/009,728, Jun. 1, 2010

Reexamination Certificate for:
Patent No.: 7,596,474
Issued: Sep. 29, 2009
Appl. No.: 10/042,936
Filed: Jan. 9, 2002

Certificate of Correction issued Sep. 28, 2010.

Related U.S. Application Data

(63) Continuation-in-part of application No. 09/995,222, filed on Nov. 27, 2001, now Pat. No. 7,519,518, and a continuation-in-part of application No. 09/675,778, filed on Sep. 29, 2000, now Pat. No. 7,623,991.

(60) Provisional application No. 60/253,154, filed on Nov. 27, 2000, and provisional application No. 60/222,394, filed on Aug. 2, 2000.

(51) Int. Cl.
*G06F 7/60* (2006.01)
*G06F 17/13* (2006.01)
*G06G 7/48* (2006.01)
*G06G 7/50* (2006.01)

(52) U.S. Cl. .................. 703/2; 703/6; 703/7; 703/9
(58) Field of Classification Search .................. None
See application file for complete search history.

(56) References Cited

To view the complete listing of prior art documents cited during the proceeding for Reexamination Control Number 90/009,728, please refer to the USPTO's public Patent Application Information Retrieval (PAIR) system under the Display References tab.

*Primary Examiner* — Matthew Heneghan

(57) ABSTRACT

Disclosed are techniques for representing and modeling one or more systems in which each system corresponds to an application mode. This may be done for one or more geometries using local and/or non-local couplings. For each application mode, physical quantities are modeled and may be defined using a graphical user interface. Physical properties may be used to model the physical quantities of each system. The physical properties may be defined in terms of numerical values or constants, and mathematical expressions that may include numerical values, space coordinates, time coordinates, and actual physical quantities. Physical quantities and any associated variables may apply to some or all of a geometric domain, and may also be disabled in other parts of a geometrical domain. Partial differential equations describe the physical quantities. One or more application modes may be combined using an automated technique into a combined system of partial differential equations as a multiphysics model. A portion of the physical quantities and variables associated with the combined system may be selectively solved for. Also described are methods for computing the stiffness matrix, residual vector, constraint matrix, and constraint residual vector for the finite element discretization of a system of partial differential equations in weak form that includes local and non-local variables coupling multiple geometries.

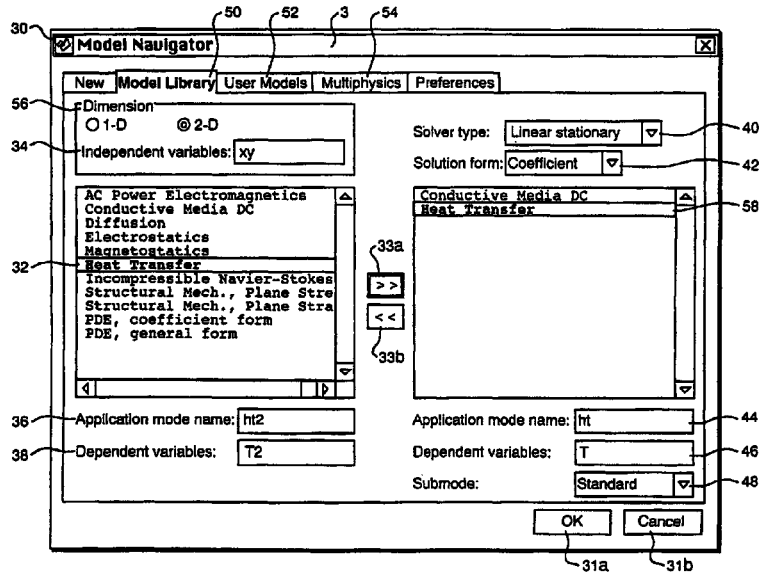

US 7,596,474 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 33, 39, 41, 48-55 and 67-72 is confirmed.

Claims 1-6, 8-13, 16, 24-26, 28, 29, 31, 32, 47, 65 and 66 are cancelled.

Claims 7, 14, 17, 20, 27, 30, 34 and 44 are determined to be patentable as amended.

Claims 15, 18, 19, 21-23, 35-38, 40, 42, 43, 45, 46 and 56-64, dependent on an amended claim, are determined to be patentable.

New claims 73-203 are added and determined to be patentable.

7. [The method of claim 1, further] *A method executed in a computer system for producing a model of a combined physical system having physical quantities by representing physical quantities of the combined system in terms of partial differential equations, said method comprising:*

*representing each of a plurality of systems as an application mode modeling in up to three space dimensions said physical quantities of each system, wherein said application modes are configured to model said physical quantities of at least one of a structural system, a fluids system, and an electromagnetic system;*

*determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;* defining [a] *said at least one* non-local coupling wherein a value of a quantity on a boundary of a first domain is referenced on parallel lines extending into said first domain;

*determining, using said processor or another processor, a solution to said model of said combined physical system using said partial differential equations corresponding to said plurality of systems, said model representing a mathematical expression of said physical quantities of said combined physical system; and*

*storing in a computer readable memory or in a computer readable data storage system said solution to said model.*

14. [The method of claim 12,] *A method executed in a computer system for producing a model of a combined physical system having physical quantities by representing physical quantities of the combined system in terms of partial differential equations, said method comprising:*

*representing each of a plurality of systems as an application mode modeling in up to three space dimensions said physical quantities of each system, wherein said application modes are configured to model said physical quantities of at least one of a structural system, a fluids system, and an electromagnetic system;*

*determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;*

*determining a stiffness matrix by determining at least one of a Jacobian of a variable and a value of a variable in accordance with a type of said variable wherein said combined system of partial differential equations is in weak form, said stiffness matrix being a Jacobian matrix of a residual vector with respect to a number of degrees of freedom, said Jacobian of a variable being represented as at least one contribution determined in accordance with a number of degrees of freedom;*

*determining said residual vector by determining at least one of a Jacobian of a variable and a value of a variable in accordance with a type of said variable wherein said combined system of partial differential equations is in weak form;*

*determining, using said processor or another processor, a solution to said model of said combined physical system using said partial differential equations corresponding to said plurality of systems, said model representing a mathematical expression of said physical quantities of said combined physical system; and*

*storing in a computer readable memory or in a computer readable data storage system said solution to said model,* wherein said determining said stiffness matrix further comprises: determining at least one of a Jacobian of a variable and a value of a variable in accordance with points included in a quadrature formula and with other points in accordance with coupling variables.

17. [The method of claim 16,] *A method executed in a computer system for producing a model of a combined physical system having physical quantities by representing physical quantities of the combined system in terms of partial differential equations, said method comprising:*

*representing each of a plurality of systems as an application mode modeling in up to three space dimensions said physical quantities of each system, wherein said application modes are configured to model said physical quantities of at least one of a structural system, a fluids system, and an electromagnetic system;*

*determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;* determining a value of a variable in accordance with a type of said variable used in at least one of said partial differential equation systems, wherein variables are recursively evaluated in accordance with variable type;

determining, using said processor or another processor, a solution to said model of said combined physical system using said partial differential equations corresponding to said plurality of systems, said model representing a mathematical expression of said physical quantities of said combined physical system; and storing in a computer readable memory or in a computer readable data storage system said solution to said model.

20. [The method of claim 1, further] *A method executed in a computer system for producing a model of a combined physical system having physical quantities by representing physical quantities of the combined system in terms of partial differential equations, said method* comprising:

*representing each of a plurality of systems as an application mode modeling in up to three space dimensions said physical quantities of each system, wherein said application modes are configured to model said physical quantities of at least one of a structural system, a fluids system, and an electromagnetic system;*

*determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;* determining a Jacobian of a variable in accordance with a type of said variable used in at least one of said partial differential equations wherein said Jacobian of a variable is represented in accordance with a number of degrees of freedom;

*determining, using said processor or another processor, a solution to said model of said combined physical system using said partial differential equations corresponding to said plurality of systems, said model representing a mathematical expression of said physical quantities of said combined physical system; and*

*storing in a computer readable memory or in a computer readable data storage system said solution to said model.*

27. [The method of claim 4, wherein said local coupling] *A method executed in a computer system for producing a model of a combined physical system having physical quantities by representing physical quantities of the combined system in terms of partial differential equations, said method comprising:*

*representing each of a plurality of systems as an application mode modeling in up to three space dimensions said physical quantities of each system, wherein said application modes are configured to model said physical quantities of at least one of a structural system, a fluids system, and an electromagnetic system;*

*determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;*

*determining, using said processor or another processor, a solution to said model of said combined physical system using said partial differential equations corresponding to said plurality of systems, said model representing a mathematical expression of said physical quantities of said combined physical system; and*

*storing in a computer readable memory or in a computer readable data storage system said solution to said model,* wherein said non-local coupling defines a value from a first domain in a first geometry to another domain in a second geometry, and wherein at least one of said partial differential equation systems uses at least one local coupling that includes a variable having a dependency only on values of other variables at the same point.

30. [The method of claim 1, further] *A method executed in a computer system for producing a model of a combined physical system having physical quantities by representing physical quantities of the combined system in terms of partial differential equations, said method comprising:*

*representing each of a plurality of systems as an application mode modeling in up to three space dimensions said physical quantities of each system, wherein said application modes are configured to model said physical quantities of at least one of a structural system, a fluids system, and an electromagnetic system;*

*determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;* defining [a] *said at least one* non-local coupling wherein a value of an integral of a variable along parallel lines extending into a first domain is used on a boundary on said first domain;

*determining, using said processor or another processor, a solution to said model of said combined physical system using said partial differential equations corresponding to said plurality of systems, said model representing a mathematical expression of said physical quantities of said combined physical system; and*

*storing in a computer readable memory or in a computer readable data storage system said solution to said model.*

34. The computer readable medium of claim 33, wherein said non-local [variable] *coupling* defines a value from a first domain in a first geometry to another domain in a second geometry.

44. The computer readable medium of claim 33, further comprising:

determining a stiffness matrix by determining at least one of a Jacobian of a variable and a value of a variable in accordance with a type of said variable wherein said combined system of partial differential equations is in weak [foam] *form*, said stiffness matrix being a Jacobian matrix of a residual vector with respect to a number of degrees of freedom, said Jacobian of a variable being represented as at least one contribution determined in accordance with a number of degrees of freedom; and determining said residual vector by determining at least one of a Jacobian of a variable and a value of a variable in accordance with a type of said variable wherein said combined system of partial differential equations is in weak form.

73. The computer readable medium of claim 33, wherein said representing of said plurality of systems as an application mode further includes modeling said physical quantities of said systems in a time dimension.

74. The computer readable medium of claim 44, wherein said determining said residual vector further comprises:
   determining at least one of a Jacobian of a variable and a value of a variable in accordance with points included in a quadrature formula and with other points in accordance with coupling variables.

75. A method executed in a computer system for producing a model of a combined physical system having physical quantities by representing physical quantities of the combined system in terms of partial differential equations, said method comprising:
   representing each of a plurality of systems as an application mode modeling in up to three space dimensions said physical quantities of each system, wherein said application modes are configured to model said physical quantities of at least one of a structural system, a fluids system, and an electromagnetic system;
   receiving an input of one or more physical properties for at least one of said application modes, wherein at least one of said one or more physical properties is specified in terms of at least one of said physical quantities;
   determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;
   determining, using said processor or another processor, a solution to said model of said combined physical system using said partial differential equations corresponding to said plurality of systems, said model representing a mathematical expression of said physical quantities of said combined physical system; and
   storing in a computer readable memory or in a computer readable data storage system said solution to said model.

76. The method of claim 75, wherein at least one of said one or more physical properties is defined as a mathematical expression in terms of at least one of said physical quantities, and at least one of said physical quantities is expressed in terms of a dependent variable associated with at least one of said application modes.

77. The method of claim 76, further comprising receiving an input of one or more non-local couplings for at least one of said application modes.

78. The method of claim 76, further comprising receiving an input of non-local couplings defined as mathematical expressions in terms of an independent variable associated with at least one of said application modes.

79. The method of claim 76, further comprising receiving an input of non-local couplings defined as mathematical expressions in terms of a dependent variable associated with at least one of said application modes.

80. The method of claim 75, further comprising receiving an input of one or more non-local couplings for at least one of said application modes.

81. The method of claim 75, further comprising receiving an input of non-local couplings defined as mathematical expressions in terms of an independent variable associated with at least one of said application modes.

82. The method of claim 75, further comprising receiving an input of non-local couplings defined as mathematical expressions in terms of a dependent variable associated with at least one of said application modes.

83. The method of claim 75, wherein said non-local coupling defines a value from a first domain in a first geometry to another domain in a second geometry.

84. The method of claim 83, further comprising forming, for each of said first and second geometries, a system of partial differential equations each having associated coupling variables.

85. The method of claim 83, wherein at least one of said partial differential equations corresponding to said plurality of systems uses at least one local coupling.

86. The method of claim 85, further comprising:
   defining a local coupling using at least one of: a basic variable, an auxiliary variable, and a glued variable.

87. The method of claim 85, wherein said local coupling includes a variable having a dependency only on values of other variables at the same point.

88. The method of claim 85, further comprising:
   defining a local coupling using at least one of an expression variable and a boundary coupled variable.

89. The method of claim 83, wherein said first and second geometries are the same.

90. The method of claim 83, wherein said first and second geometries are different.

91. The method of claim 83, further comprising:
   defining a non-local coupling in which a boundary condition associated with said first domain is defined using a value of an integral over a portion of one of said first domain and said second domain.

92. The method of claim 75, further comprising:
   defining a non-local coupling wherein a value of a quantity on a boundary of a first domain is referenced on parallel lines extending into said first domain.

93. The method of claim 75, further comprising:
   defining said at least one non-local coupling using at least one of a mapped variable and an integrated variable.

94. The method of claim 75, further comprising:
   defining a non-local coupling variable using at least one of: an extrusion variable, a projection variable, and a scalar coupling variable.

95. The method of claim 75, further comprising:
   determining a stiffness matrix by determining at least one of a Jacobian of a variable and a value of a variable in accordance with a type of said variable wherein said combined system of partial differential equations is in weak form, said stiffness matrix being a Jacobian matrix of a residual vector with respect to a number of degrees of freedom, said Jacobian of a variable being represented as at least one contribution determined in accordance with a number of degrees of freedom; and
   determining said residual vector by determining at least one of a Jacobian of a variable and a value of a variable in accordance with a type of said variable wherein said combined system of partial differential equations is in weak form.

96. The method of claim 95, further comprising:
   converting said combined system of partial differential equations from general form to weak form.

97. The method of claim 95, wherein said determining said stiffness matrix further comprises:

determining at least one of a Jacobian of a variable and a value of a variable in accordance with points included in a quadrature formula and with other points in accordance with coupling variables.

98. The method of claim 97, wherein said determining said residual vector further comprises:
determining at least one of a Jacobian of a variable and a value of a variable in accordance with points included in a quadrature formula and with other points in accordance with coupling variables.

99. The method of claim 75, further comprising:
determining a value of a variable in accordance with a type of said variable used in at least one of said partial differential equations corresponding to said plurality of systems.

100. The method of claim 99, wherein variables are recursively evaluated in accordance with variable type.

101. The method of claim 100, wherein said determining a value of a variable in accordance with a type is used in determining at least one of a: stiffness matrix, constraint matrix, residual vector, and a constraint residual vector.

102. The method of claim 101, wherein said type is one of: a basic variable, an auxiliary variable, a glued variable, a mapped variable, and an integrated variable.

103. The method of claim 75, further comprising:
determining a Jacobian of a variable in accordance with a type of said variable used in at least one of said partial differential equations wherein said Jacobian of a variable is represented in accordance with a number of degrees of freedom.

104. The method of claim 103, wherein a Jacobian of a variable is recursively evaluated in accordance with variable type.

105. The method of claim 104, wherein said determining a Jacobian of a variable in accordance with a type is used in determining at least one of: a stiffness matrix, a residual vector, constraint residual vector, and a constraint matrix.

106. The method of claim 105, wherein said type is one of: a basic variable, an auxiliary variable, a glued variable, a mapped variable, and an integrated variable.

107. The method of claim 75, wherein said at least one non-local coupling includes a variable having a dependency on another variable at at least one distant point.

108. The method of claim 107, wherein said other variable is in the same geometry as said variable.

109. The method of claim 107, wherein said other variable is in a different geometry from said variable.

110. The method of claim 75, further comprising:
defining said at least one non-local coupling used in at least one of a: subdomain, boundary, edge, and point that obtains a value at one of: a subdomain, boundary, edge, and point.

111. The method of claim 75, further comprising:
defining said at least one non-local coupling wherein a value of an integral of a variable along parallel lines extending into a first domain is used on a boundary on said first domain.

112. The method of claim 75, further comprising:
defining a boundary condition on one boundary in terms of a value of a variable on another boundary wherein said value is mapped in accordance with a coordinate transformation.

113. The method of claim 75, further comprising:
defining a boundary condition in terms of a variable defined at a single point.

114. The method of claim 75 wherein said representing of said plurality of systems as an application mode further includes modeling said physical quantities of said systems in a time dimension.

115. A computer readable medium having computer executable instructions stored thereon which when executed by at least one processor cause the processor to accomplish steps comprising:
representing each of a plurality of systems as an application mode modeling said physical quantities of each system, wherein said application modes are configured to model said physical quantities of at least one of a structural system, a fluids system, and an electromagnetic system;
receiving an input of one or more physical properties for at least one of said application modes, wherein at least one of said one or more physical properties are specified in terms of at least one of said physical quantities;
determining, using said processor or another processor, a representation of a partial differential equation system for each application mode corresponding to one of said plurality of systems using at least one non-local coupling, said at least one non-local coupling determining a value in at least one portion of a domain depending on a value from at least one other portion of a domain; and
outputting a model by forming a combined system of partial differential equations using partial differential equation systems associated with said plurality of systems, wherein said output of said model is configured to be stored in a computer readable memory or in a computer readable data storage system.

116. The computer readable medium of claim 115, wherein at least one of said one or more physical properties is defined as a mathematical expression in terms of at least one of said physical quantities, and at least one of said physical quantities is expressed in terms of a dependent variable associated with at least one of said application modes.

117. The computer readable medium of claim 116, the steps further comprising receiving an input of one or more non-local couplings for at least one of said application modes.

118. The computer readable medium of claim 116, the steps further comprising receiving an input of non-local couplings defined as mathematical expressions in terms of an independent variable associated with at least one of said application modes.

119. The computer readable medium of claim 116, the steps further comprising receiving an input of non-local couplings defined as mathematical expressions in terms of a dependent variable associated with at least one of said application modes.

120. The computer readable medium of claim 115, the steps further comprising receiving an input of one or more non-local couplings for at least one of said application modes.

121. The computer readable medium of claim 115, the steps further comprising receiving an input of non-local couplings defined as mathematical expressions in terms of an independent variable associated with at least one of said application modes.

122. The computer readable medium of claim 115, the steps further comprising receiving an input of non-local couplings defined as mathematical expressions in terms of a dependent variable associated with at least one of said application modes.

123. The computer readable medium of claim 115, wherein said non-local coupling defines a value from a first domain in a first geometry to another domain in a second geometry.

124. The computer-readable medium of claim 123, further comprising:
forming, for each of said first and second geometries, a system of partial differential equations each having associated coupling variables.

125. The computer readable medium of claim 123, wherein at least one of said partial differential equation systems uses at least one local coupling.

126. The computer readable medium of claim 125, further comprising:
defining a local coupling using at least one of: a basic variable, an auxiliary variable, and a glued variable.

127. The computer readable medium of claim 126, wherein said local coupling includes a variable having a dependency only on values of other variables at the same point.

128. The computer readable medium of claim 126, further comprising:
defining a local coupling using at least one of: an expression variable and a boundary coupled variable.

129. The computer readable medium of claim 125, further comprising:
defining a non-local coupling variable using at least one of: an extrusion variable, a projection variable, and a scalar coupling variable.

130. The computer readable medium of claim 123, wherein said first and second geometries are the same.

131. The computer readable medium of claim 123, wherein said first and second geometries are different.

132. The computer readable medium of claim 123, further comprising:
defining said non-local coupling in which a boundary condition associated with said first domain is defined using a value of an integral over a portion of one of said first domain and said second domain.

133. The computer readable medium of claim 132, wherein said at least one non-local coupling includes a variable having a dependency on another variable at at least one distant point.

134. The computer readable medium of claim 133, wherein said another variable is in the same geometry as said variable.

135. The computer readable medium of claim 133, wherein said other variable is in a different geometry from said variable.

136. The computer readable medium of claim 132, further comprising:
defining a non-local coupling used in at least one of a: subdomain, boundary, edge, and point that obtains a value at one of: a subdomain, boundary, edge, and point.

137. The computer readable medium of claim 132, further comprising:
defining a boundary condition on one boundary in terms of a value of a variable on another boundary wherein said value is mapped in accordance with a coordinate transformation.

138. The computer readable medium of claim 123, further comprising:
defining said non-local coupling wherein a value of an integral of a variable along parallel lines extending into a first domain is used on a boundary on said first domain.

139. The computer readable medium of claim 123, further comprising:
defining a boundary condition in terms of a variable defined at a single point.

140. The computer readable medium of claim 115, further comprising:
defining said non-local coupling wherein a value of a quantity on a boundary of a first domain is referenced on parallel lines extending into said first domain.

141. The computer readable medium of claim 115, further comprising:
defining said non-local coupling using at least one of a mapped variable and an integrated variable.

142. The computer readable medium of claim 115, further comprising:
determining a stiffness matrix by determining at least one of a Jacobian of a variable and a value of a variable in accordance with a type of said variable wherein said combined system of partial differential equations is in weak form, said stiffness matrix being a Jacobian matrix of a residual vector with respect to a number of degrees of freedom, said Jacobian of a variable being represented as at least one contribution determined in accordance with a number of degrees of freedom; and
determining said residual vector by determining at least one of a Jacobian of a variable and a value of a variable in accordance with a type of said variable wherein said combined system of partial difference equations is in weak form.

143. The computer readable medium of claim 142, further comprising:
converting said combined system of partial differential equations from general form to weak form.

144. The computer readable medium of claim 142, wherein said determining said stiffness matrix further comprises:
determining at least one of a Jacobian of a variable and a value of a variable in accordance with points included in a quadrature formula and with other points in accordance with coupling variables.

145. The computer readable medium of claim 142, wherein said determining said residual vector further comprises:
determining at least one of a Jacobian of a variable and a value of a variable in accordance with points included in a quadrature formula and with other points in accordance with coupling variables.

146. The computer readable medium of claim 115, further comprising:
determining a value of a variable in accordance with a type of said variable used in at least one of said partial differential equation systems.

147. The computer readable medium of claim 146, wherein variables are recursively evaluated in accordance with variable type.

148. The computer readable medium of claim 147, wherein said determining a value of a variable in accordance with a type is used determining at least one of a stiffness matrix, constraint matrix, residual vector, and a constraint residual vector.

149. The computer readable medium of claim 148, wherein said type is one of: a basic variable, an auxiliary variable, a glued variable, a mapped variable, and an integrated variable.

150. The computer readable medium of claim 115, further comprising:
determining a Jacobian of a variable in accordance with a type of said variable used in at least one of said partial differential equations wherein said Jacobian of a variable is represented in accordance with a number of degrees of freedom.

151. The computer readable medium of claim 150, wherein a Jacobian of a variable is recursively evaluated in accordance with variable type.

152. The computer readable medium of claim 150, wherein said determining a Jacobian of a variable in accordance with a type is used in determining at least one of: a stiffness matrix, a residual vector, constraint residual vector, and a constraint matrix.

153. The computer readable medium of claim 152, wherein said type is one of: a basic variable, an auxiliary variable, a glued variable, a mapped variable, and an integrated variable.

154. The computer readable medium of claim 115 wherein said representing of said plurality of systems as an application mode further includes modeling said physical quantities of said systems in a time dimension.

155. A method executed in a computer apparatus for creating a model of a combined physical system having physical quantities by representing physical quantites of the combined physical system in terms of a combined set of partial differential equations, the method comprising:

representing at least one of a plurality of systems as two or more selected application modes modeling physical quantities of the at least one of the plurality of systems, wherein at least one of the two or more selected application modes is configured to model the physical quantities of at least one of a structural system, a fluids system, and an electromagnetic system;

receiving an input of one or more physical properties for at least one of the selected application modes, wherein at least one of the one or more physical properties is specified in terms of at least one of the physical quantities;

determining a set of partial differential equations for each of the two or more selected application modes, parameters of the partial differential equations being physical quantities of corresponding ones of the plurality of systems;

forming the combined set of partial differential equations using the determined sets of partial differential equations associated with the at least one of the plurality of systems;

determining, using a processor or another processor, a solution to the model of the combined physical system based on the combined set of partial differential equations for the two or more selected application modes for the at least one of the plurality of systems, the model representing a mathematical expression of the physical quantities of the combined physical system; and storing in a computer readable memory or in a computer readable data storage system the solution to the model.

156. The method of claim 155, wherein at least one of the one or more physical properties is defined as a mathematical expression in terms of at least one of the physical quantities, and at least one of the physical quantities is expressed in terms of a dependent variable associated with at least one of the application modes.

157. The method of claim 156, further comprising receiving an input of one or more non-local couplings for at least one of the application modes.

158. The method of claim 156, further comprising receiving an input of non-local couplings defined as mathematical expressions in terms of an independent variable associated with at least one of the application modes.

159. The method of claim 156, further comprising receiving an input of non-local couplings defined as mathematical expressions in terms of a dependent variable associated with at least one of the application modes.

160. The method of claim 155, further comprising receiving an input of one or more non-local couplings for at least one of the selected application modes.

161. The method of claim 155, further comprising receiving an input of non-local couplings defined as mathematical expressions in terms of an independent variable associated with at least one of the selected application modes.

162. The method of claim 155, further comprising receiving an input of non-local couplings defined as mathematical expressions in terms of a dependent variable associated with at least one of the selected application modes.

163. The method of claim 155, wherein the representing of the at least one of the plurality of systems as two or more selected application modes further includes modeling the physical quantities of the at least one of the plurality of systems in a time dimension.

164. A computer readable medium having stored thereon instructions for creating a model of a combined physical system having physical quantities by representing physical quantities of the combined physical system in terms of a combined set of partial differential equations comprising machine executable code which when executed by at least one processor, causes the processor to perform steps comprising:

representing at least one of a plurality of systems as two or more selected application modes modeling physical quantities of said at least one of said plurality of systems, wherein said application modes are configured to model physical quantities of at least one of a structural system, a fluids system, and an electromagnetic system;

receiving an input of one or more physical properties for at least one of the selected application modes, wherein at least one of said one or more physical properties is specified in terms of at least one of said physical quantities;

determining a set of partial differential equations for each of said two or more selected application modes, parameters of said partial differential equations being physical quantities of corresponding ones of said plurality of systems;

forming said combined set of partial differential equations using sets of partial differential equations associated with said at least one of said plurality of systems;

determining, using said at least one processor or another processor, a solution to said model of said combined physical system based on said combined set of partial differential equations for said two or more selected application modes for said at least one of said plurality of systems, said model representing a mathematical expression of said physical quantities of said combined physical system; and outputting said solution to said model in a format configurable for display on a graphical user interface.

165. The computer readable medium of claim 164, wherein at least one of said one or more physical properties is defined as a mathematical expression in terms of at least one of said physical quantities, and at least one of said physical quantities is expressed in terms of a dependent variable associated with at least one of said application modes.

166. The computer readable medium of claim 165, the steps further comprising receiving an input of one or more non-local couplings for at least one of said application modes.

167. The computer readable medium of claim 165, the steps further comprising receiving an input of non-local couplings defined as mathematical expressions in terms of an independent variable associated with at least one of said application modes.

168. The computer readable medium of claim 165, the steps further comprising receiving an input of non-local couplings defined as mathematical expressions in terms of a dependent variable associated with at least one of said application modes.

169. The computer readable medium of claim 164, the steps further comprising receiving an input of one or more non-local couplings for at least one of said application modes.

170. The computer readable medium of claim 164, the steps further comprising receiving an input of non-local couplings defined as mathematical expressions in terms of an independent variable associated with at least one of said application modes.

171. The computer readable medium of claim 164, the steps further comprising receiving an input of non-local couplings defined as mathematical expressions in terms of a dependent variable associated with at least one of said application modes.

172. A method executed in a computer system for creating a model of a combined physical system having physical quantities by representing physical quantites of the combined physical system in terms of solving a set of partial differential equations comprising:

defining a plurality of user-defined application modes modeling physical quantites of an associated model having up to three space dimensions, wherein the application modes are configured to model the physical quantities of at least one of a structural system, a fluids system, and an electromagnetic system;

selecting two or more of the user-defined application modes;

receiving an input of one or more physical properties for at least one of the selected user-defined application modes, wherein at least one of the one or more physical properties is specified in terms of at least one of the physical quantities;

determining, using a processor, sets of partial differential equations for the selected two or more user-defined application modes of the associated model, parameters of the partial differential equations being physical quantities of an associated model;

determining, using the processor or another processor, a solution to the model based on a combination of the determined sets of partial differential equations for the two or more selected user-defined application modes for the associated model, the model representing physical quantities of the combined physical system;

storing in a computer readable memory or in a computer readable data storage system the solution to the model; and outputting the solution to the model in a format configurable for display on a graphical user interface.

173. The method of claim 172, wherein at least one of the one or more physical properties is defined as a mathematical expression in terms of at least one of the physical quantities, and at least one of the physical quantities is expressed in terms of a dependent variable associated with at least one of the application modes.

174. The method of claim 173, further comprising receiving an input of one or more non-local couplings for at least one of the application modes.

175. The method of claim 173, further comprising receiving an input of non-local couplings defined as mathematical expressions in terms of an independent variable associated with at least one of the application modes.

176. The method of claim 173, further comprising receiving an input of non-local couplings defined as mathematical expressions in terms of a dependent variable associated with at least one of the application modes.

177. The method of claim 172, further comprising receiving an input of one or more non-local couplings for at least one of the selected application modes.

178. The method of claim 172, further comprising receiving an input of non-local couplings defined as mathematical expressions in terms of an independent variable associated with at least one of the selected application modes.

179. The method of claim 172, further comprising receiving an input of non-local couplings defined as mathematical expressions in terms of a dependent variable associated with at least one of the selected application modes.

180. A computer readable medium having stored thereon instructions for creating a model of a combined physical system having physical quantities by representing physical quantities of the combined physical system in terms of solving a system of partial differential equations comprising machine executable code which when executed by at least one processor, causes the processor to perform steps comprising:

defining a plurality of user-defined application modes modeling physical quantities of an associated model, wherein the application modes are configured to model the physical quantities of at least one of a structural system, a fluids system, and an electromagnetic system;

selecting two or more of the user-defined application modes;

receiving an input of one or more physical properties for at least one of the selected user-defined application modes, wherein at least one of the one or more physical properties is specified in terms of at least one of the physical quantities;

determining sets of partial differential equations for said selected two or more user-defined application modes of said associated model, parameters of the partial differential equations being physical quantities of corresponding systems; and determining, using said at least one processor or another processor, a solution to the model based on a combination of the determined sets of partial differential equations for the two or more selected user-defined application modes for the associated model, the model representing a mathematical expression of the physical quantities of the combined physical system.

181. The computer readable medium of claim 180, wherein at least one of the one or more physical properties is defined as a mathematical expression in terms of at least one of the physical quantities, and at least one of the physical quantities is expressed in terms of a dependent variable associated with at least one of the application modes.

182. The computer readable medium of claim 181, the steps further comprising receiving an input of one or more non-local couplings for at least one of the application modes.

183. The computer readable medium of claim 181, the steps further comprising receiving an input of non-local couplings defined as mathematical expressions in terms of an independent variable associated with at least one of the application modes.

184. The computer readable medium of claim 181, the steps further comprising receiving an input of non-local couplings defined as mathematical expressions in terms of a dependent variable associated with at least one of the application modes.

185. The computer readable medium of claim 180, the steps further comprising receiving an input of one or more non-local couplings for at least one of the application modes.

186. The computer readable medium of claim 180, the steps further comprising receiving an input of non-local couplings defined as mathematical expressions in terms of an independent variable associated with at least one of the application modes.

187. The computer readable medium of claim 180, the steps further comprising receiving an input of non-local couplings defined as mathematical expressions in terms of a dependent variable associated with at least one of the application modes.

188. A method executed in a computer system for producing a model of a combined physical system having physical quantities by representing physical quantities of the combined system in terms of partial differential equations, said method comprising:
 representing each of a plurality of systems as an application mode modeling in up to three space dimensions said physical quantities of each system, wherein said application modes are configured to model said physical quantities of at least one of a structural system, a fluids system, and an electromagnetic system;
 determining, using a processor, a representation of a partial differential equation for each application mode corresponding to one of said plurality of systems using at least one non-local coupling, said at least one non-local coupling determining a value in at least one portion of a domain depending on a value from at least one other portion of a domain, parameters of said partial differential equations being physical quantities of corresponding ones of said plurality of systems;
 determining, using said processor or another processor, a solution to said model of said combined physical system using said partial differential equations corresponding to said plurality of systems, said model representing a mathematical expression of said physical quantities of said combined physical system; and
 storing in a computer readable memory or in a computer readable data storage system said solution to said model,
 wherein one or more of said application modes includes an interface for receiving inputs of one or more physical properties, at least one of said one or more physical properties being associated with at least a portion of said physical quantities.

189. The method of claim 188, wherein at least one of said one or more physical properties is defined as a mathematical expression in terms of at least one of said physical quantities, and at least one of said physical quantities is expressed in terms of a dependent variable associated with at least one of said application modes.

190. The method of claim 189, further comprising receiving an input of one or more non-local couplings for at least one of said application modes.

191. The method of claim 189, further comprising receiving an input of non-local couplings defined as mathematical expressions in terms of an independent variable associated with at least one of said application modes.

192. The method of claim 189, further comprising receiving an input of non-local couplings defined as mathematical expressions in terms of a dependent variable associated with at least one of said application modes.

193. The method of claim 188, further comprising receiving an input of one or more non-local couplings for at least one of said selected application modes.

194. The method of claim 188, further comprising receiving an input of non-local couplings defined as mathematical expressions in terms of an independent variable associated with at least one of said selected application modes.

195. The method of claim 188, further comprising receiving an input of non-local couplings defined as mathematical expressions in terms of a dependent variable associated with at least one of said selected application modes.

196. A method executed in a computer apparatus for creating a model of a combined physical system having physical quantities by representing physical quantities of the combined physical system in terms of a combined set of partial differential equations, the method comprising:
 representing at least one of a plurality of systems as two or more selected application modes modeling physical quantities of the at least one of the plurality of systems, wherein at least one of the two or more selected application modes is configured to model said physical quantities of at least one of a structural system, a fluids system, and an electromagnetic system;
 determining a set of partial differential equations for each of the two or more selected application modes, parameters of the partial differential equations being physical quantities of corresponding ones of the plurality of systems;
 forming the combined set of partial differential equations using the determined sets of partial differential equations associated with the at least one of the plurality of systems;
 determining, using a processor or another processor, a solution to the model of the combined physical system based on the combined set of partial differential equations for the two or more selected application modes for the at least one of the plurality of systems, the model representing a mathematical expression of the physical quantities of the combined physical system; and
 storing in a computer readable memory or in a computer readable data storage system the solution to the model,
 wherein said selected application modes include an interface for receiving inputs of one or more physical properties, at least one of said one or more physical properties being associated with at least a portion of said physical quantities.

197. The method of claim 196, wherein at least one of the one or more physical properties is defined as a mathematical expression in terms of at least one of the physical quantities, and at least one of the physical quantities is expressed in terms of a dependent variable associated with at least one of the application modes.

198. The method of claim 197, further comprising receiving an input of non-local couplings defined as mathematical expressions in terms of a dependent variable associated with at least one of the selected application modes.

199. The method of claim 197, further comprising receiving an input of one or more non-local couplings for at least one of the selected application modes.

200. The method of claim 197, further comprising receiving an input of non-local couplings as defined as mathematical expressions in terms of an independent variable associated with at least one of the selected application modes.

201. The method of claim 197, further comprising receiving an input of non-local couplings defined as mathematical expressions in terms of a dependent variable associated with at least one of the selected application modes.

202. The method of claim 196, further comprising receiving an input of one or more non-local couplings for at least one of the selected application modes.

203. The method of claim 196, further comprising receiving an input of non-local couplings defined as mathematical expressions in terms of an independent variable associated with at least one of the selected application modes.

* * * * *